US010290745B2

(12) United States Patent
Yamazaki et al.

(10) Patent No.: US 10,290,745 B2
(45) Date of Patent: *May 14, 2019

(54) SEMICONDUCTOR DEVICE AND METHOD FOR MANUFACTURING THE SAME

(71) Applicant: Semiconductor Energy Laboratory Co., Ltd., Kanagawa-ken (JP)

(72) Inventors: Shunpei Yamazaki, Tokyo (JP); Tetsuhiro Tanaka, Tokyo (JP); Akihisa Shimomura, Tochigi (JP); Yasumasa Yamane, Kanagawa (JP); Ryo Tokumaru, Kanagawa (JP); Yuhei Sato, Kanagawa (JP); Kazuhiro Tsutsui, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/632,764

(22) Filed: Jun. 26, 2017

(65) Prior Publication Data

US 2017/0294542 A1    Oct. 12, 2017

Related U.S. Application Data

(63) Continuation of application No. 14/963,945, filed on Dec. 9, 2015, now Pat. No. 9,698,277.

(30) Foreign Application Priority Data

Dec. 10, 2014  (JP) ................................. 2014-249819
May 11, 2015  (JP) ................................. 2015-096669

(51) Int. Cl.
*H01L 29/10*    (2006.01)
*H01L 29/12*    (2006.01)
(Continued)

(52) U.S. Cl.
CPC .......... *H01L 29/7869* (2013.01); *C23C 14/08* (2013.01); *C23C 14/3414* (2013.01);
(Continued)

(58) Field of Classification Search
USPC .... 257/223, 227, 291, 292, 439, 655, E21.1, 257/E27.125, E27.112, E29.117, E29.145,
(Continued)

(56) References Cited

U.S. PATENT DOCUMENTS 5,528,032 A    6/1996  Uchiyama
5,731,856 A    3/1998  Kim et al.
(Continued)

FOREIGN PATENT DOCUMENTS

CN    102725851 A    10/2012
CN    103681805 A    3/2014
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Niki H Nguyen
(74) *Attorney, Agent, or Firm* — Husch Blackwell LLP

(57) ABSTRACT

A transistor with stable electrical characteristics is provided. The transistor includes a first insulator over a substrate; first to third oxide insulators over the first insulator; a second insulator over the third oxide insulator; a first conductor over the second insulator; and a third insulator over the first conductor. An energy level of a conduction band minimum of each of the first and second oxide insulators is closer to a vacuum level than that of the oxide semiconductor is. An energy level of a conduction band minimum of the third
(Continued)

oxide insulator is closer to the vacuum level than that of the second oxide insulator is. The first insulator contains oxygen. The number of oxygen molecules released from the first insulator measured by thermal desorption spectroscopy is greater than or equal to 1E14 molecules/cm$^2$ and less than or equal to 1E16 molecules/cm$^2$.

14 Claims, 77 Drawing Sheets

(51) Int. Cl.
| | |
|---|---|
| H01L 29/786 | (2006.01) |
| H01L 29/49 | (2006.01) |
| H01L 29/51 | (2006.01) |
| H01L 29/423 | (2006.01) |
| H01L 29/66 | (2006.01) |
| H01L 21/02 | (2006.01) |
| C23C 14/08 | (2006.01) |
| C23C 14/34 | (2006.01) |
| H01L 27/12 | (2006.01) |

(52) U.S. Cl.
CPC .... *H01L 21/02266* (2013.01); *H01L 27/1207* (2013.01); *H01L 27/1225* (2013.01); *H01L 29/42384* (2013.01); *H01L 29/4908* (2013.01); *H01L 29/513* (2013.01); *H01L 29/517* (2013.01); *H01L 29/66969* (2013.01); *H01L 29/78648* (2013.01); *H01L 29/78696* (2013.01); *H01L 21/02554* (2013.01); *H01L 21/02565* (2013.01); *H01L 21/02631* (2013.01); *H01L 2029/42388* (2013.01)

(58) Field of Classification Search
USPC .. 257/E29.147, E29.151, E29.182, E29.202; 438/149, 157, 128, 154, 282
See application file for complete search history.

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,253,061 B2 | 8/2007 | Peng et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,977,254 B2 | 7/2011 | Peng et al. |
| 8,551,824 B2 | 10/2013 | Yamazaki et al. |
| 8,654,566 B2 | 2/2014 | Nagatsuka et al. |
| 8,748,240 B2 | 6/2014 | Yamazaki |
| 8,785,258 B2 | 7/2014 | Yamazaki |
| 8,828,794 B2 | 9/2014 | Yamazaki et al. |
| 8,829,586 B2 | 9/2014 | Endo et al. |
| 8,878,173 B2 | 11/2014 | Yamazaki |
| 8,921,853 B2 | 12/2014 | Yamazaki |
| 8,981,367 B2 | 3/2015 | Yoneda et al. |
| 8,981,370 B2 | 3/2015 | Tanaka et al. |
| 9,040,984 B2 | 5/2015 | Watanabe et al. |
| 9,099,303 B2 | 8/2015 | Yamazaki |
| 9,231,475 B2 | 1/2016 | Takahashi |
| 9,269,823 B2 | 2/2016 | Endo et al. |
| 9,293,602 B2 | 3/2016 | Yamazaki |
| 9,294,096 B2 | 3/2016 | Takemura |
| 9,318,506 B2 | 4/2016 | Endo et al. |
| 9,318,618 B2 | 4/2016 | Endo et al. |
| 9,378,776 B2 | 6/2016 | Koyama |
| 9,397,153 B2 | 7/2016 | Tanaka et al. |
| 9,698,277 B2 * | 7/2017 | Yamazaki ........... H01L 29/7869 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0121700 A1 | 6/2006 | Peng et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |

(56) References Cited

U.S. PATENT DOCUMENTS

| | | |
|---|---|---|
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0193079 A1 | 8/2011 | Endo et al. |
| 2011/0284844 A1 | 11/2011 | Endo et al. |
| 2012/0040495 A1 | 2/2012 | Noda et al. |
| 2013/0140569 A1 | 6/2013 | Yoneda |
| 2013/0153890 A1 | 6/2013 | Yoneda |
| 2013/0161610 A1 | 6/2013 | Yamazaki |
| 2013/0187152 A1 | 7/2013 | Yamazaki et al. |
| 2013/0234131 A1 | 9/2013 | Tanaka et al. |
| 2013/0277672 A1 | 10/2013 | Sano et al. |
| 2013/0334533 A1 | 12/2013 | Yamazaki |
| 2014/0008647 A1 | 1/2014 | Yamazaki |
| 2014/0038351 A1 | 2/2014 | Yamazaki et al. |
| 2014/0042437 A1 | 2/2014 | Yamazaki |
| 2014/0077205 A1 | 3/2014 | Yamazaki et al. |
| 2014/0103337 A1 | 4/2014 | Yamazaki et al. |
| 2014/0106504 A1 | 4/2014 | Yamazaki et al. |
| 2014/0131701 A1 | 5/2014 | Watanabe et al. |
| 2014/0138675 A1* | 5/2014 | Yamazaki ......... H01L 29/66757 257/43 |
| 2014/0152932 A1 | 6/2014 | Miyake |
| 2014/0183530 A1* | 7/2014 | Yamazaki ........... H01L 29/7869 257/43 |
| 2014/0225104 A1* | 8/2014 | Yamazaki ........... H01L 29/7869 257/43 |
| 2014/0319514 A1 | 10/2014 | Noda et al. |
| 2014/0326992 A1 | 11/2014 | Hondo et al. |
| 2014/0332800 A1* | 11/2014 | Hanaoka ............ H01L 29/7869 257/43 |
| 2014/0339547 A1 | 11/2014 | Hondo et al. |
| 2015/0028330 A1 | 1/2015 | Yamazaki et al. |
| 2015/0041803 A1 | 2/2015 | Endo et al. |
| 2015/0060845 A1 | 3/2015 | Shishido |
| 2015/0084046 A1 | 3/2015 | Kato et al. |
| 2015/0137120 A1 | 5/2015 | Yamazaki |
| 2015/0155387 A1 | 6/2015 | Yamazaki et al. |
| 2015/0179803 A1 | 6/2015 | Yamazaki et al. |
| 2015/0179806 A1 | 6/2015 | Yoneda et al. |
| 2015/0187951 A1 | 7/2015 | Endo et al. |
| 2015/0221679 A1 | 8/2015 | Yamazaki et al. |
| 2015/0221775 A1 | 8/2015 | Yamazaki et al. |
| 2015/0243332 A1 | 8/2015 | Koyama |
| 2015/0249385 A1 | 9/2015 | Takahashi |
| 2015/0270403 A1 | 9/2015 | Katayama et al. |
| 2015/0280715 A1 | 10/2015 | Takemura |
| 2015/0311346 A1 | 10/2015 | Koezuka et al. |
| 2016/0035865 A1 | 2/2016 | Nagamatsu et al. |
| 2016/0056043 A1 | 2/2016 | Tanaka et al. |
| 2016/0071840 A1 | 3/2016 | Yamamoto et al. |
| 2016/0211381 A1 | 7/2016 | Kurokawa |
| 2016/0218225 A1 | 7/2016 | Yamazaki |
| 2016/0233235 A1 | 8/2016 | Miyairi et al. |
| 2016/0233339 A1 | 8/2016 | Okazaki |
| 2016/0240683 A1 | 8/2016 | Miyake et al. |
| 2016/0240684 A1 | 8/2016 | Yamazaki et al. |
| 2016/0254386 A1 | 9/2016 | Yamazaki et al. |

FOREIGN PATENT DOCUMENTS

| | | |
|---|---|---|
| CN | 105190902 A | 12/2015 |
| DE | 10 2013 217 808 A1 | 3/2014 |
| EP | 1 737 044 A1 | 12/2006 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-181906 A | 9/2011 |
| JP | 2013-214732 A | 10/2013 |
| JP | 2014-075580 A | 4/2014 |
| JP | 2014-116594 A | 6/2014 |
| JP | 2014-143408 A | 8/2014 |
| JP | 2014-225651 A | 12/2014 |
| JP | 2014-239213 A | 12/2014 |
| KR | 2012-0130763 A | 12/2012 |
| KR | 2014-0035822 A | 3/2014 |
| KR | 2014-0063445 A | 5/2014 |
| KR | 2014-0128243 A | 11/2014 |
| TW | 201145510 | 12/2011 |
| TW | 201417289 | 5/2014 |
| TW | 201427012 | 7/2014 |
| TW | 201448228 | 12/2014 |
| TW | 201501313 | 1/2015 |
| WO | WO 2004/114391 A1 | 12/2004 |
| WO | WO 2011/096271 A1 | 8/2011 |
| WO | WO 2014/181785 A1 | 11/2014 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT",

(56) References Cited

OTHER PUBLICATIONS

SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters), 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

(56) References Cited

OTHER PUBLICATIONS

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AMOLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/IB2015/059310) dated Apr. 5, 2016.

Written Opinion (Application No. PCT/IB2015/059310) dated Apr. 5, 2016.

\* cited by examiner

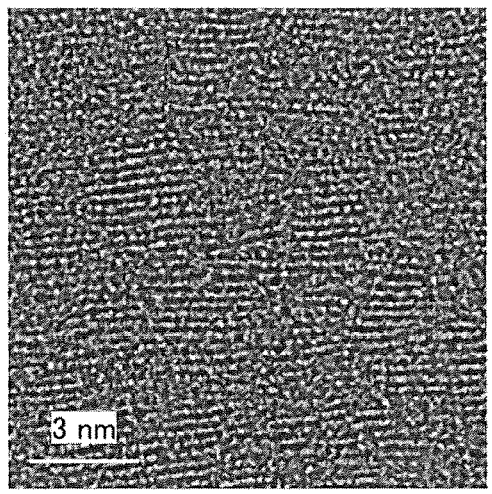
FIG. 4A
FIG. 4B
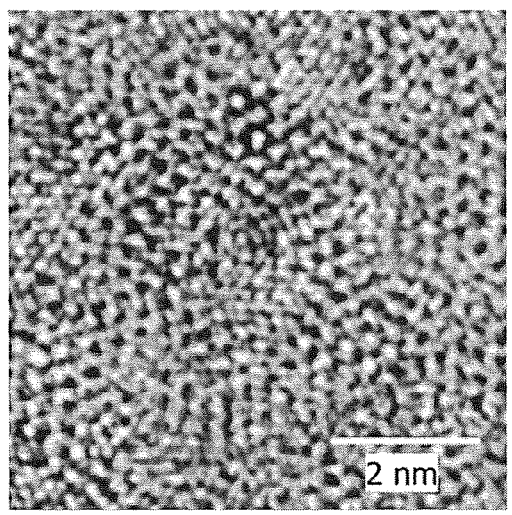
FIG. 4C
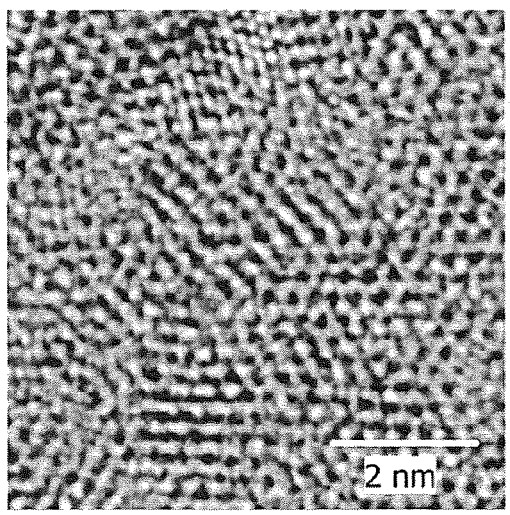
FIG. 4D
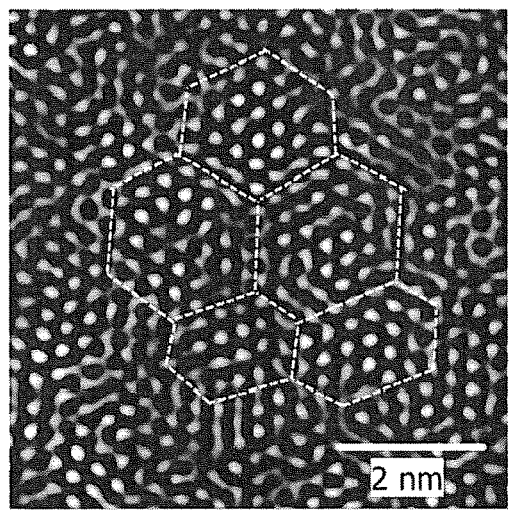
FIG. 4E
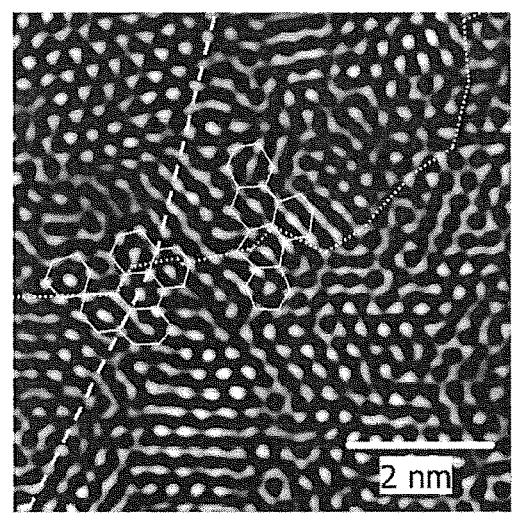

A1　　106d　　　　　112　　A2

A3　　　　　　　　　　A4

A1　　　　　114　　　　A2

A3 114　　　　　　　　A4

A1　　　　　116　118　A2

A3　　　　　　　　　　A4

126

A1　　　　　　　　　　A2

A3　　　　　　　A4

FIG. 48A1
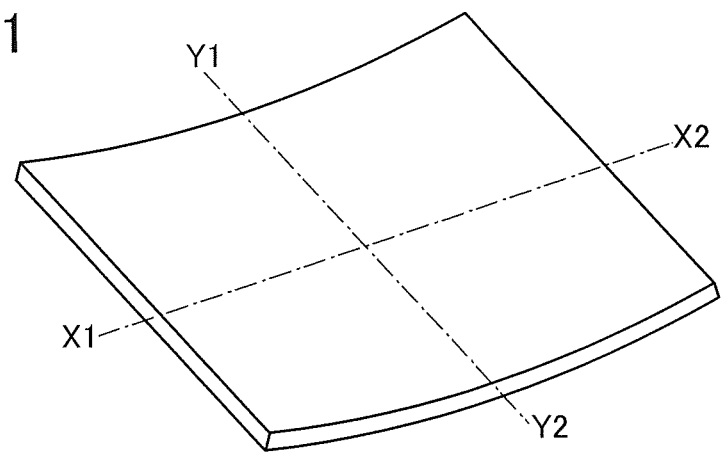
FIG. 48A2
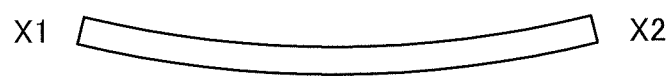
FIG. 48A3
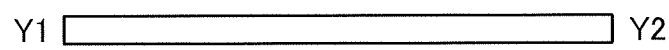
FIG. 48B1
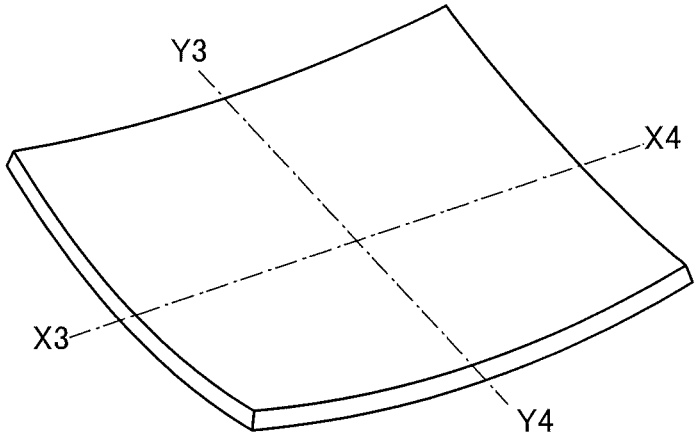
FIG. 48B2
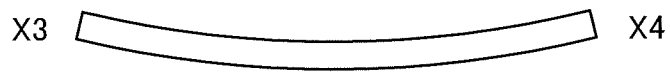
FIG. 48B3
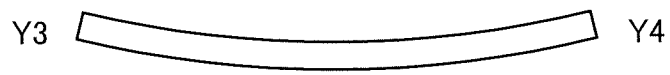

Field-Effect Mobility [cm2/Vs]

Shift [V]

S value [mV/dec]

Threshold Voltage [V]

SEMICONDUCTOR DEVICE AND METHOD FOR MANUFACTURING THE SAME

This application is a continuation of copending U.S. application Ser. No. 14/963,945, filed on Dec. 9, 2015 which is incorporated herein by reference.

TECHNICAL FIELD

The present invention relates to, for example, a transistor or a semiconductor device. The present invention relates to, for example, a method for manufacturing a transistor or a semiconductor device. The present invention relates to, for example, a display device, a light-emitting device, a lighting device, a power storage device, a memory device, a processor, or an electronic device. The present invention relates to a method for manufacturing a display device, a liquid crystal display device, a light-emitting device, a memory device, or an electronic device. The present invention relates to a driving method of a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

BACKGROUND ART

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. On the other hand, in the case of a transistor included in a high-performance display device where driver circuits are formed over the same substrate, it is preferred to use polycrystalline silicon, which can form a transistor having high field-effect mobility. As a method for forming polycrystalline silicon, high-temperature heat treatment or laser light treatment which is performed on amorphous silicon has been known.

In recent years, transistors including oxide semiconductors (typically, In—Ga—Zn oxide) have been actively developed. Oxide semiconductors have been researched since early times. In 1988, there was a disclosure of a crystal In—Ga—Zn oxide that can be used for a semiconductor element (see Patent Document 1). In 1995, a transistor including an oxide semiconductor was invented, and its electrical characteristics were disclosed (see Patent Document 2).

The transistor including an oxide semiconductor has different features from a transistor including amorphous silicon or polycrystalline silicon. For example, a display device in which a transistor including an oxide semiconductor is used is known to have low power consumption. An oxide semiconductor can be formed by a sputtering method or the like, and thus can be used in a transistor included in a large display device. A transistor including an oxide semiconductor has high field-effect mobility; therefore, a high-performance display device where driver circuits are formed over the same substrate can be obtained. In addition, there is an advantage that capital investment can be reduced because part of production equipment for a transistor including amorphous silicon can be retrofitted and utilized.

REFERENCE

Patent Document

[Patent Document 1] Japanese Published Patent Application No. S63-239117
[Patent Document 2] Japanese translation of PCT international application No. H11-505377

DISCLOSURE OF INVENTION

An object is to provide a transistor with stable electrical characteristics. Another object is to provide a transistor having a low leakage current in an off state. Another object is to provide a transistor with high frequency characteristics. Another object is to provide a transistor with normally-off electrical characteristics. Another object is to provide a transistor with a small subthreshold swing value. Another object is to provide a highly reliable transistor.

Another object is to provide a semiconductor device including the transistor. Another object is to provide a module including the semiconductor device. Another object is to provide an electronic device including the semiconductor device or the module. Another object is to provide a novel semiconductor device. Another object is to provide a novel module. Another object is to provide a novel electronic device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device that includes a first insulator over a substrate; a first oxide insulator over the first insulator; an oxide semiconductor in contact with at least part of a top surface of the first oxide insulator; a second oxide insulator in contact with at least part of a top surface of the oxide semiconductor; a third oxide insulator in contact with at least part of a top surface of the second oxide insulator; a second insulator over the third oxide insulator; a first conductor over the second insulator; and a third insulator over the first conductor. The energy level of the conduction band minimum of the first oxide insulator is closer to the vacuum level than the energy level of the conduction band minimum of the oxide semiconductor is. The energy level of the conduction band minimum of the second oxide insulator is closer to the vacuum level than the energy level of the conduction band minimum of the oxide semiconductor is. The energy level of the conduction band minimum of the third oxide insulator is closer to the vacuum level than the energy level of the conduction band minimum of the second oxide insulator is. The first insulator contains oxygen. The number of oxygen molecules released from the first insulator measured by thermal desorption spectroscopy is greater than or equal to $1.0\times10^{14}$ molecules/cm$^2$ and less than or equal to $1.0\times10^{16}$ molecules/cm$^2$.

Another embodiment of the present invention is a semiconductor device that includes a first insulator over a substrate; a first oxide insulator over the first insulator; an oxide semiconductor in contact with at least part of a top surface of the first oxide insulator; a second oxide insulator in contact with at least part of a top surface of the oxide semiconductor; a third oxide insulator in contact with at least part of a top surface of the second oxide insulator; a second insulator over the third oxide insulator; a first conductor over the second insulator; and a third insulator over the first conductor. The energy gap of the first oxide insulator is larger than the energy gap of the oxide semiconductor. The energy gap of the second oxide insulator is larger than the energy gap of the oxide semiconductor. The energy gap of the third oxide insulator is larger than the energy gap of the second oxide insulator. The first insulator contains oxygen. The number of oxygen molecules released from the first insulator measured by thermal desorption spectroscopy is greater than or equal to $1.0\times10^{14}$ molecules/cm$^2$ and less than or equal to $1.0\times10^{16}$ molecules/cm$^2$.

The above semiconductor device may further include a second conductor and a third conductor, in which case the second conductor is in contact with at least part of the top surface of the second oxide insulator and is contact with at least part of a bottom surface of the third oxide insulator, the third conductor is in contact with at least part of the top surface of the second oxide insulator and is in contact with at least part of the bottom surface of the third oxide insulator, and at least part of the first conductor does not overlap with the second conductor and the third conductor.

In the above semiconductor device, the second conductor and the third conductor may be in contact with the top surface of the second oxide insulator in a region not overlapping with the first oxide insulator and the oxide semiconductor.

The above semiconductor device may further include a second conductor and a third conductor, in which case the second conductor is in contact with at least part of the top surface of the oxide semiconductor and is in contact with at least part of a bottom surface of the second oxide insulator, the third conductor is in contact with at least part of the top surface of the oxide semiconductor and is in contact with at least part of the bottom surface of the second oxide insulator, and at least part of the first conductor does not overlap with the second conductor and the third conductor.

In the above semiconductor device, the third oxide insulator may contain an element M (Ti, Ga, Y, Zr, La, Ce, Nd, Sn, or Hf), zinc, and oxygen.

In the above semiconductor device, the second conductor and the third conductor may each have a stacked-layer structure, and an upper layer of each of the second conductor and the third conductor may contain a metal containing one or more kinds of elements selected from silver, copper, ruthenium, iridium, platinum, and gold or an oxide containing one or more kinds of elements selected from silver, copper, ruthenium, iridium, platinum, and gold.

Another embodiment of the present invention is a semiconductor device that includes a first insulator over a substrate; a first oxide insulator over the first insulator; an oxide semiconductor in contact with at least part of a top surface of the first oxide insulator; a first conductor in contact with at least part of a top surface of the oxide semiconductor; a second conductor in contact with at least part of the top surface of the oxide semiconductor; a second oxide insulator over the first conductor and the second conductor and in contact with at least part of the top surface of the oxide semiconductor; a second insulator over the second oxide insulator; a third conductor over the second insulator, at least part of which does not overlap with the first conductor and the second conductor; and a third insulator over the third conductor, at least part of which is in contact with a top surface of the first insulator. The energy level of the conduction band minimum of the first oxide insulator and the energy level of the conduction band minimum of the second oxide insulator are closer to the vacuum level than the energy level of the conduction band minimum of the oxide semiconductor is. The distance between a region in which the first insulator is in contact with the third insulator and a region of the oxide semiconductor that does not overlap with the first conductor and the second conductor and overlaps with the third conductor is 3 µm or less. The first insulator contains oxygen. The number of oxygen molecules released from the first insulator measured by thermal desorption spectroscopy is greater than or equal to $1.0\times10^{14}$ molecules/cm$^2$ and less than or equal to $1.0\times10^{16}$ molecules/cm$^2$.

In the above semiconductor device, a bottom surface of the first conductor and a bottom surface of the second conductor are not necessarily in contact with the top surface of the first insulator.

In the above semiconductor device, at least part of each of the first conductor and the second conductor may overlap with the third insulator with the second oxide insulator positioned therebetween in a region not overlapping with the first conductor.

The above semiconductor device may further include a fourth conductor and fourth insulator, in which case the fourth conductor is firm med over the substrate and below the first insulator, the fourth insulator is formed between the fourth conductor and the first insulator, and the fourth insulator is an oxide or a nitride containing boron, aluminum, silicon, scandium, titanium, gallium, yttrium, zirconium, indium, lanthanum, cerium, neodymium, hafnium, or thallium.

In the above semiconductor device, the first oxide insulator, the oxide semiconductor, and the second oxide insulator may each contain indium, an element M (Ti, Ga, Y, Zr, La, Ce, Nd, Sn, or Hf), zinc, and oxygen.

In the above semiconductor device, the third insulator may contain oxygen and aluminum.

Another embodiment of the present invention is a method for manufacturing a semiconductor device that includes the following steps: forming a first insulator over a substrate; forming a first oxide insulator, an oxide semiconductor, a first conductor, and a second conductor over the first insulator; forming a second oxide insulator over the oxide semiconductor, the first conductor, and the second conductor; forming a second insulator and a third conductor over the second oxide insulator; forming a third insulator over the third conductor by an RF sputtering method so that at least part of the third insulator is in contact with the first insulator; and performing heat treatment in an atmosphere containing oxygen.

Another embodiment of the present invention is a method for manufacturing a semiconductor device that includes the following steps: forming a first insulator over a substrate; forming a first oxide insulator, an oxide semiconductor, a first conductor, and a second conductor over the first insulator; forming a second oxide insulator over the oxide semiconductor, the first conductor, and the second conductor; forming a second insulator and a third conductor over the second oxide insulator; forming a third insulator over the third conductor by an atomic layer deposition method so that at least part of the third insulator is in contact with the first insulator; adding oxygen from above the third insulator; and performing heat treatment in an atmosphere containing oxygen.

In the above method for manufacturing the semiconductor device, the oxygen may be added by an ion implantation method.

In the above method for manufacturing the semiconductor device, the first oxide insulator, the oxide semiconductor, and the second oxide insulator may each contain indium, an element M (Ti, Ga, Y, Zr, La, Ce, Nd, Sn, or Hf), zinc, and oxygen.

In the above method for manufacturing the semiconductor device, the third insulator may contain oxygen and aluminum.

A transistor with stable electrical characteristics can be provided. A transistor having a low leakage current in an off state can be provided. A transistor with high frequency characteristics can be provided. A transistor with normally-off electrical characteristics can be provided. A transistor with a small subthreshold swing value can be provided. A highly reliable transistor can be provided.

A semiconductor device including the transistor can be provided. A module including the semiconductor device can be provided. An electronic device including the semiconductor device or the module can be provided. A novel semiconductor device can be provided. A novel module can be provided. A novel electronic device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 4A to 4E show a cross-sectional TEM image and plan-view TEM images of a CAAC-OS and images obtained through analysis thereof.

FIGS. 48A1, 48A2, 48A3, 48B1, 48B2, and 48B3 are perspective views and cross-sectional views of a semiconductor device of one embodiment of the present invention.

BEST MODE FOR CARRYING OUT THE INVENTION

Figure 1A:
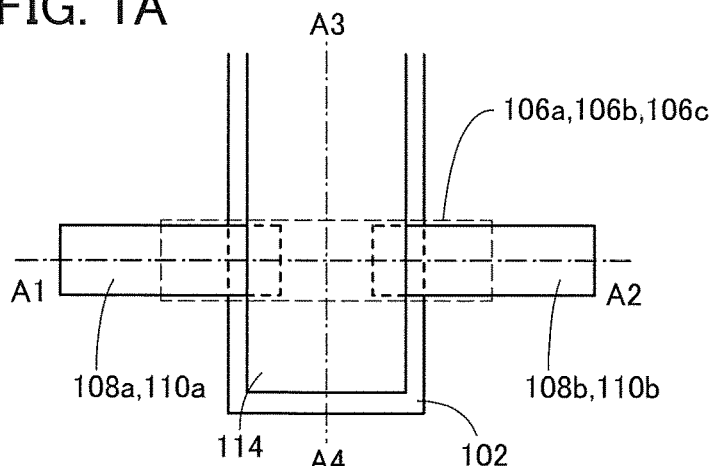
FIGS. 1A to 1E are a top view and cross-sectional views illustrating a transistor of one embodiment of the present invention.

Hereinafter, embodiments and examples of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

A structure in one of the following embodiments can be appropriately applied to, combined with, or replaced with another structure in another embodiment, for example, and the resulting structure is also one embodiment of the present invention.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a source potential or a ground potential (GND)). A voltage can be referred to as a potential and vice versa. Note that in general, a potential (a voltage) is relative and is determined depending on the amount relative to a certain potential. Therefore, a potential that is represented as a "ground potential" or the like is not always 0 V. For example, the lowest potential in a circuit may be represented as a "ground potential." Alternatively, a substantially intermediate potential in a circuit may be represented as a "ground potential." In these cases, a positive potential and a negative potential are set using the potential as a reference.

Note that the ordinal numbers such as "first" and "second" are used for convenience and do not denote the order of steps or the stacking order of layers. Therefore, for example, the term "first" can be replaced with the term "second," "third," or the like as appropriate. In addition, the ordinal numbers in this specification and the like do not correspond to the ordinal numbers which specify one embodiment of the present invention in some cases.

Note that a "semiconductor" has characteristics of an "insulator" in some cases when the conductivity is sufficiently low, for example. Furthermore, a "semiconductor" and an "insulator" cannot be strictly distinguished from each other in some cases because a border therebetween is not clear. Accordingly, a "semiconductor" in this specification can be called an "insulator" in some cases. Similarly, an "insulator" in this specification can be called a "semiconductor" in some cases.

Furthermore, a "semiconductor" has characteristics of a "conductor" in some cases when the conductivity is sufficiently high, for example. Furthermore, a "semiconductor" and a "conductor" cannot be strictly distinguished from each other in some cases because a border therebetween is not clear. Accordingly, a "semiconductor" in this specification can be called a "conductor" in some cases. Similarly, a "conductor" in this specification can be called a "semiconductor" in some cases.

Note that impurities in a semiconductor refer to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

In this specification, the phrase "A has a region with a concentration B" includes, for example, the case where the concentration of the whole of a region of A in the depth direction is B, the case where the average concentration in a region of A in the depth direction is B, the case where the median value of a concentration in a region of A in the depth direction is B, the case where the maximum value of a concentration in a region of A in the depth direction is B, the case where the minimum value of a concentration in a region of A in the depth direction is B, the case where a convergence value of a concentration in a region of A in the depth direction is B, and the case where a concentration in a region in which a probable value of A is obtained in measurement is B.

In this specification, the phrase "A has a region with a size B, a length B, a thickness B, a width B, or a distance B" includes, for example, the case where the whole of a region of A has a size B, a length B, a thickness B, a width B, or a distance B, the case where the average value in a region of A has a size B, a length B, a thickness B, a width B, or a distance B, the case where the median value in a region of A has a size B, a length B, a thickness B, a width B, or a distance B, the case where the maximum value in a region of A has a size B, a length B, a thickness B, a width B, or a distance B, the case where the minimum value in a region of A has a size B, a length B, a thickness B, a width B, or a distance B, the case where a convergence value in a region of A has a size B, a length B, a thickness B, a width B, or a distance B, and the case where a region in which a probable value of A is obtained in measurement has a size B, a length B, a thickness B, a width B, or a distance B.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a plan view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on a transistor structure, a channel width in a region where a channel is formed actually (hereinafter referred to as an effective channel width) is different from a channel width shown in a plan view of a transistor (hereinafter referred to as an apparent channel width) in some cases. For example, in a transistor having a three-dimensional structure, an effective channel width is greater than an apparent channel width shown in a plan view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the plan view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a plan view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values might be different from those calculated by using an effective channel width.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be read as the description "one end portion of A is positioned on an outer side than one end portion of B in a top view," for example.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

<Transistor 1>

The structure of a transistor is described below as an example of the semiconductor device of one embodiment of the present invention.

Figure 1B:
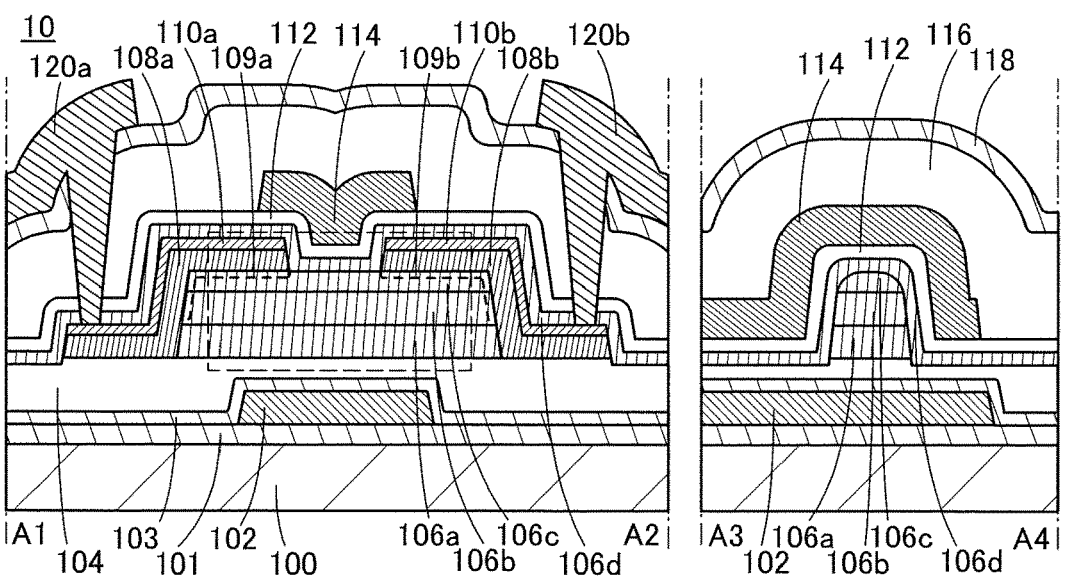
Figure 1C:
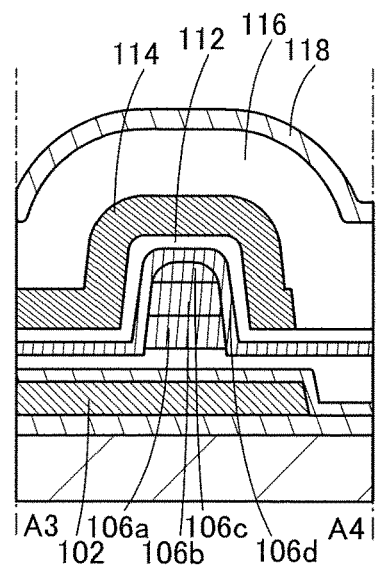

The structure of a transistor 10 is described with reference to FIGS. 1A to 1C. FIG. 1A is a top view of the transistor 10. FIG. 1B is a cross-sectional view taken along a dashed-dotted line A1-A2 in FIG. 1A, and FIG. 1C is a cross-sectional view taken along a dashed-dotted line A3-A4 in FIG. 1A. A region along dashed-dotted line A1-A2 shows a structure of the transistor 10 in the channel length direction, and a region along dashed-dotted line A3-A4 shows a structure of the transistor 10 in the channel width direction. An insulator 106a, a semiconductor 106b, and an insulator 106c can be provided to substantially overlap with conductors 108a and 108b and the like; however, for clarity of the top view, the insulator 106a, the semiconductor 106b, and the insulator 106c are denoted with a thin dashed line in FIG. 1A as being misaligned.

As illustrated in FIGS. 1A to 1C, the transistor 10 includes an insulator 101, a conductor 102, an insulator 103, and an insulator 104 that are formed over a substrate 100; the insulator 106a, the semiconductor 106b, the insulator 106c, an insulator 106d that are formed over the insulator 104; the conductor 108a, the conductor 108b, a conductor 110a, and a conductor 110b that are formed over the insulator 106c; an insulator 112 formed over the insulator 106d; a conductor 114 formed over the insulator 112; and an insulator 116, an insulator 118, a conductor 120a, and a conductor 120b that are formed over the conductor 114.

Here, the insulator 101, the insulator 103, the insulator 104, the insulator 106a, the insulator 106c, the insulator 106d, the insulator 112, the insulator 116, and the insulator 118 can also be referred to as insulating films or insulating layers. The conductor 102, the conductor 108a, the conductor 108b, the conductor 110a, the conductor 110b, the conductor 114, the conductor 120a, and the conductor 120b can also be referred to as conductive films or conductive layers. The semiconductor 106b can also be referred to as a semiconductor film or a semiconductor layer.

Note that as the details are described later, the insulator 106a, the insulator 106c, and the insulator 106d are sometimes formed using a substance that can function as a conductor, a semiconductor, or an insulator when they are used alone. However, when the transistor is formed by stacking the semiconductor 106b, electrons flow in the semiconductor 106b, in the vicinity of an interface between the semiconductor 106b and the insulator 106a, and in the vicinity of an interface between the semiconductor 106b and the insulator 106c, and some regions of the insulators 106a, 106c, and 106d do not serve as a channel of the transistor. For that reason, in the present specification and the like, the insulators 106a, 106c, and 106d are not referred to as semiconductors but insulators.

Over the insulator 101 formed over the substrate 100, the conductor 102 is formed. The conductor 102 overlaps with the insulator 106a, the semiconductor 106b, the insulator 106c, and the insulator 106d. The insulator 103 is formed on and in contact with the conductor 102 to cover the conductor 102. The insulator 104 is formed over the insulator 103.

The insulator 106a is formed over the insulator 104, the semiconductor 106b is formed in contact with at least part of a top surface of the insulator 106a, and the insulator 106c is formed in contact with at least part of a top surface of the semiconductor 106b. Although end portions of the insulator 106a, the semiconductor 106b, and the insulator 106c are substantially aligned in FIG. 1B, the structure of the semiconductor device described in this embodiment is not limited to this example.

The conductor 108a and the conductor 108b are formed in contact with at least part of a top surface of the insulator 106c. The conductor 108a and the conductor 108b are spaced and are preferably formed to face each other with the conductor 114 provided therebetween as illustrated in FIG. 1A. As illustrated in FIG. 1B, the conductor 110a may be formed on and in contact with the conductor 108a and the conductor 110b may be formed on and in contact with the conductor 108b, in which case the conductors form a stacked-layer structure.

The insulator 106d is formed in contact with at least part of the top surface of the insulator 106c. The insulator 106d is preferably in contact with the insulator 106c in a region sandwiched between the conductor 108a and the conductor 108b. Although the insulator 106d is formed to cover the conductor 108a, the conductor 108b, and the like in FIG. 1B, the structure of the semiconductor device described in this embodiment is not limited to this example.

The insulator 112 is formed over the insulator 106d. The conductor 114 is formed over the insulator 112 to overlap with a region between the conductor 108a and the conductor 108b. Although the insulator 112 is formed to cover the insulator 106d, the conductor 108a, the conductor 108b, and the like in FIG. 1B, the structure of the semiconductor device described in this embodiment is not limited to this example.

The insulator 116 is formed over the conductor 114 and the insulator 112, and the insulator 118 is formed over the insulator 116. The conductor 120a and the conductor 120b are formed over the insulator 118. The conductor 120a and the conductor 120b are connected to the conductor 110a and the conductor 110b through openings formed in the insulator 106d, the insulator 112, the insulator 116, and the insulator 118.

Figure 1D:
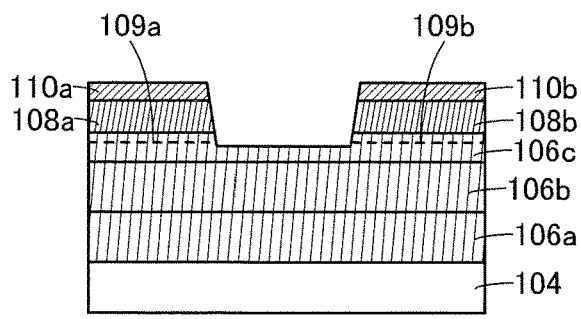
Figure 1E:
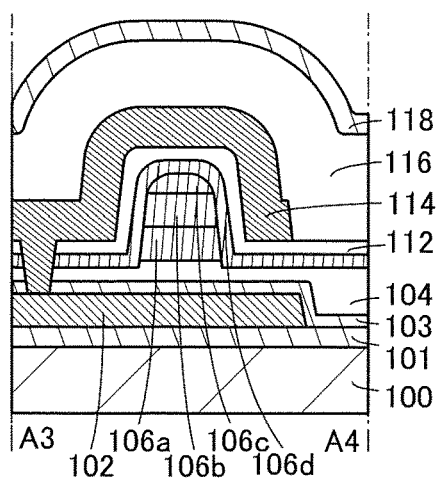

As illustrated in FIG. 1E, the conductor 114 may be connected to the conductor 102 through an opening formed in the insulator 112, the insulator 106d, the insulator 104, the insulator 103, and the like.

<Semiconductor 1>

The structure of the semiconductor 106b is described in detail below. In this section, the structures of the insulator 106a, the insulator 106c, and the insulator 106d are described in addition to the structure of the semiconductor 106b.

The semiconductor 106b is an oxide semiconductor containing indium, for example. The semiconductor 106b can have high carrier mobility (electron mobility) by containing indium, for example. The semiconductor 106b preferably contains an element M. The element M is preferably Ti, Ga, Y, Zr, La, Ce, Nd, Sn, or Hf. Note that two or more of the above elements may be used in combination as the element M in some cases. The element M is an element having high bonding energy with oxygen, for example. The element M is an element whose bonding energy with oxygen is higher than that of indium, for example. The element M is an element that can increase the energy gap of the oxide semiconductor, for example. Furthermore, the semiconductor 106b preferably contains zinc. When the oxide semiconductor contains zinc, the oxide semiconductor is easily crystallized, in some cases.

Note that the semiconductor 106b is not limited to the oxide semiconductor containing indium. The semiconductor 106b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For example, the insulator 106a and the insulator 106c are oxide semiconductors including one or more elements, or two or more elements other than oxygen included in the semiconductor 106b. Since the insulator 106a and the insulator 106c each include one or more elements, or two or more elements other than oxygen included in the semiconductor 106b, a defect state is less likely to be formed at the interface between the insulator 106a and the semiconductor 106b and the interface between the semiconductor 106b and the insulator 106c.

The insulator 106a, the semiconductor 106b, and the insulator 106c preferably include at least indium. In the case of using an In-M-Zn oxide as the insulator 106a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 106b, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the insulator 106c, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the insulator 106c may be an oxide that is of the same type as the oxide of the insulator 106a. Note that the insulator 106a and/or the insulator 106c do/does not necessarily contain indium in some cases. For example, the insulator 106a and/or the insulator 106c may be gallium oxide or a Ga—Zn oxide. Note that the atomic ratio between the elements included in the insulator 106a, the semiconductor 106b, and the insulator 106c is not necessarily a simple integer ratio.

In the case of deposition using a sputtering method, typical examples of the atomic ratio between the metal elements of a target that is used for the insulator 106a include In:M:Zn=1:2:4, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, In:M:Zn=1:6:9, and In:M:Zn=1:10:1. The atomic ratio between the metal elements of the target that is used for the insulator 106a may be M:Zn=10:1.

In the case of deposition using a sputtering method, typical examples of the atomic ratio between the metal elements of a target that is used for the semiconductor 106b include In:M:Zn=1:1:1, In:M:Zn=1:1:1.2, In:M:Zn=2:1:1.5, In:M:Zn=2:1:2.3, In:M:Zn=2:1:3, In: M:Zn=3:1:2, In:M:Zn=4:2:4.1, and In:M:Zn=5:1:7. In particular, when a sputtering target containing In, Ga, and Zn at an atomic ratio of 4:2:4.1 is used, the deposited semiconductor 106b may contain In, Ga, and Zn at an atomic ratio of around 4:2:3.

In the case of deposition using a sputtering method, typical examples of the atomic ratio between the metal elements of the target that is used for the insulator 106c include In:M:Zn=1:2:4, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, In:M:Zn=1:6:9, and In:M:Zn=1:10:1. The atomic ratio between the metal elements of the target that is used for the insulator 106c may be M:Zn=10:1.

An indium gallium oxide has small electron affinity and a high oxygen-blocking property. Therefore, the insulator 106c preferably includes an indium gallium oxide. The gallium atomic ratio [Ga/(In+Ga)] is, for example, higher than or equal to 70%, preferably higher than or equal to 80%, further preferably higher than or equal to 90%.

For example, the insulator 106d is an oxide semiconductor including one or more elements, or two or more elements other than oxygen included in the insulator 106c. Since the insulator 106d includes one or more, or two or more elements other than oxygen included in the insulator 106c, defect states are not easily formed at an interface between the insulator 106c and the insulator 106d.

The insulator 106d preferably contains a smaller amount of indium than the insulator 106c. It is further preferable that the insulator 106d not contain indium. For example, gallium oxide, a Ga—Zn oxide, or an In—Ga—Zn oxide can be used for the insulator 106d. Note that the atomic ratio between the elements contained in the insulator 106d is not necessarily a simple integer ratio. For example, in the case of deposition using a sputtering method, a typical example of the atomic ratio between the metal elements of the target that is used for the insulator 106d is Ga:Zn=10:1.

When such an oxide semiconductor containing less indium or preferably no indium is used for the insulator 106d, less indium can diffuse from the insulator 106d to the insulator 112 serving as the gate insulating film of the transistor 10. Here, if indium diffuses into the insulator 112 or to the interface between the insulator 112 and the insulator 106d, an increase in leakage current of the transistor is induced. However, when the insulator 106d provided between the insulator 112 and the insulator 106a, the semiconductor 106b, and the insulator 106c is an oxide semiconductor containing less indium or no indium, indium in the insulator 112 or at the interface between the insulator 112 and the insulator 106d can be reduced and an increase in leakage current can be inhibited. With the above structure, while an increase in leakage current is inhibited, on-state current can be increased by increasing the indium content of the insulator 106a, the semiconductor 106b, and the insulator 106c.

For the semiconductor 106b, an oxide with a wide energy gap may be used, for example. For example, the energy gap of the semiconductor 106b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV. Here, the energy gap of the insulator 106a is larger than that of the semiconductor 106b. The energy gap of the insulator 106c is larger than that of the semiconductor 106b. The energy gap of the insulator 106d is larger than that of the insulator 106c.

As the semiconductor 106b, an oxide having an electron affinity larger than those of the insulators 106a and 106c is used. For example, as the semiconductor 106b, an oxide having an electron affinity larger than those of the insulators 106a and 106c by 0.07 eV or higher and 1.3 eV or lower, preferably 0.1 eV or higher and 0.7 eV or lower, further preferably 0.15 eV or higher and 0.4 eV or lower is used. As the insulator 106c, an oxide having an electron affinity larger than that of the insulator 106d is used. Note that the electron affinity refers to an energy difference between the vacuum level and the conduction band minimum. In other words, the energy level of the conduction band minimum of the insulator 106a is closer to the vacuum level than the energy level of the conduction band minimum of the semiconductor 106b is. The energy level of the conduction band minimum of the insulator 106c is closer to the vacuum level than the energy level of the conduction band minimum of the semiconductor 106b is. The energy level of the conduction band minimum of the insulator 106d is closer to the vacuum level than the energy level of the conduction band minimum of the insulator 106c is.

By applying gate voltage at this time, a channel is formed in the semiconductor 106b having the largest electron affinity among the insulator 106a, the semiconductor 106b, the insulator 106c, and the insulator 106d.

The insulator 106a, the insulator 106c, and the insulator 106d are formed using a substance that can function as a conductor, a semiconductor, or an insulator when they are used alone. However, when the transistor is formed by stacking the semiconductor 106b, electrons flow in the semiconductor 106b, in the vicinity of an interface between the semiconductor 106b and the insulator 106a, and in the vicinity of an interface between the semiconductor 106b and the insulator 106c, and some regions of the insulators 106a, 106c, and 106d do not serve as a channel of the transistor. For that reason, in the present specification and the like, the insulators 106a, 106c, and 106d are not referred to as semiconductors but insulators. Note that the reason why the insulator 106a, the insulator 106c, and the insulator 106d are each referred to as an insulator is because they are closer to an insulator than the semiconductor 106b is in terms of their functions in a transistor, and the substance that can be used for the semiconductor 106b is used for the insulator 106a, the insulator 106c, and the insulator 106d in some cases.

Here, in some cases, there is a mixed region of the insulator 106a and the semiconductor 106b between the insulator 106a and the semiconductor 106b. Furthermore, in some cases, there is a mixed region of the semiconductor 106b and the insulator 106c between the semiconductor 106b and the insulator 106c. Furthermore, in some cases, there is a mixed region of the insulator 106c and the insulator 106d between the insulator 106c and the insulator 106d. The mixed region has a low density of defect states. For that reason, the stack including the insulator 106a, the semiconductor 106b, the insulator 106c, and the insulator 106d has a band structure where energy is changed continuously at each interface and in the vicinity of the interface (continuous junction) (see FIG. 2). Note that boundaries of the insulator 106a, the semiconductor 106b, the insulator 106c, and the insulator 106d are not clear in some cases.

At this time, electrons move mainly in the semiconductor 106b, not in the insulator 106a, the insulator 106c, and the insulator 106d. As described above, when the density of defect states at the interface between the insulator 106a and the semiconductor 106b and the density of defect states at the interface between the semiconductor 106b and the insulator 106c are decreased, electron movement in the semiconductor 106b is less likely to be inhibited and the on-state current of the transistor can be increased.

As described above, the insulator 106d, which is an oxide semiconductor with a small indium content, preferably an oxide semiconductor not containing indium, is formed in contact with the insulator 112 serving as the gate insulating film, whereby indium in the insulator 112 or at the interface between the insulator 112 and the insulator 106d can be reduced. As a result, an increase in leakage current of the transistor 10 can be inhibited. However, when the insulator 106d is formed on and in direct contact with the semiconductor 106b, a difference between metal elements contained in the semiconductor 106b and the insulator 106d or a difference between electron affinities of the semiconductor 106b and the insulator 106d might lead to an increase in the density of defect states at the interface between the semiconductor 106b and the insulator 106d.

In contrast, the insulator 106c is closer to the semiconductor 106b than the insulator 106d is in terms of the contained elements and the electron affinity. When the insulator 106c is formed between the semiconductor 106b and the insulator 106d, the density of defect states at the interface in contact with the semiconductor 106b (the interface between the semiconductor 106b and the insulator 106c) can be lower than when the semiconductor 106b and the insulator 106d are in direct contact with each other.

The density of defect states at the interface between the semiconductor 106b and the insulator 106c is thus reduced, whereby electron movement in the semiconductor 106b is less likely to be inhibited. Accordingly, the above-described structure also improves mobility. A factor in causing noise in drain current of the transistor is 1/f noise. The 1/f noise is a frequency component of current fluctuation that increases inversely with frequency f. In a physical model explaining the 1/f noise, electrons that are carriers are scattered to change the mobility. In other words, by reducing the density of defect states to improve the mobility, the 1/f noise can be reduced. When the 1/f noise is reduced, a reduction in the noise in the transistor can be achieved even at a high frequency; thus, the transistor can have high frequency characteristics.

By providing the insulator 106a, the semiconductor 106b, the insulator 106c, and the insulator 106d that form the above-described structure, 1/f noise and an increase in leakage current can be inhibited.

As factors in inhibiting electron movement are decreased, the on-state current of the transistor can be increased. For example, in the case where there is no factor in inhibiting electron movement, electrons are assumed to be efficiently moved. Electron movement is inhibited, for example, in the case where physical unevenness of the channel formation region is large.

To increase the on-state current of the transistor, for example, root mean square (RMS) roughness with a measurement area of 1 μm×1 μm of a top surface or a bottom surface of the semiconductor 106b (a formation surface; here, the insulator 106a) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P–V) with the measurement area of 1×1 μm is less than 10 nm, preferably less than 9 nm, further preferably less than 8 nm, still further preferably less than 7 nm. RMS roughness, Ra, and P–V can be measured using a scanning probe microscope SPA-500 manufactured by SII Nano Technology Inc.

Moreover, the thickness of the insulator 106c is preferably as small as possible to increase the on-state current of the transistor. It is preferable that the thickness of the insulator 106c is smaller than that of the insulator 106a and smaller than that of the semiconductor 106b. For example, the insulator 106c is formed to include a region having a thickness of less than 10 nm, preferably less than or equal to 5 nm, further preferably less than or equal to 3 nm. Meanwhile, the insulator 106c has a function of blocking entry of elements other than oxygen (such as hydrogen and silicon) included in the adjacent insulator into the semiconductor 106b where a channel is formed. For this reason, it is preferable that the insulator 106c have a certain thickness. For example, the insulator 106c is formed to include a region having a thickness of greater than or equal to 0.3 nm, preferably greater than or equal to 1 nm, further preferably greater than or equal to 2 nm. The insulator 106c preferably has an oxygen blocking property to suppress outward diffusion of oxygen released from the insulator 104 and the like.

Moreover, the thickness of the insulator 106d is preferably as small as possible to increase the on-state current of the transistor. The sum of the thickness of the insulator 106d and that of the insulator 106c is preferably smaller than the thickness of the semiconductor 106b.

To improve reliability, preferably, the thickness of the insulator 106a is large and the thickness of the insulator 106c is small. For example, the insulator 106a includes a region with a thickness of, for example, greater than or equal to 10 nm, preferably greater than or equal to 20 nm, further preferably greater than or equal to 40 nm, still further preferably greater than or equal to 60 nm. When the thickness of the insulator 106a is made large, a distance from an interface between the adjacent insulator and the insulator 106a to the semiconductor 106b in which a channel is formed can be large. Since the productivity of the semiconductor device might be decreased, the insulator 106a has a region with a thickness of, for example, less than or equal to 200 nm, preferably less than or equal to 120 nm, further preferably less than or equal to 80 nm.

For example, a region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 106b and the insulator 106a. A region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 106b and the insulator 106c.

It is preferable to reduce the hydrogen concentration in the insulator 106a and the insulator 106c in order to reduce the hydrogen concentration in the semiconductor 106b. The insulator 106a and the insulator 106c each include a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. It is preferable to reduce the nitrogen concentration in the insulator 106a and the insulator 106c in order to reduce the nitrogen concentration in the semiconductor 106b. The insulator 106a and the insulator 106c each include a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$.

FIG. 1D is an enlarged cross-sectional view illustrating the middle portion of the insulator 106a, the semiconductor 106b, and the insulator 106c and the vicinity of the middle portion. As illustrated in FIGS. 1B and 1D, regions of the semiconductor 106b, the insulator 106c, and the like that are in contact with the conductor 108a and the conductor 108b (which are denoted with dotted lines in FIGS. 1B and 1D) include a low-resistance region 109a and a low-resistance region 109b in some cases. The low-resistance region 109a and the low-resistance region 109b are mainly formed when oxygen is extracted by the conductor 108a and the conductor 108b that are in contact with the semiconductor 106b and the insulator 106c, or when a conductive material in the conductor 108a or the conductor 108b is bonded to an element in the semiconductor 106b or the insulator 106c. The formation of the low-resistance region 109a and the low-resistance region 109b leads to a reduction in contact resistance between the conductor 108a or 108b and the semiconductor 106b or the insulator 106c, whereby the transistor 10 can have high on-state current.

Although not illustrated, a low-resistance region is sometimes formed in regions of the insulator 106a that are in contact with the conductor 108a or the conductor 108b. In the following drawings, a dotted line denotes a low-resistance region.

As illustrated in FIG. 1D, the insulator 106c might have a smaller thickness in a region between the conductor 108a and the conductor 108b than in regions overlapping with the conductor 108a and the conductor 108b. This is because part of the top surface of the insulator 106c is removed at the time of formation of the conductor 108a and the conductor 108b. In formation of the conductor to be the conductor 108a and the conductor 108b, a region with low resistance like the low-resistance regions 109a and 109b is formed on the top surface of the insulator 106c in some cases. By removal of a region of the top surface of the insulator 106c that is positioned between the conductor 108a and the conductor 108b, the channel can be prevented from being formed in the low-resistance region on the top surface of the insulator 106c. In the drawings, even when a thin region is not drawn in an enlarged view or the like, such a thin region might be formed.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 3A:
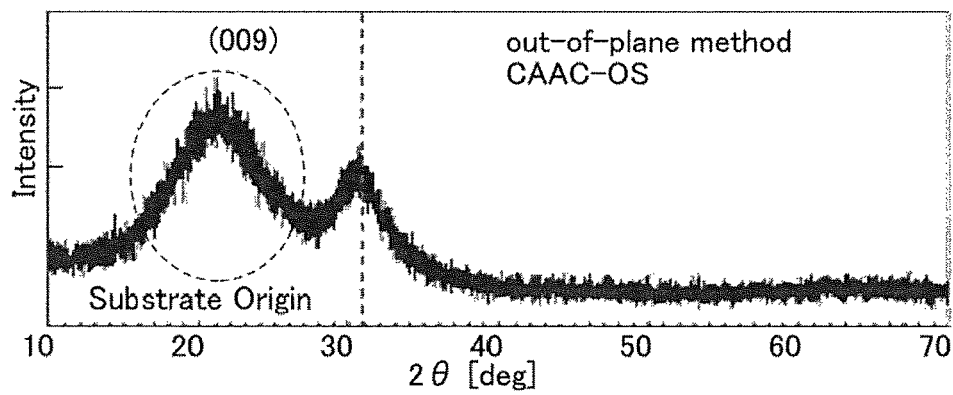
FIGS. 3A to 3E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 3A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 3B:
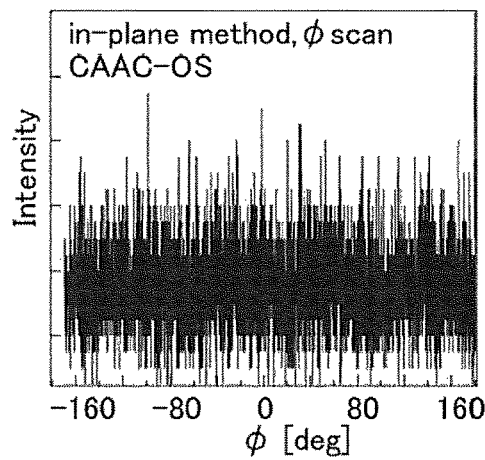
Figure 3C:
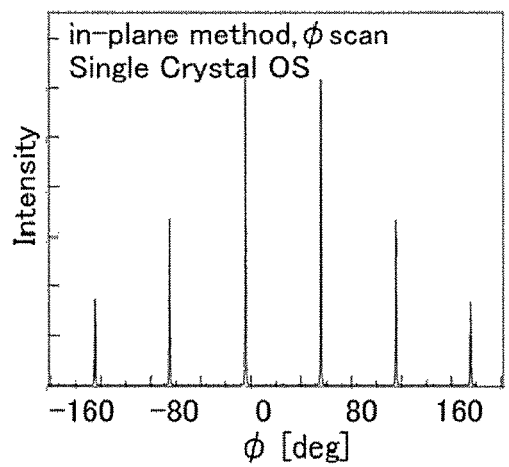

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 3B, a peak is not clearly observed. In contrast, in the case where single crystal InGaZnO$_4$ is subjected to φ scan with 2θ fixed at around 56°, as shown in FIG. 3C, six peaks which are derived from crystal planes equivalent to the (110) plane are observed. Accordingly, the structural analysis using XRD shows that the directions of a-axes and b-axes are irregularly oriented in the CAAC-OS.

Figure 3D:
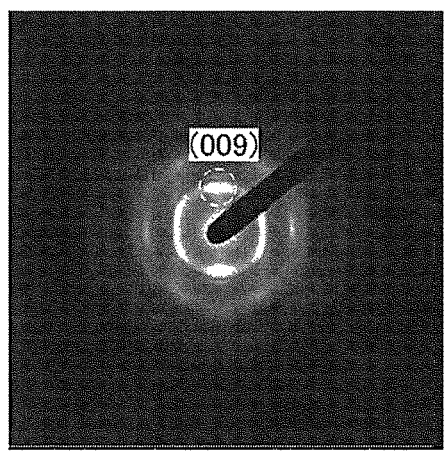
Figure 3E:
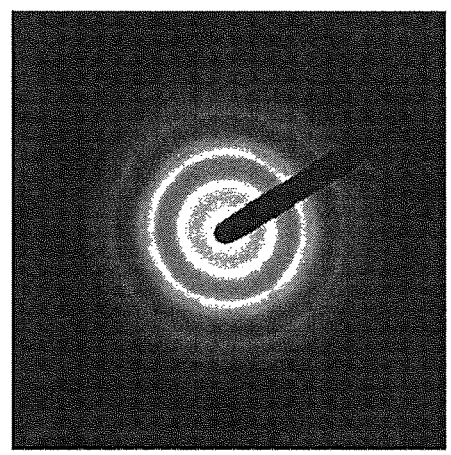

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 3D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 3E shows a diffraction pattern obtained in such a manner that an electron beam with a probe diameter of 300 nm is incident on the same sample in a direction perpendicular to the sample surface. As shown in FIG. 3E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 3E is considered to be derived from the (010) plane, the (100) plane, and the like of the InGaZnO$_4$ crystal. The second ring in FIG. 3E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

FIG. 4A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 4A shows pellets in which metal atoms are arranged in a layered manner. FIG. 4A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

FIGS. 4B and 4C show Cs-corrected high-resolution TEM images of a plane of the CAAC-OS observed from a direction substantially perpendicular to the sample surface. FIGS. 4D and 4E are images obtained through image processing of FIGS. 4B and 4C. The method of image processing is as follows. The image in FIG. 4B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 4D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 4E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small number of oxygen vacancies. The CAAC-OS having small numbers of impurities and oxygen vacancies is an oxide semiconductor with low carrier density (specifically, lower than $8\times10^{11}/cm^3$, preferably lower than $1\times10^{11}/cm^3$, or further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

Hydrogen (hereinafter also referred to as $V_OH$) trapped in oxygen vacancies in an oxide semiconductor serves as a carrier scattering center. Accordingly, formation of $V_OH$ causes a reduction in mobility or subthreshold swing value (S value) of a transistor. In view of this, a reduction of hydrogen that is an impurity and oxygen vacancies is important. Oxygen vacancies can be compensated by supplying an oxide semiconductor with oxygen.

For compensation of oxygen vacancies, excess oxygen (hereinafter also referred to as ex-O) in an insulator (e.g., silicon oxide) provided in contact with the oxide semiconductor is preferably used. At this time, excess oxygen ex-O might act against hydrogen $V_OH$ trapped in oxygen vacancies, in which case OH is formed. The OH might serve as a shallow level DOS. As a result, electrons as carriers in the semiconductor are trapped in OH and trapped electrons as carriers are released as expressed by the following formula.

[Chemical Formula 1]

The OH becomes stable when bonded to Zn contained in the oxide semiconductor to be ZnOH; thus, the OH presumably ceases to serve as a shallow level DOS in this manner. In order to achieve this, in the transistor 10, the insulator 106a, the semiconductor 106b, the insulator 106c, and the insulator 106d preferably contain excess zinc. It is preferable that for example, an oxide semiconductor deposited using the aforementioned target with an atomic ratio of In:M:Zn=1:4:5 be used as the insulator 106a and/or the insulator 106c. Specifically, by using an oxide semiconductor deposited using the target with an atomic ratio of In:M:Zn=1:4:5 for the insulator 106a that is the lowest layer, Zn is released from the insulator 106a and is diffused into the bulk of the semiconductor 106b, the insulator 106c, and the insulator 106d and/or their interfaces. As a result, more OH and Zn can be bonded to each other.

Such a structure can inhibit formation of a shallow level DOS in the oxide semiconductor of the transistor. Thus, factors in inhibiting carrier electron movement in the transistor are decreased, whereby on-state current and mobility can be increased and a favorable S value can be obtained, for example.

In an oxide semiconductor, zinc forms a crystal structure relatively easily. Therefore, when the insulator 106a, the semiconductor 106b, and the insulator 106c contain much zinc, the above-described CAAC-OS can be easily formed.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 5A:
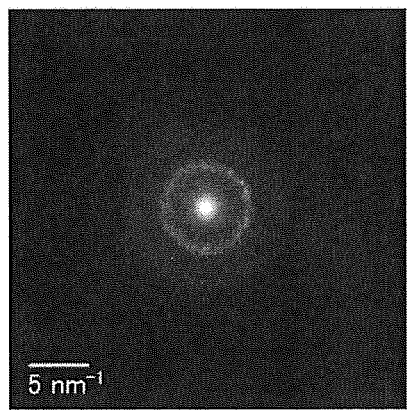
FIGS. 5A to 5D show electron diffraction patterns and a cross-sectional TEM image of an nc-OS.
Figure 5B:
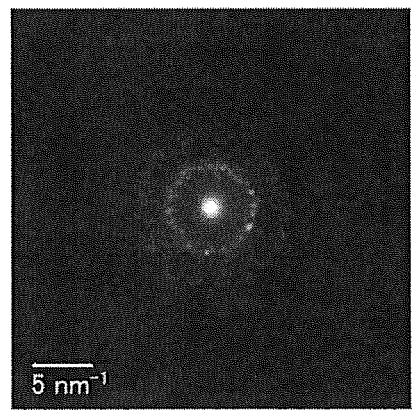

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 5A is observed. FIG. 5B shows a diffraction pattern obtained when an electron beam with a probe diameter of 1 nm is incident on the same sample. As shown in FIG. 5B, a plurality of spots are observed in a ring-like region. In other words, ordering in an nc-OS is not observed with an electron beam with a probe diameter of 50 nm but is observed with an electron beam with a probe diameter of 1 nm.

Figure 5C:
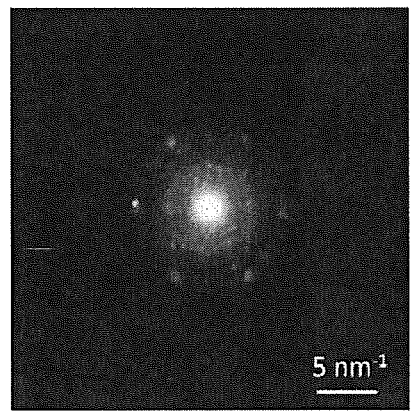

Furthermore, an electron diffraction pattern in which spots are arranged in an approximately hexagonal shape is observed in some cases as shown in FIG. 5C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 5D:
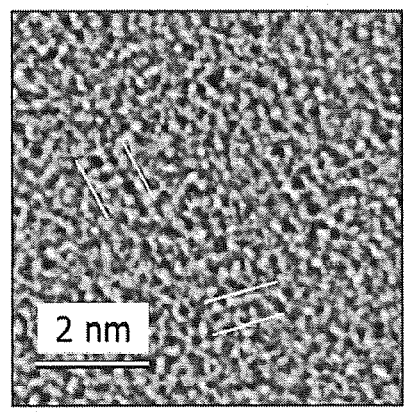

FIG. 5D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 5D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

Figure 6A:
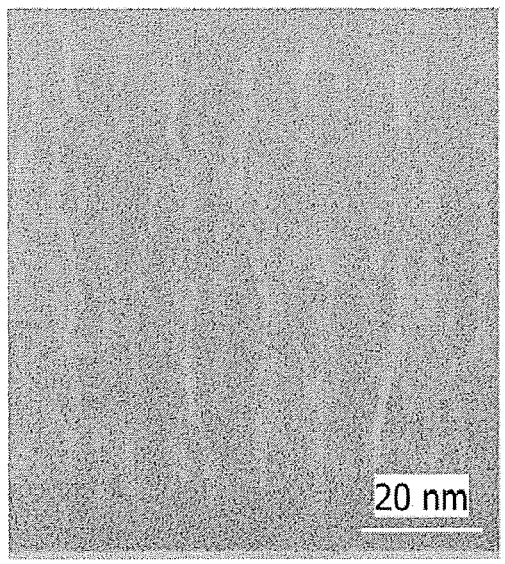
FIGS. 6A and 6B show cross-sectional TEM images of an a-like OS.
Figure 6B:
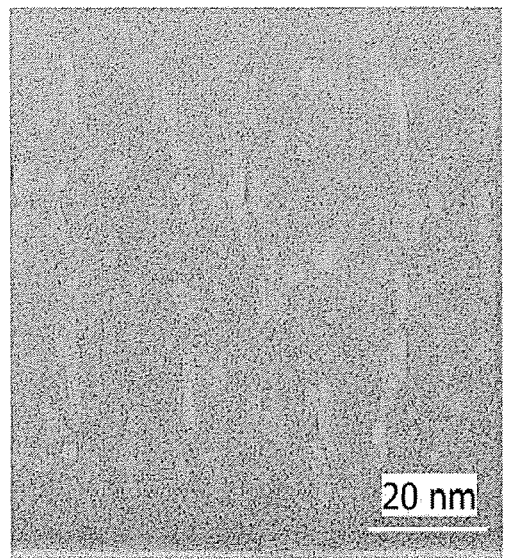

FIGS. 6A and 6B are high-resolution cross-sectional TEM images of an a-like OS. FIG. 6A is the high-resolution cross-sectional TEM image of the a-like OS at the start of the electron irradiation. FIG. 6B is the high-resolution cross-sectional TEM image of a-like OS after the electron ($e^-$) irradiation at $4.3 \times 10^8$ $e^-/nm^2$. FIGS. 6A and 6B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 7:
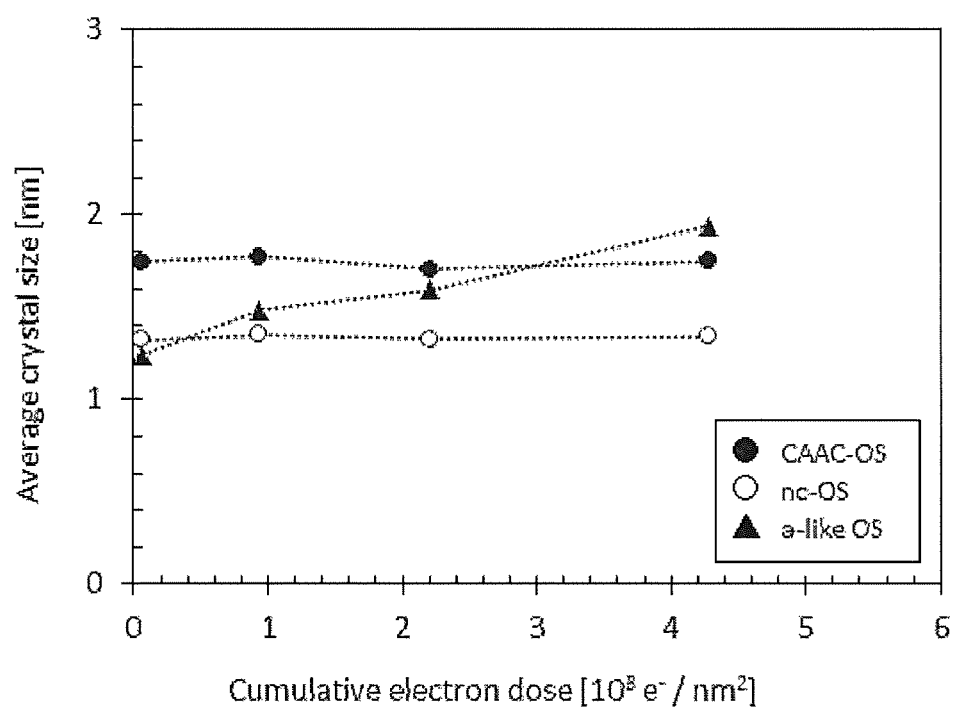
FIG. 7 shows a change of crystal parts of an In—Ga—Zn oxide due to electron irradiation.

FIG. 7 shows change in the average size of crystal parts (at 22 points to 30 points) in each sample. Note that the crystal part size corresponds to the length of a lattice fringe. FIG. 7 indicates that the crystal part size in the a-like OS increases with an increase in the cumulative electron dose in obtaining TEM images, for example. As shown in FIG. 7, a crystal part of approximately 1.2 nm (also referred to as an initial nucleus) at the start of TEM observation grows to a size of approximately 1.9 nm at a cumulative electron (e) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 7, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Formation Method of CAAC-OS Film>

An example of a method for forming a CAAC-OS film will be described below.

Figure 8:
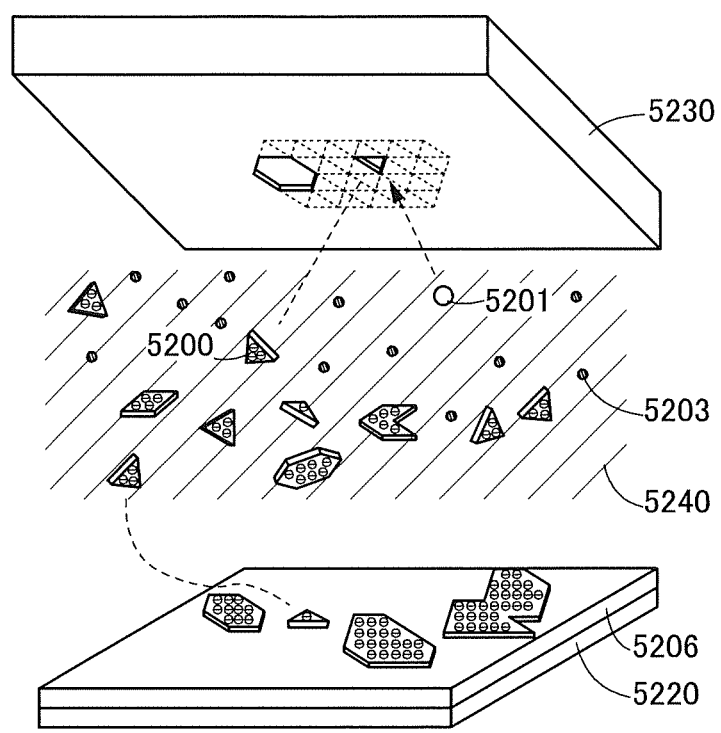
FIG. 8 is a schematic diagram illustrating a deposition model of a CAAC-OS.

FIG. 8 is a schematic diagram illustrating the inside of a deposition chamber. The CAAC-OS film can be formed by a sputtering method.

As shown in FIG. 8, a substrate 5220 and a target 5230 are arranged to face each other. Plasma 5240 is generated between the substrate 5220 and the target 5230. The plasma 5240 includes an ion 5201 generated by ionization of a component of a sputtering gas.

The ion 5201 is accelerated to move toward the target 5230, and when the ion 5201 collides with the target 5230, a pellet 5200 that is a pellet-like particle is separated from the target 5230. At that time, a particle 5203 formed from an atom contained in the target 5230 is concurrently separated. Then, the pellet 5200 and the particle 5203 receive electric charge in the plasma 5240 and thus are charged.

An oxide thin film 5206 has been already deposited over the substrate 5220. After reaching a surface of the oxide thin film 5206, the pellet 5200 and the particle 5203 are deposited to avoid another pellet 5200. This deposition is caused by repelling force (repulsive force) generated on the surfaces of the pellets 5200 that are electrically charged with the same polarity (negative in this case). Note that the substrate 5220 is heated, and the pellet 5200 and the particle 5203 that are deposited migrate over the surface of the substrate 5220.

Figure 9A:
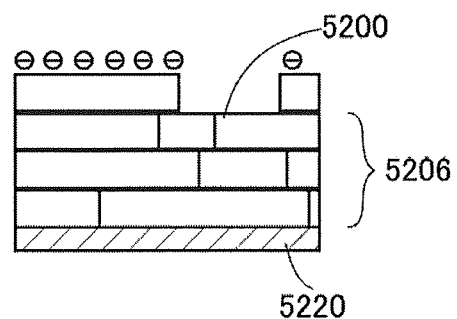
FIGS. 9A to 9C illustrate an InGaZnO$_4$ crystal and a pellet.

The oxide thin film 5206 and the pellet 5200 over the substrate 5220 have cross-sectional shapes shown in FIG. 9A.

Note that the pellet 5200 has a shape obtained by cleavage of the target 5230. An In-M-Zn oxide (M represents Ti, Ga, Y, Zr, La, Ce, Nd, Sn, or Hf), for example, has a cross-sectional shape shown in FIG. 9B and a top-view shape shown in FIG. 9C.

<Deposition Models of CAAC-OS and nc-OS>

A deposition model of the CAAC-OS will be described in detail below.

The distance d between the substrate 5220 and the target 5230 (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5230, and the plasma 5240 is observed. The magnetic field forms a high-density plasma region in the vicinity of the target 5230. In the high-density plasma region, the deposition gas is ionized, so that an ion 5201 is generated. Examples of the ion 5201 include an oxygen cation (O$^+$) and an argon cation (Ar$^+$). A heating mechanism may be provided under the substrate 5220 although not shown in the drawing.

The target 5230 is attached to a backing plate although not shown in the drawing. A plurality of magnets are arranged to face the target 5230 with the backing plate positioned therebetween. A sputtering method in which the disposition speed is increased by utilizing a magnetic field of magnets is referred to as a magnetron sputtering method.

Here, the target 5230 has a polycrystalline structure which includes a plurality of crystal grains and in which a cleavage plane exists in any of the crystal grains.

Figure 9B:
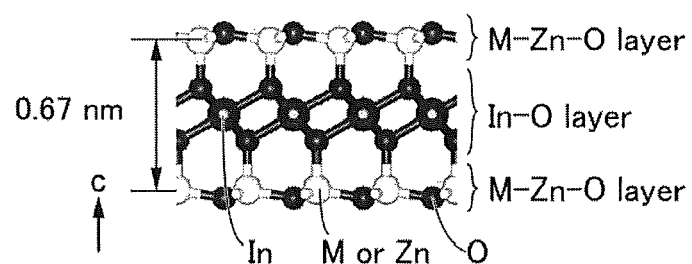
Figure 9C:
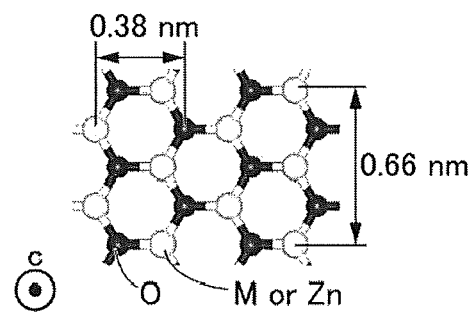

The ion 5201 generated in the high-density plasma region is accelerated toward the target 5230 side by an electric field, and then collides with the target 5230. At this time, the pellet 5200, which is a flat-plate-like or pellet-like sputtered particle, is separated from the cleavage plane. The cross section and the top view of the pellet 5200 are as shown in FIG. 9B and FIG. 9C, respectively. Note that the structure of the pellet 5200 may be distorted by an impact of collision of the ion 5201.

The pellet 5200 is a flat-plate-like (pellet-like) sputtered particle having a triangle plane, e.g., regular triangle plane. Alternatively, the pellet 5200 is a flat-plate-like (pellet-like) sputtered particle having a hexagon plane, e.g., regular hexagon plane. However, the shape of a flat plane of the pellet 5200 is not limited to a triangle or a hexagon. For example, the flat plane may have a shape formed by combining two or more triangles. For example, a quadrangle (e.g., rhombus) may be formed by combining two triangles (e.g., regular triangles).

The thickness of the pellet 5200 is determined in accordance with the kind of the deposition gas and the like. For example, the thickness of the pellet 5200 is greater than or equal to 0.4 nm and less than or equal to 1 nm, preferably greater than or equal to 0.6 nm and less than or equal to 0.8 nm. In addition, for example, the width of the pellet 5200 is greater than or equal to 1 nm and less than or equal to 3 nm, preferably greater than or equal to 1.2 nm and less than or equal to 2.5 nm.

The surface of the pellet 5200 may be negatively or positively charged when the pellet 5200 passes through the plasma 5240. That is because, for example, the pellet 5200 receives a negative electric charge from $O_2^-$ in the plasma 5240. As a result, oxygen atoms on the surface of the pellet 5200 may be negatively charged. In addition, when passing through the plasma 5240, the pellet 5200 is sometimes combined with indium, the element M, zinc, oxygen, or the like in the plasma 5240 to grow up.

The pellet 5200 and the particle 5203 that have passed through the plasma 5240 reach a surface of the substrate 5220. Note that some of the particles 5203 are discharged to the outside by a vacuum pump or the like because of their smallness in mass.

After the gaps between the pellets 5200 are filled with the particles 5203, a layer (a first layer) with a thickness approximately the same as that of the pellet 5200 is formed. That is, nanocrystalline pellets 5200 exist in the initial stage and grow on the substrate 5220 to be integrated. Another pellet 5200 is deposited over the integrated layer, whereby a second layer is formed. With repetition of this cycle, the stacked-layer thin film structure is formed.

A deposition way of the pellets 5200 changes according to the surface temperature of the substrate 5220 or the like. For example, if the surface temperature of the substrate 5220 is high, migration of the pellets 5200 occurs over the surface of the substrate 5220. As a result, a proportion of the pellets 5200 that are directly connected with each other without the particles 5203 increases, whereby a CAAC-OS with high orientation is made. The surface temperature of the substrate 5220 for formation of the CAAC-OS is higher than or equal to 100° C. and lower than 500° C., preferably higher than or equal to 140° C. and lower than 450° C., or further preferably higher than or equal to 170° C. and lower than 400° C. Therefore, even when a large-sized substrate of the 8th generation or more is used as the substrate 5220, a warp or the like hardly occurs.

Figure 10:
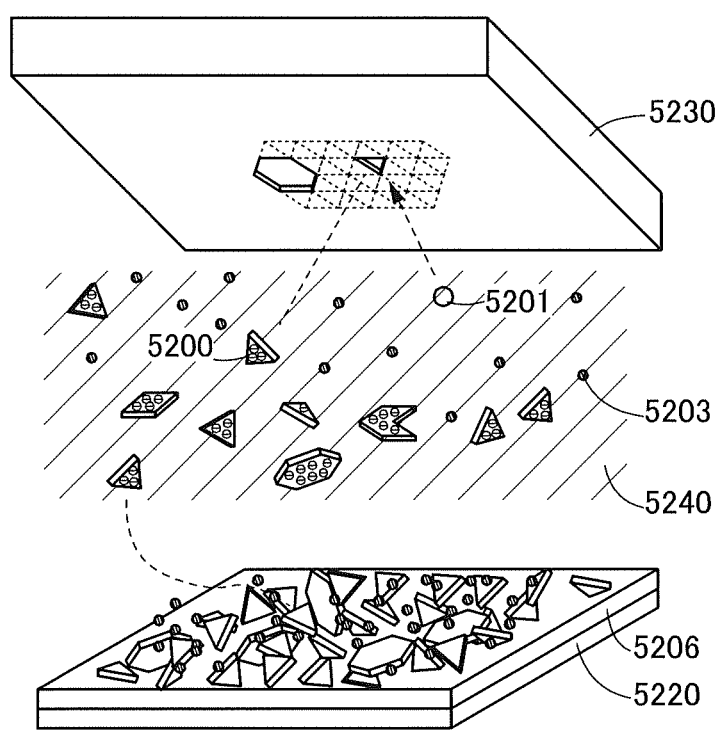
FIG. 10 is a schematic diagram illustrating a deposition model of an nc-OS.

On the other hand, if the surface temperature of the substrate 5220 is low, the migration of the pellets 5200 over the substrate 5220 does not easily occur. As a result, the pellets 5200 are stacked to form an nc-OS or the like with low orientation (see FIG. 10). In the nc-OS, the pellets 5200 are possibly deposited equidistantly from one another since the pellets 5200 are negatively charged. Therefore, the nc-OS has low orientation but some regularity, and thus it has a denser structure than an amorphous oxide semiconductor.

When spaces between pellets are extremely small, the pellets may form a large pellet. The inside of the large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from above.

The pellets 5200 are considered to be deposited on the substrate 5220 according to the deposition model described above. Thus, a CAAC-OS can be deposited even when a formation surface does not have a crystal structure; therefore, a growth mechanism in this case is different from epitaxial growth. In addition, a uniform film of a CAAC-OS or an nc-OS can be formed even over a large-sized glass substrate or the like. For example, even when the surface of the substrate 5220 (formation surface) has an amorphous structure (e.g., such as amorphous silicon oxide), a CAAC-OS can be formed.

In addition, even when the surface of the substrate 5220 (formation surface) has an uneven shape, the pellets 5200 are aligned along the shape.

According to the deposition model described above, a CAAC-OS with high crystallinity can be formed even on a film formation surface with an amorphous structure.

<Substrate, Insulator, and Conductor 1>

Components other than the semiconductor of the transistor 10 are described in detail below.

As the substrate 100, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate formed using silicon, germanium, or the like or a semiconductor substrate formed using silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate resistant to heat treatment performed in manufacture of the transistor may be used as the substrate 100. As a method for providing the transistor over a flexible substrate, there is a method in which the transistor is formed over a non-flexible substrate and then the transistor is separated and transferred to the substrate 100 which is a flexible substrate. In that case, a separation layer is preferably provided between the non-flexible substrate and the transistor. As the substrate 100, a sheet, a film, or a foil containing a fiber may be used. The substrate 100 may have elasticity. The substrate 100 may have a property of returning to its original shape when bending or pulling is stopped. Alternatively, the substrate 100 may have a property of not returning to its original shape. The thickness of the substrate 100 is, for example, greater than or equal to 5 μm and less than or equal to 700 μm, preferably greater than or equal to 10 μm and less than or equal to 500 μm, or further preferably greater than or equal to 15 μm and less than or equal to 300 μm. When the substrate 100 has a small thickness, the weight of the semiconductor device can be reduced. When the substrate 100 has a small thickness, even in the case of using glass or the like, the substrate 100 may have elasticity or a property of returning to its original shape when bending or pulling is stopped. Therefore, an impact applied to the semiconductor device over the substrate 100, which is caused by dropping or the like, can be reduced. That is, a durable semiconductor device can be provided.

For the substrate 100 which is a flexible substrate, metal, an alloy, resin, glass, or fiber thereof can be used, for example. The flexible substrate 100 preferably has a lower coefficient of linear expansion because deformation due to an environment is suppressed. The flexible substrate 100 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate 100 because of its low coefficient of linear expansion.

As the insulator 101, an insulator having a function of blocking hydrogen or water is used. Hydrogen and water in the insulator that is provided in the vicinity of the insulator 106a, the semiconductor 106b, the insulator 106c, and the insulator 106d cause carriers to be generated in the insulator 106a, the semiconductor 106b, the insulator 106c, and the insulator 106d that also function as oxide semiconductors. As a result, the reliability of the transistor 10 might decrease. Particularly when the substrate 100 is a substrate that is provided with a silicon-based semiconductor element such as a switching element, hydrogen used to terminate a dangling bond in the semiconductor element might be diffused to the transistor 10. In that case, the insulator 101 that has a function of blocking hydrogen or water can inhibit diffusion of hydrogen or water from below the transistor 10, increasing the reliability of the transistor 10.

The insulator 101 preferably has a function of blocking oxygen. When oxygen diffused from the insulator 104 is blocked by the insulator 101, oxygen can be effectively supplied from the insulator 104 to the insulator 106a, the semiconductor 106b, the insulator 106c, and the insulator 106d.

The insulator 101 can be formed using, for example, aluminum oxide, aluminum oxynitride, gallium oxide, gallium oxynitride, yttrium oxide, yttrium oxynitride, hafnium oxide, or hafnium oxynitride. The use of such a material enables the insulator 101 to function as an insulating film blocking diffusion of oxygen, hydrogen, or water. The insulator 101 can be formed using, for example, silicon nitride or silicon nitride oxide. The use of such a material enables the insulator 101 to function as an insulating film blocking diffusion of hydrogen or water. Note that silicon nitride oxide means a substance that contains more nitrogen than oxygen and silicon oxynitride means a substance that contains more oxygen than nitrogen in this specification and the like.

At least part of the conductor 102 preferably overlaps with the semiconductor 106b in a region positioned between the conductor 108a and the conductor 108b. The conductor 102 functions as a back gate of the transistor 10. The conductor 102 can control the threshold voltage of the transistor 10. Although the transistor 10 includes the conductor 102, the structure of the semiconductor device described in this embodiment is not limited to this example.

The conductor 102 may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 103 is provided to cover the conductor 102. The insulator 103 preferably has a function of blocking oxygen. Providing the insulator 103 can prevent oxidation of the conductor 102, or extraction of oxygen from the insulator 104 by the conductor 102. Accordingly, oxygen can be effectively supplied from the insulator 104 to the insulator 106a, the semiconductor 106b, the insulator 106c, and the insulator 106d. By improving the coverage with the insulator 103, extraction of oxygen from the insulator 104 can be further reduced and oxygen can be more effectively supplied from the insulator 104 to the insulator 106a, the semiconductor 106b, the insulator 106c, and the insulator 106d.

As the insulator 103, an oxide or a nitride containing boron, aluminum, silicon, scandium, titanium, gallium, yttrium, zirconium, indium, lanthanum, cerium, neodymium, hafnium, or thallium is used. It is preferable to use hafnium oxide or aluminum oxide.

In the case where a conductor such as a wiring is provided in the same layer as the conductor 102, the insulator 103 is preferably formed to cover the conductor.

In the case where the conductor 102 is not provided, the insulator 103 is not necessarily provided. When the insulator 103 is not provided, it is preferable that the insulator 101 have a function of blocking oxygen.

The insulator 104 is preferably an insulator containing excess oxygen. Such insulator 104 makes it possible to supply oxygen from the insulator 104 to the insulator 106a, the semiconductor 106b, the insulator 106c, and the insulator 106d. The supplied oxygen can reduce oxygen vacancies which are to be defects in the insulator 106a, the semiconductor 106b, the insulator 106c, and the insulator 106d which are oxide semiconductors. As a result, the insulator 106a, the semiconductor 106b, the insulator 106c, and the insulator 106d can be oxide semiconductors with a low density of defect states and stable characteristics.

The insulator 104 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, for the insulator 104, silicon oxide or silicon oxynitride is preferably used. The insulator 104 may be formed using aluminum oxide, magnesium oxide, silicon nitride oxide, silicon nitride, gallium oxide, germanium oxide, yttrium oxide, zirconium oxide, lanthanum oxide, neodymium oxide, hafnium oxide, or tantalum oxide.

The insulator 104 including excess oxygen releases oxygen molecules, the number of which is greater than or equal to $1.0 \times 10^{14}$ molecules/cm$^2$ and less than or equal to $1.0 \times 10^{16}$ molecules/cm$^2$, preferably greater than or equal to $1.0 \times 10^{15}$ molecules/cm$^2$ and less than or equal to $5.0 \times 10^{15}$ molecules/cm$^2$ in thermal desorption spectroscopy (TDS) analysis in the range of surface temperatures of 100° C. to 700° C. or 100° C. to 500° C.

The method for measuring the amount of released oxygen using TDS analysis will be described below.

The total amount of gas released from a measurement sample in TDS analysis is proportional to the integral value of the ion intensity of the released gas. Then, comparison with a reference sample is made, whereby the total amount of released gas can be calculated.

For example, the number of oxygen molecules ($N_{O2}$) released from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is not taken into consideration either because the proportion of such a molecule in the natural world is negligible.

$$N_{O2} = N_{H2}/S_{H2} \times S_{O2} \times \alpha$$

The value $N_H$ is obtained by conversion of the number of hydrogen molecules desorbed from the standard sample into densities. The value $S_{H2}$ is the integral value of ion intensity when the standard sample is subjected to the TDS analysis. Here, the reference value of the standard sample is set to $N_{H2}/S_{H2}$. $S_{O2}$ is the integral value of ion intensity when the measurement sample is analyzed by TDS. The value a is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W, using a silicon substrate containing a certain amount of hydrogen atoms as the reference sample.

Furthermore, in the TDS analysis, oxygen is partly detected as an oxygen atom. The ratio between oxygen molecules and oxygen atoms can be calculated from the ionization rate of the oxygen molecules. Note that since the above a includes the ionization rate of the oxygen molecules, the number of the released oxygen atoms can also be estimated through the measurement of the number of the released oxygen molecules.

Note that $N_{O2}$ is the number of the released oxygen molecules. The number of released oxygen in the case of being converted into oxygen atoms is twice the number of the released oxygen molecules.

Furthermore, the insulator from which oxygen is released by heat treatment may contain a peroxide radical. Specifically, the spin density attributed to the peroxide radical is greater than or equal to $5 \times 10^{17}$ spins/cm$^3$. Note that the insulator containing a peroxide radical may have an asymmetric signal with a g factor of approximately 2.01 in electron spin resonance (ESR).

The insulator 104 may have a function of preventing diffusion of impurities from the substrate 100. The insulator 104 may be an insulator that has a hydrogen trap.

As described above, the top surface or the bottom surface of the semiconductor 106b preferably has high planarity. Thus, to improve the planarity, the top surface of the insulator 104 may be subjected to planarization treatment performed by a chemical mechanical polishing (CMP) method or the like.

The conductors 108a and 108b serve as a source electrode and a drain electrode of the transistor 10.

The conductors 108a and 108b may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The conductors 110a and 110b are preferably formed using a substance with high Gibbs free energy for oxidation. In that case, it is possible to inhibit extraction of oxygen from films in contact with the conductor 108a and the conductor 108b at top surfaces of the conductor 108a and the conductor 108b. Accordingly, the conductor 108a and the conductor 108b can be prevented from being partly oxidized to have increased resistivity, and oxygen can be effectively supplied to the insulator 106a, the semiconductor 106b, the insulator 106c, and the insulator 106d.

The conductor 110a and the conductor 110b may be formed to have a single-layer structure or a stacked-layer structure using a metal or an oxide containing at least one element selected from silver, copper, ruthenium, iridium, platinum, and gold, for example. Note that in the case where the conductor 110a and the conductor 110b are formed using an oxide, an oxide including ruthenium or iridium is preferably used because of its high conductivity. As examples of an oxide including ruthenium or iridium, RuO$_X$ (X is greater than or equal to 0.5 and less than or equal to 3), IrO$_X$ (X is greater than or equal to 0.5 and less than or equal to 3), or SrRuO$_X$ (X is greater than or equal to 1 and less than or equal to 5) can be given. Alternatively, the conductor 110a and the conductor 110b may be formed using tungsten silicide or the like.

Although the conductor 110a and the conductor 110b are formed over the conductor 108a and the conductor 108b in FIG. 1B, the structure of the semiconductor device described in this embodiment is not limited to this example. For example, a structure not including the conductor 110a and the conductor 110b but including the conductor 108a and the conductor 108b or a structure not including the conductor 108a and the conductor 108b but including the conductor 110a and the conductor 110b may be employed. The conductor 110a and the conductor 110b may be provided under the conductor 108a and the conductor 108b.

The insulator 112 functions as a gate insulating film of the transistor 10. Like the insulator 104, the insulator 112 may be an insulator containing excess oxygen. Such insulator 112 makes it possible to supply oxygen from the insulator 112 to the insulator 106a, the semiconductor 106b, the insulator 106c, and the insulator 106d.

The insulator 112 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 112 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The conductor 114 functions as a gate electrode of the transistor 10. The conductor 114 can be formed using the conductor that can be used for the conductor 102.

Here, as illustrated in FIG. 1C, the semiconductor 106b can be electrically surrounded by an electric field of the conductor 102 and the conductor 114 (a structure in which a semiconductor is electrically surrounded by an electric field of a conductor is referred to as a surrounded channel (s-channel) structure). Therefore, a channel is formed in the entire semiconductor 106b (the top, bottom, and side surfaces). In the s-channel structure, a large amount of current can flow between a source and a drain of a transistor, so that a high on-state current can be obtained.

In the case where the transistor has the s-channel structure, a channel is formed also in the side surface of the semiconductor 106b. Therefore, as the semiconductor 106b has a larger thickness, the channel region becomes larger. In other words, the thicker the semiconductor 106b is, the larger the on-state current of the transistor is. In addition, when the semiconductor 106b is thicker, the proportion of the region with a high carrier controllability increases, leading to a smaller subthreshold swing value. For example, the semiconductor 106b has a region with a thickness greater than or equal to 10 nm, preferably greater than or equal to 20 nm, further preferably greater than or equal to 40 nm, still further preferably greater than or equal to 60 nm, yet still further preferably greater than or equal to 100 nm. Since the productivity of the semiconductor device might be decreased, the semiconductor 106b has a region with a thickness of, for example, less than or equal to 300 nm, preferably less than or equal to 200 nm, further preferably less than or equal to 150 nm. In some cases, when the channel formation region is reduced in size, electrical characteristics of the transistor with a smaller thickness of the semiconductor 106b may be improved. Therefore, the semiconductor 106b may have a thickness less than 10 nm.

The s-channel structure is suitable for a miniaturized transistor because a high on-state current can be achieved. A semiconductor device including the miniaturized transistor can have a high integration degree and high density. For example, the transistor includes a region having a channel length of preferably less than or equal to 40 nm, further preferably less than or equal to 30 nm, still further preferably less than or equal to 20 nm and a region having a channel width of preferably less than or equal to 40 nm, further preferably less than or equal to 30 nm, still further preferably less than or equal to 20 nm.

The insulators 116 and 118 function as interlayer insulating films of the transistor 10. Like the insulator 104, the insulator 116 may be an insulator containing excess oxygen. Such insulator 116 makes it possible to supply oxygen from the insulator 116 to the insulator 106a, the semiconductor 106b, the insulator 106c, and the insulator 106d. The insulator 116 can be formed using the insulator that can be used for the insulator 104.

The insulator 118 may be formed to have a single-layer structure or a stacked-layer structure including an insulator containing, for example, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 118 preferably has a blocking effect against oxygen, hydrogen, water, alkali metal, alkaline earth metal, and the like. As such an insulator, for example, a nitride insulating film can be used. As examples of the nitride insulating film, a silicon nitride film, a silicon nitride oxide film, an aluminum nitride film, an aluminum nitride oxide film, and the like can be given. Note that instead of the nitride insulating film, an oxide insulating film having a blocking effect against oxygen, hydrogen, water, and the like, may be provided. As examples of the oxide insulating film, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Aluminum oxide is preferably used as the insulator 118 because it is highly effective in preventing transmission of both oxygen and impurities such as hydrogen and moisture. Oxygen contained in the aluminum oxide can be diffused to the insulator 106a, the semiconductor 106b, the insulator 106c, and the insulator 106d through the insulator 116 and the like.

The conductor 120a and the conductor 120b function as wirings electrically connected to the source electrode and the drain electrode of the transistor 10. As the conductor 120a and the conductor 120b, the conductor that can be used for the conductor 108a and the conductor 108b is used.

When the above-described structure is employed, a transistor with stable electrical characteristics, a transistor having a low leakage current in an off state, a transistor with high frequency characteristics, a transistor with normally-off electrical characteristics, a transistor with a small subthreshold swing value, or a highly reliable transistor can be provided.

Modification Example of Transistor 1

Modification examples of the transistor 10 are described below with reference to FIGS. 11A to 11D, FIGS. 12A to 12D, FIGS. 13A to 13D, FIGS. 14A to 14D, FIGS. 15A to 15D, FIGS. 16A to 16D, and FIGS. 17A to 17D. FIGS. 11A to 11D, FIGS. 12A to 12D, FIGS. 13A to 13D, FIGS. 14A to 14D, FIGS. 15A to 15D, FIGS. 16A to 16D, and FIGS. 17A to 17D are cross-sectional views in the channel length direction and those in the channel width direction like FIGS. 1B and 1C.

Figure 11A:
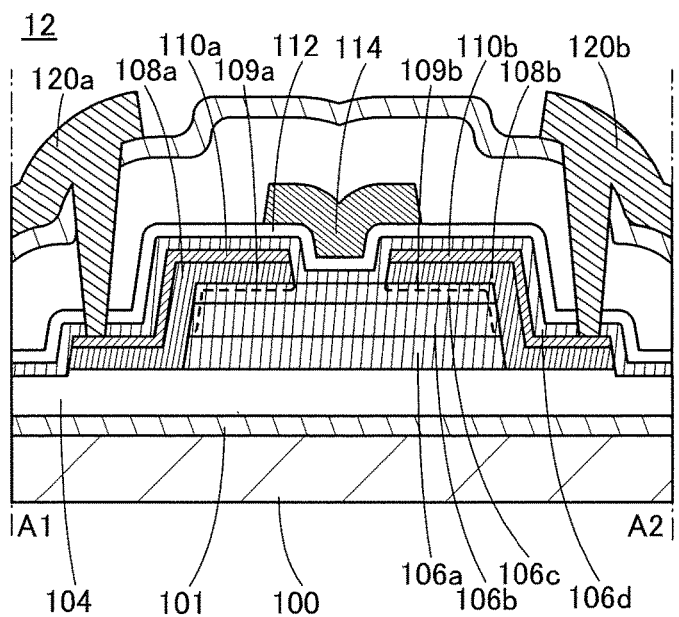
FIGS. 11A to 11D are cross-sectional views illustrating transistors of embodiments of the present invention.
Figure 11B:
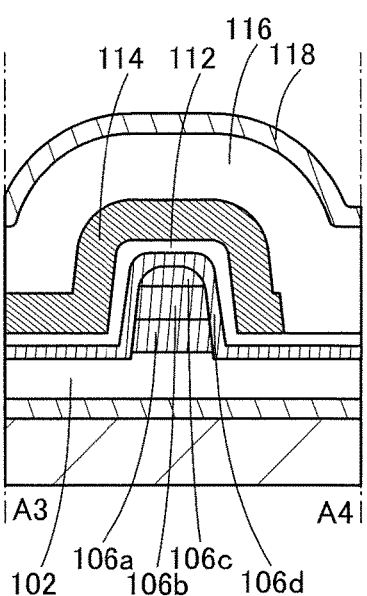

A transistor 12 shown in FIGS. 11A and 11B is different from the transistor 10 in that the conductor 102 and the insulator 103 are not provided. In that case, since the insulator 101 has a function of blocking oxygen, oxygen can be more effectively supplied from the insulator 104 to the insulator 106a, the semiconductor 106b, the insulator 106c, and the insulator 106d.

Figure 11C:
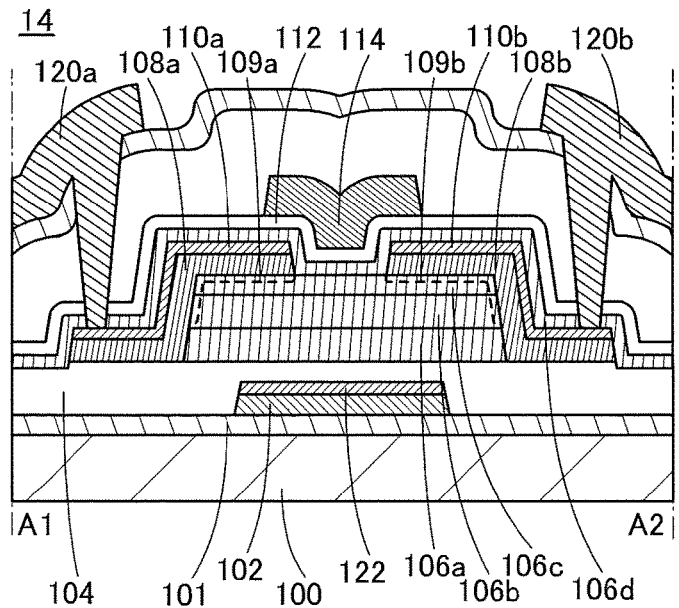
Figure 11D:
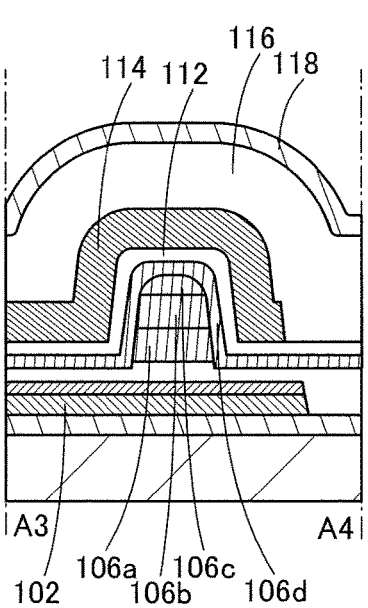

A transistor 14 shown in FIGS. 11C and 11D is different from the transistor 10 in that a conductor 122 is provided over the conductor 102 and the insulator 103 is not provided. The conductor 122 is formed using a conductor similar to that of the conductor 110a and the conductor 110b. This structure can inhibit extraction of oxygen from the insulator 104 at the top surface of the conductor 102. Accordingly, the conductor 102 can be prevented from being partly oxidized to have increased resistivity, and oxygen can be effectively supplied to the insulator 106a, the semiconductor 106b, the insulator 106c, and the insulator 106d.

Figure 12A:
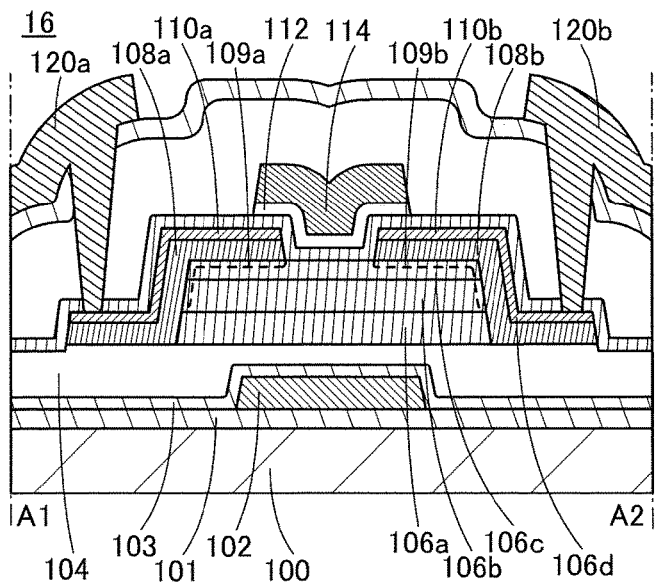
FIGS. 12A to 12D are cross-sectional views illustrating transistors of embodiments of the present invention.
Figure 12B:
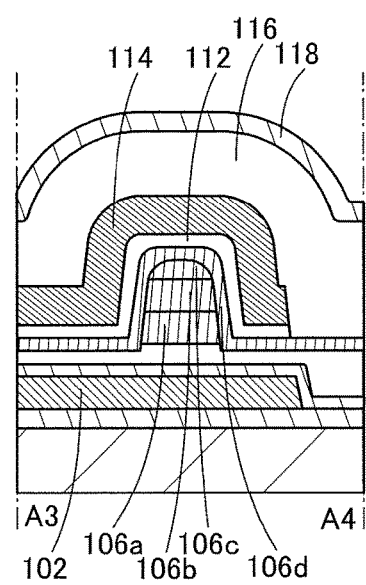
Figure 12C:
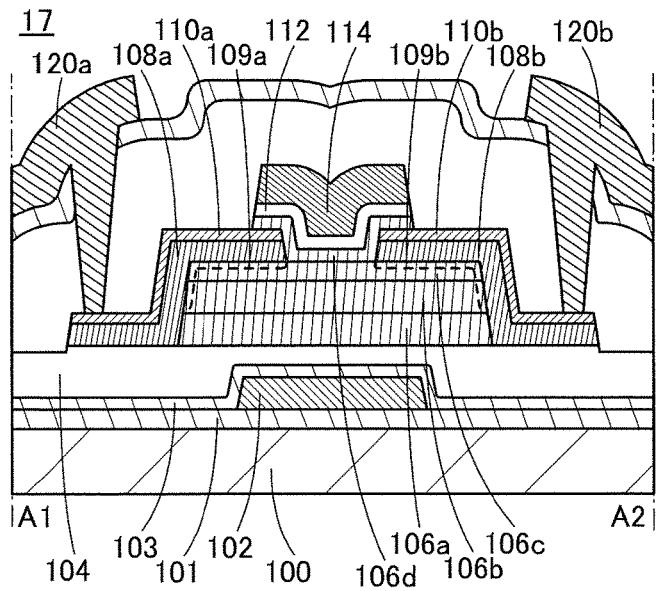
Figure 12D:
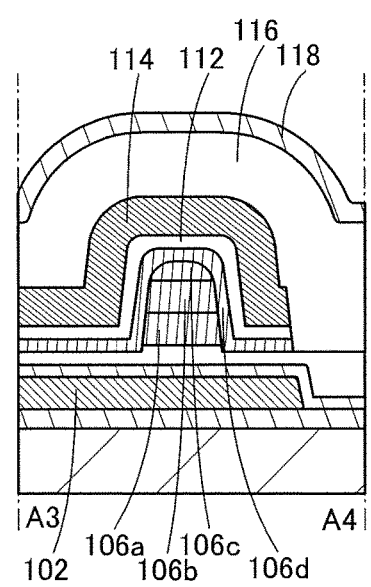

A transistor 16 shown in FIGS. 12A and 12B is different from the transistor 10 in that end portions of the conductor 114 and the insulator 112 are substantially aligned. A transistor 17 shown in FIGS. 12C and 12D is different from the transistor 10 in that end portions of the conductor 114, the insulator 112, and the insulator 106d are substantially aligned.

Figure 13A:
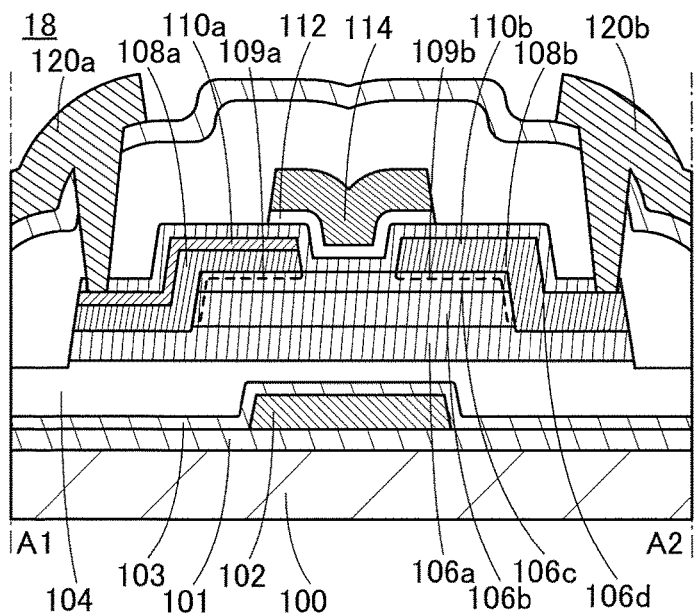
FIGS. 13A to 13D are cross-sectional views illustrating transistors of embodiments of the present invention.
Figure 13B:
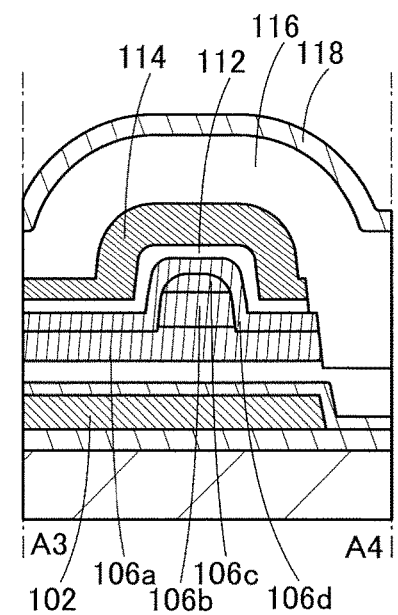

A transistor 18 shown in FIGS. 13A and 13B is different from the transistor 16 in that the conductor 108a and the conductor 108b are in contact with the top surface of the insulator 106a in a region not overlapping with the semiconductor 106b and the insulator 106c. Here, the conductor 108a and the conductor 108b are separated from the insulator 104. This structure can inhibit extraction of oxygen from the insulator 104 at the bottom surfaces of the conductor 108a and the conductor 108b. Accordingly, the conductor 108a and the conductor 108b can be prevented from being partly oxidized to have increased resistivity, and oxygen can be effectively supplied from the insulator 104 to the insulator 106a, the semiconductor 106b, the insulator 106c, and the insulator 106d.

Note that the insulator 106a might have a smaller thickness in a region not overlapping with the semiconductor 106b than in a region overlapping with the semiconductor 106b. This is because part of the top surface of the insulator 106a is sometimes removed at the time of formation of the semiconductor 106b.

Figure 13C:
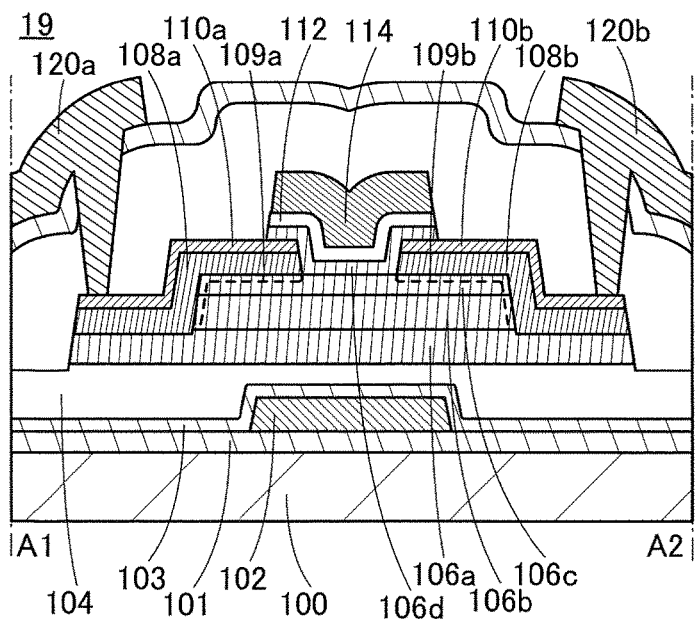
Figure 13D:
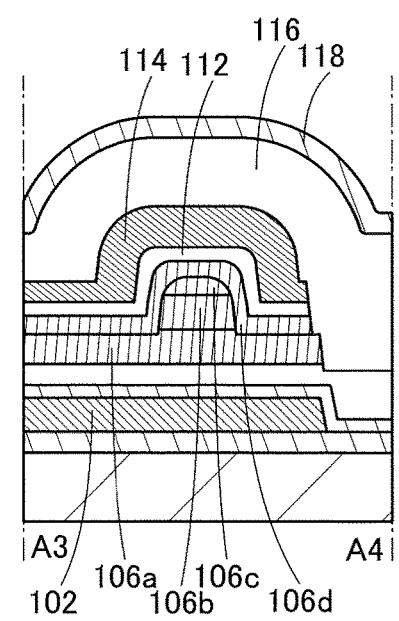

A transistor 19 shown in FIGS. 13C and 13D is different from the transistor 18 in that end portions of the conductor 114, the insulator 112, and the insulator 106d are substantially aligned.

Figure 14A:
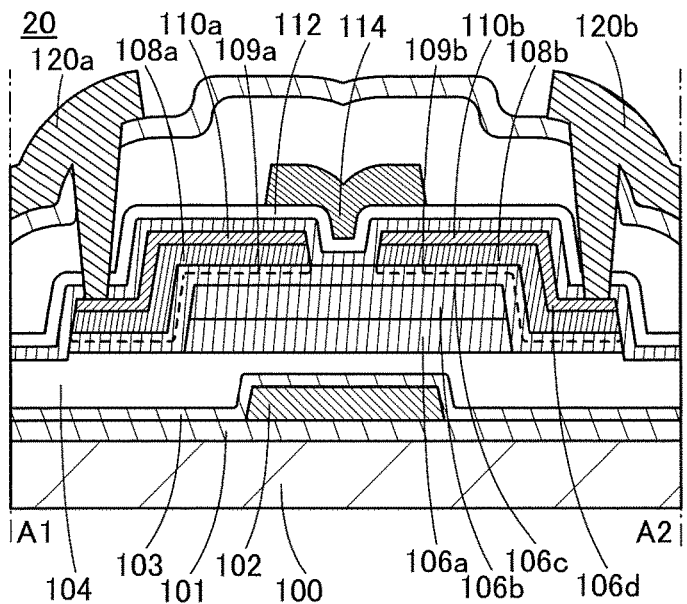
FIGS. 14A to 14D are cross-sectional views illustrating transistors of embodiments of the present invention.
Figure 14B:
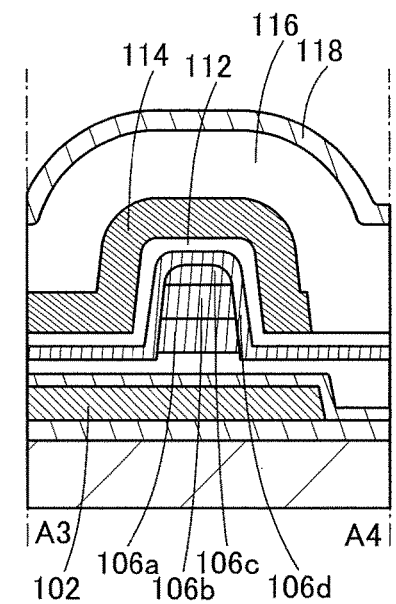

A transistor 20 shown in FIGS. 14A and 14B is different from the transistor 10 in that the conductor 108a and the conductor 108b are in contact with the top surface of the insulator 106c in a region not overlapping with the insulator 106a and the semiconductor 106b. Here, the conductor 108a and the conductor 108b are separated from the insulator 104. This structure can inhibit extraction of oxygen from the insulator 104 at the bottom surfaces of the conductor 108a and the conductor 108b. Accordingly, the conductor 108a and the conductor 108b can be prevented from being partly oxidized to have increased resistivity, and oxygen can be effectively supplied from the insulator 104 to the insulator 106a, the semiconductor 106b, the insulator 106c, and the insulator 106d.

Figure 14C:
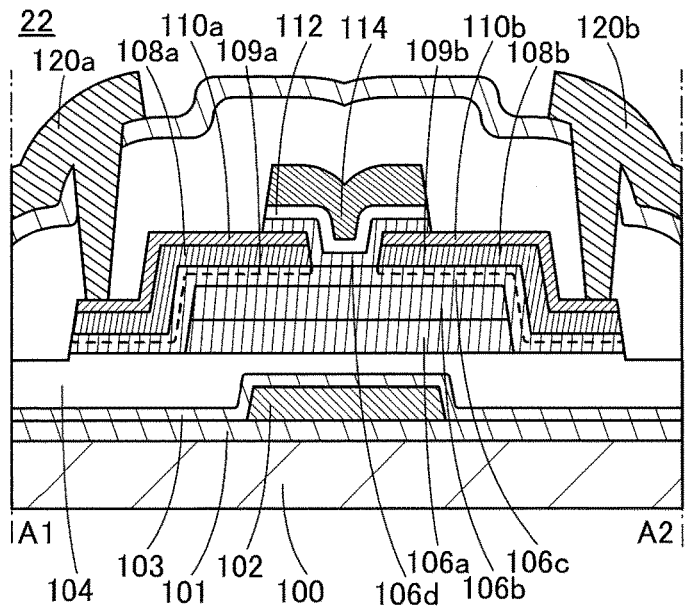
Figure 14D:
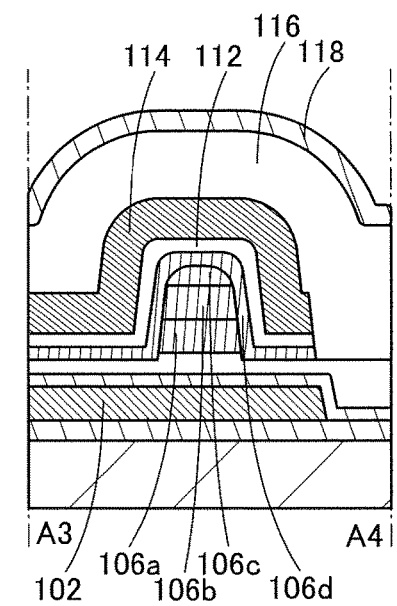

A transistor 22 shown in FIGS. 14C and 14D is different from the transistor 20 in that end portions of the conductor 114, the insulator 112, and the insulator 106d are substantially aligned.

Figure 15A:
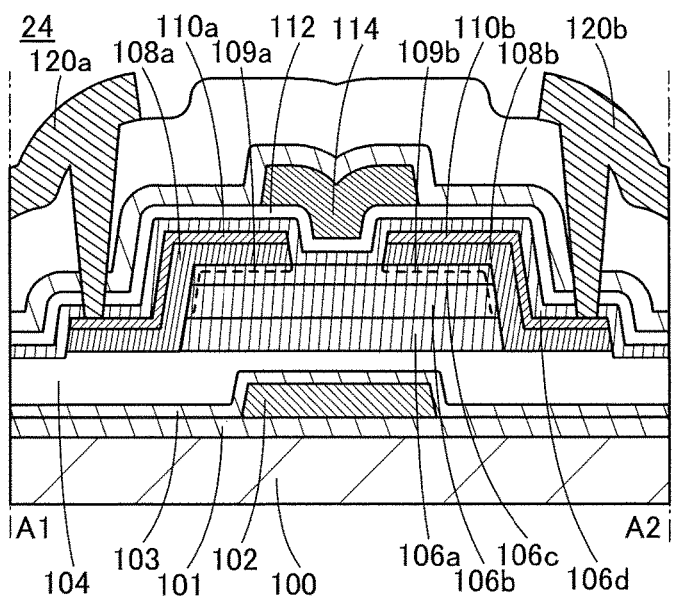
FIGS. 15A to 15D are cross-sectional views illustrating transistors of embodiments of the present invention.
Figure 15B:
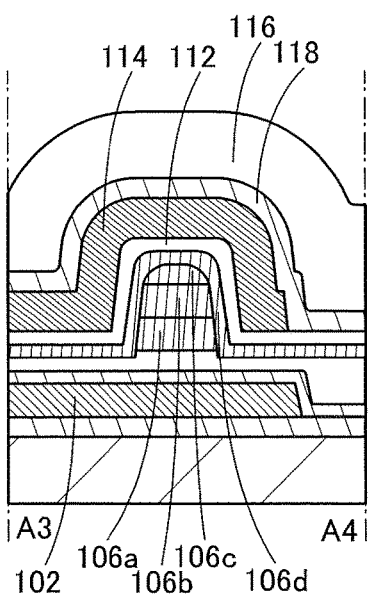

A transistor 24 shown in FIGS. 15A and 15B is different from the transistor 10 in that the insulator 118 is formed over the conductor 114 and the insulator 112 and the insulator 116 is formed over the insulator 118. With this structure, more oxygen can be supplied from the insulator 118 to the insulator 104, and oxygen can be effectively supplied from the insulator 104 to the insulator 106a, the semiconductor 106b, the insulator 106c, and the insulator 106d.

Figure 15C:
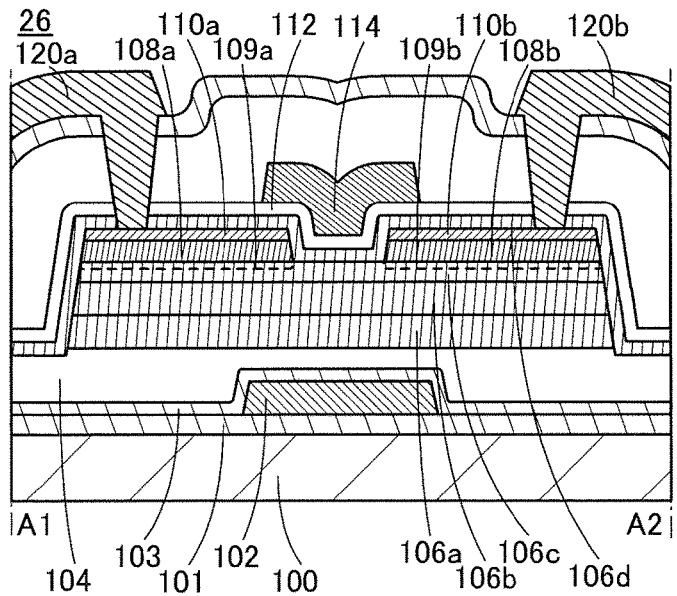
Figure 15D:
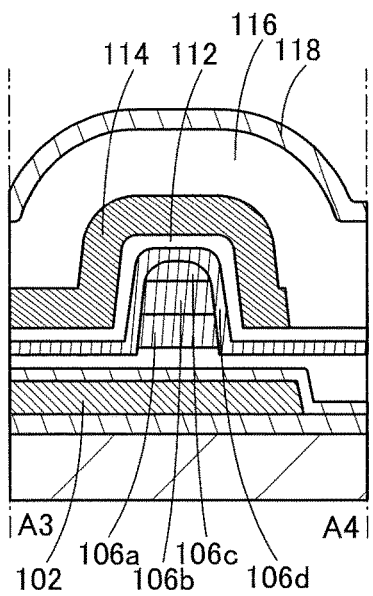

A transistor 26 shown in FIGS. 15C and 15D is different from the transistor 10 in that the bottom surfaces of the conductor 108a and the conductor 108b are in contact with only the top surface of the insulator 106c. As illustrated in FIGS. 15C and 15D, one end portion of the conductor 108a may be aligned with one end portion of each of the insulator 106a, the semiconductor 106b, and the insulator 106c, and one end portion of the conductor 108b may be aligned with the other end portion of each of the insulator 106a, the semiconductor 106b, and the insulator 106c. Here, the conductor 108a and the conductor 108b are separated from the insulator 104. This structure can inhibit extraction of oxygen from the insulator 104 at the bottom surfaces of the conductor 108a and the conductor 108b. Accordingly, the conductor 108a and the conductor 108b can be prevented from being partly oxidized to have increased resistivity, and oxygen can be effectively supplied from the insulator 104 to the insulator 106a, the semiconductor 106b, the insulator 106c, and the insulator 106d.

Figure 16A:
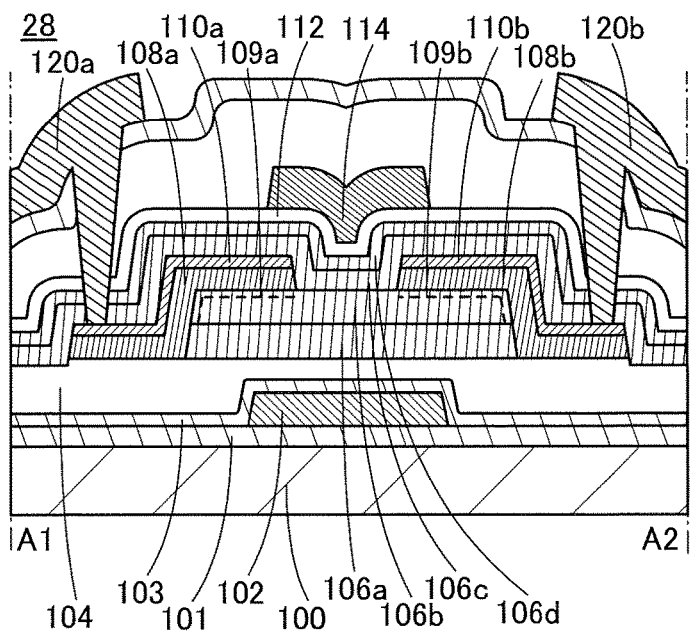
FIGS. 16A to 16D are cross-sectional views illustrating transistors of embodiments of the present invention.
Figure 16B:
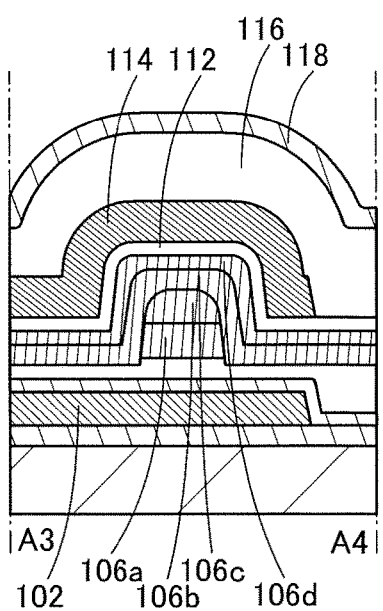

A transistor 28 shown in FIGS. 16A and 16B is different from the transistor 10 in that the conductor 108a and the conductor 108b are in contact with at least part of the top surface of the semiconductor 106b and at least part of the bottom surface of the insulator 106c. With this structure, the conductor 108a and the conductor 108b are in direct contact with at least part of the top surface of the semiconductor 106b, so that on-state current of the transistor 28 can be increased.

Note that an oxide semiconductor such as an In—Ga—Zn oxide is less thermally conductive than silicon. Therefore, by using an oxide semiconductor for the insulator 106a, the semiconductor 106b, and the insulator 106c, heat is easily generated especially at end portions of a channel formation region of the semiconductor 106b on the drain side. However, since the conductors 108a and 108b have regions overlapping with the conductor 114 in the transistor 28 shown in FIGS. 16A and 16B, the conductors 108a and 108b are provided in the vicinity of the channel formation region of the semiconductor 106b. Therefore, heat generated in the channel formation region of the semiconductor 106b is transferred to the conductors 108a and 108b. That is, heat can be dissipated in the vicinity of the channel formation region with the use of the conductors 108a and 108b. Note that this applies to not only the transistor 28 but also other transistors described in this embodiment.

Figure 16C:
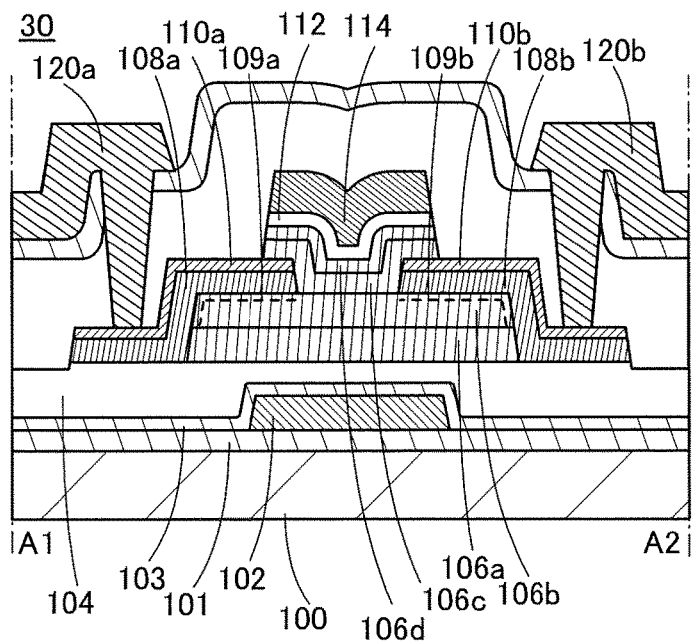
Figure 16D:
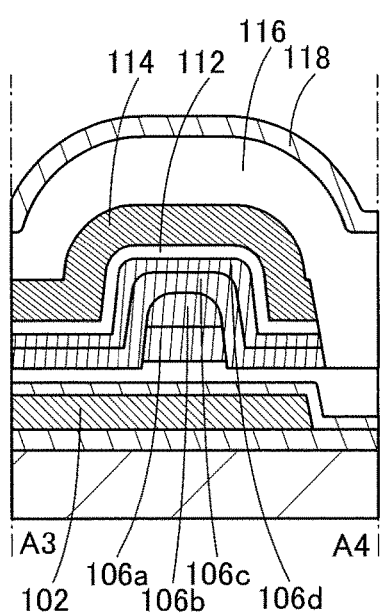

A transistor 30 shown in FIGS. 16C and 16D is different from the transistor 28 in that end portions of the conductor 114, the insulator 112, the insulator 106c, and the insulator 106d are substantially aligned.

Figure 17A:
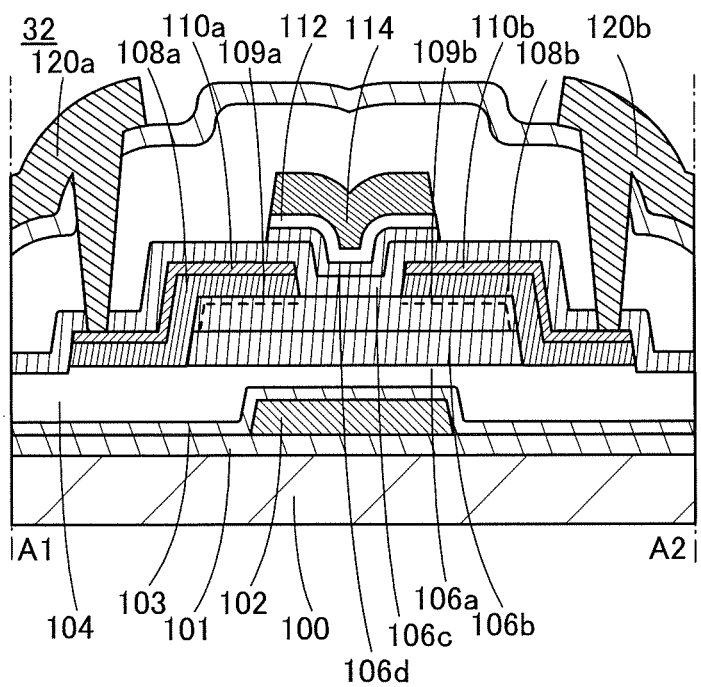
FIGS. 17A to 17D are cross-sectional views illustrating transistors of embodiments of the present invention.
Figure 17B:
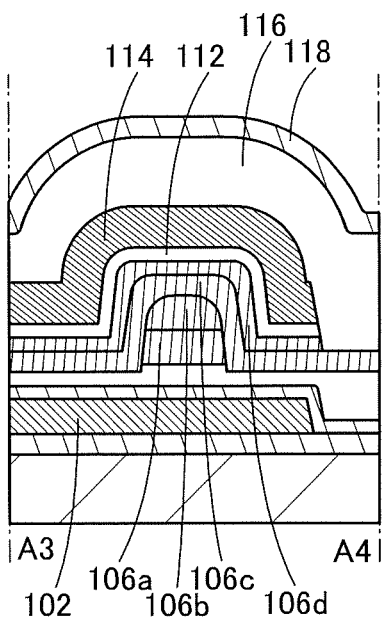

A transistor 32 shown in FIGS. 17A and 17B is different from the transistor 28 in that end portions of the conductor 114, the insulator 112, and the insulator 106d are substantially aligned.

Figure 17C:
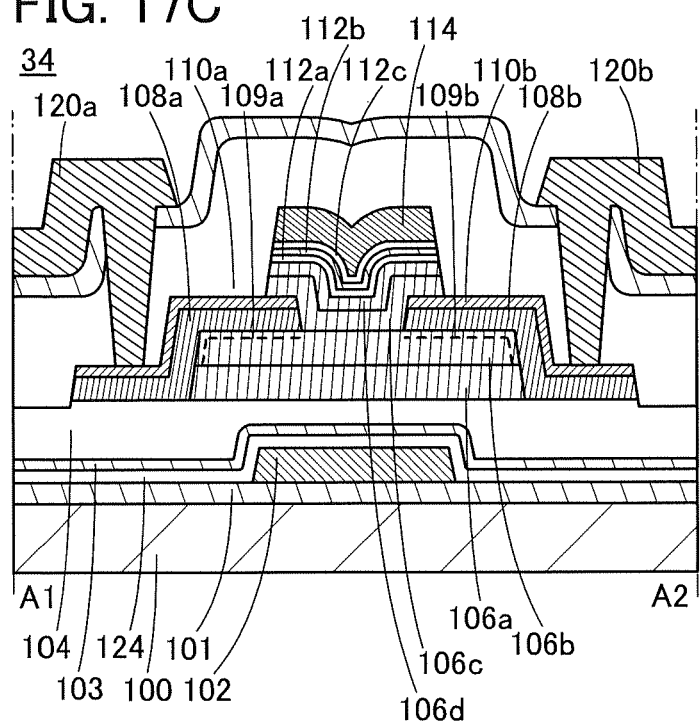
Figure 17D:
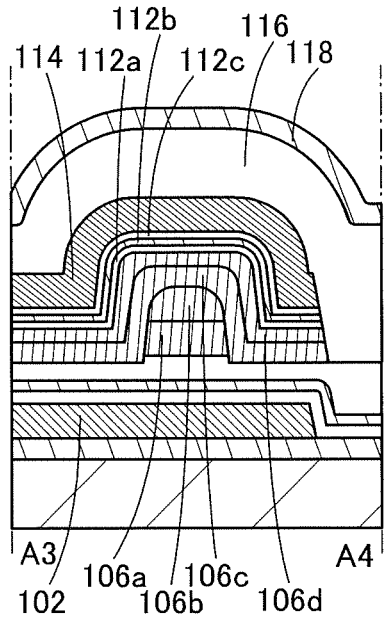

A transistor 34 shown in FIGS. 17C and 17D is different from the transistor 30 in that an insulator 124 is formed between the insulator 103, and the insulator 101 and the conductor 102 and the insulator 112 has a stacked-layer structure including insulators 112a to 112c. The insulator 124 can be formed using an insulator similar to that of the insulator 104. The insulator 112a and the insulator 112c can be formed using an insulator similar to that of the insulator 112 and the insulator 112b can be formed using an insulator similar to that of the insulator 103.

Here, of the insulators 112a to 112c, the insulator 112b preferably includes an electron trap region. The electron trap region has a function of trapping electrons. When the insulator 112a and the insulator 112c have a function of inhibiting release of electrons, the electrons trapped in the insulator 112b behave as if they are negative fixed charges. Thus, the insulator 112b has a function of a floating gate. Note that in some cases, a conductor or a semiconductor may be used instead of the insulator 112b. However, when the insulator 112b is used, release of trapped electrons can be inhibited in some cases.

Of the insulators 124, 103, and 104, the insulator 103 preferably includes an electron trap region. When the insulator 124 and the insulator 104 have a function of inhibiting release of electrons, the electrons trapped in the insulator 103 behave as if they are negative fixed charges. Thus, the insulator 103 has a function of a floating gate. Note that in some cases, a conductor or a semiconductor may be used instead of the insulator 103. However, when the insulator 103 is used, release of trapped electrons can be inhibited in some cases.

<Fabrication Method of Transistor 1>

A method for manufacturing the transistor 10 is described below with reference to FIGS. 18A to 18H, FIGS. 19A to 19F, and FIGS. 20A to 20D.

First, the substrate 100 is prepared. Any of the above-mentioned substrates can be used for the substrate 100.

Next, the insulator 101 is formed. Any of the above-mentioned insulators can be used for the insulator 101.

The insulator 101 may be formed by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

In the case of a PECVD method, a high quality film can be obtained at relatively low temperature. Furthermore, a TCVD method does not use plasma and thus causes less plasma damage to an object. For example, a wiring, an electrode, an element (e.g., transistor or capacitor), or the like included in a semiconductor device might be charged up by receiving electric charges from plasma. In that case, accumulated electric charges might break the wiring, electrode, element, or the like included in the semiconductor device. Such plasma damage is not caused in the case of using a TCVD method, and thus the yield of a semiconductor device can be increased. In addition, since plasma damage does not occur in the deposition by a TCVD method, a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. For that reason, a formed film is less likely to have a pinhole or the like. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by the CVD method or the ALD method, a film with a desired composition can be formed by adjusting the flow ratio of a source gas. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity.

In a conventional deposition apparatus utilizing a CVD method, one or a plurality of source gases for reaction are supplied to a chamber at the same time at the time of deposition. In a deposition apparatus utilizing an ALD method, a source gas (also called precursor) for reaction and a gas serving as a reactant are alternately introduced into a chamber, and then the gas introduction is repeated. Note that the gases to be introduced can be switched using the respective switching valves (also referred to as high-speed valves).

For example, deposition is performed in the following manner. First, precursors are introduced into a chamber and adsorbed onto a substrate surface (first step). Here, the precursors are adsorbed onto the substrate surface, whereby a self-limiting mechanism of surface chemical reaction works and no more precursors are adsorbed onto a layer of the precursors over the substrate. Note that the proper range of substrate temperatures at which the self-limiting mechanism of surface chemical reaction works is also referred to as an ALD window. The ALD window depends on the temperature characteristics, vapor pressure, decomposition temperature, and the like of a precursor. Next, an inert gas (e.g., argon or nitrogen) or the like is introduced into the chamber, so that excessive precursors, a reaction product, and the like are released from the chamber (second step). Instead of introduction of an inert gas, vacuum evacuation can be performed to release excessive precursors, a reaction product, and the like from the chamber. Then, a reactant (e.g., an oxidizer such as $H_2O$ or $O_3$) is introduced into the chamber to react with the precursors adsorbed onto the substrate surface, whereby part of the precursors is removed while the molecules of the film are adsorbed onto the substrate (third step). After that, introduction of an inert gas or vacuum evacuation is performed, whereby excessive reactant, a reaction product, and the like are released from the chamber (fourth step).

A first single layer can be formed on the substrate surface in the above manner. By performing the first to fourth steps again, a second single layer can be stacked over the first single layer. With the introduction of gases controlled, the first to fourth steps are repeated plural times until a film having a desired thickness is obtained, whereby a thin film with excellent step coverage can be formed. The thickness of the thin film can be adjusted by the number of repetition times; therefore, an ALD method makes it possible to adjust a thickness accurately and thus is suitable for manufacturing a minute transistor In an ALD method, a film is formed through reaction of the precursor using thermal energy. An ALD method in which the reactant becomes a radical state with the use of plasma in the above-described reaction of the reactant is sometimes called a plasma ALD method. An ALD method in which reaction between the precursor and the reactant is performed using thermal energy is sometimes called a thermal ALD method.

By an ALD method, an extremely thin film can be formed to have a uniform thickness. In addition, the coverage of an uneven surface with the film is high.

When the plasma ALD method is employed, the film can be formed at a lower temperature than when the thermal ALD method is employed. With the plasma ALD method, for example, the film can be formed without decreasing the deposition rate even at 100° C. or lower. Furthermore, in the plasma ALD method, any of a variety of reactants, including a nitrogen gas, can be used without being limited to an oxidizer; therefore, it is possible to form various kinds of films of not only an oxide but also a nitride, a fluoride, a metal, and the like.

In the case where the plasma ALD method is employed, as in an inductively coupled plasma (ICP) method or the like, plasma can be generated apart from a substrate. When plasma is generated in this manner, plasma damage can be minimized.

Figure 21A:
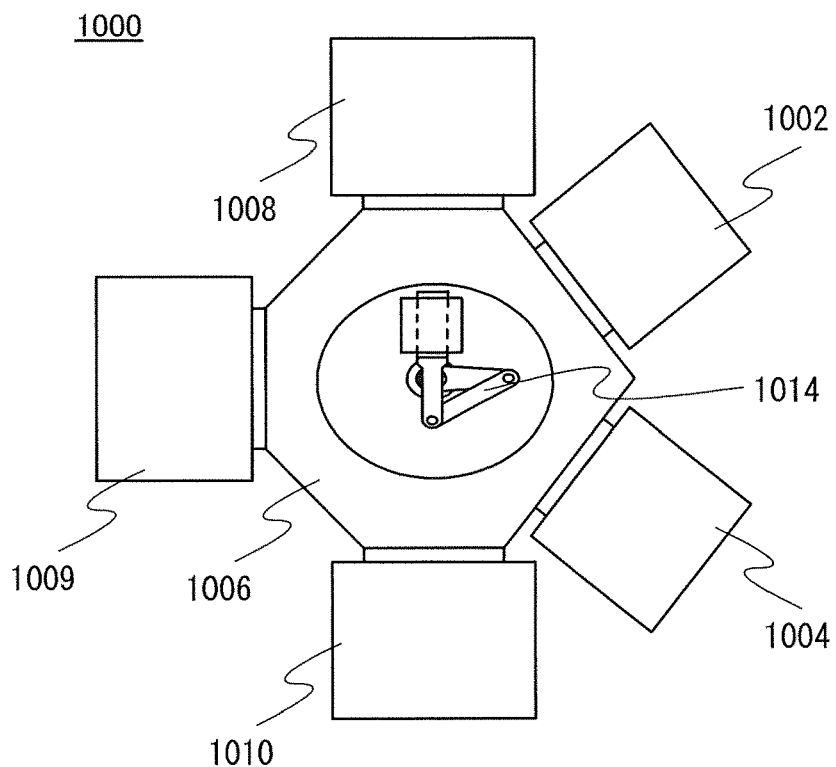
FIGS. 21A and 21B are a schematic diagram and a cross-sectional view illustrating a deposition apparatus.
Figure 21B:
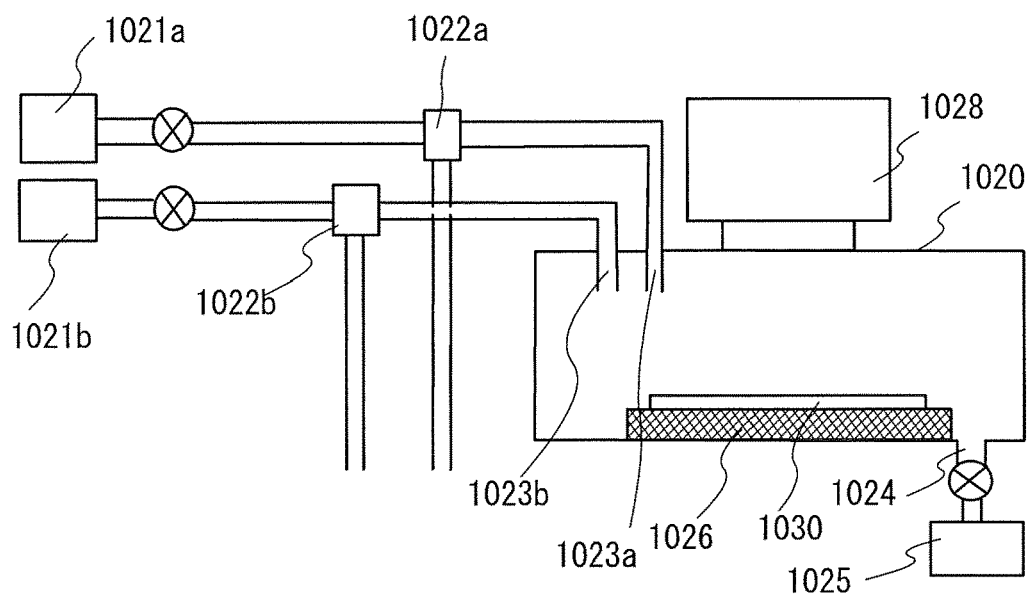

Here, a structure of a deposition apparatus 1000 is described with reference to FIGS. 21A and 21B as an example of an apparatus with which a film can be formed by an ALD method. FIG. 21A is a schematic diagram of a multi-chamber deposition apparatus 1000, and FIG. 21B is a cross-sectional view of an ALD apparatus that can be used for the deposition apparatus 1000.

Example of Structure of Deposition Apparatus

The deposition apparatus 1000 includes a carrying-in chamber 1002, a carrying-out chamber 1004, a transfer chamber 1006, a deposition chamber 1008, a deposition chamber 1009, a deposition chamber 1010, and a transfer arm 1014. Here, the carrying-in chamber 1002, the carrying-out chamber 1004, and the deposition chambers 1008 to 1010 are connected to the transfer chamber 1006. Thus, successive film formation can be performed in the deposition chambers 1008 to 1010 without exposure to the air, whereby entry of impurities into a film can be prevented.

Note that in order to prevent attachment of moisture, the carrying-in chamber 1002, the carrying-out chamber 1004, the transfer chamber 1006, and the deposition chambers 1008 to 1010 are preferably filled with an inert gas (such as a nitrogen gas) whose dew point is controlled, more preferably maintain reduced pressure.

An ALD apparatus can be used for the deposition chambers 1008 to 1010. A deposition apparatus other than an ALD apparatus may be used for any of the deposition chambers 1008 to 1010. Examples of the deposition apparatus used for the deposition chambers 1008 to 1010 include a sputtering apparatus, a PECVD apparatus, a TCVD apparatus, and an MOCVD apparatus.

For example, when an ALD apparatus and a PECVD apparatus are provided in the deposition chambers 1008 to 1010, the insulator 124 made of silicon oxide and included in the transistor 34 in FIGS. 17C and 17D can be formed by a PECVD method, the insulator 103 made of hafnium oxide can be formed by an ALD method, and the insulator 104 made of silicon oxide can be formed by a PECVD method. Because the series of film formation is successively performed without exposure to the air, films can be formed without entry of impurities into the films.

Although the deposition apparatus 1000 includes the carrying-in chamber 1002, the carrying-out chamber 1004, and the deposition chambers 1008 to 1010, the present invention is not limited to this structure. The deposition apparatus 1000 may have four or more deposition chambers, or may additionally include a treatment chamber for heat treatment or plasma treatment. The deposition apparatus 1000 may be of a single-wafer type or may be of a batch type, in which case film formation is performed on a plurality of substrates at a time.

<<ALD Apparatus>>

Next, a structure of an ALD apparatus that can be used for the deposition apparatus 1000 is described. The ALD apparatus includes a deposition chamber (chamber 1020), source material supply portions 1021a and 1021b, high-speed valves 1022a and 1022b which are flow rate controllers, source material introduction ports 1023a and 1023b, a source material exhaust port 1024, and an evacuation unit 1025. The source material introduction ports 1023a and 1023b provided in the chamber 1020 are connected to the source material supply portions 1021a and 1021b, respectively, through supply tubes and valves. The source material exhaust port 1024 is connected to the evacuation unit 1025 through an exhaust tube, a valve, and a pressure controller.

A plasma generation apparatus 1028 is connected to the chamber 1020 as illustrated in FIG. 21B, whereby film formation can be performed by a plasma ALD method instead of a thermal ALD method. By a plasma ALD method, a film can be formed without decreasing the deposition rate even at low temperatures; thus, a plasma ALD method is preferably used for a single-wafer type deposition apparatus with low deposition efficiency.

A substrate holder 1026 with a heater is provided in the chamber, and a substrate 1030 over which a film is to be formed is provided over the substrate holder 1026.

In the source material supply portions 1021a and 1021b, a source gas is formed from a solid source material or a liquid source material by using a vaporizer, a heating unit, or the like. Alternatively, the source material supply portions 1021a and 1021b may supply a source gas.

Although two source material supply portions 1021a and 1021b are provided as an example, without limitation thereto, three or more source material supply portions may be provided. The high-speed valves 1022a and 1022b can be accurately controlled by time, and a source gas and an inert gas are supplied by the high-speed valves 1022a and 1022b. The high-speed valves 1022a and 1022b are flow rate controllers for a source gas, and can also be referred to as flow rate controllers for an inert gas.

In the deposition apparatus illustrated in FIG. 21B, a thin film is formed over a surface of the substrate 1030 in the following manner: the substrate 1030 is transferred to be put on the substrate holder 1026, the chamber 1020 is sealed, the substrate 1030 is heated to a desired temperature (e.g., higher than or equal to 80° C., higher than or equal to 100° C., or higher than or equal to 150° C.) by heating the substrate holder 1026 with a heater; and supply of a source gas, evacuation with the evacuation unit 1025, supply of an inert gas, and evacuation with the evacuation unit 1025 are repeated.

In the deposition apparatus illustrated in FIG. 21B, an insulating layer formed using an oxide (including a composite oxide) containing one or more elements selected from hafnium, aluminum, tantalum, zirconium, and the like can be formed by selecting a source material (e.g., a volatile organometallic compound) used for the source material supply portions 1021a and 1021b appropriately. Specifically, it is possible to use an insulating layer formed using hafnium oxide, an insulating layer formed using aluminum oxide, an insulating layer formed using hafnium silicate, or an insulating layer formed using aluminum silicate. Alternatively, a thin film, e.g., a metal layer such as a tungsten layer or a titanium layer, or a nitride layer such as a titanium nitride layer can be formed by selecting a source material (e.g., a volatile organometallic compound) used for the source material supply portions 1021a and 1021b appropriately.

For example, in the case where a hafnium oxide layer is formed by an ALD apparatus, two kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamido)hafnium (TDMAH)) are used. In this case, the first source gas supplied from the source material supply portion 1021a is TDMAH, and the second source gas supplied from the source material supply portion 1021b is ozone. Note that the chemical formula of tetrakis (dimethylamido)hafnium is $Hf[N(CH_3)_2]_4$. Examples of another material liquid include tetrakis(ethylmethylamido) hafnium.

For example, in the case where an aluminum oxide layer is formed by an ALD apparatus, two kinds of gases, e.g., $H_2O$ as an oxidizer and a source gas which is obtained by vaporizing liquid containing a solvent and an aluminum precursor compound (e.g., trimethylaluminum (TMA)) are used. In this case, the first source gas supplied from the source material supply portion 1021a is TMA, and the second source gas supplied from the source material supply portion 1021b is $H_2O$. Note that the chemical formula of trimethylaluminum is $Al(CH_3)_3$. Examples of another material liquid include tris(dimethylamido)aluminum, triisobutylaluminum, and aluminum tris(2,2,6,6-tetramethyl-3,5-heptanedionate).

In the case where a tungsten layer is formed using an ALD apparatus, a $WF_6$ gas and a $B_2H_6$ gas are sequentially introduced a plurality of times to form an initial tungsten layer, and then a $WF_6$ gas and an $H_2$ gas are sequentially introduced a plurality of times to form a tungsten layer. Note that an $SiH_4$ gas may be used instead of a $B_2H_6$ gas. These gases may be controlled by mass flow controllers.

Next, a conductor to be the conductor 102 is formed. Any of the above-described conductors can be used for the conductor to be the conductor 102. The conductor can be formed by a sputtering method, a CVD method, an MBE method, a PLD method, an ALD method, or the like.

Figure 18A:
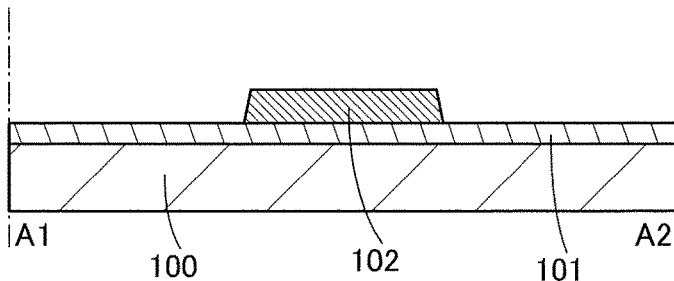
FIGS. 18A to 18H are cross-sectional views illustrating a method for manufacturing a transistor of one embodiment of the present invention.
Figure 18B:
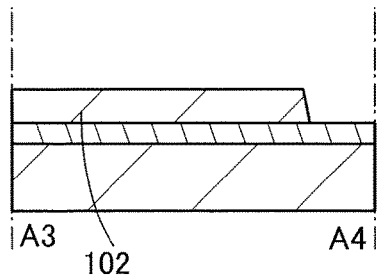

Next, a resist or the like is formed over the conductor and processing is performed using the resist, whereby the conductor 102 is formed (see FIGS. 18A and 18B). Note that the case where the resist is simply formed also includes the case where a BARC is formed below the resist.

The resist is removed after the object is processed by etching or the like. For the removal of the resist, plasma treatment and/or wet etching are/is used. Note that as the plasma treatment, plasma ashing is preferable. In the case where the removal of the resist or the like is not enough, the remaining resist or the like may be removed using ozone water and/or hydrofluoric acid at a concentration higher than or equal to 0.001 volume % and lower than or equal to 1 volume %, and the like.

Then, the insulator 103 is formed. Any of the above-described insulators can be used for the insulator 103. The insulator 103 can be formed by a sputtering method, a CVD method, an MBE method, a PLD method, an ALD method, or the like.

Figure 18C:
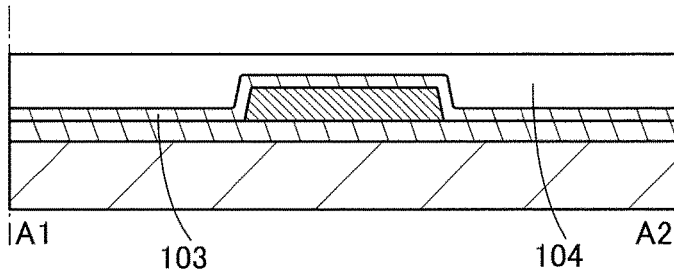
Figure 18D:
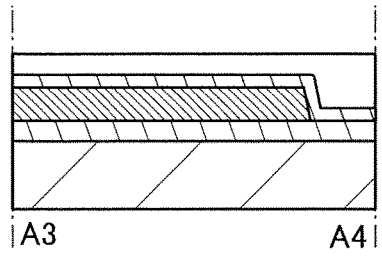

Then, the insulator 104 is formed (see FIGS. 18C and 18D). Any of the above-described insulators can be used for the insulator 104. The insulator 104 can be formed by a sputtering method, a CVD method, an MBE method, a PLD method, an ALD method, or the like.

The top surface or the bottom surface of the semiconductor 106b to be formed later preferably has high planarity. Thus, to improve the planarity, the top surface of the insulator 104 may be subjected to planarization treatment such as CMP treatment as illustrated in FIGS. 18C and 18D.

Then, an insulator to be the insulator 106a is formed. Any of the above-described insulators and semiconductors that can be used for the insulator 106a can be used for the insulator to be the insulator 106a. The insulator to be the insulator 106a can be formed by a sputtering method, a CVD method, an MBE method, a PLD method, an ALD method, or the like.

Next, a semiconductor to be the semiconductor 106b is formed. Any of the above-described semiconductors can be used for the semiconductor to be the semiconductor 106b. The semiconductor to be the semiconductor 106b can be formed by a sputtering method, a CVD method, an MBE method, a PLD method, an ALD method, or the like. Note that successive film formation of the insulator to be the insulator 106a and the semiconductor to be the semiconductor 106b without exposure to the air can reduce entry of impurities into the films and their interface.

Next, an insulator to be the insulator 106c is formed. Any of the above-described insulators and semiconductors that can be used for the insulator 106c can be used for the insulator to be the insulator 106c. The insulator to be the insulator 106c can be formed by a sputtering method, a CVD method, an MBE method, a PLD method, an ALD method, or the like. Note that successive film formation of the semiconductor to be the semiconductor 106b and the insulator to be the insulator 106c without exposure to the air can reduce entry of impurities into the films and their interface.

Next, heat treatment is preferably performed. The heat treatment can reduce the hydrogen concentration of the insulator to be the insulator 106a, the semiconductor to be the semiconductor 106b, and the insulator to be the insulator 106c in some cases. The heat treatment can reduce oxygen vacancies in the insulator to be the insulator 106a, the semiconductor to be the semiconductor 106b, and the insulator to be the insulator 106c in some cases. The heat treatment is performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment can increase the crystallinity of the insulator to be the insulator 106a, the semiconductor to be the semiconductor 106b, and the insulator to be the insulator 106c and can remove impurities, such as hydrogen and water, for example. For the heat treatment, lamp heating can be performed with use of an RTA apparatus.

Figure 18E:
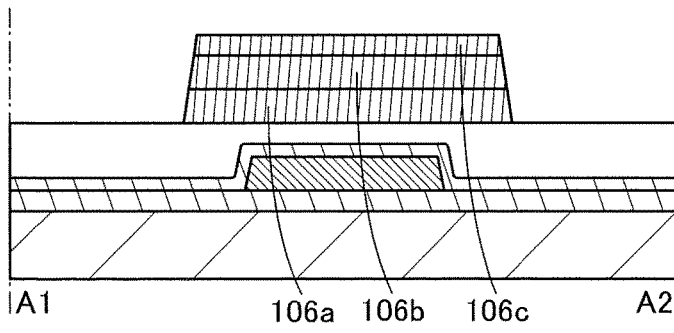
Figure 18F:
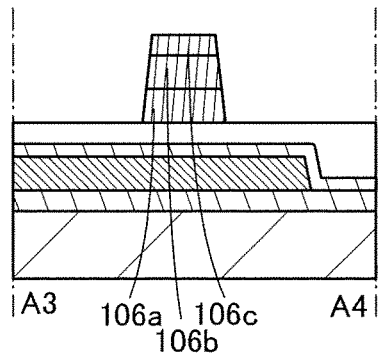

Next, a resist or the like is formed over the insulator to be the insulator 106c and processing is performed using the resist, whereby the insulator 106a, the semiconductor 106b, and the insulator 106c are formed (see FIGS. 18E and 18F).

Next, a conductor to be the conductor 108a and the conductor 108b is formed. Any of the above-described conductors can be used for the conductor to be the conductor 108a and the conductor 108b. The conductor can be formed by a sputtering method, a CVD method, an MBE method, a PLD method, an ALD method, or the like.

Next, a conductor to be the conductor 110a and the conductor 110b is formed. Any of the above-described conductors can be used for the conductor to be the conductor 110a and the conductor 110b. The conductor can be formed by a sputtering method, a CVD method, an MBE method, a PLD method, an ALD method, or the like.

Figure 18G:
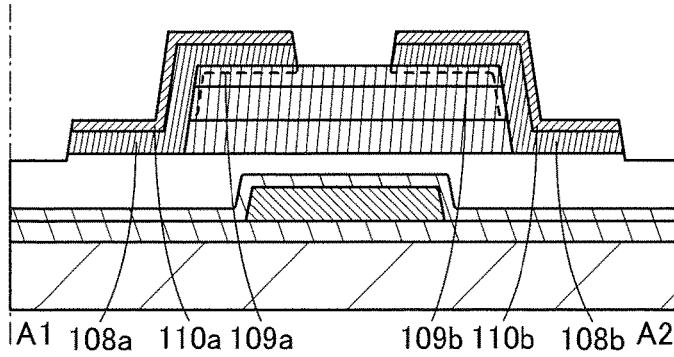
Figure 18H:
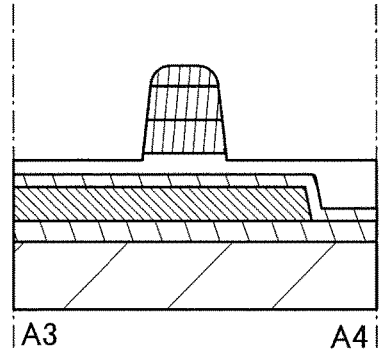

Next, a resist or the like is formed over the conductors and processing is performed using the resist, whereby the conductor 108a, the conductor 108b, the conductor 110a, and the conductor 110b are formed (see FIGS. 18G and 18H).

Here, regions of the semiconductor 106b and the insulator 106c that are in contact with the conductor 108a and the conductor 108b include the low-resistance region 109a and the low-resistance region 109b in some cases. Although not illustrated, a low-resistance region is sometimes formed in regions of the insulator 106a that are in contact with the conductor 108a and the conductor 108b.

Here, as illustrated in FIG. 1D, the insulator 106c might have a smaller thickness in a region between the conductor 108a and the conductor 108b than in regions overlapping with the conductor 108a and the conductor 108b. This is because part of the top surface of the insulator 106c is sometimes removed at the time of the formation of the conductor 108a and the conductor 108b.

Then, the insulator 106d is formed. Any of the above-described semiconductors can be used for the insulator 106d. The insulator 106d can be formed by a sputtering method, a CVD method, an MBE method, a PLD method, an ALD method, or the like. Before the formation of the insulator 106d, surfaces of the insulator 106c, the conductor 110a, and the conductor 110b may be etched. For example, plasma containing a rare gas can be used for the etching. After that, the insulator 106d is successively formed without being exposed to the air, whereby impurities can be prevented from entering interfaces between the insulator 106d and the insulator 106c, the conductor 110a, and the conductor 110b. In some cases, impurities at an interface between films are diffused more easily than impurities in a film. For this reason, a reduction in impurity at the interfaces leads to stable electrical characteristics of a transistor.

Figure 19A:
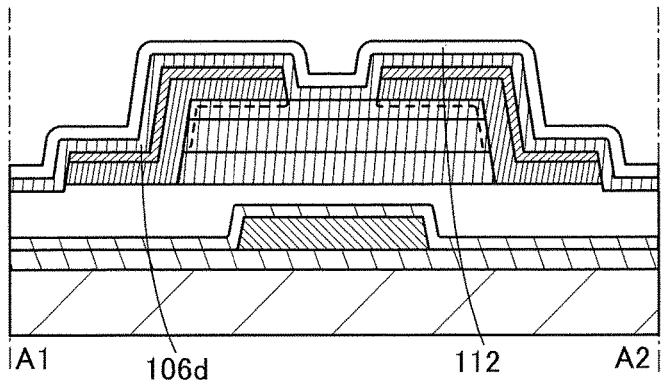
FIGS. 19A to 19F are cross-sectional views illustrating a method for manufacturing a transistor of one embodiment of the present invention.
Figure 19B:
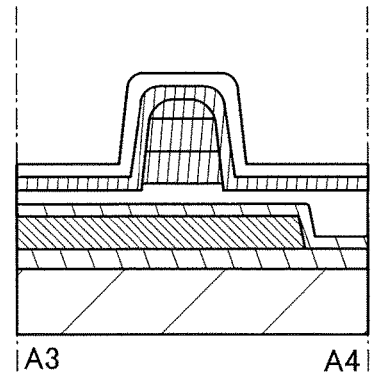

Then, the insulator 112 is formed (see FIGS. 19A and 19B). Any of the above-described insulators can be used for the insulator 112. The insulator 112 can be formed by a sputtering method, a CVD method, an MBE method, a PLD method, an ALD method, or the like. Note that successive film formation of the insulator 106d and the insulator 112 without exposure to the air can reduce entry of impurities into the films and their interface.

Next, a conductor to be the conductor 114 is formed. Any of the above-described conductors can be used for the conductor to be the conductor 114. The conductor can be formed by a sputtering method, a CVD method, an MBE method, a PLD method, an ALD method, or the like.

Figure 19C:
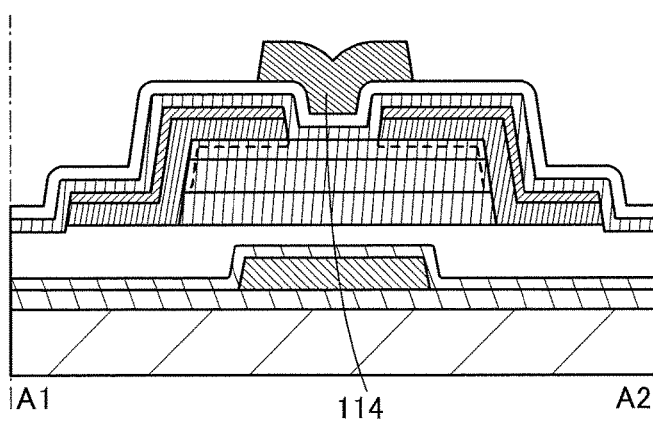
Figure 19D:
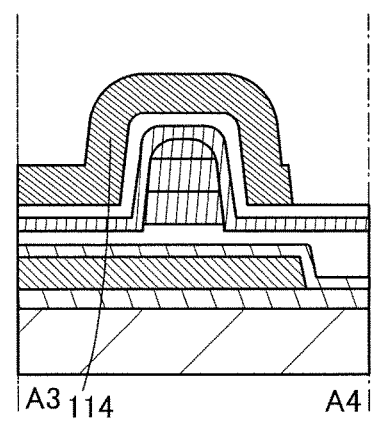

Next, a resist or the like is formed over the conductor and processing is performed using the resist, whereby the conductor 114 is formed (see FIGS. 19C and 19D).

Then, the insulator 116 is formed. Any of the above-described insulators can be used for the insulator 116. The insulator 116 can be formed by a sputtering method, a CVD method, an MBE method, a PLD method, an ALD method, or the like.

Figure 19E:
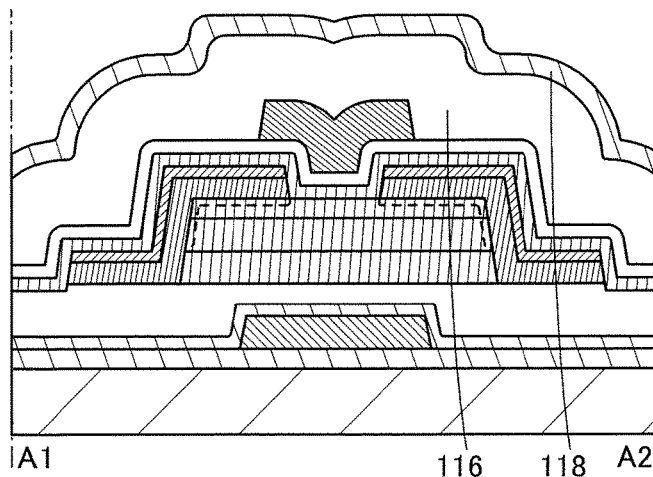
Figure 19F:
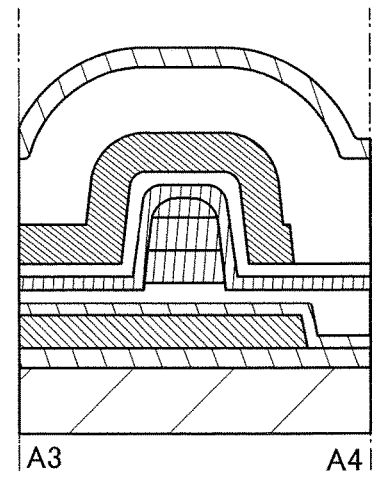

Then, the insulator 118 is formed (see FIGS. 19E and 19F). Any of the above-described insulators can be used for the insulator 118. The insulator 118 can be formed by a sputtering method, a CVD method, an MBE method, a PLD method, an ALD method, or the like.

Here, as the insulator 118, an oxide insulating film of aluminum oxide or the like having a blocking effect against oxygen, hydrogen, water, or the like is preferably provided. When the insulator 118 is formed by an ALD method, formation of a void at a projection or the like can be inhibited and the insulator 118 with excellent coverage can be formed.

The insulator 118 may have a stacked-layer structure. For example, an aluminum oxide film may be formed by an ALD method to a thickness of approximately 5 nm to 10 nm, and then, an aluminum oxide film may be formed by an RF sputtering method with a higher deposition rate. In that case, the film with excellent coverage can be formed by an ALD method in the vicinity of the interface with the insulator 116, and the film thereover can be formed with high throughput. In the case where the insulator 118 has a stacked-layer structure as described above, after the first film is formed, oxygen ions may be added as described later, and then, the second film may be formed.

The insulator 118 can also be formed by a sputtering method. As the above sputtering method, a radio frequency (RF) sputtering method in which a high frequency power source is used as a sputtering power source, a reactive sputtering method in which a reactive gas atmosphere is used, or the like can be employed.

Here, when an RF sputtering method or a reactive sputtering method is performed in an atmosphere containing oxygen, oxygen can be supplied to the insulator 116 and the like through the insulator 118 to be excess oxygen. The oxygen gas flow rate or deposition power for sputtering can be set as appropriate in accordance with the amount of oxygen ions to be added. Furthermore, in the case where excess oxygen is contained in the insulator 118 and the like at the same time as formation thereof as described above, addition of oxygen ions to be described below with reference to FIGS. 20A and 20B is not necessarily performed.

Figure 20A:
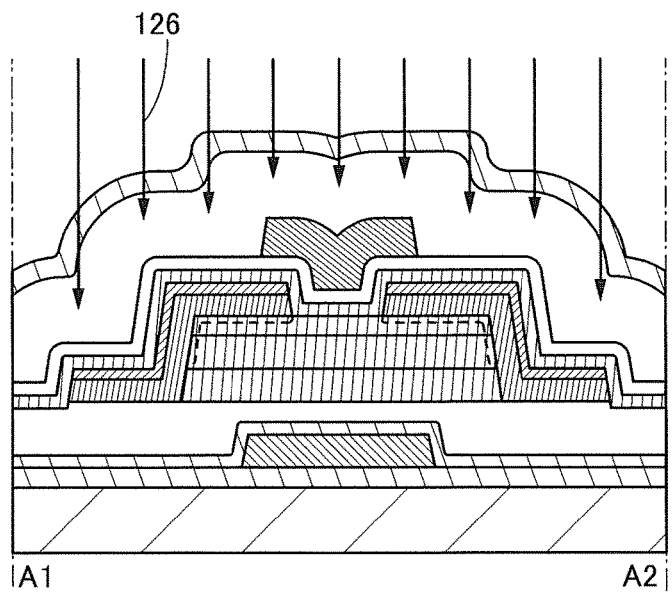
FIGS. 20A to 20D are cross-sectional views illustrating a method for manufacturing a transistor of one embodiment of the present invention.
Figure 20B:
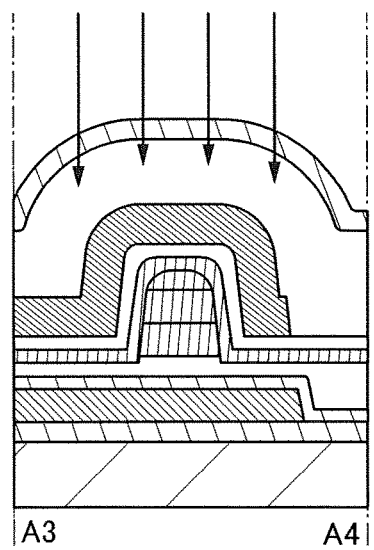

Next, oxygen ions 126 may be added to pass through the insulator 118, whereby excess oxygen is contained in the insulator 116, the insulator 112, and/or the insulator 104 (see FIGS. 20A and 20B). An ion implantation method, an ion doping method, a plasma immersion ion implantation method, or the like can be used as a method for adding oxygen ions. The addition of oxygen ions may be performed by an ion implantation method at an acceleration voltage of greater than or equal to 2 kV and less than or equal to 10 kV at a dose of greater than or equal to $5\times10^{14}$ ions/cm$^2$ and less than or equal to $5\times10^{16}$ ions/cm$^2$, for example.

Figure 22A:
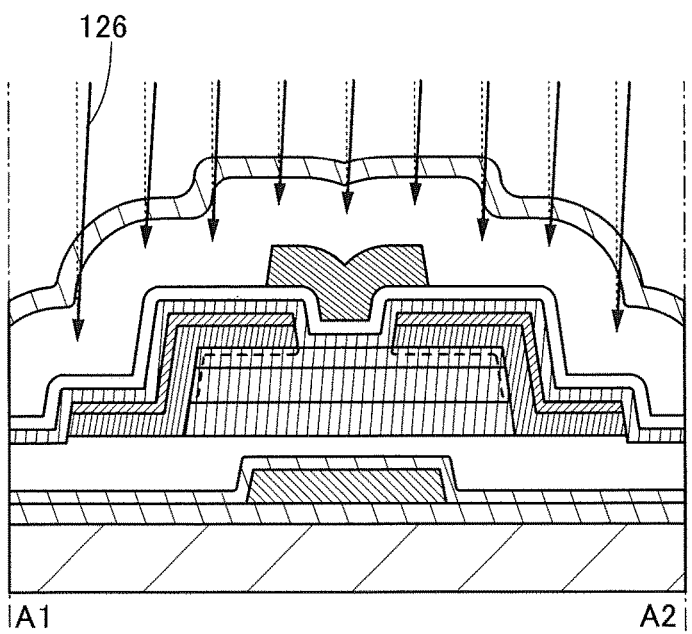
FIGS. 22A and 22B are cross-sectional views illustrating a method for manufacturing a transistor of one embodiment of the present invention.
Figure 22B:
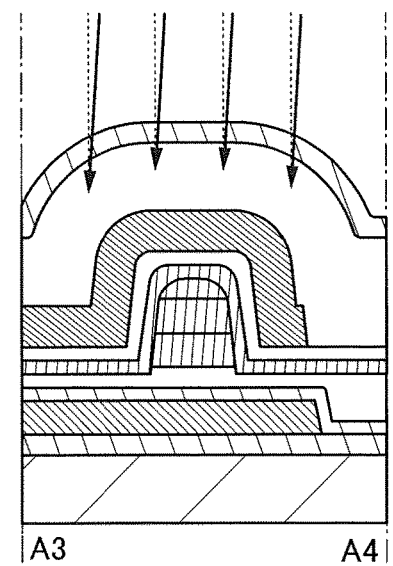

FIGS. 20A and 20B illustrate the case where the oxygen ions 126 are added in a normal direction of a plane surface of the substrate; however, the present invention is not limited to this structure. As illustrated in FIGS. 22A and 22B, the oxygen ions 126 may be added at an angle with the normal of the plane surface of the substrate. The tilt angle and the twist angle can be set as appropriate in accordance with the amount of oxygen ions to be added.

When oxygen ions are added by a sputtering method, an ion implantation method, or the like as described above, in some cases, oxygen is also added to a surface of the conductor 114 and the vicinity of the surface. In that case, the surface of the conductor 114 and the vicinity of the surface sometimes include a region with an oxygen concentration higher than that of the conductor 114 on the insulator 112 side.

Next, heat treatment is preferably performed. By the heat treatment, the excess oxygen supplied to the insulator 116, the insulator 112, and/or the insulator 104 can be diffused to be supplied to the insulator 106a, the semiconductor 106b, the insulator 106c, and the insulator 106d. The heat treatment is performed at a temperature higher than or equal to 250° C. and lower than or equal to 650° C., preferably higher than or equal to 350° C. and lower than or equal to 450° C. The heat treatment is performed in an inert gas atmosphere or an atmosphere containing an oxidizing gas at 10 ppm or more, 1% or more, or 10% or more. The heat treatment may be performed under a reduced pressure. For the heat treatment, lamp heating can be performed with use of an RTA apparatus.

Note that the heat treatment after the addition of oxygen ions may be performed at any time after the addition of oxygen ions. For example, the heat treatment may be performed after the conductors 120a and 120b are formed.

Next, a resist or the like is formed over the insulator 118, and openings are formed in the insulator 118, the insulator 116, the insulator 112, and the insulator 106d. Then, a conductor to be the conductor 120a and the conductor 120b is formed. Any of the above-described conductors can be used for the conductor to be the conductor 120a and the conductor 120b. The conductor can be formed by a sputtering method, a CVD method, an MBE method, a PLD method, an ALD method, or the like.

Figure 20C:
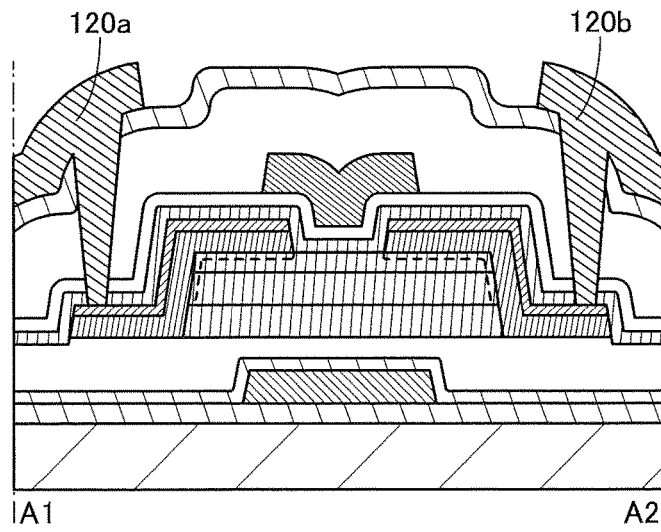
Figure 20D:
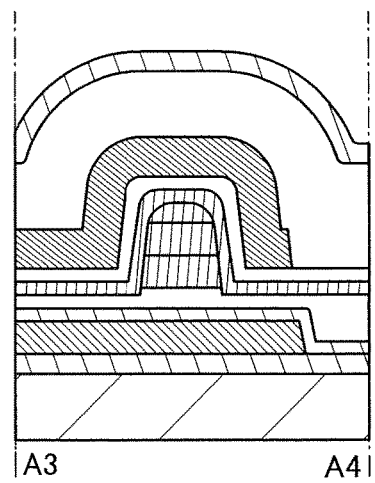

Next, a resist or the like is formed over the conductor, and the conductor is processed into the conductor 120a and the conductor 120b using the resist (see FIGS. 20C and 20D).

Through the above process, the transistor of one embodiment of the present invention can be manufactured.

<Transistor 2>

The structure of a transistor is described below as an example of the semiconductor device of one embodiment of the present invention.

Figure 23A:
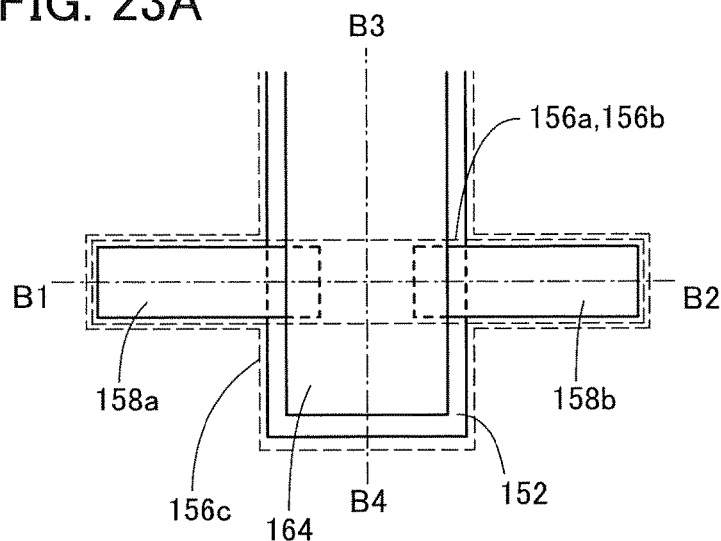
FIGS. 23A to 23C are a top view and cross-sectional views illustrating a transistor of one embodiment of the present invention.
Figure 23B:
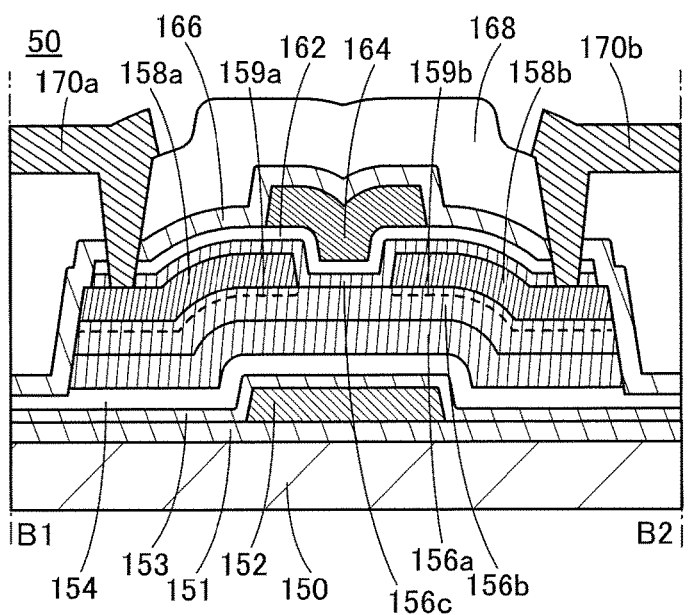
Figure 23C:
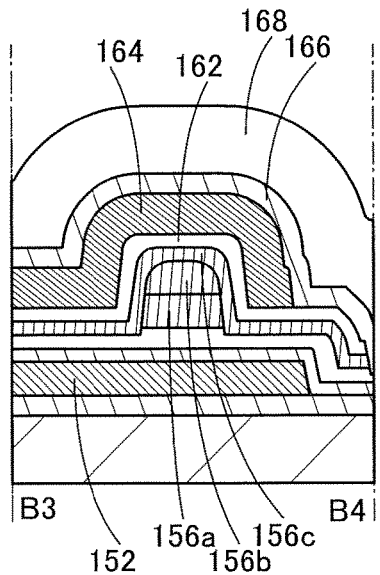

The structure of a transistor 50 is described with reference to FIGS. 23A to 23C. FIG. 23A is a top view of the transistor 50. FIG. 23B is a cross-sectional view taken along a dashed-dotted line B1-B2 in FIG. 23A, and FIG. 23C is a cross-sectional view taken along a dashed-dotted line B3-B4 in FIG. 23A. A region along dashed-dotted line B1-B2 shows a structure of the transistor 50 in the channel length direction, and a region along dashed-dotted line B3-B4 shows a structure of the transistor 50 in the channel width direction. An insulator 156a, a semiconductor 156b, and an insulator 156c can be provided to substantially overlap with conductors 152, 158a, 158b, and 164; however, for clarity of the top view, the insulator 156a, the semiconductor 156b, and the insulator 156c are denoted with a thin dashed line in FIG. 23A as being misaligned.

As illustrated in FIGS. 23A to 23C, the transistor 50 includes an insulator 151, a conductor 152, an insulator 153, and an insulator 154 that are formed over a substrate 150; the insulator 156a, the semiconductor 156b, and the insulator 156c that are formed over the insulator 154; the conductor 158a and the conductor 158b that are formed over the semiconductor 156b; an insulator 162 formed over the insulator 156c; a conductor 164 formed over the insulator 162; and an insulator 166, an insulator 168, a conductor 170a, and a conductor 170b that are formed over the conductor 164.

Here, the insulator 151, the insulator 153, the insulator 154, the insulator 156a, the insulator 156c, the insulator 162, the insulator 166, and the insulator 168 can also be referred to as insulating films or insulating layers. The conductor 152, the conductor 158a, the conductor 158b, the conductor 164, the conductor 170a, and the conductor 170b can also be referred to as conductive films or conductive layers. The semiconductor 156b can also be referred to as a semiconductor film or a semiconductor layer.

Note that as the details are described later, the insulator 156a and the insulator 156c are sometimes formed using a substance that can function as a conductor, a semiconductor, or an insulator when they are used alone. However, when the transistor is formed by stacking the semiconductor 156b, electrons flow in the semiconductor 156b, in the vicinity of an interface between the semiconductor 156b and the insulator 156a, and in the vicinity of an interface between the semiconductor 156b and the insulator 156c, and some regions of the insulators 156a and 156c do not serve as a channel of the transistor. For that reason, in the present specification and the like, the insulators 156a and 156c are not referred to as semiconductors but insulators.

Over the insulator 151 formed over the substrate 150, the conductor 152 is formed. The conductor 152 overlaps with the insulator 156a, the semiconductor 156b, and the insulator 156c. The insulator 153 is formed on and in contact with the conductor 152 to cover the conductor 152. The insulator 154 is formed over the insulator 153.

The insulator 156a is formed over the insulator 154, and the semiconductor 156b is formed in contact with at least part of a top surface of the insulator 156a. Although end portions of the insulator 156a and the semiconductor 156b are substantially aligned in FIG. 23B, the structure of the semiconductor device described in this embodiment is not limited to this example.

The conductor 158a and the conductor 158b are formed in contact with at least part of a top surface of the semiconductor 156b. The conductor 158a and the conductor 158b are spaced and are preferably formed to face each other with the conductor 164 provided therebetween as illustrated in FIG. 23A.

The insulator 156c is formed in contact with at least part of the top surface of the semiconductor 156b. The insulator 156c is preferably in contact with the semiconductor 156b in a region sandwiched between the conductor 158a and the conductor 158b.

The insulator 162 is formed over the insulator 156c. The conductor 164 is formed over the insulator 162 to overlap with a region between the conductor 158a and the conductor 158b. Although the insulator 162 and the insulator 156c are formed so that end portions thereof are aligned in FIG. 23B, the structure of the semiconductor device described in this embodiment is not limited to this example.

The insulator 166 is formed over the conductor 164 and the insulator 162, and the insulator 168 is formed over the insulator 166. The conductor 170a and the conductor 170b are formed over the insulator 168. The conductor 170a and the conductor 170b are electrically connected to the conductor 158a and the conductor 158b through openings formed in the insulator 156c, the insulator 162, the insulator 166, and the insulator 168.

Here, at least part of the insulator 166 is in contact with a top surface of the insulator 154. As illustrated in FIG. 23B, the insulator 166 is preferably formed to cover the insulator 156a, the semiconductor 156b, the insulator 156c, the conductor 158a, the conductor 158b, and the insulator 162. It is preferable that the insulator 166 be in contact with the insulator 154 in a region where the insulator 154 does not overlap with the insulator 156a, the semiconductor 156b, the insulator 156c, the conductor 158a, the conductor 158b, and the insulator 162, e.g., a region outside the insulator 156a, the semiconductor 156b, and the insulator 156c in FIG. 23A.

<Semiconductor 2>

The structure of the semiconductor 156b is described in detail below. In this section, the structures of the insulator 156a and the insulator 156c are described in addition to the structure of the semiconductor 156b. The insulator 156a, the semiconductor 156b, and the insulator 156c can correspond to the above-described insulator 106a, semiconductor 106b, and insulator 106c.

The semiconductor 156b is an oxide semiconductor containing indium, for example. The semiconductor 156b can have high carrier mobility (electron mobility) by containing indium, for example. The semiconductor 156b preferably contains an element M. The element M is preferably Ti, Ga, Y, Zr, La, Ce, Nd, Sn, or Hf. Note that two or more of the above elements may be used in combination as the element M in some cases. The element M is an element having high bonding energy with oxygen, for example. The element M is an element whose bonding energy with oxygen is higher than that of indium, for example. The element M is an element that can increase the energy gap of the oxide semiconductor, for example. Furthermore, the semiconductor 156b preferably contains zinc. When the oxide semiconductor contains zinc, the oxide semiconductor is easily crystallized, in some cases.

Note that the semiconductor 156b is not limited to the oxide semiconductor containing indium. The semiconductor 156b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For example, the insulator 156a and the insulator 156c are oxide semiconductors including one or more elements, or two or more elements other than oxygen included in the semiconductor 156b. Since the insulator 156a and the insulator 156c each include one or more elements, or two or more elements other than oxygen included in the semiconductor 156b, a defect state is less likely to be formed at the interface between the insulator 156a and the semiconductor 156b and the interface between the semiconductor 156b and the insulator 156c.

The insulator 156a, the semiconductor 156b, and the insulator 156c preferably include at least indium. In the case of using an In-M-Zn oxide as the insulator 156a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 156b, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the insulator 156c, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the insulator 156c may be an oxide that is of the same type as the oxide of the insulator 156a. Note that the insulator 156a and/or the insulator 156c do/does not necessarily contain indium in some cases. For example, the insulator 156a and/or the insulator 156c may be gallium oxide or a Ga—Zn oxide. Note that the atomic ratio between the elements included in the insulator 156a, the semiconductor 156b, and the insulator 156c is not necessarily a simple integer ratio.

In the case of deposition using a sputtering method, typical examples of the atomic ratio between the metal elements of a target that is used for the insulator 156a include In:M:Zn=1:2:4, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, In:M:Zn=1:6:9, and In:M:Zn=1:10:1. The atomic ratio between the metal elements of the target that is used for the insulator 156a may be M:Zn=10:1.

In the case of deposition using a sputtering method, typical examples of the atomic ratio between the metal elements of a target that is used for the semiconductor 156b include In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, and In:M:Zn=5:1:7. In particular, when a sputtering target containing In, Ga, and Zn at an atomic ratio of 4:2:4.1 is used, the deposited semiconductor 156b may contain In, Ga, and Zn at an atomic ratio of around 4:2:3.

In the case of deposition using a sputtering method, typical examples of the atomic ratio between the metal elements of the target that is used for the insulator 156c include In:M:Zn=1:2:4, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, In:M:Zn=1:6:9, and In:M:Zn=1:10:1. The atomic ratio between the metal elements of the target that is used for the insulator 156c may be M:Zn=10:1.

An indium gallium oxide has small electron affinity and a high oxygen-blocking property. Therefore, the insulator 156c preferably includes an indium gallium oxide. The gallium atomic ratio [Ga/(In+Ga)] is, for example, higher than or equal to 70%, preferably higher than or equal to 80%, further preferably higher than or equal to 90%.

For the semiconductor 156b, an oxide with a wide energy gap may be used, for example. For example, the energy gap of the semiconductor 156b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV. Here, the energy gap of the insulator 156a is larger than that of the semiconductor 156b. The energy gap of the insulator 156c is larger than that of the semiconductor 156b.

As the semiconductor 156b, an oxide having an electron affinity larger than those of the insulators 156a and 156c is used. For example, as the semiconductor 156b, an oxide having an electron affinity larger than those of the insulators 156a and 156c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the conduction band minimum. In other words, the energy level of the conduction band minimum of the insulator 156a is closer to the vacuum level than the energy level of the conduction band minimum of the semiconductor 156b is. The energy level of the conduction band minimum of the insulator 156c is closer to the vacuum level than the energy level of the conduction band minimum of the semiconductor 156b is.

By applying gate voltage at this time, a channel is formed in the semiconductor 156b having the largest electron affinity among the insulator 156a, the semiconductor 156b, and the insulator 156c.

The insulator 156a and the insulator 156c are formed using a substance that can function as a conductor, a semiconductor, or an insulator when they are used alone. However, when the transistor is formed by stacking the semiconductor 156b, electrons flow in the semiconductor 156b, in the vicinity of an interface between the semiconductor 156b and the insulator 156a, and in the vicinity of an interface between the semiconductor 156b and the insulator 156c, and some regions of the insulators 156a and 156c do not serve as a channel of the transistor. For that reason, in the present specification and the like, the insulators 156a and 156c are not referred to as semiconductors but insulators. Note that the reason why the insulator 156a and the insulator 156c are each referred to as an insulator is because they are closer to an insulator than the semiconductor 156b is in terms of their functions in a transistor, and the substance that can be used for the semiconductor 156b is used for the insulator 156a and the insulator 156c in some cases.

Here, in some cases, there is a mixed region of the insulator 156a and the semiconductor 156b between the insulator 156a and the semiconductor 156b. Furthermore, in some cases, there is a mixed region of the semiconductor 156b and the insulator 156c between the semiconductor 156b and the insulator 156c. The mixed region has a low density of defect states. For that reason, in the stack including the insulator 156a, the semiconductor 156b, and the insulator 156c, energy is changed continuously at each interface and in the vicinity of the interface (continuous junction). Note that boundaries of the insulator 156a, the semiconductor 156b, and the insulator 156c are not clear in some cases.

At this time, electrons move mainly in the semiconductor 156b, not in the insulator 156a and the insulator 156c. As described above, when the density of defect states at the interface between the insulator 156a and the semiconductor 156b and the density of defect states at the interface between the semiconductor 156b and the insulator 156c are decreased, electron movement in the semiconductor 156b is less likely to be inhibited and the on-state current of the transistor can be increased.

As factors in inhibiting electron movement are decreased, the on-state current of the transistor can be increased. For example, in the case where there is no factor in inhibiting electron movement, electrons are assumed to be efficiently moved. Electron movement is inhibited, for example, in the case where physical unevenness of the channel formation region is large.

Moreover, the thickness of the insulator 156c is preferably as small as possible to increase the on-state current of the transistor. It is preferable that the thickness of the insulator 156c is smaller than that of the insulator 156a and smaller than that of the semiconductor 156b. For example, the insulator 156c is formed to include a region having a thickness of less than 10 nm, preferably less than or equal to 5 nm, further preferably less than or equal to 3 nm. Meanwhile, the insulator 156c has a function of blocking entry of elements other than oxygen (such as hydrogen and silicon) included in the adjacent insulator into the semiconductor 156b where a channel is formed. For this reason, it is preferable that the insulator 156c have a certain thickness. For example, the insulator 156c is formed to include a region having a thickness of greater than or equal to 0.3 nm, preferably greater than or equal to 1 nm, further preferably greater than or equal to 2 nm. The insulator 156c preferably has an oxygen blocking property to suppress outward diffusion of oxygen released from the insulator 154 and the like.

To improve reliability, preferably, the thickness of the insulator 156a is large and the thickness of the insulator 156c is small. For example, the insulator 156a includes a region with a thickness of, for example, greater than or equal to 10 nm, preferably greater than or equal to 20 nm, further preferably greater than or equal to 40 nm, still further preferably greater than or equal to 60 nm. When the thickness of the insulator 156a is made large, a distance from an interface between the adjacent insulator and the insulator 156a to the semiconductor 156b in which a channel is formed can be large. Since the productivity of the semiconductor device might be decreased, the insulator 156a has a region with a thickness of, for example, less than or equal to 200 nm, preferably less than or equal to 120 nm, further preferably less than or equal to 80 nm.

For example, a region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 156b and the insulator 156a. A region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 156b and the insulator 156c.

It is preferable to reduce the hydrogen concentration in the insulator 156a and the insulator 156c in order to reduce the hydrogen concentration in the semiconductor 156b. The insulator 156a and the insulator 156c each include a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. It is preferable to reduce the nitrogen concentration in the insulator 156a and the insulator 156c in order to reduce the nitrogen concentration in the semiconductor 156b. The insulator 156a and the insulator 156c each include a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$.

As illustrated in FIG. 23B, regions of the semiconductor 156b and the like that are in contact with the conductor 158a and the conductor 158b (which are denoted with dotted lines in FIG. 23B) include a low-resistance region 159a and a low-resistance region 159b in some cases. The low-resistance region 159a and the low-resistance region 159b are mainly formed when oxygen is extracted by the conductor 158a and the conductor 158b that are in contact with the semiconductor 156b, or when a conductive material in the conductor 158a or the conductor 158b is bonded to an element in the semiconductor 156b. The formation of the low-resistance region 159a and the low-resistance region 159b leads to a reduction in contact resistance between the conductor 158a or 158b and the semiconductor 156b, whereby the transistor 50 can have high on-state current.

A low-resistance region is sometimes formed in regions of the insulator 156a that are in contact with the conductor 158a or the conductor 158b. In the following drawings, a dotted line denotes a low-resistance region.

As in the case illustrated in FIG. 1D, the semiconductor 156b might have a smaller thickness in a region between the conductor 158a and the conductor 158b than in regions overlapping with the conductor 158a and the conductor 158b.

Note that the above-described three-layer structure is an example. For example, a two-layer structure formed by omitting the insulator 156a or the insulator 156c may be employed. A four-layer structure in which any one of the semiconductors described as examples of the insulator 156a, the semiconductor 156b, and the insulator 156c is provided under or over the insulator 156a or under or over the insulator 156c may be employed. An n-layer structure (n is an integer of 5 or more) in which any one of the semiconductors described as examples of the insulator 156a, the semiconductor 156b, and the insulator 156c is provided at two or more of the following positions: over the insulator 156a, under the insulator 156a, over the insulator 156c, and under the insulator 156c.

Like the insulator 106a, the semiconductor 106b, and the insulator 106c, the insulator 156a, the semiconductor 156b, and the insulator 156c are preferably formed using a CAAC-OS. As already described above, the CAAC-OS is an oxide semiconductor having small numbers of impurities and oxygen vacancies and low carrier density (specifically, lower than $8\times10^{11}/cm^3$, preferably lower than $1\times10^{11}/cm^3$, or further preferably lower than $1\times10^{10}/cm^3$, and is higher than or equal to $1\times10^{-9}/cm^3$). A CAAC-OS has a low impurity concentration and a low density of defect states. Thus, the CAAC-OS can be referred to as an oxide semiconductor having stable characteristics.

Thus, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Substrate, Insulator, and Conductor 2>

Components other than the semiconductor of the transistor 50 are described in detail below.

As the substrate 150, a substrate similar to the above-described substrate 100 can be used.

As the insulator 151, an insulator having a function of blocking hydrogen or water is used. Hydrogen and water in the insulator that is provided in the vicinity of the insulator 156a, the semiconductor 156b, and the insulator 156c cause carriers to be generated in the insulator 156a, the semiconductor 156b, and the insulator 156c, which are oxide semiconductors. As a result, the reliability of the transistor 50 might decrease. Particularly when the substrate 150 is a substrate that is provided with a silicon-based semiconductor element such as a switching element, hydrogen used to terminate a dangling bond in the semiconductor element might be diffused to the transistor 50. In that case, the insulator 151 that has a function of blocking hydrogen or water can inhibit diffusion of hydrogen or water from below the transistor 50, increasing the reliability of the transistor 50.

The insulator 151 preferably has a function of blocking oxygen. When oxygen diffused from the insulator 154 is blocked by the insulator 151, oxygen can be effectively supplied from the insulator 154 to the insulator 156a, the semiconductor 156b, and the insulator 156c. The insulator 151 can be formed using an insulator similar to that of the above-described insulator 101.

At least part of the conductor 152 preferably overlaps with the semiconductor 156b in a region positioned between the conductor 158a and the conductor 158b. The conductor 152 functions as a back gate of the transistor 50. The conductor 152 can control the threshold voltage of the transistor 50. Although the transistor 50 includes the conductor 152, the structure of the semiconductor device described in this embodiment is not limited to this example.

The conductor 152 can be formed using a conductor similar to that of the above-described conductor 102.

The insulator 153 is provided to cover the conductor 152. The insulator 153 preferably has a function of blocking oxygen. Providing the insulator 153 can prevent oxidation of the conductor 152, or extraction of oxygen from the insulator 154 by the conductor 152. Accordingly, oxygen can be effectively supplied from the insulator 154 to the insulator 156a, the semiconductor 156b, and the insulator 156c. By improving the coverage with the insulator 153, extraction of oxygen from the insulator 154 can be further reduced and oxygen can be more effectively supplied from the insulator 154 to the insulator 156a, the semiconductor 156b, and the insulator 156c.

The insulator 153 can be formed using an insulator similar to that of the above-described insulator 103.

In the case where a conductor such as a wiring is provided in the same layer as the conductor 152, the insulator 153 is preferably formed to cover the conductor.

In the case where the conductor 152 is not provided, the insulator 153 is not necessarily provided. When the insulator 153 is not provided, it is preferable that the insulator 151 have a function of blocking oxygen.

The insulator 154 is preferably an insulator containing excess oxygen. Such insulator 154 makes it possible to supply oxygen from the insulator 154 to the insulator 156a, the semiconductor 156b, and the insulator 156c. The supplied oxygen can reduce oxygen vacancies which are to be defects in the insulator 156a, the semiconductor 156b, and the insulator 156c which are oxide semiconductors. As a result, the insulator 156a, the semiconductor 156b, and the insulator 156c can be oxide semiconductors with a low density of defect states and stable characteristics.

The insulator 154 can be formed using an insulator similar to that of the above-described insulator 104.

The insulator 154 including excess oxygen releases oxygen molecules, the number of which is greater than or equal to $1.0\times10^{14}$ molecules/cm² and less than or equal to $1.0\times10^{16}$ molecules/cm², preferably greater than or equal to $1.0\times10^{15}$ molecules/cm² and less than or equal to $5.0\times10^{15}$ molecules/cm² in thermal desorption spectroscopy (TDS) analysis in the range of surface temperatures of 100° C. to 700° C. or 100° C. to 500° C.

Furthermore, the insulator from which oxygen is released by heat treatment may contain a peroxide radical. Specifically, the spin density attributed to the peroxide radical is greater than or equal to $5\times10^{17}$ spins/cm³. Note that the insulator containing a peroxide radical may have an asymmetric signal with a g factor of approximately 2.01 in ESR.

Note that the top surface of the insulator 154 preferably includes few defects or few elements serving as impurities for the above oxide semiconductor. Since the top surface of the insulator 154 is an interface between the insulator 154 and the insulator 156a, the top surface including many impurities or defects causes an increase in the density of defect states at the interface between the insulator 154 and the insulator 156a.

The insulator 154 may have a function of preventing diffusion of impurities from the substrate 150. The insulator 154 may be an insulator that has a hydrogen trap.

The conductors 158a and 158b serve as a source electrode and a drain electrode of the transistor 50. The conductors 158a and 158b can be formed using a conductor similar to that of the conductors 108a and 108b.

Here, it is preferable that the bottom surfaces of the conductors 158a and 158b not be in contact with the top surface of the insulator 154. For example, the bottom surfaces of the conductors 158a and 158b are in contact with only the top surface of the semiconductor 156b as illustrated in FIG. 23B. This structure can inhibit extraction of oxygen from the insulator 154 at the bottom surfaces of the conductors 158a and 158b. Accordingly, the conductors 158a and 158b can be prevented from being partly oxidized to have increased resistivity, and oxygen can be effectively supplied from the insulator 154 to the insulator 156a, the semiconductor 156b, and the insulator 156c.

At least part of the conductors 158a and 158b preferably overlaps with the insulator 162 with the insulator 156c provided therebetween in a region not overlapping with the conductor 164. For example, the insulator 156c covers most of the top surfaces of the conductors 158a and 158b as illustrated in FIG. 23B. This structure can inhibit extraction of oxygen from the insulator 162 at the top surfaces of the conductors 158a and 158b. Accordingly, the conductors 158a and 158b can be prevented from being partly oxidized to have increased resistivity, and oxygen can be effectively supplied from the insulator 162 to the insulator 156a, the semiconductor 156b, and the insulator 156c.

The insulator 162 functions as a gate insulating film of the transistor 50. Like the insulator 154, the insulator 162 may be an insulator containing excess oxygen. Such insulator 162 makes it possible to supply oxygen from the insulator 162 to the insulator 156a, the semiconductor 156b, and the insulator 156c. The insulator 162 can be formed using an insulator similar to that of the above-described insulator 112.

The conductor 164 functions as a gate electrode of the transistor 50. The conductor 164 can be formed using the conductor that can be used for the conductor 152. Note that the surface of the conductor 164 and the vicinity of the surface sometimes include a region with an oxygen concentration higher than that of the conductor 164 on the insulator 162 side.

Here, as illustrated in FIG. 23C, the semiconductor 156b can be electrically surrounded by an electric field of the conductor 152 and the conductor 164. That is, the transistor 50 has an s-channel structure like the transistor 10. Therefore, a channel is formed in the entire semiconductor 156b (the top, bottom, and side surfaces). In the s-channel structure, a large amount of current can flow between a source and a drain of a transistor, so that a high on-state current can be obtained.

In the case where the transistor has the s-channel structure, a channel is formed also in the side surface of the semiconductor 156b. Therefore, as the semiconductor 156b has a larger thickness, the channel region becomes larger. In other words, the thicker the semiconductor 156b is, the larger the on-state current of the transistor is. In addition, when the semiconductor 156b is thicker, the proportion of the region with a high carrier controllability increases, leading to a smaller subthreshold swing value. For example, the semiconductor 156b has a region with a thickness greater than or equal to 10 nm, preferably greater than or equal to 20 nm, further preferably greater than or equal to 40 nm, still further preferably greater than or equal to 60 nm, yet still further preferably greater than or equal to 100 nm. Since the productivity of the semiconductor device might be decreased, the semiconductor 156b has a region with a thickness of, for example, less than or equal to 300 nm, preferably less than or equal to 200 nm, further preferably less than or equal to 150 nm. In some cases, when the channel formation region is reduced in size, electrical characteristics of the transistor with a smaller thickness of the semiconductor 156b may be improved. Therefore, the semiconductor 156b may have a thickness less than 10 nm.

The s-channel structure is suitable for a miniaturized transistor because a high on-state current can be achieved. A semiconductor device including the miniaturized transistor can have a high integration degree and high density. For example, the transistor includes a region having a channel length of preferably less than or equal to 40 nm, further preferably less than or equal to 30 nm, still further preferably less than or equal to 20 nm and a region having a channel width of preferably less than or equal to 40 nm, further preferably less than or equal to 30 nm, still further preferably less than or equal to 20 nm.

The insulators 166 and 168 function as interlayer insulating films of the transistor 50. Here, the thickness of the insulator 166 can be greater than or equal to 5 nm, or greater than or equal to 20 nm, for example. It is preferable that the insulator 166 be an insulator that transmits less oxygen than the insulator 154 and have a function of blocking oxygen. Providing the insulator 166 can prevent oxygen from being externally released to above the insulator 154 at the time of supply of oxygen from the insulator 154 to the insulator 156a, the semiconductor 156b, and the insulator 156c. Accordingly, oxygen can be effectively supplied from the insulator 154 to the insulator 156a, the semiconductor 156b, and the insulator 156c. Although details are described later, by forming the insulator 166 by a sputtering method or the like in an atmosphere containing oxygen, oxygen can be added to the insulator 154 at the time of the formation.

The insulator 166 may be formed to have a single-layer structure or a stacked-layer structure including an insulator containing, for example, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 166 preferably has a blocking effect against oxygen, hydrogen, water, alkali metal, alkaline earth metal, and the like. As such an insulator, for example, a nitride insulating film can be used. As examples of the nitride insulating film, a silicon nitride film, a silicon nitride oxide film, an aluminum nitride film, an aluminum nitride oxide film, and the like can be given. Note that instead of the nitride insulating film, an oxide insulating film having a blocking effect against oxygen, hydrogen, water, and the like, may be provided. As examples of the oxide insulating film, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Aluminum oxide is preferably used as the insulator 166 because it is highly effective in preventing transmission of both oxygen and impurities such as hydrogen and moisture. Since aluminum oxide can be easily deposited by a sputtering method, oxygen can be added to the insulator 154 at the time of deposition and can be diffused to the insulator 156a, the semiconductor 156b, and the insulator 156c through the insulator 154 and the like.

The insulator 166 functions as at least a film that does not easily transmit oxygen, and the oxide that can be used for the above-described insulator 156a or insulator 156c can also be used as the insulator 166. The insulator 166 is preferably formed using an oxide insulator containing In, such as an In—Al oxide, an In—Ga oxide, or an In—Ga—Zn oxide. An oxide insulator containing In can be favorably used for the insulator 166 because the number of particles generated at the time of the deposition by a sputtering method is small.

Figure 25A:
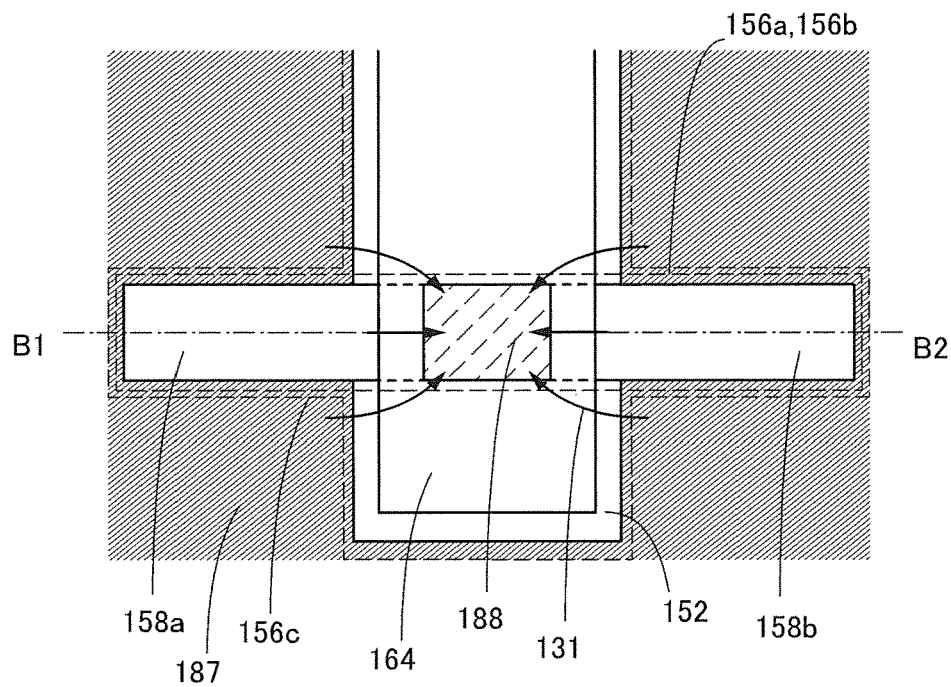
FIGS. 25A and 25B are a top view and a cross-sectional view illustrating a transistor of one embodiment of the present invention.
Figure 25B:
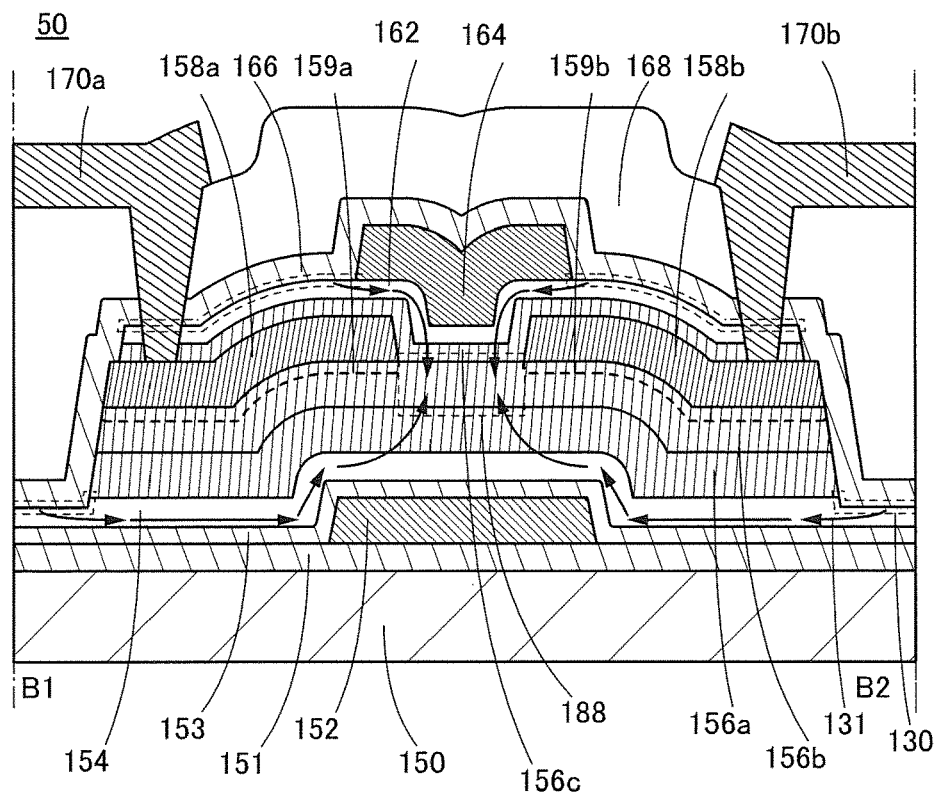

As described above, at least part of the insulator 166 is in contact with the top surface of the insulator 154. In the transistor 50 or the like, oxygen is added to a region of the insulator 154 that is in contact with the insulator 166, so that oxygen is diffused from the region to be supplied to the insulator 156a, the semiconductor 156b, and the insulator 156c. FIGS. 25A and 25B illustrate oxygen supply in the transistor 50. FIG. 25A is a top view of the transistor 50. FIG. 25B is a cross-sectional view along dashed-dotted line B1-B2 in FIG. 25A.

A hatched region outside the insulator 156c and the like in FIG. 25A is a region (region 187) where the top surface of the insulator 154 is in contact with the insulator 166. A region of the semiconductor 156b positioned between the conductor 158a and the conductor 158b in FIG. 25A is a channel formation region 188. Arrows in FIGS. 25A and 25B denote oxygen diffusion paths.

Figure 24A:
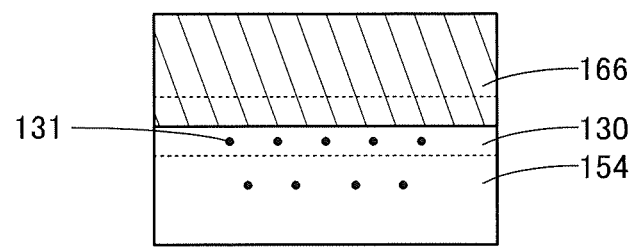
FIGS. 24A and 24B are cross-sectional views illustrating a transistor of one embodiment of the present invention.
Figure 24B:
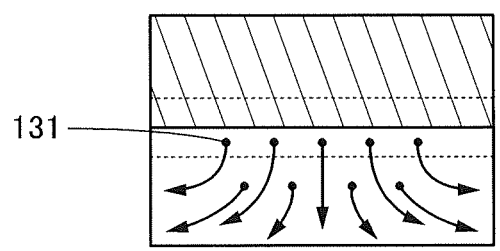

FIGS. 24A and 24B are enlarged views of the interface between the insulator 154 and the insulator 166 shown in FIG. 25B and the vicinity of the interface. The process in which oxygen is supplied through the insulator 154 to the insulator 156a, the semiconductor 156b, and the insulator 156c is described below. Note that in the following description, $SiO_x$ is given as a typical example of the insulator 154 (which is sometimes referred to as the insulator 154 ($SiO_x$)), and $AlO_x$ is given as a typical example of the insulator 166 (which is sometimes referred to as the insulator 166 ($AlO_x$)).

First, the insulator 166 ($AlO_x$) is formed over the insulator 154 ($SiO_x$) (see FIG. 24A). Here, it is preferable that the insulator 166 ($AlO_x$) be formed by a sputtering method and it is further preferable that the insulator 166 ($AlO_x$) be formed by a sputtering method in an atmosphere containing oxygen. When the insulator 166 ($AlO_x$) is formed by a sputtering method, oxygen 131 is added to a surface of the insulator 154 ($SiO_x$) and the vicinity of the surface (after the insulator 166 ($AlO_x$) is formed, the interface between the insulator 154 ($SiO_x$) and the insulator 166 ($AlO_x$) and the vicinity of the interface) at the same time as the formation. Although the oxygen 131 is added to the insulator 154 ($SiO_x$) as an oxygen radical here, for example, the state of the oxygen 131 at the time of being added is not limited thereto. The oxygen 131 may be added to the insulator 154 ($SiO_x$) as an oxygen atom, an oxygen ion, or the like. Note that by addition of the oxygen 131, oxygen in excess of the stoichiometric composition is contained in the insulator 154 ($SiO_x$) in some cases, and the oxygen 131 in such a case can be called excess oxygen.

In a region of the insulator 154 ($SiO_x$) that is in contact with the insulator 166 ($AlO_x$), a mixed region 130 is formed in some cases. The mixed region 130 contains both components of the insulator 154 ($SiO_x$) and components of the insulator 166 ($AlO_x$), so that the mixed region 130 can be represented by $AlSi_xO_y$. Since the mixed region 130 is formed in a region in the vicinity of the interface between the insulator 154 ($SiO_x$) and the insulator 166 ($AlO_x$), the concentration of the oxygen 131 is higher in the mixed region 130 than in the layer below the mixed region 130.

In this manner, oxygen 131 is added to the region 187 of the insulator 154 ($SiO_x$). The oxygen 131 added to the region 187 is diffused from the region 187 into the insulator 154 ($SiO_x$) by heat treatment (see FIG. 24B). At least during the heat treatment, the insulator 154 ($SiO_x$) has a sufficiently large interatomic distance in terms of diffusion of the oxygen 131 and can be regarded as, so to speak, being porous for the oxygen 131. For this reason, heat treatment performed on the insulator 154 ($SiO_x$) can diffuse the oxygen 131 very easily. The heat treatment here may be performed at a temperature higher than or equal to 250° C. and lower than or equal to 650° C., preferably higher than or equal to 350° C. and lower than or equal to 450° C., for example. The oxygen 131 can be thus diffused in the insulator 154 ($SiO_x$), mainly the mixed region 130 with a high concentration of the oxygen 131.

Here, the insulator 166 ($AlO_x$) is an insulator that transmits less oxygen than the insulator 154 ($SiO_x$) and functions as a barrier film that blocks oxygen. Because of the insulator 166 ($AlO_x$) formed over the insulator 154 ($SiO_x$), the oxygen 131 diffused in the insulator 154 ($SiO_x$) is not diffused to above the insulator 154 ($SiO_x$) but is diffused in the insulator 154 ($SiO_x$) mainly in the lateral direction or the downward direction. In this manner, the oxygen 131 diffused in the insulator 154 ($SiO_x$) is supplied to the insulator 156a, the semiconductor 156b, and the insulator 156c, or particularly, the channel formation region 188 of the semiconductor 156b.

The insulator 153 having a function of blocking oxygen covers the conductor 152, thereby preventing the oxygen 131 diffused in the insulator 154 from being extracted by the conductor 152. The insulator 153 or the insulator 151 has a function of blocking oxygen, thereby preventing the oxygen 131 diffused in the insulator 154 from being diffused to below the insulator 154. As a result, the oxygen 131 can be supplied to above the insulator 154, i.e., to the insulator 156a, the semiconductor 156b, and the insulator 156c.

Furthermore, the insulator 156a and the semiconductor 156b are formed between the bottom surfaces of the conductors 158a and 158b and the insulator 154 so that the conductors 158a and 158b are not in direct contact with the insulator 154, which can prevent the oxygen 131 diffused in the insulator 154 from being extracted by the conductors 158a and 158b.

When the conductor 152, the conductor 158a, and the conductor 158b of the transistor 50 are not in direct contact with the insulator 154 in which the oxygen 131 is diffused, it is possible to effectively supply the oxygen 131 to the insulator 156a, the semiconductor 156b, and the insulator 156c, or particularly, the channel formation region 188 of the semiconductor 156b.

In this manner, oxygen vacancies can be reduced by supplying the oxygen 131 to the insulator 156a, the semiconductor 156b, and the insulator 156c shown in FIGS. 23A to 23C. In the insulator 156a, the semiconductor 156b, and the insulator 156c, hydrogen is trapped in oxygen vacancies and a shallow donor level is formed. That is, by reducing oxygen vacancies, a highly purified intrinsic or substantially highly purified intrinsic oxide semiconductor can be obtained.

During heat treatment at 400° C. for 1 hour, the diffusion length of oxygen in the insulator 154 is estimated to be approximately 3 μm. For this reason, the distance between the region 187 and the channel formation region 188 is preferably 3 μm or less, further preferably 1 or less. Alternatively, the distance between the channel formation region 188 and the mixed region 130 formed in a region of the insulator 154 that is in contact with the insulator 166 is preferably 3 μm or less, further preferably 1 μm or less. Note that details of the diffusion length of oxygen are described later in Example.

Although the insulator 154 is regarded as a main oxygen diffusion path in the above description, the semiconductor device in this embodiment is not limited to the description. In some cases, the insulator 162 is the diffusion path of the oxygen 131. In the case where the insulator 162 serves as a diffusion path of the oxygen 131, the oxygen 131 is added to a region where the insulator 166 and the insulator 162 are in contact with each other, and is supplied from the region to the insulator 156c and the semiconductor 156b through the insulator 162. At this time, the insulator 156c formed in contact with the top surfaces of the conductor 158a and the conductor 158b can prevent the oxygen 131 diffused in the insulator 162 from being extracted by the conductor 158a and the conductor 158b. Furthermore, the mixed region 130 is formed in a region of the insulator 162 that is in contact with the insulator 166 in some cases.

Similarly to the diffusion length of oxygen in the insulator 154, during heat treatment at 400° C. for 1 hour, the diffusion length of oxygen in the insulator 162 is estimated to be approximately 3 µm. For this reason, the distance from the channel formation region 188 to a boundary between the conductor 164 and the insulator 166 that are on and in contact with the insulator 162 (or to the periphery of the conductor 164) is preferably 3 µm or less, further preferably 1 µm or less. Alternatively, the distance between the channel formation region 188 and the mixed region 130 formed in a region of the insulator 162 that is in contact with the insulator 166 is preferably 3 µm or less, further preferably 1 µm or less.

The insulator 168 can be formed using the insulator that can be used for the insulator 154.

The conductor 170a and the conductor 170b function as wirings electrically connected to the source electrode and the drain electrode of the transistor 50. As the conductor 170a and the conductor 170b, the conductor that can be used for the conductor 158a and the conductor 158b is used.

When the above-described structure is employed, a transistor with stable electrical characteristics, a transistor having a low leakage current in an off state, a transistor with high frequency characteristics, a transistor with normally-off electrical characteristics, a transistor with a small subthreshold swing value, or a highly reliable transistor can be provided.

Modification Example of Transistor 2

Modification examples of the transistor 50 are described below with reference to FIGS. 26A to 26D, FIGS. 27A to 27D, FIGS. 28A to 28D, FIGS. 29A to 29D, and FIGS. 30A to 30D. FIGS. 26A to 26D, FIGS. 27A to 27D, FIGS. 28A to 28D, FIGS. 29A to 29D, and FIGS. 30A to 30D are cross-sectional views in the channel length direction and those in the channel width direction like FIGS. 23B and 23C.

Figure 26A:
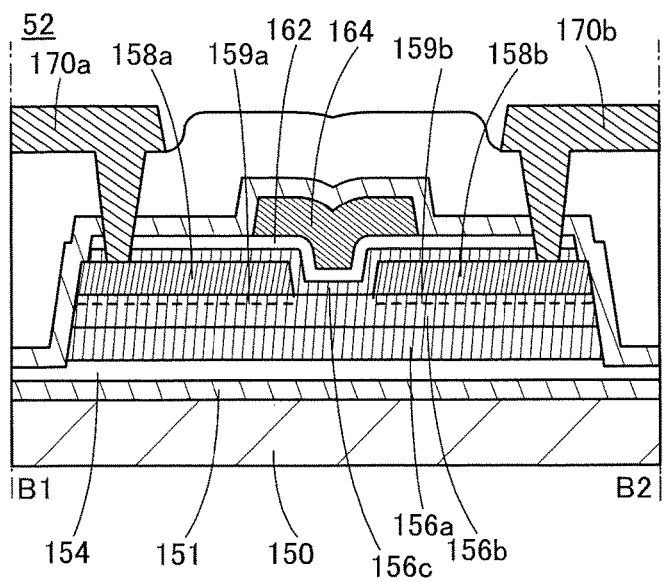
FIGS. 26A to 26D are cross-sectional views illustrating transistors of embodiments of the present invention.
Figure 26B:
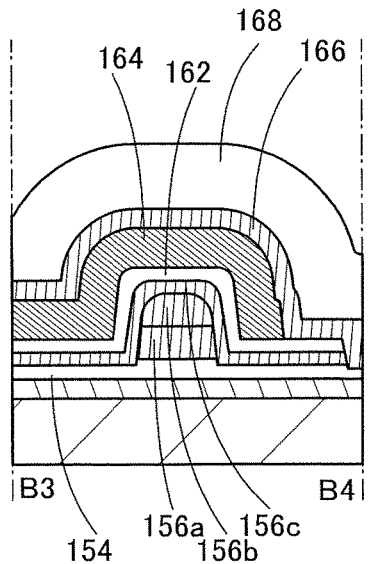

A transistor 52 shown in FIGS. 26A and 26B is different from the transistor 50 in that the conductor 152 and the insulator 153 are not provided. In that case, since the insulator 151 has a function of blocking oxygen, oxygen can be more effectively supplied from the insulator 154 to the insulator 156a, the semiconductor 156b, and the insulator 156c.

Figure 26C:
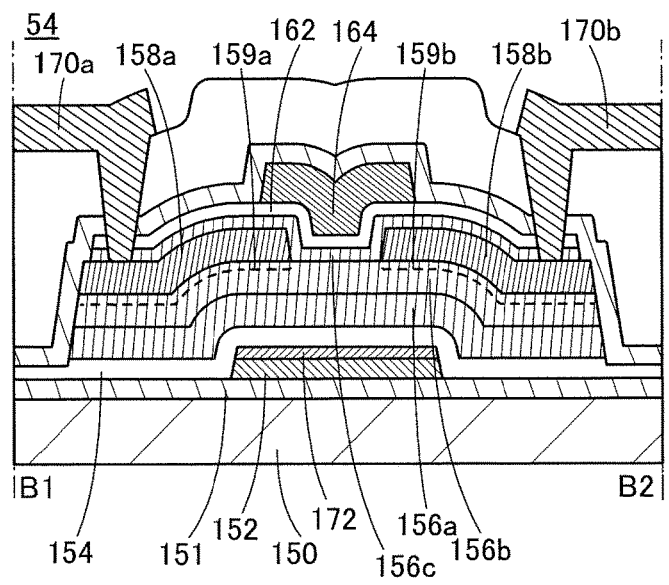
Figure 26D:
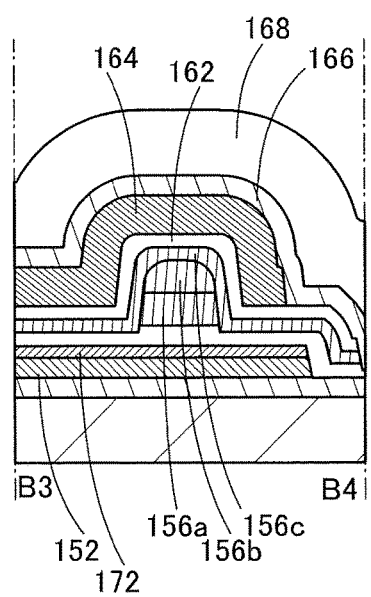

A transistor 54 shown in FIGS. 26C and 26D is different from the transistor 50 in that a conductor 172 is provided over the conductor 152 and the insulator 153 is not provided. The conductor 172 is preferably formed using a substance with high Gibbs free energy for oxidation. This structure can inhibit extraction of oxygen from the insulator 154 at the top surface of the conductor 152. Accordingly, even when the insulator 153 is not provided, the conductor 152 can be prevented from being partly oxidized to have increased resistivity, and oxygen can be effectively supplied to the insulator 156a, the semiconductor 156b, and the insulator 156c. The conductor 172 can be formed using a conductor similar to that of the conductor 110a and the conductor 110b.

Figure 27A:
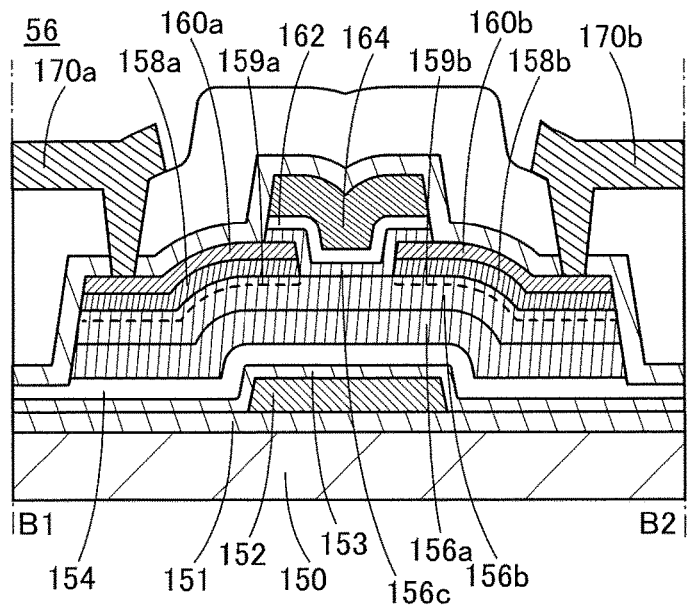
FIGS. 27A to 27D are cross-sectional views illustrating transistors of embodiments of the present invention.
Figure 27B:
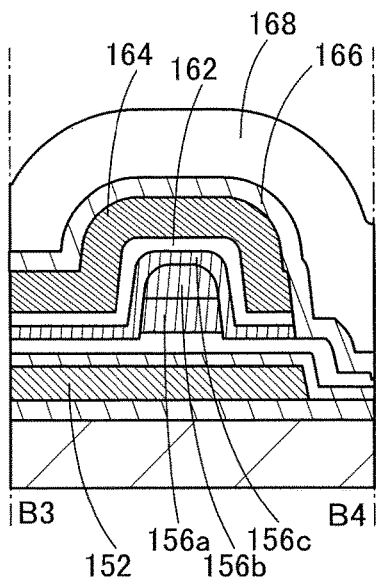

A transistor 56 illustrated in FIGS. 27A and 27B is different from the transistor 50 in that end portions of the conductor 164, the insulator 162, and the insulator 156c are substantially aligned, the conductor 160a is formed on and in contact with the conductor 158a, and the conductor 160b is formed on and in contact with the conductor 158b. This structure can inhibit extraction of oxygen from the insulator 166 at the top surfaces of the conductors 158a and 158b. Accordingly, the conductors 158a and 158b can be prevented from being partly oxidized to have increased resistivity, and oxygen can be effectively supplied to the insulator 156a, the semiconductor 156b, and the insulator 156c. The conductor 160a and the conductor 160b can be formed using a conductor similar to that of the conductor 110a and the conductor 110b.

Figure 27C:
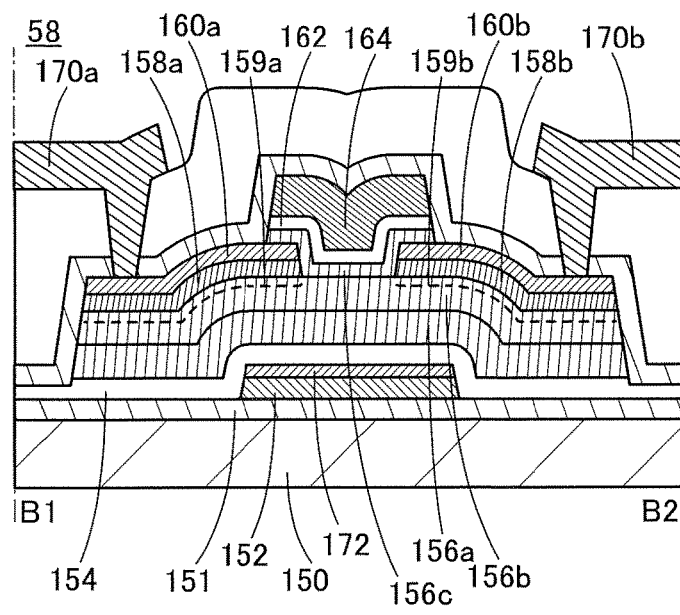
Figure 27D:
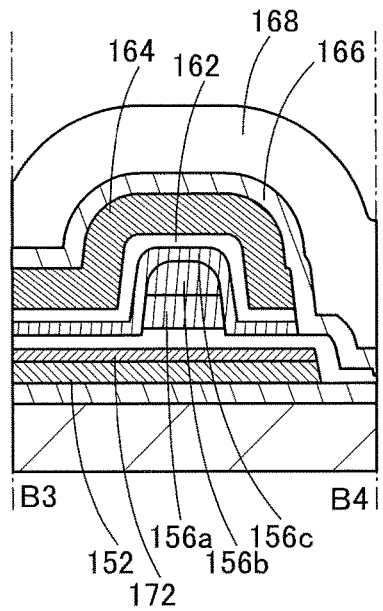

A transistor 58 shown in FIGS. 27C and 27D is different from the transistor 56 in that the conductor 172 is provided over the conductor 152 and the insulator 153 is not provided. This structure can inhibit extraction of oxygen from the insulator 154 at the top surface of the conductor 152. Accordingly, even when the insulator 153 is not provided, the conductor 152 can be prevented from being partly oxidized to have increased resistivity, and oxygen can be effectively supplied to the insulator 156a, the semiconductor 156b, and the insulator 156c.

Figure 28A:
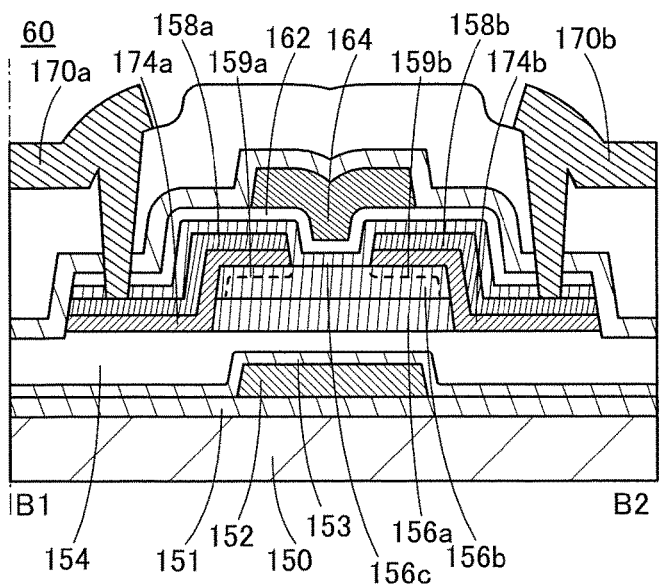
FIGS. 28A to 28D are cross-sectional views illustrating transistors of embodiments of the present invention.
Figure 28B:
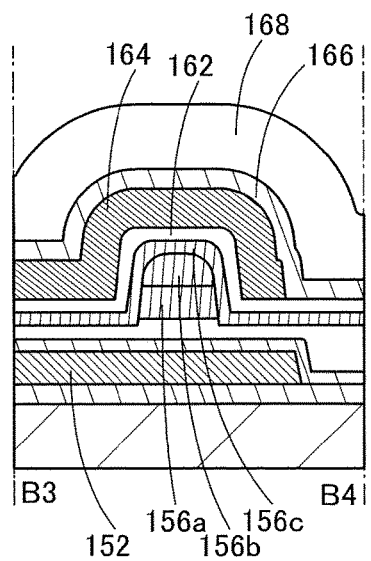

A transistor 60 illustrated in FIGS. 28A and 28B is different from the transistor 50 in that end portions of the conductor 158a and the conductor 158b extend beyond end portions of the insulator 156a and the semiconductor 156b in the channel width direction, a conductor 174a is formed in contact with the bottom surface of the conductor 158a, and a conductor 174b is formed in contact with the bottom surface of the conductor 158b. The conductor 174a and the conductor 174b can be formed using a conductor similar to that of the conductor 110a and the conductor 110b. This structure can inhibit extraction of oxygen from the insulator 154 at the bottom surfaces of the conductors 158a and 158b. Accordingly, the conductors 158a and 158b can be prevented from being partly oxidized to have increased resistivity, and oxygen can be effectively supplied to the insulator 156a, the semiconductor 156b, and the insulator 156c.

Figure 28C:
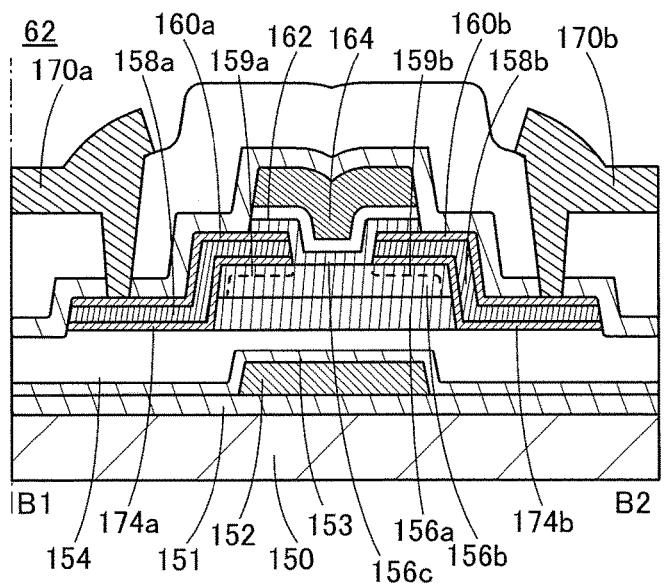
Figure 28D:
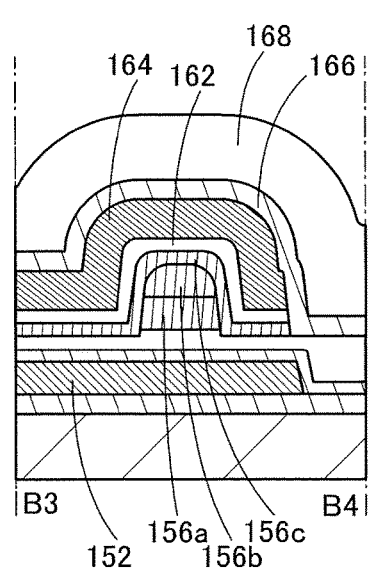

A transistor 62 illustrated in FIGS. 28C and 28D is different from the transistor 60 in that end portions of the conductor 164, the insulator 162, and the insulator 156c are substantially aligned, the conductor 160a is formed in contact with the top surface of the conductor 158a, and the conductor 160b is formed in contact with the top surface of the conductor 158b. This structure can inhibit extraction of oxygen from the insulator 166 and the insulator 154 at the top surfaces and the bottom surfaces of the conductors 158a and 158b. Accordingly, the conductors 158a and 158b can be prevented from being partly oxidized to have increased resistivity, and oxygen can be effectively supplied to the insulator 156a, the semiconductor 156b, and the insulator 156c. Furthermore, as in the transistor 62, the top surface of the insulator 154 may be subjected to CMP treatment or the like to improve planarity.

Figure 29A:
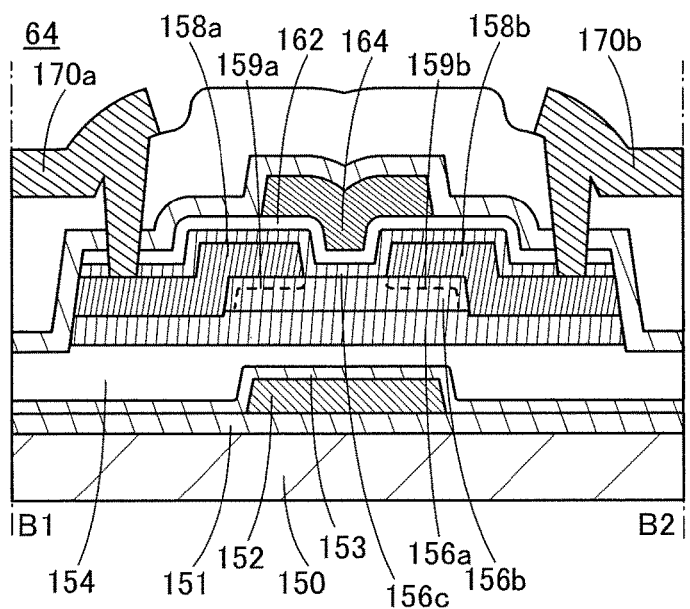
FIGS. 29A to 29D are cross-sectional views illustrating transistors of embodiments of the present invention.
Figure 29B:
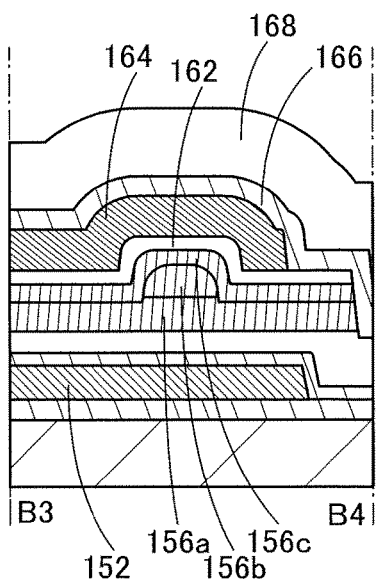

A transistor 64 illustrated in FIGS. 29A and 29B is different from the transistor 50 in that the conductor 158a and the conductor 158b are in contact with the top surface of the insulator 156a in a region not overlapping with the semiconductor 156b. Here, the conductor 158a and the conductor 158b are separated from the insulator 154. This structure can inhibit extraction of oxygen from the insulator 154 at the bottom surfaces of the conductor 158a and the conductor 158b. Accordingly, the conductor 158a and the conductor 158b can be prevented from being partly oxidized to have increased resistivity, and oxygen can be effectively supplied from the insulator 154 to the insulator 156a, the semiconductor 156b, and the insulator 156c.

Note that the insulator 156a might have a smaller thickness in a region not overlapping with the semiconductor 156b than in a region overlapping with the semiconductor 156b. This is because part of the top surface of the insulator 156a is sometimes removed at the time of formation of the semiconductor 156b.

Figure 29C:
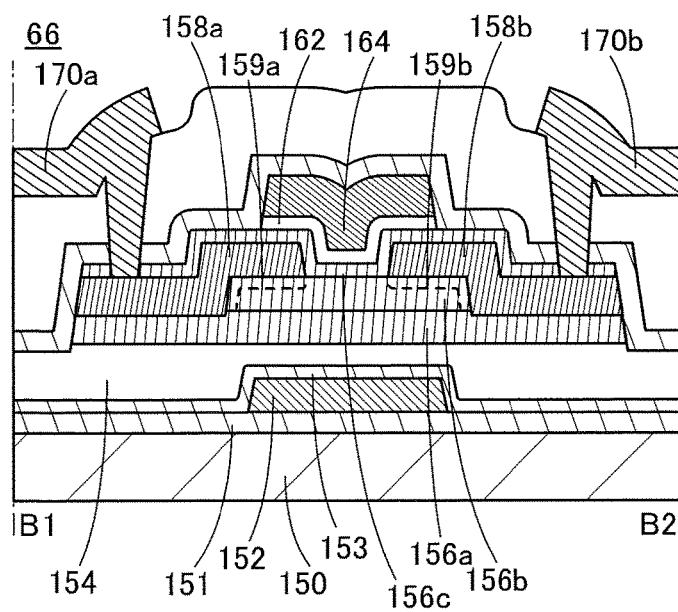
Figure 29D:
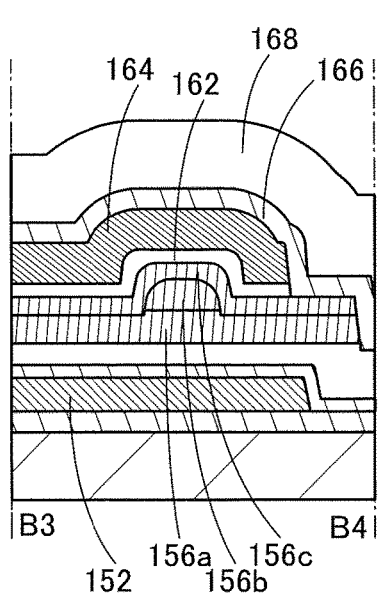

A transistor 66 shown in FIGS. 29C and 29D is different from the transistor 64 in that end portions of the conductor 164 and the insulator 162 are substantially aligned.

Figure 30A:
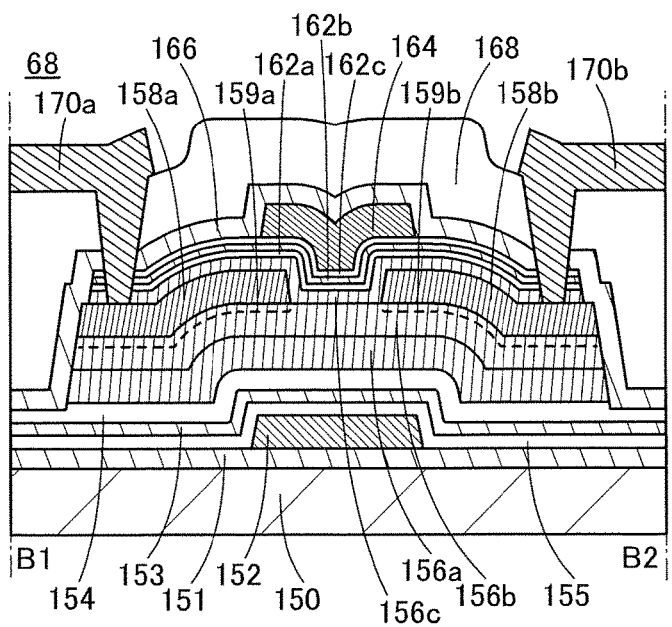
FIGS. 30A to 30D are cross-sectional views illustrating transistors of embodiments of the present invention.
Figure 30B:
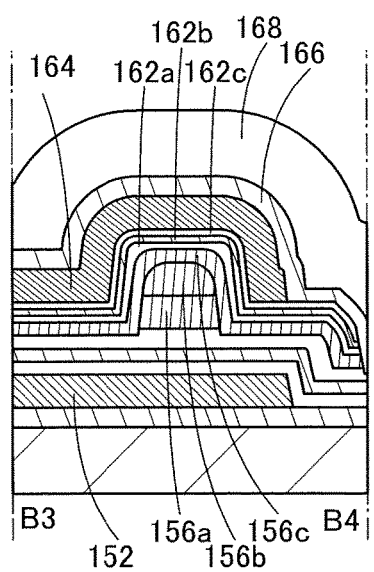

A transistor 68 shown in FIGS. 30A and 30B is different from the transistor 50 in that an insulator 155 is formed between the insulator 153, and the insulator 151 and the conductor 152 and the insulator 162 has a stacked-layer structure including insulators 162a to 162c. The insulator 155 can be formed using an insulator similar to that of the insulator 104. The insulator 162a and the insulator 162c can be formed using an insulator similar to that of the insulator 162 and the insulator 162b can be formed using an insulator similar to that of the insulator 153.

Here, of the insulators 162a to 162c, the insulator 162b preferably includes an electron trap region. The electron trap region has a function of trapping electrons. When the insulator 162a and the insulator 162c have a function of inhibiting release of electrons, the electrons trapped in the insulator 162b behave as if they are negative fixed charges. Thus, the insulator 162b has a function of a floating gate. Note that in some cases, a conductor or a semiconductor may be used instead of the insulator 162b. However, when the insulator 162b is used, release of trapped electrons can be inhibited in some cases.

Of the insulators 155, 153, and 154, the insulator 153 preferably includes an electron trap region. When the insulator 155 and the insulator 154 have a function of inhibiting release of electrons, the electrons trapped in the insulator 153 behave as if they are negative fixed charges. Thus, the insulator 153 has a function of a floating gate. Note that in some cases, a conductor or a semiconductor may be used instead of the insulator 153. However, when the insulator 153 is used, release of trapped electrons can be inhibited in some cases.

Note that the transistor 68 is not limited to the structure illustrated in FIGS. 30A and 30B and for example, may have a structure in which the insulator 162 in the transistor 50 is used instead of the stacked-layer structure including the insulators 162a to 162c.

Figure 30C:
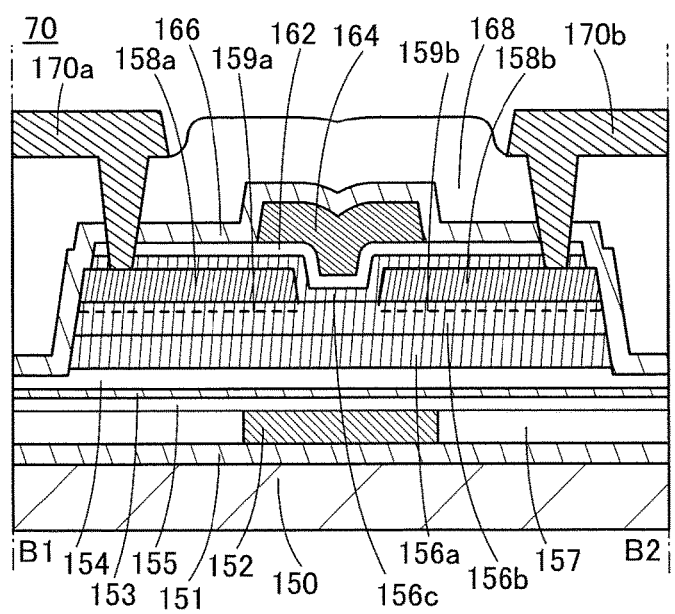
Figure 30D:
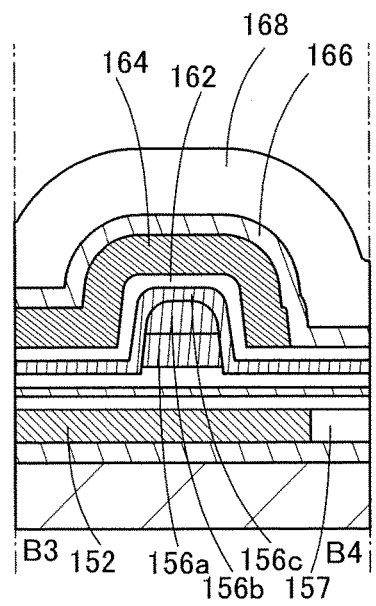

A transistor 70 illustrated in FIGS. 30C and 30D is different from the transistor 52 in that the conductor 152, the insulator 157, the insulator 155, and the insulator 153 are provided between the insulator 154 and the insulator 151. Here, the conductor 152 is formed to be embedded in an opening provided in the insulator 157, and the top surfaces of the conductor 152 and the insulator 157 are preferably planarized by CMP treatment or the like. The insulator 155 can be formed using an insulator similar to that of the insulator 104.

Of the insulators 155, 153, and 154, the insulator 153 preferably includes an electron trap region. When the insulator 155 and the insulator 154 have a function of inhibiting release of electrons, the electrons trapped in the insulator 153 behave as if they are negative fixed charges. Thus, the insulator 153 has a function of a floating gate. Note that in some cases, a conductor or a semiconductor may be used instead of the insulator 153. However, when the insulator 153 is used, release of trapped electrons can be inhibited in some cases.

<Fabrication Method of Transistor 2>

A method for manufacturing the transistor 50 is described below with reference to FIGS. 31A to 31H, FIGS. 32A to 32F, and FIGS. 33A to 33F.

First, the substrate 150 is prepared. Any of the above-mentioned substrates can be used for the substrate 150.

Next, the insulator 151 is formed. Any of the above-mentioned insulators can be used for the insulator 151. The insulator 151 can be formed by a sputtering method, a CVD method, an MBE method, a PLD method, an ALD method, or the like.

Next, a conductor to be the conductor 152 is formed. Any of the above-described conductors can be used for the conductor to be the conductor 152. The conductor can be formed by a sputtering method, a CVD method, an MBE method, a PLD method, an ALD method, or the like.

Figure 31A:
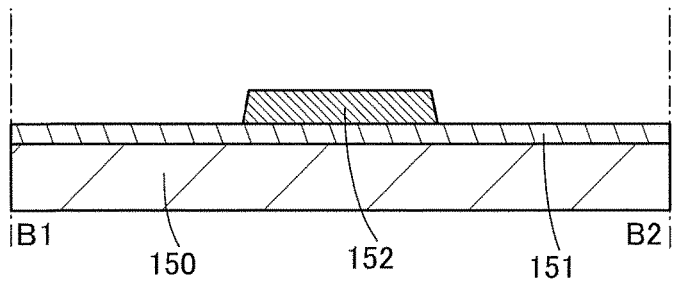
FIGS. 31A to 31H are cross-sectional views illustrating a method for manufacturing a transistor of one embodiment of the present invention.
Figure 31B:
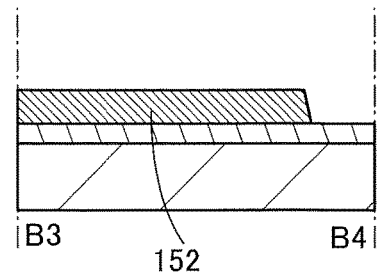

Next, a resist or the like is formed over the conductor and processing is performed using the resist, whereby the conductor 152 is formed (see FIGS. 31A and 31B).

Then, the insulator 153 is formed. Any of the above-described insulators can be used for the insulator 153. The insulator 153 can be formed by a sputtering method, a CVD method, an MBE method, a PLD method, an ALD method, or the like.

Figure 31C:
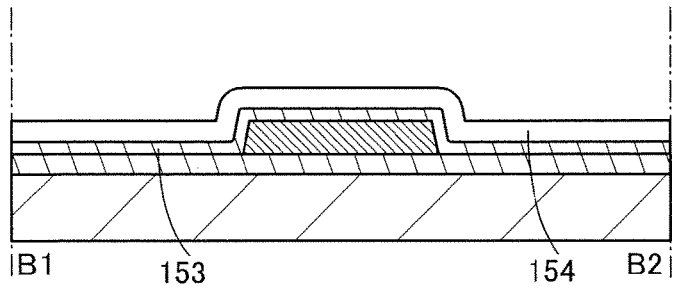
Figure 31D:
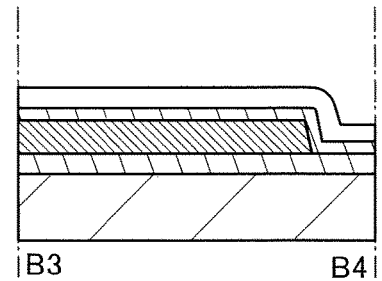

Then, the insulator 154 is formed (see FIGS. 31C and 31D). Any of the above-described insulators can be used for the insulator 154. The insulator 154 can be formed by a sputtering method, a CVD method, an MBE method, a PLD method, an ALD method, or the like. Note that when the insulator 154 is formed by a film formation method without plasma such as a thermal CVD method or an ALD method, the insulator 154 can be formed without causing plasma damage to the top surface thereof.

The top surface or the bottom surface of the semiconductor 156b to be formed later preferably has high planarity. Thus, to improve the planarity, the top surface of the insulator 154 may be subjected to planarization treatment such as CMP treatment as in the insulator 104 illustrated in FIGS. 18C and 18D.

Then, the insulator 176a is formed. Any of the above-described insulators and semiconductors that can be used for the insulator 156a can be used for the insulator 176a. The insulator 176a can be formed by a sputtering method, a CVD method, an MBE method, a PLD method, an ALD method, or the like.

Next, the semiconductor 176b is formed. Any of the above-described semiconductors that can be used for the semiconductor 156b can be used for the semiconductor 176b. The semiconductor 176b can be formed by a sputtering method, a CVD method, an MBE method, a PLD method, an ALD method, or the like. Note that successive film formation of the insulator 176a and the semiconductor 176b without exposure to the air can reduce entry of impurities into the films and their interface.

Next, heat treatment is preferably performed. The heat treatment can reduce the hydrogen concentration of the insulator 176a and the semiconductor 176b in some cases. The heat treatment can reduce oxygen vacancies in the insulator 176a and the semiconductor 176b in some cases. The heat treatment is performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment can increase the crystallinity of the insulator 176a and the semiconductor 176b and can remove impurities, such as hydrogen and water, for example. For the heat treatment, lamp heating can be performed with use of an RTA apparatus. Heat treatment with an RTA apparatus is effective for an improvement in productivity because it needs short time as compared with the case of using a furnace. By heat treatment, the peak intensity is increased and a full width at half maximum is decreased when a CAAC-OS is used for the insulator 176a and the semiconductor 176b. In other words, the crystallinity of a CAAC-OS is increased by heat treatment.

Figure 31E:
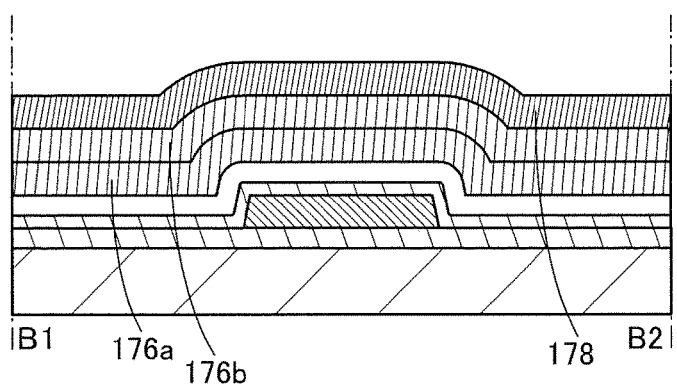
Figure 31F:
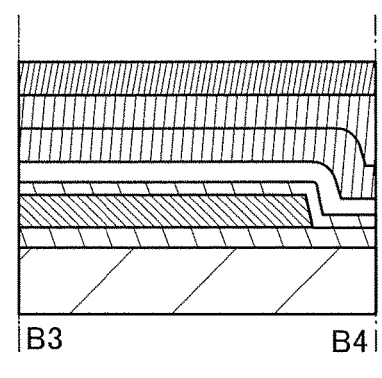

Next, the conductor 178 is formed (see FIGS. 31E and 31F). Any of the above-described conductors that can be used for the conductors 158a and 158b can be used for the conductor 178. The conductor 178 can be formed by a sputtering method, a CVD method, an MBE method, a PLD method, an ALD method, or the like.

Next, a resist or the like is formed over the conductor 178 and processing is performed using the resist, whereby the conductors 158a and 158b are formed.

Figure 31G:
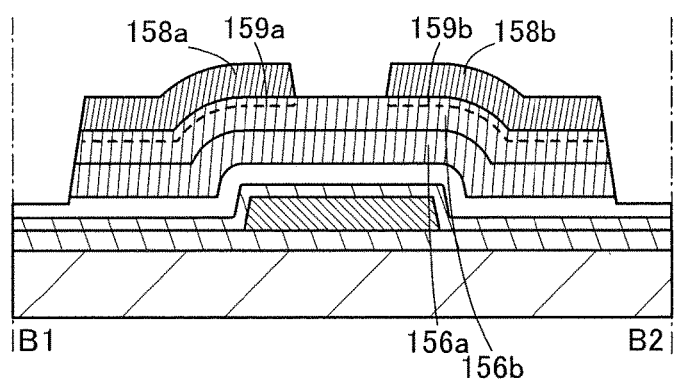
Figure 31H:
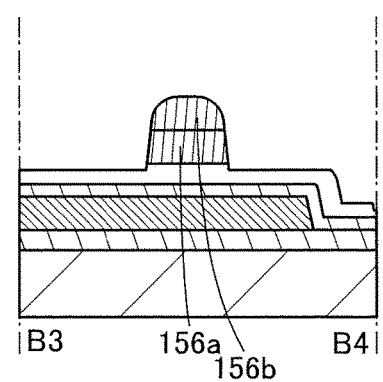

Next, a resist or the like is formed over the semiconductor 176b and processing is performed using the resist and the conductors 158a and 158b, whereby the insulator 156a and the semiconductor 156b are formed (see FIGS. 31G and 31H).

Here, regions of the semiconductor 156b that are in contact with the conductor 158a and the conductor 158b include the low-resistance region 159a and the low-resistance region 159b in some cases. The semiconductor 156b might have a smaller thickness in a region between the conductor 158a and the conductor 158b than in regions overlapping with the conductor 158a and the conductor 158b. This is because part of the top surface of the semiconductor 156b is sometimes removed at the time of the formation of the conductor 158a and the conductor 158b.

Note that after formation of the conductor 178, the insulator 176a, the semiconductor 176b, and the conductor 178 may be collectively processed to form the insulator 156a, the semiconductor 156b, and a conductor having a shape overlapping with the semiconductor 156b, and the conductor having the shape overlapping with the semiconductor 156b may be further processed to form the conductor 158a and the conductor 158b.

Next, heat treatment is preferably performed. The heat treatment can further reduce water or hydrogen in the insulator 153 and the insulator 154. In the transistor 68 illustrated in FIGS. 30A and 30B, for example, the heat treatment can further reduce water or hydrogen in the insulator 155 and the like. The heat treatment is performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The heat treatment is preferably performed in an inert gas atmosphere. The heat treatment may be performed in an atmosphere containing an oxidizing gas. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. For the heat treatment, lamp heating can be performed with use of an RTA apparatus. Heat treatment with an RTA apparatus is effective for an improvement in productivity because it needs short time as compared with the case of using a furnace.

Note that in the case where a semiconductor element layer is provided below the transistor 50, the heat treatment is preferably performed in a relatively low temperature range (e.g., higher than or equal to 350° C. and lower than or equal to 445° C.). For example, the temperature is preferably set lower than or equal to the highest heating temperature among the substrate heating temperatures for forming the insulator 153 and the insulator 154 (as well as the insulator 155, in the case of the transistor 68 in FIGS. 30A and 30B, for example).

As described above, heat treatment needs to be performed for dehydration, dehydrogenation, or oxygen vacancy reduction in the insulator 156a, the semiconductor 156b, the insulator 156c, and the like. However, a high-temperature heat treatment might degrade layers below the insulator 154. Specifically, in the case where the transistor 50 in this embodiment is stacked over a semiconductor element layer in which a semiconductor (e.g., silicon) different from the semiconductor 156b is an active layer, the heat treatment might damage or degrade elements, wirings, and the like included in the semiconductor element layer.

For example, in the case where the semiconductor element layer is formed over a silicon substrate, elements need to be reduced in resistance for miniaturization of the elements. To reduce the resistance, for example, a Cu wiring with low resistivity may be used for a wiring material, or nickel silicide may be provided in a source region and a drain region of the transistor to form the regions. On the other hand, a Cu wiring and nickel silicide have low heat resistance. For example, high-temperature heat treatment on a Cu wiring causes formation of a void or hillock or Cu diffusion. High-temperature heat treatment on nickel silicide expands the silicide region so that the source region and the drain region of the transistor are short-circuited.

Thus, the above-described heat treatment is preferably performed in a temperature range that does not degrade the semiconductor element layer in a lower layer. However, in the case where the insulator 154 contains much water and hydrogen at the time of being formed, such heat treatment in a temperature range that does not degrade the semiconductor element layer in the lower layer cannot remove the water, hydrogen, and the like sufficiently from the insulator 154 in some cases. Moreover, if heat treatment in such a temperature range is performed after formation of the insulator 156a, the semiconductor 156b, and the insulator 156c, water, hydrogen, and the like might be supplied from the insulator 154 to the semiconductor 156b and the like, forming defect states.

In contrast, when the heat treatment is performed at the stage where the insulator 156a and the semiconductor 156b are formed and a surface of the insulator 154 is exposed, as described above, it is possible to inhibit supply of water and hydrogen to the insulator 156a and the semiconductor 156b and to further reduce water or hydrogen in the insulator 154 and the insulator 153 (and the insulator 155 if it is formed). When water or hydrogen in the insulator 154 and the insulator 153 (and the insulator 155 if it is formed) is further reduced, heating at a relatively low temperature (e.g., higher than or equal to 350° C. and lower than or equal to 445° C.) can sufficiently remove water, hydrogen, and the like so that defect states can be prevented from being formed in the semiconductor 156b and the like. In this manner, it is possible to provide a highly reliable transistor.

Then, the insulator 176c is formed. Any of the above-described insulators or semiconductors that can be used for the insulator 156c can be used for the insulator 176c, for example. The insulator 176c can be formed by a sputtering method, a CVD method, an MBE method, a PLD method, an ALD method, or the like. Before the formation of the insulator 176c, surfaces of the semiconductor 156b, the conductor 158a, and the conductor 158b may be etched. For example, plasma containing a rare gas can be used for the etching. After that, the insulator 176c is successively formed without being exposed to the air, whereby impurities can be prevented from entering interfaces between the insulator 156c and the semiconductor 156b, the conductor 158a, and the conductor 158b. In some cases, impurities at an interface between films are diffused more easily than impurities in a film. For this reason, a reduction in impurity at the interfaces leads to stable electrical characteristics of a transistor.

Then, the insulator 182 is formed. Any of the above-described insulators that can be used for the insulator 162 can be used for the insulator 182. The insulator 182 can be formed by a sputtering method, a CVD method, an MBE method, a PLD method, an ALD method, or the like. Note that successive film formation of the insulator 176c and the insulator 182 without exposure to the air can reduce entry of impurities into the films and their interface.

Figure 32A:
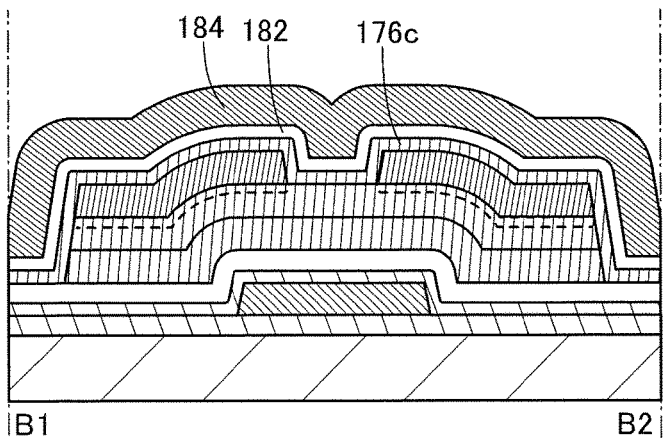
FIGS. 32A to 32F are cross-sectional views illustrating a method for manufacturing a transistor of one embodiment of the present invention.
Figure 32B:
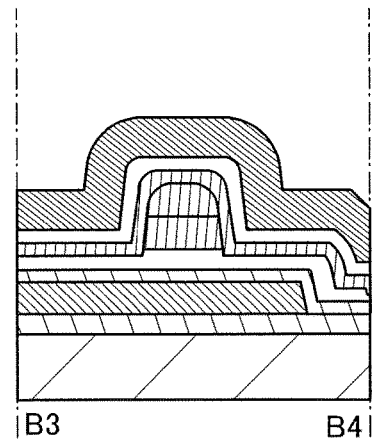

Next, the conductor 184 is formed (see FIGS. 32A and 32B). Any of the above-described conductors that can be used for the conductor 164 can be used for the conductor 184. The conductor 184 can be formed by a sputtering method, a CVD method, an MBE method, a PLD method, an ALD method, or the like. Note that successive film formation of the insulator 182 and the conductor 184 without exposure to the air can reduce entry of impurities into the films and their interface.

Next, a resist or the like is formed over the conductor 184 and processing is performed using the resist, whereby the conductor 164 is formed.

Figure 32C:
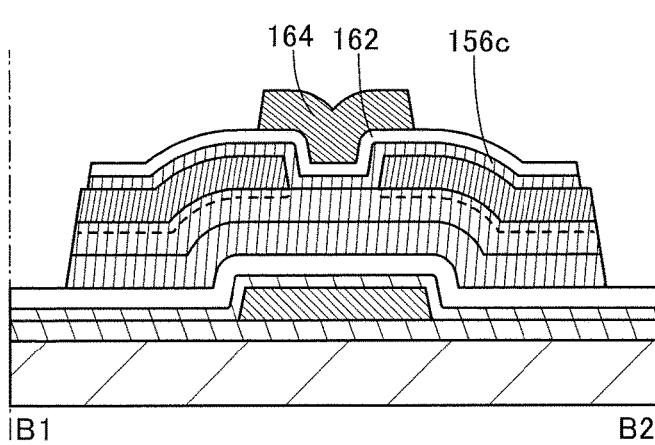
Figure 32D:
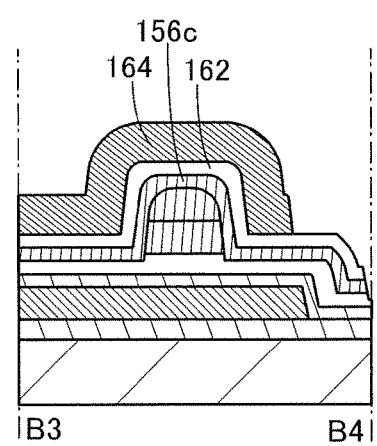

Then, a resist or the like is formed over the conductor 164 and the insulator 182 and processing is performed using the resist, whereby the insulator 156c and the insulator 162 are formed (see FIGS. 32C and 32D). Note that at this time, the insulator 156c and the insulator 162 may be formed to expose regions where the conductor 170a and the conductor 170b that are formed later are in contact with the conductor 158a and the conductor 158b.

Figure 32E:
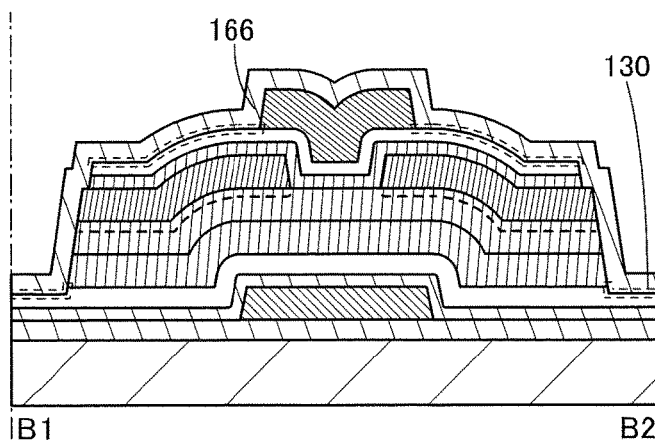
Figure 32F:
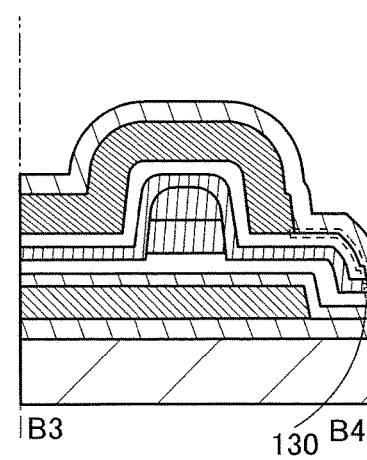

Then, the insulator 166 is formed (see FIGS. 32E and 32F). Any of the above-described insulators can be used for the insulator 166. The insulator 166 can be formed by a sputtering method, a CVD method, an MBE method, a PLD method, an ALD method, or the like.

Here, as the insulator 166, an oxide insulating film of aluminum oxide or the like having a blocking effect against oxygen, hydrogen, water, or the like is preferably provided. When the insulator 166 is formed by an ALD method, formation of a void at a projection (e.g., a side surface of the conductor 164) or the like can be inhibited and the insulator 166 with excellent coverage can be formed.

The insulator 166 may have a stacked-layer structure. For example, an aluminum oxide film may be formed by an ALD method to a thickness of approximately 5 nm to 10 nm, and then, an aluminum oxide film may be formed by an RF sputtering method with a higher deposition rate. In that case, the film with excellent coverage can be formed by an ALD method in the vicinity of the interface between the insulator 166, and the insulator 162 and the conductor 164, and the film thereover can be formed with high throughput. In the case where the insulator 166 has a stacked-layer structure as described above, after the first film is formed, oxygen ions may be added as described later, and then, the second film may be formed.

The insulator 166 is preferably formed by utilizing plasma, further preferably a sputtering method, still further preferably a sputtering method in an atmosphere containing oxygen. As the above sputtering method, a radio frequency (RF) sputtering method in which a high frequency power source is used as a sputtering power source, a reactive sputtering method in which a reactive gas atmosphere is used, or the like can be employed. A direct current (DC) sputtering method in which a DC power source is used as a sputtering power source, or a pulsed DC sputtering method in which a bias is applied in a pulsed manner may be used. A magnetron sputtering method using a magnet system inside a chamber, a bias sputtering method in which voltage is also applied to a substrate during deposition, or the like may be used.

Figure 33A:
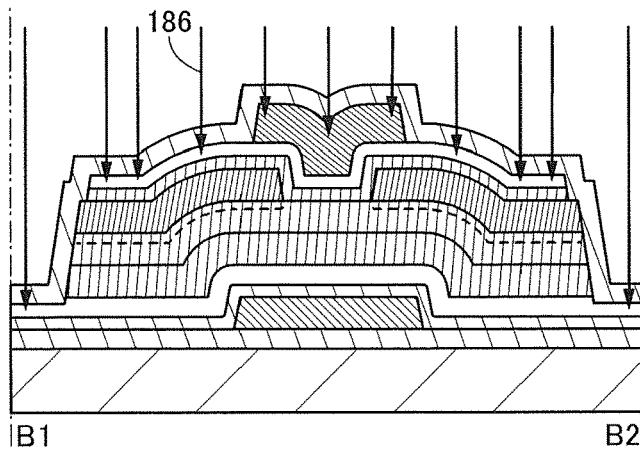
FIGS. 33A to 33F are cross-sectional views illustrating a method for manufacturing a transistor of one embodiment of the present invention.
Figure 33B:
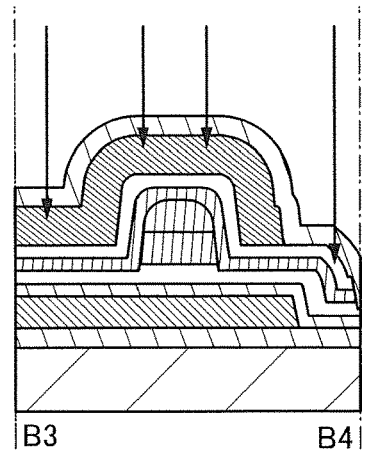

When the insulator 166 is formed by a sputtering method in an atmosphere containing oxygen, oxygen is added to a surface of the insulator 154 (or the insulator 162) and the vicinity of the surface (after the insulator 166 is formed, the interface between the insulator 154 (or the insulator 162) and the insulator 166 and the vicinity of the interface) at the same time as the formation. Although the oxygen is added to the insulator 154 (or the insulator 162) as an oxygen radical, for example, the state of the oxygen at the time of being added is not limited thereto. The oxygen may be added to the insulator 154 (or the insulator 162) as an oxygen atom, an oxygen ion, or the like. Note that by addition of oxygen, oxygen in excess of the stoichiometric composition is contained in the insulator 154 (or the insulator 162) in some cases, and the oxygen in such a case can be called excess oxygen. The oxygen gas flow rate or deposition power for sputtering can be set as appropriate in accordance with the amount of oxygen ions to be added. Furthermore, in the case where oxygen is contained in the insulator 154 (or the insulator 162) at the same time as formation of the insulator 166 as described above, addition of oxygen ions to be described below with reference to FIGS. 33A and 33B is not necessarily performed.

In the case where oxygen ions are added at the same time as formation of the insulator 166 by a sputtering method and the formation of the insulator 166 is performed in an atmosphere containing a rare gas such as argon, a rare gas such as argon is also added to the insulator 154 and the like. As a result, the insulator 154 has a higher concentration of a rare gas such as argon in the region 187 shown in FIGS. 25A and 25B than in the other regions (e.g., a region of the insulator 154 that overlaps with the channel formation region 188) in some cases.

In a region in the vicinity of the interface between the insulator 154 (or the insulator 162) and the insulator 166, the mixed region 130 is formed in some cases. Since the mixed region 130 is formed in the region in the vicinity of the interface between the insulator 154 (or the insulator 162) and the insulator 166, the concentration of the oxygen is higher in the mixed region 130 than in the layer below the mixed region 130.

The insulator 166 functions as at least a film that is less likely to transmit oxygen than the insulator 154, and the oxide that can be used for the above-described insulator 156a can also be used as the insulator 166. The insulator 166 is preferably formed using an oxide insulator containing In, such as an In—Al oxide, an In—Ga oxide, or an In—Ga—Zn oxide. When an oxide insulator containing In is deposited by a sputtering method or the like as the insulator 166, oxygen can be added to the insulator 154 as described above. An oxide insulator containing In can be favorably used for the insulator 166 because the number of particles generated at the time of the deposition by a sputtering method is small.

Next, oxygen ions 186 are added to pass through the insulator 166, whereby excess oxygen is contained in the insulator 154 (or the insulator 162) (see FIGS. 33A and 33B). An ion implantation method, an ion doping method, a plasma immersion ion implantation method, or the like can be used as a method for adding oxygen ions. The addition of oxygen ions may be performed by an ion implantation method at an acceleration voltage of greater than or equal to 2 kV and less than or equal to 10 kV at a dose of greater than or equal to $5 \times 10^{14}$ ions/cm$^2$ and less than or equal to $5 \times 10^{16}$ ions/cm$^2$, for example.

FIGS. 33A and 33B illustrate the case where the oxygen ions 186 are added in a normal direction of a plane surface of the substrate; however, the present invention is not limited to this structure. As already described with reference to FIGS. 22A and 22B, the oxygen ions 186 may be added at an angle with the normal of the plane surface of the substrate. The tilt angle and the twist angle can be set as appropriate in accordance with the amount of oxygen ions to be added.

In the case where oxygen ions are added by an ion implantation method, mainly oxygen ions with a mass number of 16 are added to the insulator 154. As a result, in a region to which oxygen ions are added, the abundance ratio of $^{16}$O is higher than the natural abundance thereof (99.762 atomic %) in some cases. For this reason, in some cases, the insulator 154 has a higher abundance ratio of $^{16}$O in the region 187 shown in FIGS. 25A and 25B than in the other regions (e.g., a region of the insulator 154 that overlaps with the channel formation region 188), and the abundance ratio of $^{16}$O in the region is higher than the natural abundance thereof.

When oxygen ions are added by a sputtering method, an ion implantation method, or the like as described above, in some cases, oxygen is also added to a surface of the conductor 164 and the vicinity of the surface. In that case, the surface of the conductor 164 and the vicinity of the surface sometimes include a region with an oxygen concentration higher than that of the conductor 164 on the insulator 162 side.

Figure 33C:
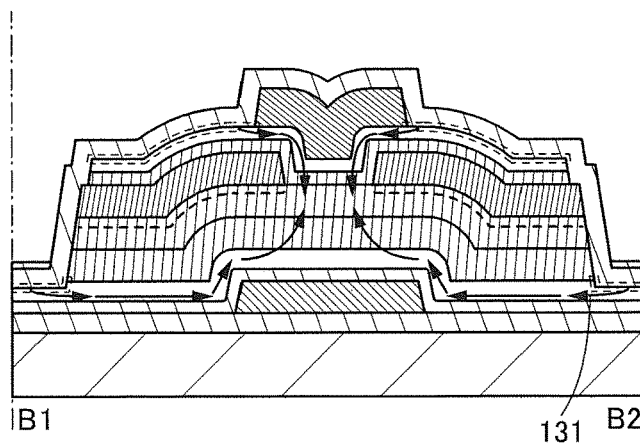
Figure 33D:
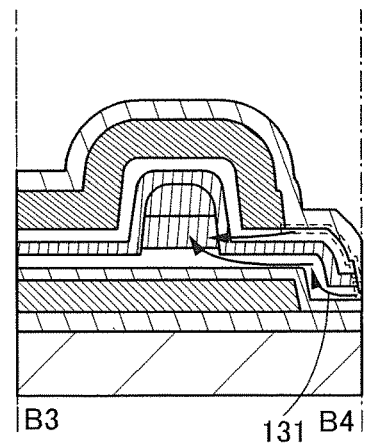

Next, heat treatment is preferably performed (see FIGS. 33C and 33D). By the heat treatment, the oxygen added to the insulator 154 (or the insulator 162) can be diffused to be supplied to the insulator 156a, the semiconductor 156b, and the insulator 156c. The heat treatment is performed at a temperature higher than or equal to 250° C. and lower than or equal to 650° C., preferably higher than or equal to 350° C. and lower than or equal to 450° C. The heat treatment is performed in an inert gas atmosphere or an atmosphere containing an oxidizing gas at 10 ppm or more, 1% or more, or 10% or more. The heat treatment may be performed under a reduced pressure. For the heat treatment, lamp heating can be performed with use of an RTA apparatus.

This heat treatment is preferably performed at a temperature lower than that of the heat treatment performed after formation of the semiconductor 176b. A temperature difference between the heat treatment and the heat treatment performed after formation of the semiconductor 176b is to be 20° C. or more and 150° C. or less, preferably 40° C. or more and 100° C. or less. Accordingly, superfluous release of excess oxygen (oxygen) from the insulator 154 and the like can be inhibited. Note that in the case where heating at the time of formation of the layers (e.g., heating at the time of formation of the insulator 166) doubles as the heat treatment after formation of the insulator 166, the heat treatment after formation of the insulator 166 is not necessarily performed. The heat treatment after the formation of the insulator 166 may be performed at any time after the addition of oxygen ions. For example, the heat treatment may be performed after the formation of the insulator 168 or after the formation of the conductors 170a and 170b.

The oxygen 131 is diffused into the insulator 154 (or the insulator 162) by the heat treatment (see FIGS. 33C and 33D). The oxygen 131 can be thus diffused in the insulator 154 (or the insulator 162), mainly the mixed region 130 with a high concentration of the oxygen 131.

Here, the insulator 166 is an insulator that transmits less oxygen than the insulator 154 (or the insulator 162) and functions as a barrier film that blocks oxygen. Because of the insulator 166 formed over the insulator 154 (or the insulator 162), the oxygen 131 diffused in the insulator 154 (or the insulator 162) is not diffused to above the insulator 154 (or the insulator 162) but is diffused in the insulator 154 (or the insulator 162) mainly in the lateral direction or the downward direction. In this manner, the oxygen 131 diffused in the insulator 154 (or the insulator 162) is supplied to the insulator 156a, the semiconductor 156b, and the insulator 156c, or particularly, the channel formation region 188 of the semiconductor 156b.

The insulator 153 having a function of blocking oxygen covers the conductor 152, thereby preventing the oxygen 131 diffused in the insulator 154 from being extracted by the conductor 152. The insulator 153 or the insulator 151 has a function of blocking oxygen, whereby the oxygen 131 diffused in the insulator 154 can be prevented from being diffused to below the insulator 154 and can be supplied to above the insulator 154, i.e., to the insulator 156a, the semiconductor 156b, and the insulator 156c.

Furthermore, the insulator 156a and the semiconductor 156b are formed between the bottom surfaces of the conductors 158a and 158b and the insulator 154 so that the conductors 158a and 158b are not in direct contact with the insulator 154, which can prevent the oxygen 131 diffused in the insulator 154 from being extracted by the conductors 158a and 158b.

When the conductor 152, the conductor 158a, and the conductor 158b of the transistor 50 are not in direct contact with the insulator 154 in which the oxygen 131 is diffused, it is possible to effectively supply the oxygen 131 to the insulator 156a, the semiconductor 156b, and the insulator 156c, or particularly, the channel formation region 188 of the semiconductor 156b.

In this manner, the oxygen 131 is supplied to the insulator 156a, the semiconductor 156b, and the insulator 156c, whereby oxygen vacancies can be filled with the oxygen 131 to be reduced. By a reduction of oxygen vacancies, hydrogen trapping by oxygen vacancies can be reduced; thus, it is possible to reduce formation of a shallow donor level in the semiconductor 156b. As a result, a highly purified intrinsic or substantially highly purified intrinsic oxide semiconductor with a low density of defect states can be obtained.

In the case where the above-described oxide insulator containing In is used for the insulator 168, the oxide insulator containing In may be removed by etching or the like after the above heat treatment and the insulator 168 may be formed again using a different material.

Then, the insulator 168 is formed. Any of the above-described insulators can be used for the insulator 168. The insulator 168 can be formed by a sputtering method, a CVD method, an MBE method, a PLD method, an ALD method, or the like.

Next, a resist or the like is formed over the insulator 168, and openings are formed in the insulator 168, the insulator 166, the insulator 162, and the insulator 156*c*. Then, a conductor to be the conductor 170*a* and the conductor 170*b* is formed. Any of the above-described conductors can be used for the conductor to be the conductor 170*a* and the conductor 170*b*. The conductor can be formed by a sputtering method, a CVD method, an MBE method, a PLD method, an ALD method, or the like.

Figure 33E:
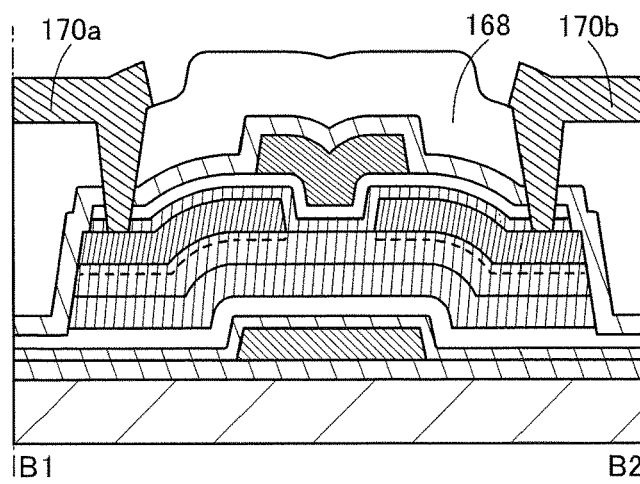
Figure 33F:
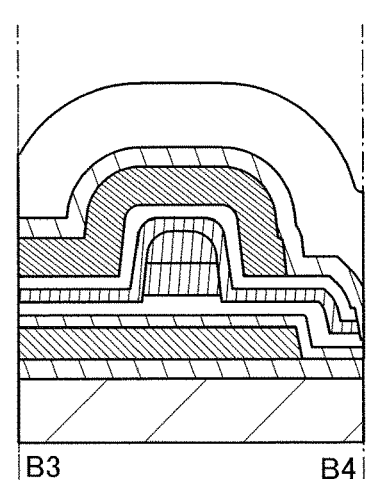

Next, a resist or the like is formed over the conductor, and the conductor is processed into the conductor 170*a* and the conductor 170*b* using the resist (see FIGS. 33E and 33F).

Through the above process, the transistor of one embodiment of the present invention can be manufactured.

<Circuit>

An example of a circuit of a semiconductor device including a transistor or the like of one embodiment of the present invention is described below.

<CMOS Inverter>

Figure 34A:
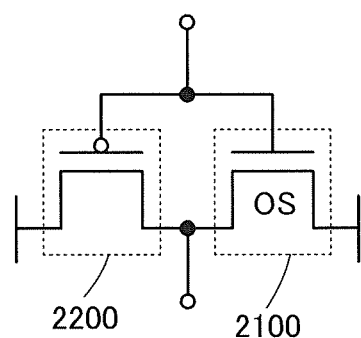
FIGS. 34A and 34B are circuit diagrams illustrating a semiconductor device of one embodiment of the present invention.

A circuit diagram in FIG. 34A shows a configuration of a so-called CMOS inverter in which a p-channel transistor 2200 and an n-channel transistor 2100 are connected to each other in series and in which gates of them are connected to each other.

<Structure of Semiconductor Device>

Figure 35:
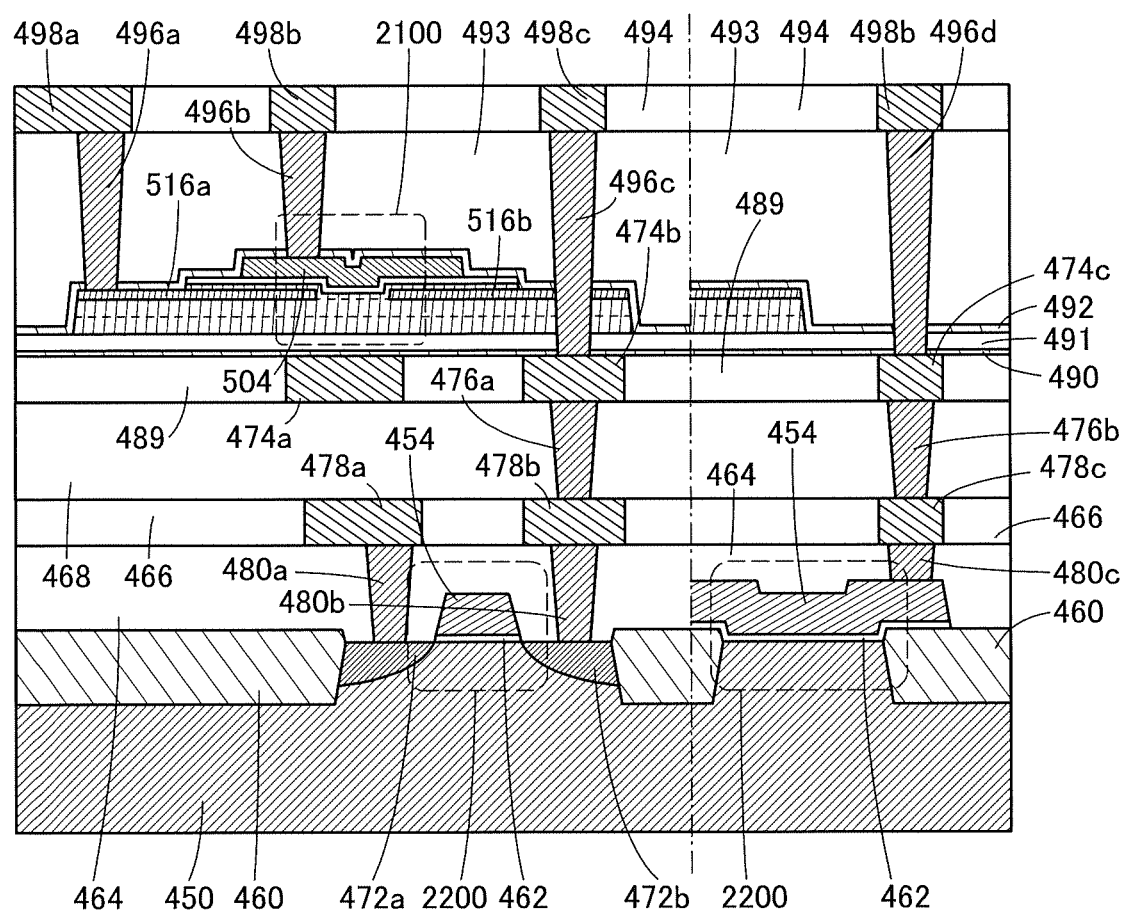
FIG. 35 is a cross-sectional view illustrating a semiconductor device of one embodiment of the present invention.

FIG. 35 is a cross-sectional view of the semiconductor device of FIG. 34A. The semiconductor device shown in FIG. 35 includes the transistor 2200 and the transistor 2100. The transistor 2100 is placed above the transistor 2200. Although an example where the transistor 52 shown in FIG. 26A is used as the transistor 2100 is shown, a semiconductor device of one embodiment of the present invention is not limited thereto. Any of the transistors described in the above embodiments can be used as the transistor 2100. For example, any of the transistors illustrated in FIGS. 1A to 1E, FIGS. 11A to 11D, FIGS. 12A to 12D, FIGS. 13A to 13D, FIGS. 14A to 14D, FIGS. 15A to 15D, FIGS. 16A to 16D, FIGS. 17A to 17D, FIGS. 23A to 23C, FIGS. 26A to 26D, FIGS. 27A to 27D, FIGS. 28A to 28D, and FIGS. 29A to 29D can be used as the transistor 2100. Therefore, the description regarding the above-mentioned transistors is referred to for the transistor 2100 as appropriate.

The transistor 2200 shown in FIG. 35 is a transistor using a semiconductor substrate 450. The transistor 2200 includes a region 472*a* in the semiconductor substrate 450, a region 472*b* in the semiconductor substrate 450, an insulator 462, and a conductor 454.

In the transistor 2200, the regions 472*a* and 472*b* have functions of a source region and a drain region. The insulator 462 has a function of a gate insulator. The conductor 454 has a function of a gate electrode. Thus, the resistance of a channel formation region can be controlled by a potential applied to the conductor 454. In other words, conduction or non-conduction between the region 472*a* and the region 472*b* can be controlled by the potential applied to the conductor 454.

For the semiconductor substrate 450, a single-material semiconductor substrate formed using silicon, germanium, or the like or a semiconductor substrate formed using silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 2200 is formed. Alternatively, the semiconductor substrate 450 may be an i-type semiconductor substrate.

A top surface of the semiconductor substrate 450 preferably has a (110) plane. Thus, on-state characteristics of the transistor 2200 can be improved.

The regions 472*a* and 472*b* are regions including impurities imparting the p-type conductivity. Accordingly, the transistor 2200 has a structure of a p-channel transistor.

Note that the transistor 2200 is apart from an adjacent transistor by a region 460 and the like. The region 460 is an insulating region.

The semiconductor device shown in FIG. 35 includes an insulator 464, an insulator 466, an insulator 468, a conductor 480*a*, a conductor 480*b*, a conductor 480*c*, a conductor 478*a*, a conductor 478*b*, a conductor 478*c*, a conductor 476*a*, a conductor 476*b*, a conductor 474*a*, a conductor 474*b*, a conductor 474*c*, a conductor 496*a*, a conductor 496*b*, a conductor 496*c*, a conductor 496*d*, a conductor 498*a*, a conductor 498*b*, a conductor 498*c*, an insulator 489, an insulator 490, an insulator 491, an insulator 492, an insulator 493, and an insulator 494.

The insulator 464 is placed over the transistor 2200. The insulator 466 is placed over the insulator 464. The insulator 468 is placed over the insulator 466. The insulator 489 is placed over the insulator 468. The transistor 2100 is placed over the insulator 489. The insulator 493 is placed over the transistor 2100. The insulator 494 is placed over the insulator 493.

The insulator 464 includes an opening reaching the region 472*a*, an opening reaching the region 472*b*, and an opening reaching the conductor 454. In the openings, the conductor 480*a*, the conductor 480*b*, and the conductor 480*c* are embedded.

The insulator 466 includes an opening reaching the conductor 480*a*, an opening reaching the conductor 480*b*, and an opening reaching the conductor 480*c*. In the openings, the conductor 478*a*, the conductor 478*b*, and the conductor 478*c* are embedded.

The insulator 468 includes an opening reaching the conductor 478*b* and an opening reaching the conductor 478*c*. In the openings, the conductor 476*a* and the conductor 476*b* are embedded.

The insulator 489 includes an opening overlapping with a channel formation region of the transistor 2100, an opening reaching the conductor 476*a*, and an opening reaching the conductor 476*b*. In the openings, the conductor 474*a*, the conductor 474*b*, and the conductor 474*c* are embedded.

The conductor 474*a* may have a function of a gate electrode of the transistor 2100. The electrical characteristics of the transistor 2100, such as the threshold voltage, may be controlled by application of a predetermined potential to the conductor 474*a*, for example. The conductor 474*a* may be electrically connected to the conductor 504 having a function of the gate electrode of the transistor 2100, for example. In that case, on-state current of the transistor 2100 can be increased. Furthermore, a punch-through phenomenon can be suppressed; thus, the electrical characteristics of the transistor 2100 in a saturation region can be stable. Note that the conductor 474*a* corresponds to the conductor 152 in the above embodiment and thus, the description of the conductor 152 can be referred to for details about the conductor 474*a*.

The insulator 490 includes an opening reaching the conductor 474*b* and an opening reaching the conductor 474*c*.

Note that the insulator 490 corresponds to the insulator 153 in the above embodiment and thus, the description of the insulator 153 can be referred to for details about the insulator 490. As described in the above embodiment, the insulator 490 is provided to cover the conductors 474a to 474c except for the openings, whereby extraction of oxygen from the insulator 491 by the conductors 474a to 474c can be prevented. Accordingly, oxygen can be effectively supplied from the insulator 491 to an oxide semiconductor of the transistor 2100.

The insulator 491 includes an opening reaching the conductor 474b and an opening reaching the conductor 474c. Note that the insulator 491 corresponds to the insulator 154 in the above embodiment and thus, the description of the insulator 154 can be referred to for details about the insulator 491.

The insulator 492 includes an opening reaching the conductor 474b through the conductor 516b that is one of a source electrode and a drain electrode of the transistor 2100, an opening reaching the conductor 516a that is the other of the source electrode and the drain electrode of the transistor 2100, an opening reaching the conductor 504 that is the gate electrode of the transistor 2100, and an opening reaching the conductor 474c. Note that the insulator 492 corresponds to the insulator 166 in the above embodiment and thus, the description of the insulator 166 can be referred to for details about the insulator 492.

The insulator 493 includes an opening reaching the conductor 474b through the conductor 516b that is one of a source electrode and a drain electrode of the transistor 2100, an opening reaching the conductor 516a that is the other of the source electrode and the drain electrode of the transistor 2100, an opening reaching the conductor 504 that is the gate electrode of the transistor 2100, and an opening reaching the conductor 474c. In the openings, the conductor 496a, the conductor 496b, the conductor 496c, and the conductor 496d are embedded. Note that in some cases, an opening provided in a component of the transistor 2100 or the like is positioned between openings provided in other components.

The insulator 494 includes an opening reaching the conductor 496a, an opening reaching the conductor 496b and the conductor 496d, and an opening reaching the conductor 496c. In the openings, the conductor 498a, the conductor 498b, and the conductor 498c are embedded.

The insulators 464, 466, 468, 489, 493, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The insulator that has a function of blocking oxygen and impurities such as hydrogen is preferably included in at least one of the insulators 464, 466, 468, 489, 493, and 494. When an insulator that has a function of blocking oxygen and impurities such as hydrogen is placed near the transistor 2100, the electrical characteristics of the transistor 2100 can be stable.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, and the conductor 498c may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 36:
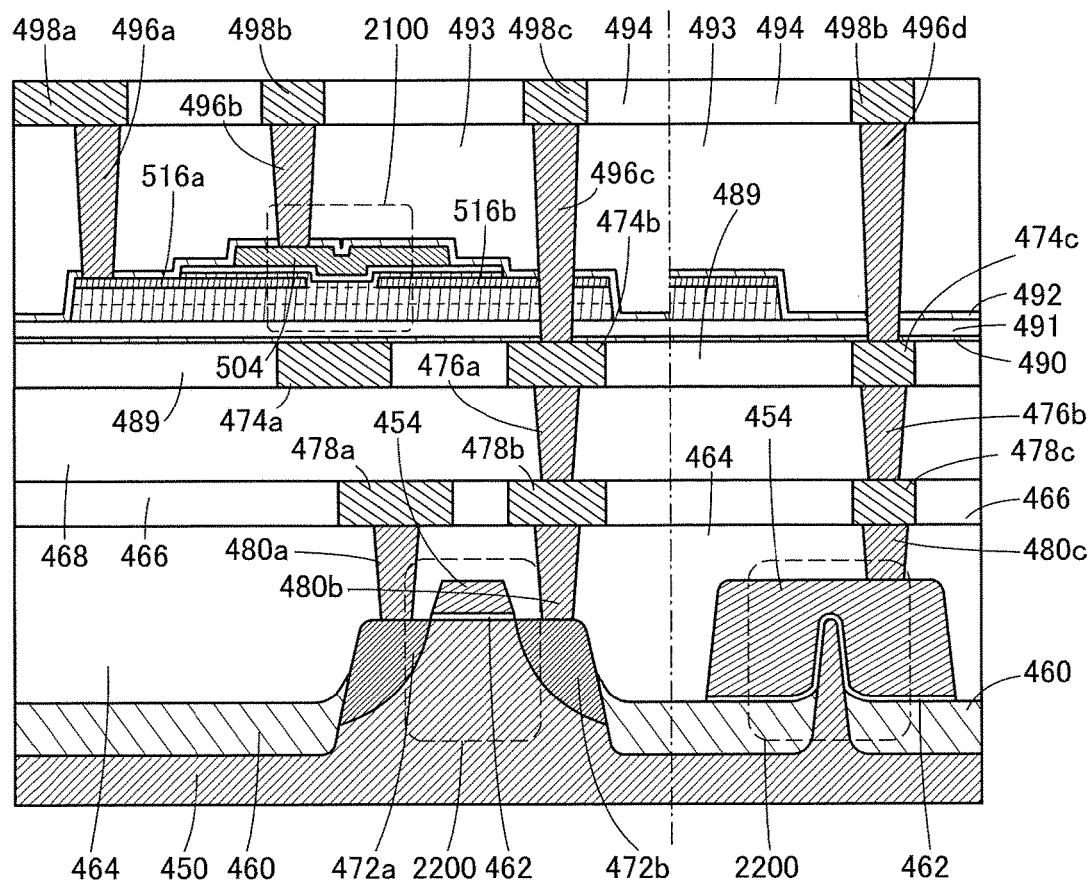
FIG. 36 is a cross-sectional view illustrating a semiconductor device of one embodiment of the present invention.

Note that a semiconductor device in FIG. 36 is the same as the semiconductor device in FIG. 35 except the structure of the transistor 2200. Therefore, the description of the semiconductor device in FIG. 35 is referred to for the semiconductor device in FIG. 36. In the semiconductor device in FIG. 36, the transistor 2200 is a Fin-type transistor. The effective channel width is increased in the Fin-type transistor 2200, whereby the on-state characteristics of the transistor 2200 can be improved. In addition, since contribution of the electric field of the gate electrode can be increased, the off-state characteristics of the transistor 2200 can be improved.

Figure 37:
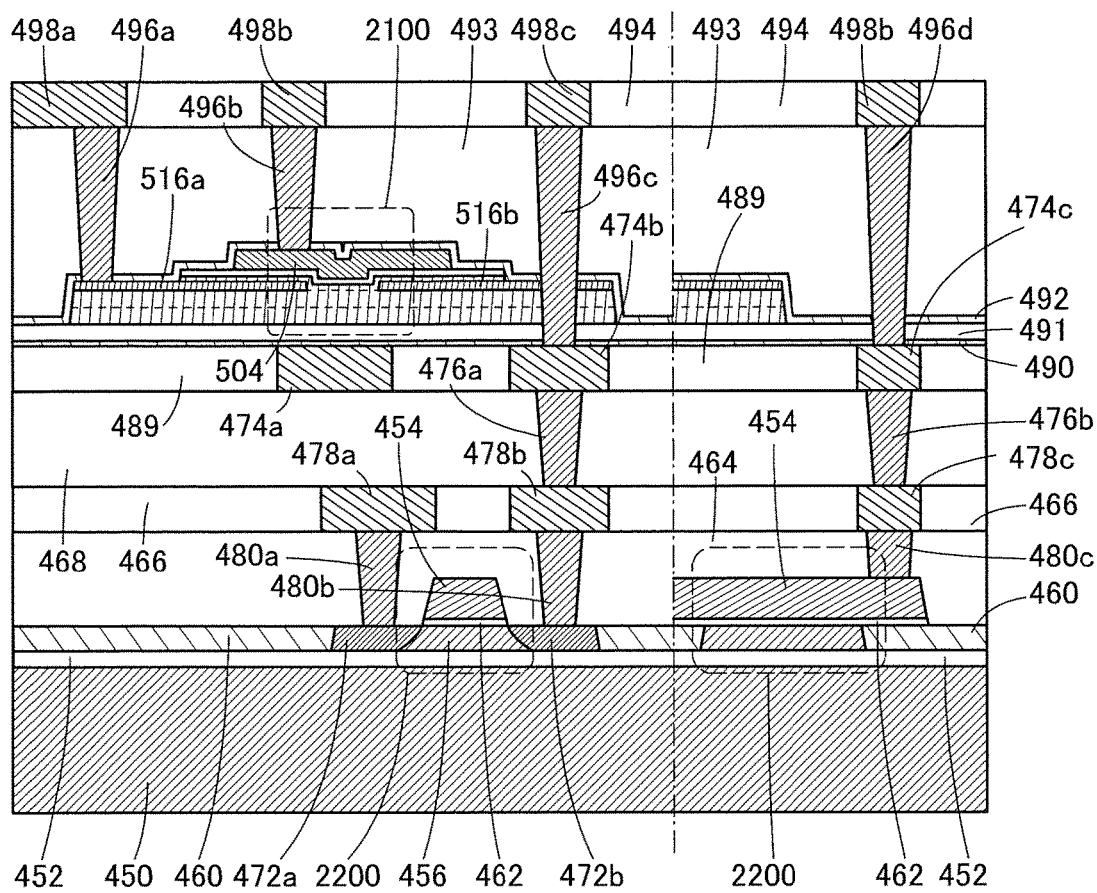
FIG. 37 is a cross-sectional view illustrating a semiconductor device of one embodiment of the present invention.

Note that a semiconductor device in FIG. 37 is the same as the semiconductor device in FIG. 35 except the structure of the transistor 2200. Therefore, the description of the semiconductor device in FIG. 35 is referred to for the semiconductor device in FIG. 37. Specifically, in the semiconductor device in FIG. 37, the transistor 2200 is formed in the semiconductor substrate 450 that is an SOI substrate. In the structure in FIG. 37, a region 456 is apart from the semiconductor substrate 450 with an insulator 452 provided therebetween. Since the SOI substrate is used as the semiconductor substrate 450, a punch-through phenomenon and the like can be suppressed; thus, the off-state characteristics of the transistor 2200 can be improved. Note that the insulator 452 can be formed by turning the semiconductor substrate 450 into an insulator. For example, silicon oxide can be used as the insulator 452.

In each of the semiconductor devices shown in FIG. 35, FIG. 36, and FIG. 37, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

<CMOS Analog Switch>

Figure 34B:
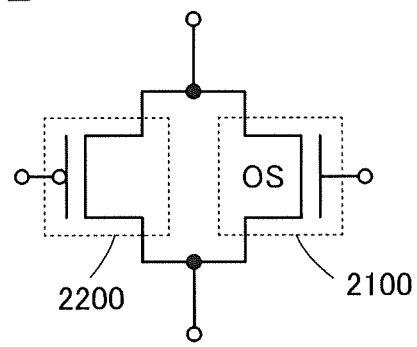

A circuit diagram in FIG. 34B shows a configuration in which sources of the transistors 2100 and 2200 are connected to each other and drains of the transistors 2100 and 2200 are connected to each other. With such a configuration, the transistors can function as a so-called CMOS analog switch.

<Memory Device 1>

Figure 38A:
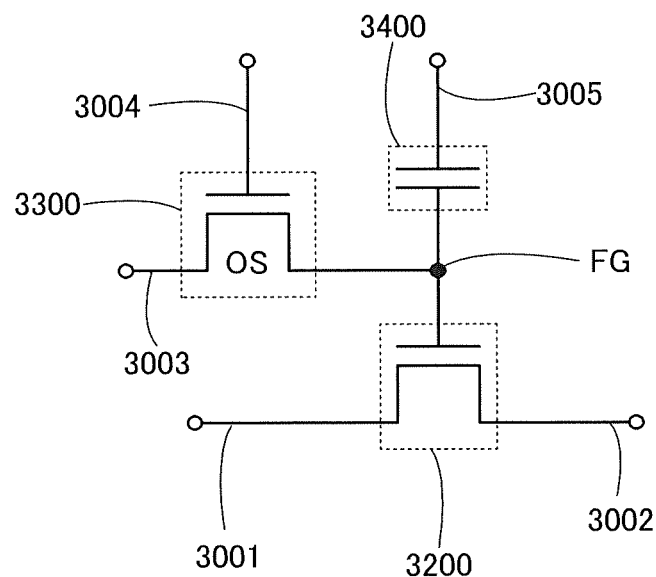
FIGS. 38A and 38B are circuit diagrams illustrating a memory device of one embodiment of the present invention.
Figure 38B:
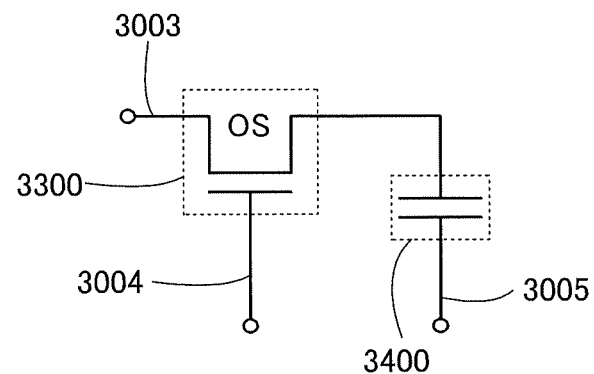

An example of a semiconductor device (memory device) which includes the transistor of one embodiment of the present invention, which can retain stored data even when not powered, and which has an unlimited number of write cycles is shown in FIGS. 38A and 38B.

The semiconductor device illustrated in FIG. 38A includes a transistor 3200 using a first semiconductor, a transistor 3300 using a second semiconductor, and a capacitor 3400. Note that a transistor similar to the above-described transistor 2100 can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 38A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 38A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charges providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\text{-}x}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ ($>V_{th\_H}$), the transistor 3200 is brought into "on state." In the case where the low-level electric charge is supplied to the node FG in writing, even when the potential of the fifth wiring 3005 is $V_0$ ($<V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. In the case where data of the other memory cells is not read, the fifth wiring 3005 may be supplied with a potential at which the transistor 3200 is in "off state" regardless of the electric charge supplied to the node FG, that is, a potential lower than $V_{th\_H}$. Alternatively, the fifth wiring 3005 may be supplied with a potential at which the transistor 3200 is brought into "on state" regardless of the electric charge supplied to the node FG, that is, a potential higher than $V_{th\_L}$.

Although an example in which two kinds of electric charges are retained in the node FG, the semiconductor device of the present invention is not limited to this example. For example, a structure in which three or more kinds of electric charges can be retained in the node FG of the semiconductor device may be employed. With such a structure, the semiconductor device can be multi-valued and the storage capacity can be increased.

<Structure of Memory Device 1>

Figure 39:
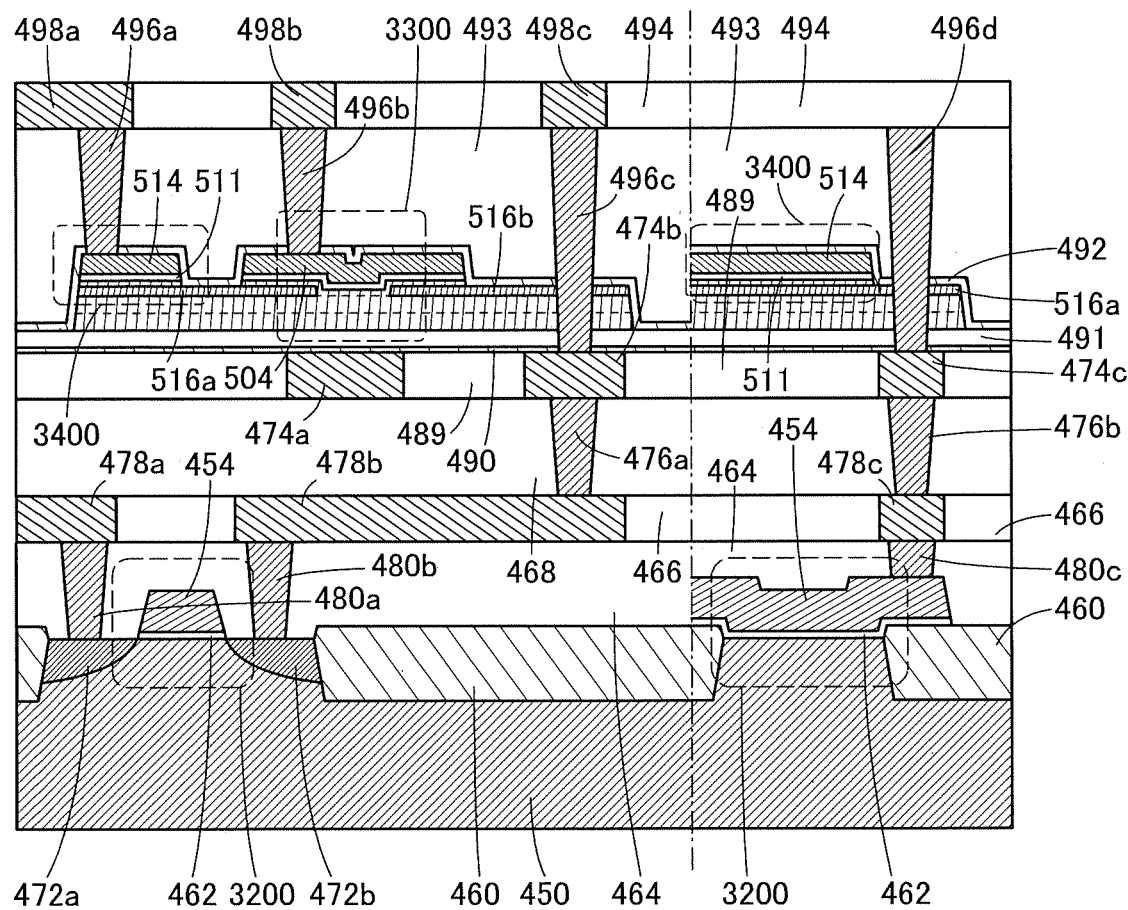
FIG. 39 is a cross-sectional view illustrating a semiconductor device of one embodiment of the present invention.

FIG. 39 is a cross-sectional view of the semiconductor device of FIG. 38A. The semiconductor device shown in FIG. 39 includes the transistor 3200, the transistor 3300, and the capacitor 3400. The transistor 3300 and the capacitor 3400 are placed above the transistor 3200. Note that for the transistor 3300, the description of the above transistor 2100 is referred to. Furthermore, for the transistor 3200, the description of the transistor 2200 in FIG. 35 is referred to. Note that although the transistor 2200 is illustrated as a p-channel transistor in FIG. 35, the transistor 3200 may be an n-channel transistor.

The transistor 3200 illustrated in FIG. 39 is a transistor using a semiconductor substrate 450. The transistor 3200 includes a region 472a in the semiconductor substrate 450, a region 472b in the semiconductor substrate 450, an insulator 462, and a conductor 454.

The semiconductor device illustrated in FIG. 39 includes insulators 464, 466, and 468, conductors 480a, 480b, 480c, 478a, 478b, 478c, 476a, 476b, 474a, 474b, 474c, 496a, 496b, 496c, 496d, 498a, 498b, and 498c, and the insulators 489, 490, 491, 492, 493, and 494.

The insulator 464 is provided over the transistor 3200. The insulator 466 is provided over the insulator 464. The insulator 468 is provided over the insulator 466. The insulator 489 is provided over the insulator 468. The transistor 3300 is provided over the insulator 489. The insulator 493 is provided over the transistor 3300. The insulator 494 is provided over the insulator 493.

The insulator 464 has an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with the channel formation region of the transistor 3300, an opening reaching the conductor 476a, and an opening reaching the conductor 476b. In the openings, the conductors 474a, the conductor 474b, and the conductor 474c are embedded.

The conductor 474a may have a function as a bottom gate electrode of the transistor 3300. Alternatively, for example, electric characteristics such as the threshold voltage of the transistor 3300 may be controlled by application of a constant potential to the conductor 474a. Further alternatively, for example, the conductor 474a and the conductor 504 that is the top gate electrode of the transistor 3300 may be electrically connected to each other. Thus, the on-state current of the transistor 3300 can be increased. A punch-through phenomenon can be suppressed; thus, stable electric characteristics in the saturation region of the transistor 3300 can be obtained.

The insulator 490 includes an opening reaching the conductor 474b and an opening reaching the conductor 474c. Note that the insulator 490 corresponds to the insulator 153 in the above embodiment and thus, the description of the insulator 153 can be referred to for details about the insulator 490. As described in the above embodiment, the insulator 490 is provided to cover the conductors 474a to 474c except for the openings, whereby extraction of oxygen from the insulator 491 by the conductors 474a to 474c can be prevented. Accordingly, oxygen can be effectively supplied from the insulator 491 to an oxide semiconductor of the transistor 3300.

The insulator 491 includes an opening reaching the conductor 474b and an opening reaching the conductor 474c. Note that the insulator 491 corresponds to the insulator 154 in the above embodiment and thus, the description of the insulator 154 can be referred to for details about the insulator 491.

The insulator 492 includes an opening reaching the conductor 474b through the conductor 516b that is one of a source electrode and a drain electrode of the transistor 3300, an opening reaching the conductor 514 that overlaps with the conductor 516a that is the other of the source electrode and the drain electrode of the transistor 3300, with the insulator 511 positioned therebetween, an opening reaching the conductor 504 that is a gate electrode of the transistor 3300, and an opening reaching the conductor 474c through the conductor 516a that is the other of the source electrode and the drain electrode of the transistor 3300. Note that the insulator 492 corresponds to the insulator 166 in the above embodiment and thus, the description of the insulator 166 can be referred to for details about the insulator 492.

The insulator 493 includes an opening reaching the conductor 474b through the conductor 516b that is one of a source electrode and a drain electrode of the transistor 3300, an opening reaching the conductor 514 that overlaps with the conductor 516a that is the other of the source electrode and the drain electrode of the transistor 3300, with the insulator 511 positioned therebetween, an opening reaching the conductor 504 that is a gate electrode of the transistor 3300, and an opening reaching the conductor 474c through the conductor 516a that is the other of the source electrode and the drain electrode of the transistor 3300. In the openings, the conductor 496a, the conductor 496b, the conductor 496c, and the conductor 496d are embedded. Note that in some cases, an opening provided in a component of the transistor 3300 or the like is positioned between openings provided in other components.

The insulator 494 includes an opening reaching the conductor 496a, an opening reaching the conductor 496b, and an opening reaching the conductor 496c. In the openings, the conductors 498a, 498b, and 498c are embedded.

At least one of the insulators 464, 466, 468, 489, 493, and 494 preferably has a function of blocking oxygen and impurities such as hydrogen. When an insulator that has a function of blocking oxygen and impurities such as hydrogen is placed near the transistor 3300, the electrical characteristics of the transistor 3300 can be stable.

The source or drain of the transistor 3200 is electrically connected to the conductor 516b that is one of a source electrode and a drain electrode of the transistor 3300 through the conductor 480b, the conductor 478b, the conductor 476a, the conductor 474b, and the conductor 496c. The conductor 454 that is the gate electrode of the transistor 3200 is electrically connected to the conductor 516a that is the other of the source electrode and the drain electrode of the transistor 3300 through the conductor 480c, the conductor 478c, the conductor 476b, the conductor 474c, and the conductor 496d.

The capacitor 3400 includes the conductor 516a that is the other of the source electrode and the drain electrode of the transistor 3300, the conductor 514, and an insulator 511. Because the insulator 511 can be formed by the same step as the insulator serving as a gate insulator of the transistor 3300, productivity can be preferably increased in some cases. When a layer formed by the same step as the conductor 504 serving as a gate electrode of the transistor 3300 is used as the conductor 514, productivity can be preferably increased in some cases.

For the structures of other components, the description of FIG. 35 and the like can be referred to as appropriate.

Figure 40:
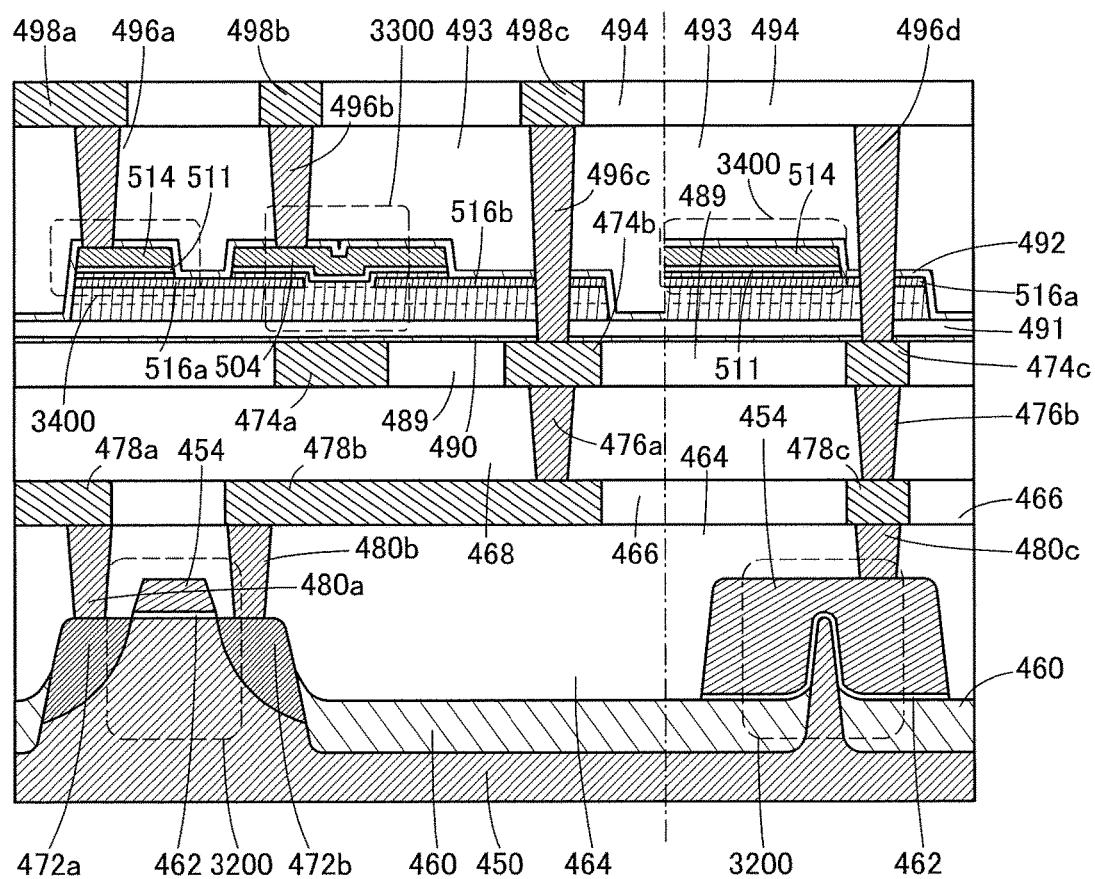
FIG. 40 is a cross-sectional view illustrating a semiconductor device of one embodiment of the present invention.

A semiconductor device in FIG. 40 is the same as the semiconductor device in FIG. 39 except the structure of the transistor 3200. Therefore, the description of the semiconductor device in FIG. 39 is referred to for the semiconductor device in FIG. 40. Specifically, in the semiconductor device in FIG. 40, the transistor 3200 is a Fin-type transistor. For the Fin-type transistor 3200, the description of the transistor 2200 in FIG. 36 is referred to. Note that although the transistor 2200 is illustrated as a p-channel transistor in FIG. 36, the transistor 3200 may be an n-channel transistor.

Figure 41:
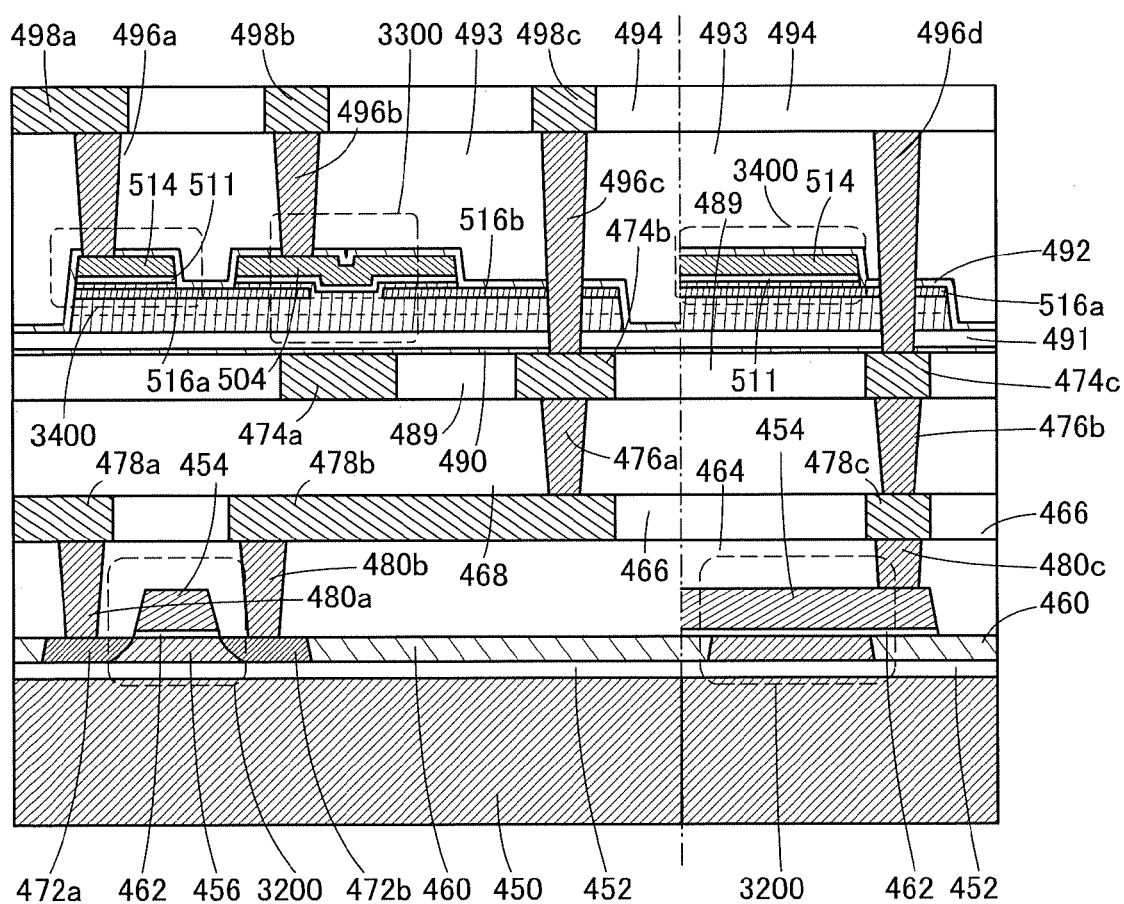
FIG. 41 is a cross-sectional view illustrating a semiconductor device of one embodiment of the present invention.

A semiconductor device in FIG. 41 is the same as the semiconductor device in FIG. 39 except a structure of the transistor 3200. Therefore, the description of the semiconductor device in FIG. 39 is referred to for the semiconductor device in FIG. 41. Specifically, in the semiconductor device in FIG. 41, the transistor 3200 is provided in the semiconductor substrate 450 that is an SOI substrate. For the transistor 3200, which is provided in the semiconductor substrate 450 that is an SOI substrate, the description of the transistor 2200 in FIG. 37 is referred to. Note that although the transistor 2200 is illustrated as a p-channel transistor in FIG. 37, the transistor 3200 may be an n-channel transistor.

<Memory Device 2>

The semiconductor device in FIG. 38B is different from the semiconductor device in FIG. 38A in that the transistor 3200 is not provided. Also in this case, data can be written and retained in a manner similar to that of the semiconductor device in FIG. 38A.

Reading of data in the semiconductor device in FIG. 38B is described. When the transistor 3300 is brought into on state, the third wiring 3003 which is in a floating state and the capacitor 3400 are brought into conduction, and the electric charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the electric charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Memory Device 3>

A modification example of the semiconductor device (memory device) illustrated in FIG. 38A is described with reference to a circuit diagram in FIG. 42.

Figure 42:
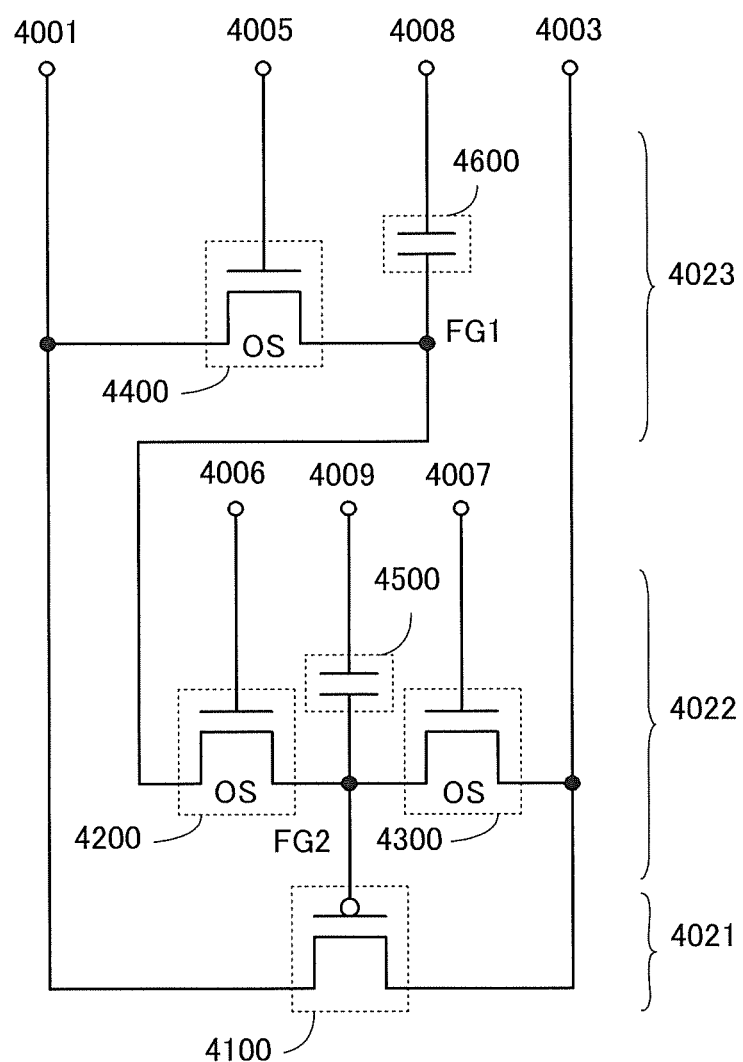
FIG. 42 is a circuit diagram illustrating a semiconductor device of one embodiment of the present invention.

The semiconductor device illustrated in FIG. 42 includes transistors 4100, 4200, 4300, and 4400 and capacitors 4500 and 4600. Here, a transistor similar to the above-described transistor 3200 can be used as the transistor 4100, and transistors similar to the above-described transistor 3300 can be used as the transistors 4200 to 4400. Although not illustrated in FIG. 42, a plurality of semiconductor devices in FIG. 42 are provided in a matrix. The semiconductor devices in FIG. 42 can control writing and reading of a data voltage in accordance with a signal or a potential supplied to a wiring 4001, a wiring 4003, and wirings 4005 to 4009.

One of a source and a drain of the transistor 4100 is connected to the wiring 4003. The other of the source and the drain of the transistor 4100 is connected to the wiring 4001. Although the transistor 4100 is a p-channel transistor in FIG. 42, the transistor 4100 may be an n-channel transistor.

The semiconductor device in FIG. 42 includes two data retention portions. For example, a first data retention portion retains an electric charge between one of a source and a drain of the transistor 4400, one electrode of the capacitor 4600, and one of a source and a drain of the transistor 4200 which are connected to a node FG1. A second data retention portion retains an electric charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200, 4300, and 4400 each function as a switch for control of writing a data voltage and retaining an electric charge. Note that, as each of the transistors 4200 to 4400, it is preferable to use a transistor having a low current that flows between a source and a drain in an off state (low off-state current). As an example of the transistor with a low off-state current, a transistor including an oxide semiconductor in its channel formation region (an OS transistor) is preferably used. An OS transistor has a low off-state current and can be manufactured to overlap with a transistor including silicon, for example. Although the transistors 4200 to 4400 are n-channel transistors in FIG. 42, the transistors 4200, 4300, and 4400 may be p-channel transistors.

The transistors 4200 and 4300 and the transistor 4400 are preferably provided in different layers even when the transistors 4200, 4300, and 4400 are transistors including oxide semiconductors. In other words, the semiconductor device in FIG. 42 preferably includes, as illustrated in FIG. 42, a first layer 4021 where the transistor 4100 is provided, a second layer 4022 where the transistors 4200 and 4300 are provided, and a third layer 4023 where the transistor 4400 is provided. By stacking layers where transistors are provided, the circuit area can be reduced, so that the size of the semiconductor device can be reduced.

Next, operation of writing data to the semiconductor device illustrated in FIG. 42 is described.

First, operation of writing data voltage to the data retention portion connected to the node FG1 (hereinafter referred to as writing operation 1) is described. In the following description, data voltage written to the data retention portion connected to the node FG1 is $V_{D1}$, and the threshold voltage of the transistor 4100 is $V_{th}$.

In the writing operation 1, the potential of the wiring 4003 is set at $V_{D1}$, and after the potential of the wiring 4001 is set at a ground potential, the wiring 4001 is brought into an electrically floating state. The wirings 4005 and 4006 are set at a high level. The wirings 4007 to 4009 are set at a low level. Then, the potential of the node FG2 in the electrically floating state is increased, so that a current flows through the transistor 4100. The current flows through the transistor 4100, so that the potential of the wiring 4001 is increased. The transistors 4400 and 4200 are turned on. Thus, as the potential of the wiring 4001 is increased, the potentials of the nodes FG1 and FG2 are increased. When the potential of the node FG2 is increased and a voltage ($V_{gs}$) between a gate and a source of the transistor 4100 becomes the threshold voltage $V_{th}$ of the transistor 4100, the current flowing through the transistor 4100 is decreased. Accordingly, the potentials of the wiring 4001 and the nodes FG1 and FG2 stop increasing, so that the potentials of the nodes FG1 and FG2 are fixed at "$V_{D1}-V_{th}$" in which $V_{D1}$ is decreased by $V_{th}$.

When a current flows through the transistor 4100, $V_{D1}$ supplied to the wiring 4003 is supplied to the wiring 4001, so that the potentials of the nodes FG1 and FG2 are increased. When the potential of the node FG2 becomes "$V_{D1}-V_{th}$" with the increase in the potentials, $V_{gs}$ of the transistor 4100 becomes $V_{th}$, so that the current flow is stopped.

Next, operation of writing data voltage to the data retention portion connected to the node FG2 (hereinafter referred to as writing operation 2) is described. In the following description, data voltage written to the data retention portion connected to the node FG2 is $V_{D2}$.

In the writing operation 2, the potential of the wiring 4001 is set at $V_{D2}$, and after the potential of the wiring 4003 is set at a ground potential, the wiring 4003 is brought into an electrically floating state. The wiring 4007 is set at the high level. The wirings 4005, 4006, 4008, and 4009 are set at the low level. The transistor 4300 is turned on, so that the wiring 4003 is set at the low level. Thus, the potential of the node FG2 is decreased to the low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and $V_{gs}$ of the transistor 4100 becomes $V_{th}$ of the transistor 4100, the current flowing through the transistor 4100 is decreased. Accordingly, an increase in the potentials of the wiring 4003 and the node FG2 is stopped, so that the potential of the node FG2 is fixed at "$V_{D2}-V_{th}$" in which $V_{D2}$ is decreased by $V_{th}$.

In other words, when a current flows through the transistor 4100, $V_{D2}$ supplied to the wiring 4001 is supplied to the wiring 4003, so that the potential of the node FG2 is increased. When the potential of the node FG2 becomes "$V_{D2}-V_{th}$" with the increase in the potential, $V_{gs}$ of the transistor 4100 becomes $V_{th}$, so that the current flow is stopped. At this time, the transistors 4200 and 4400 are off and the potential of the node FG1 remains at "$V_{D1}-V_{th}$" written in the writing operation 1.

In the semiconductor device in FIG. 42, after data voltages are written to the plurality of data retention portions, the wiring 4009 is set at the high level, so that the potentials of the nodes FG1 and FG2 are increased. Then, the transistors are turned off to stop movement of electric charges; thus, the written data voltages are retained.

By the above-described writing operation of the data voltage to the nodes FG1 and FG2, the data voltages can be retained in the plurality of data retention portions. Although examples where "$V_{D1}-V_{th}$" and "$V_{D2}-V_{th}$" are used as the written potentials are described, they are data voltages corresponding to multilevel data. Therefore, in the case where the data retention portions each retain 4-bit data, 16-value "$V_{D1}-V_{th}$" and 16-value "$V_{D2}-V_{th}$" can be obtained.

Next, operation of reading data from the semiconductor device illustrated in FIG. 42 is described.

First, operation of reading data voltage to the data retention portion connected to the node FG2 (hereinafter referred to as reading operation 1) is described.

In the reading operation 1, after precharge is performed, the wiring 4003 in an electrically floating state is discharged. The wirings 4005 to 4008 are set low. When the wiring 4009 is set low, the potential of the node FG2 which is electrically floating is set at "$V_{D2}-V_{th}$". The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$" which is larger than the potential of the node FG2, "$V_{D2}-V_{th}$", by $V_{th}$. The potential of the wiring 4003 corresponds to the data voltage of the data retention portion connected to the node FG2. The data voltage of the read analog value is subjected to A/D conversion, so that data of the data retention portion connected to the node FG2 is obtained.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D2}$". In the transistor 4100, $V_{gs}$ between "$V_{D2}-V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}-V_{th}$" of the node FG2.

Then, the electric charges retained in the node FG1 are distributed between the node FG1 and the node FG2, data voltage in the data retention portion connected to the node FG1 is transferred to the data retention portion connected to the node FG2. The wirings 4001 and 4003 are set low. The wiring 4006 is set high. The wiring 4005 and the wirings 4007 to 4009 are set low. When the transistor 4200 is turned on, the electric charges in the node FG1 are distributed between the node FG1 and the node FG2.

Here, the potential after the electric charge distribution is decreased from the written potential, "$V_{D1}-V_{th}$". Thus, the capacitance of the capacitor 4600 is preferably larger than the capacitance of the capacitor 4500. Alternatively, the potential written to the node FG1, "$V_{D1}-V_{th}$", is preferably larger than the potential corresponding to the same data, "$V_{D2}-V_{th}$". By changing the ratio of the capacitances and setting the written potential larger in advance as described above, a decrease in potential after the electric charge distribution can be suppressed. The change in potential due to the electric charge distribution is described later.

Next, operation of reading data voltage to the data retention portion connected to the node FG1 (hereinafter referred to as reading operation 2) is described.

In the reading operation 2, the wiring 4003 which is brought into an electrically floating state after precharge is discharged. The wirings 4005 to 4008 are set low. The wiring 4009 is set high at the time of precharge and then, set low. When the wiring 4009 is set low, the potential of the node FG2 which is electrically floating is set at "$V_{D1}-V_{th}$". The potential of the node FG2 is decreased, so that a current flows through the transistor 4100. The current flows, so that the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$" which is larger than the potential of the node FG2, "$V_{D1}-V_{th}$", by $V_{th}$. The potential of the wiring 4003 corresponds to the data voltage of the data retention portion connected to the node FG1. The data voltage of the read analog value is subjected to A/D conversion, so that data of the data retention portion connected to the node FG1 is obtained. The above is the reading operation of the data voltage of the data retention portion connected to the node FG1.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D1}$". In the transistor 4100, $V_{gs}$ between "$V_{D1}-V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operation of data voltages from the nodes FG1 and FG2, the data voltages can be read from the plurality of data retention portions. For example, 4-bit (16-level) data is retained in each of the node FG1 and the node FG2, whereby 8-bit (256-level) data can be retained in total. Although the first to third layers 4021 to 4023 are provided in the structure illustrated in FIG. 42, the storage capacity can be increased by adding layers without increasing the area of the semiconductor device.

The read potential can be read as a voltage larger than the written data voltage by $V_{th}$. Therefore, $V_{th}$ of "$V_{D1}-V_{th}$" and $V_{th}$ of "$V_{D2}-V_{th}$" written in the writing operation can be canceled to be read. As a result, the memory capacity per memory cell can be improved and read data can be close to accurate data; thus, the data reliability becomes excellent.

Figure 43:
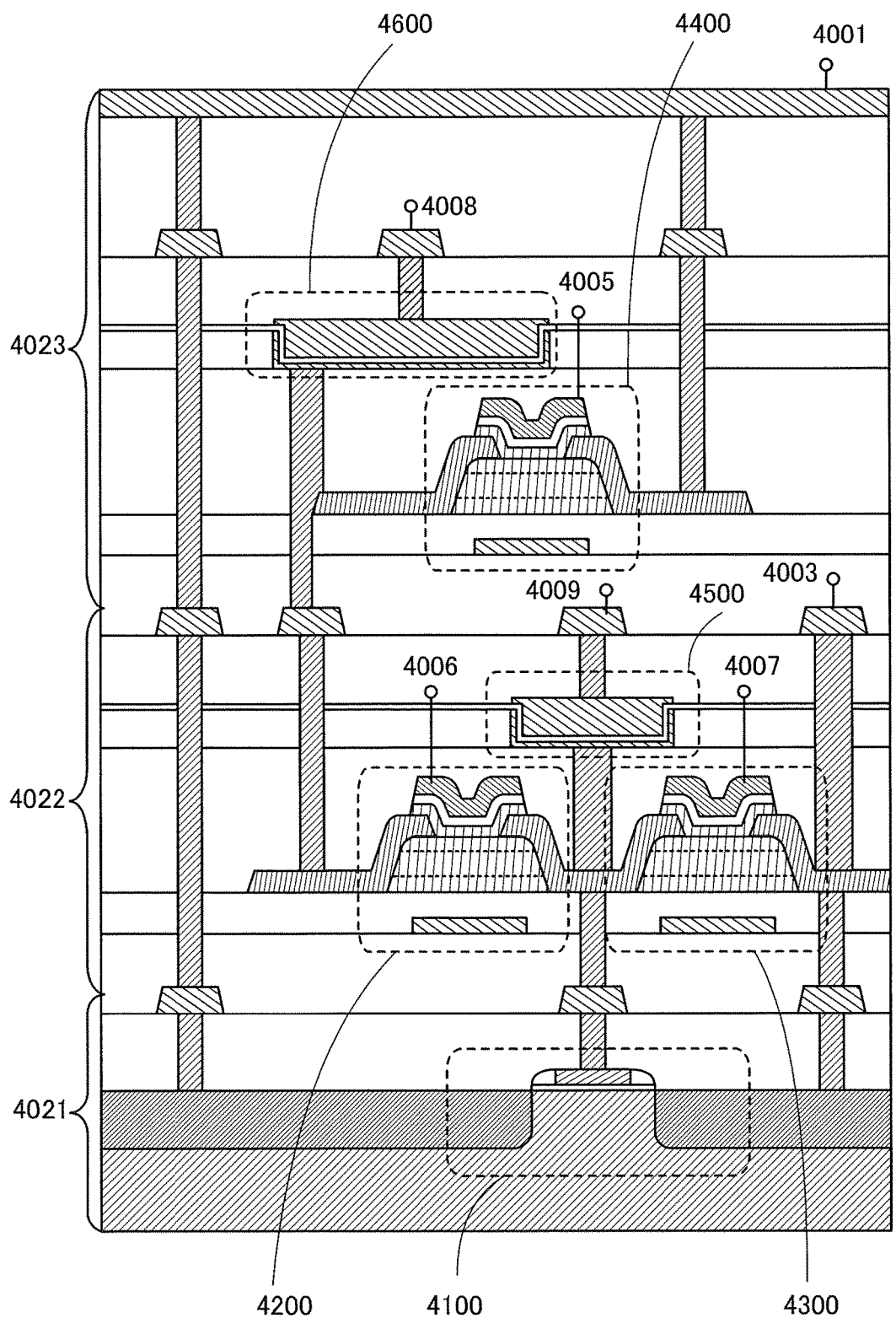
FIG. 43 is a cross-sectional view illustrating a semiconductor device of one embodiment of the present invention.

FIG. 43 is a cross-sectional view of a semiconductor device that corresponds to FIG. 42. The semiconductor device illustrated in FIG. 43 includes the transistors 4100 to 4400 and the capacitors 4500 and 4600. Here, the transistor 4100 is formed in the first layer 4021, the transistors 4200 and 4300 and the capacitor 4500 are formed in the second layer 4022, and the transistor 4400 and the capacitor 4600 are formed in the third layer 4023.

Here, the description of the transistor 3300 can be referred to for the transistors 4200 to 4400, and the description of the transistor 3200 can be referred to for the transistor 4100. The description made with reference to FIG. 39 can be appropriately referred to for other wirings, other insulators, and the like.

Note that the capacitors 4500 and 4600 are formed by including the conductive layers each having a trench-like shape, while the conductive layer of the capacitor 3400 in the semiconductor device in FIG. 39 is parallel to the substrate. With this structure, a larger capacity can be obtained without increasing the occupation area.

<Imaging Device>

An imaging device of one embodiment of the present invention is described below.

Figure 44A:
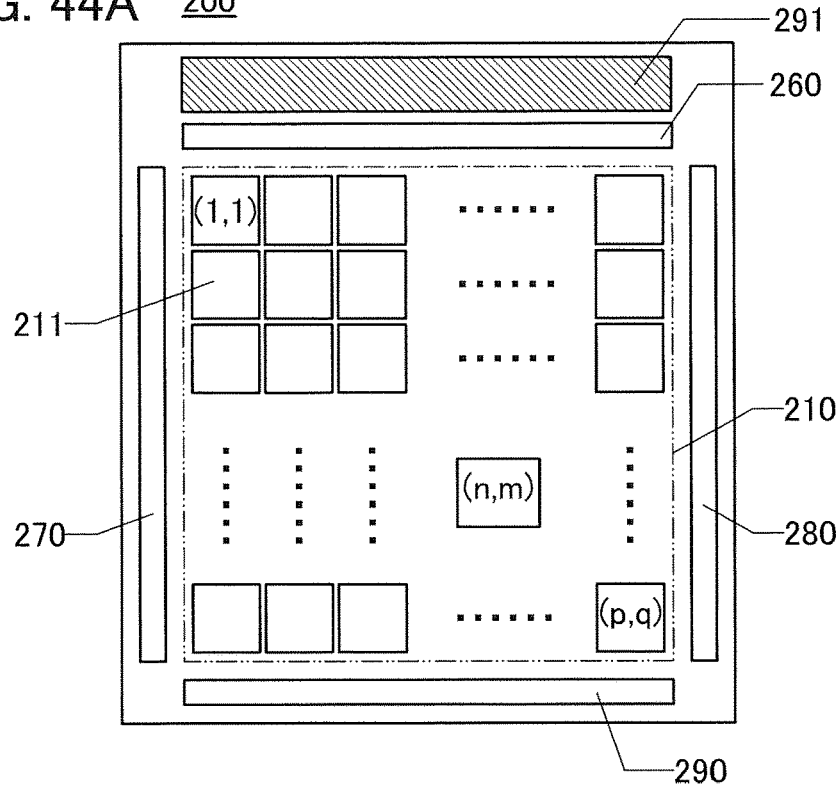
FIGS. 44A and 44B are top views each illustrating a semiconductor device of one embodiment of the present invention.

FIG. 44A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each an integer of 2 or more). The peripheral circuit 260, the peripheral circuit 270, the peripheral circuit 280, and the peripheral circuit 290 are each connected to the plurality of pixels 211, and a signal for driving the plurality of pixels 211 is supplied. In this specification and the like, in some cases, "a peripheral circuit" or "a driver circuit" indicate all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be formed over a substrate where the pixel portion 210 is formed. A semiconductor device such as an IC chip may be used as part or the whole of the peripheral circuit. Note that as the peripheral circuit, one or more of the peripheral circuits 260, 270, 280, and 290 may be omitted.

Figure 44B:
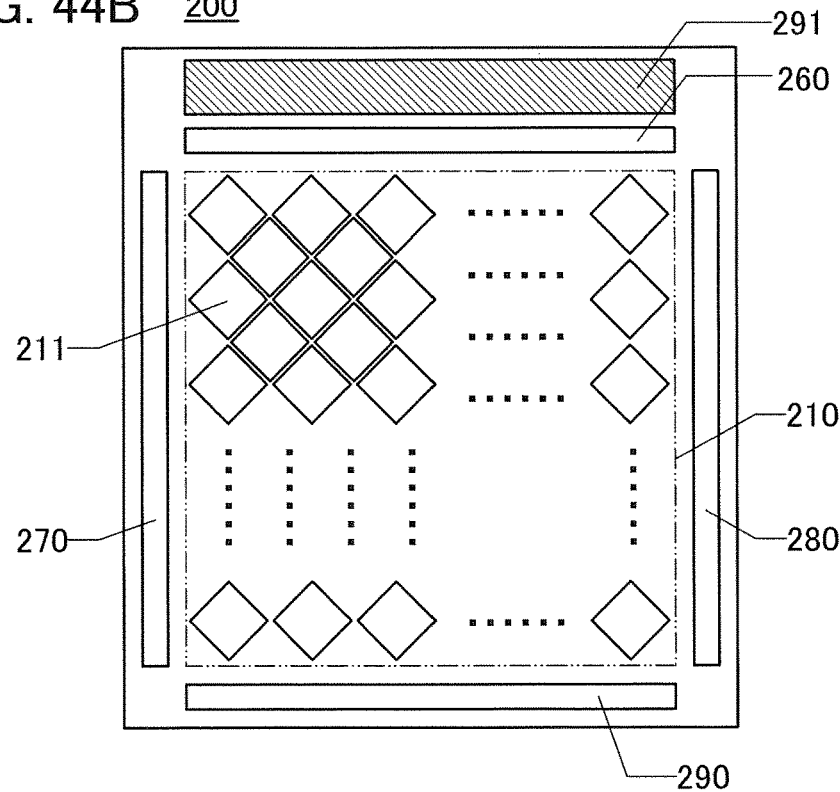

As illustrated in FIG. 44B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

Configuration Example 1 of Pixel

The pixel 211 included in the imaging device 200 is formed with a plurality of subpixels 212, and each subpixel 212 is combined with a filter which transmits light with a specific wavelength band (color filter), whereby data for achieving color image display can be obtained.

Figure 45A:
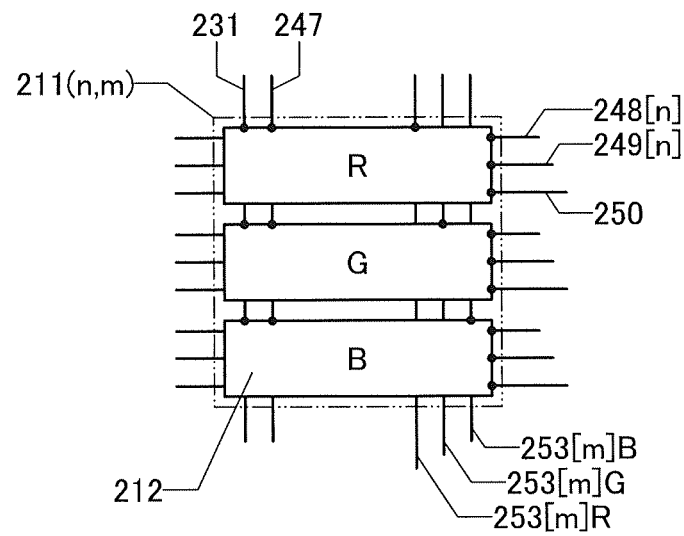
FIGS. 45A and 45B are block diagrams each illustrating a semiconductor device of one embodiment of the present invention.

FIG. 45A is a plan view showing an example of the pixel 211 with which a color image is obtained. The pixel 211 illustrated in FIG. 45A includes a subpixel 212 provided with a color filter transmitting light with a red (R) wavelength band (also referred to as a subpixel 212R), a subpixel 212 provided with a color filter transmitting light with a green (G) wavelength band (also referred to as a subpixel 212G), and a subpixel 212 provided with a color filter transmitting light with a blue (B) wavelength band (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independently provided. In this specification and the like, for example, the wiring 248 and the wiring 249 that are connected to the pixel 211 in the n-th row are referred to as a wiring 248[n] and a wiring 249[n]. For example, the wiring 253 connected to the pixel 211 in the m-th column is referred to as a wiring 253[m]. Note that in FIG. 45A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B. The subpixels 212 are electrically connected to the peripheral circuit through the above wirings.

Figure 45B:
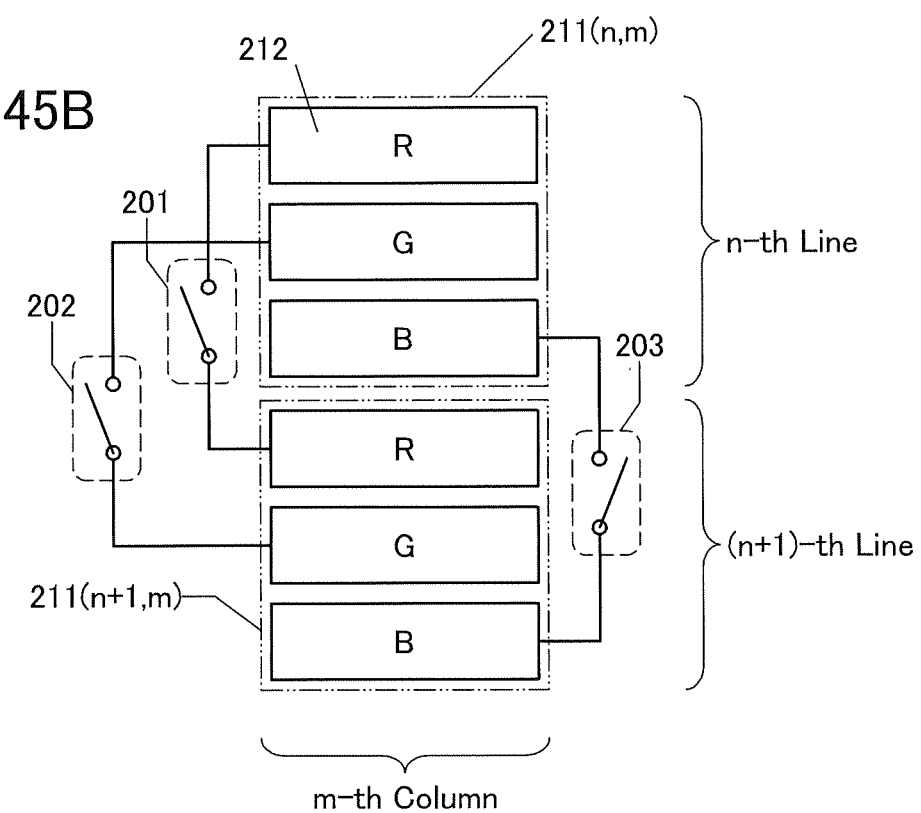

The imaging device 200 has a structure in which the subpixel 212 is electrically connected to the subpixel 212 in an adjacent pixel 211 which is provided with a color filter transmitting light with the same wavelength band as the subpixel 212, via a switch. FIG. 45B shows a connection example of the subpixels 212: the subpixel 212 in the pixel 211 arranged in an n-th (n is an integer greater than or equal to 1 and less than or equal top) row and an m-th (m is an integer greater than or equal to 1 and less than or equal to q) column and the subpixel 212 in the adjacent pixel 211 arranged in an (n+1)-th row and the m-th column. In FIG. 45B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light with four different wavelength bands are provided in one pixel 211, the reproducibility of colors of an obtained image can be increased.

For example, in FIG. 45A, in regard to the subpixel 212 sensing a red wavelength band, the subpixel 212 sensing a green wavelength band, and the subpixel 212 sensing a blue wavelength band, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing the same wavelength band are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 46A and 46B. With the lens 255, the photoelectric conversion element can receive incident light efficiently. Specifically, as illustrated in FIG. 46A, light 256 enters a photoelectric conversion element 220 through the lens 255, the filter 254 (a filter 254R, a filter 254G, and a filter 254B), a pixel circuit 230, and the like which are provided in the pixel 211.

As indicated by a region surrounded with dashed-dotted lines, however, part of the light 256 indicated by arrows might be blocked by some wirings 257. Thus, a preferable structure is such that the lens 255 and the filter 254 are provided on the photoelectric conversion element 220 side as illustrated in FIG. 46B, whereby the photoelectric conversion element 220 can efficiently receive the light 256. When the light 256 enters the photoelectric conversion element 220 from the photoelectric conversion element 220 side, the imaging device 200 with high sensitivity can be provided.

Figure 46A:
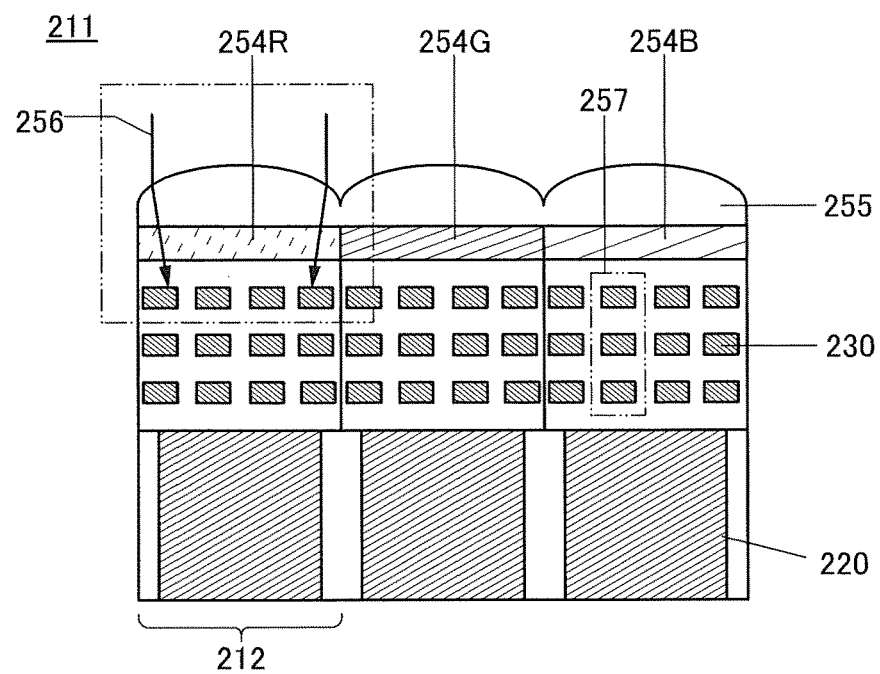
FIGS. 46A and 46B are cross-sectional views each illustrating a semiconductor device of one embodiment of the present invention.
Figure 46B:
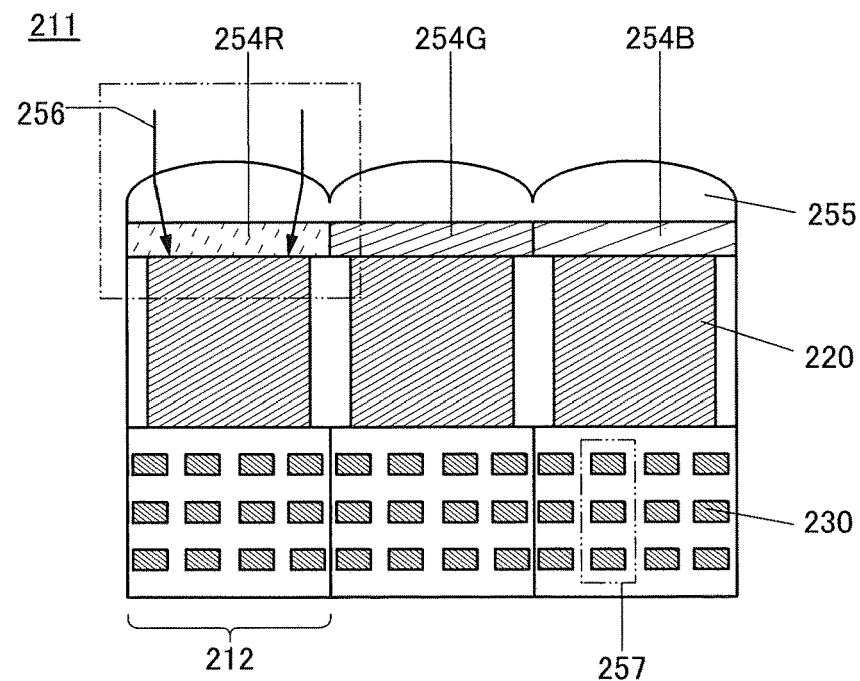

As the photoelectric conversion element 220 illustrated in FIGS. 46A and 46B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 45A and 45B.

Configuration Example 2 of Pixel

An example of a pixel including a transistor using silicon and a transistor using an oxide semiconductor is described below.

Figure 47A:
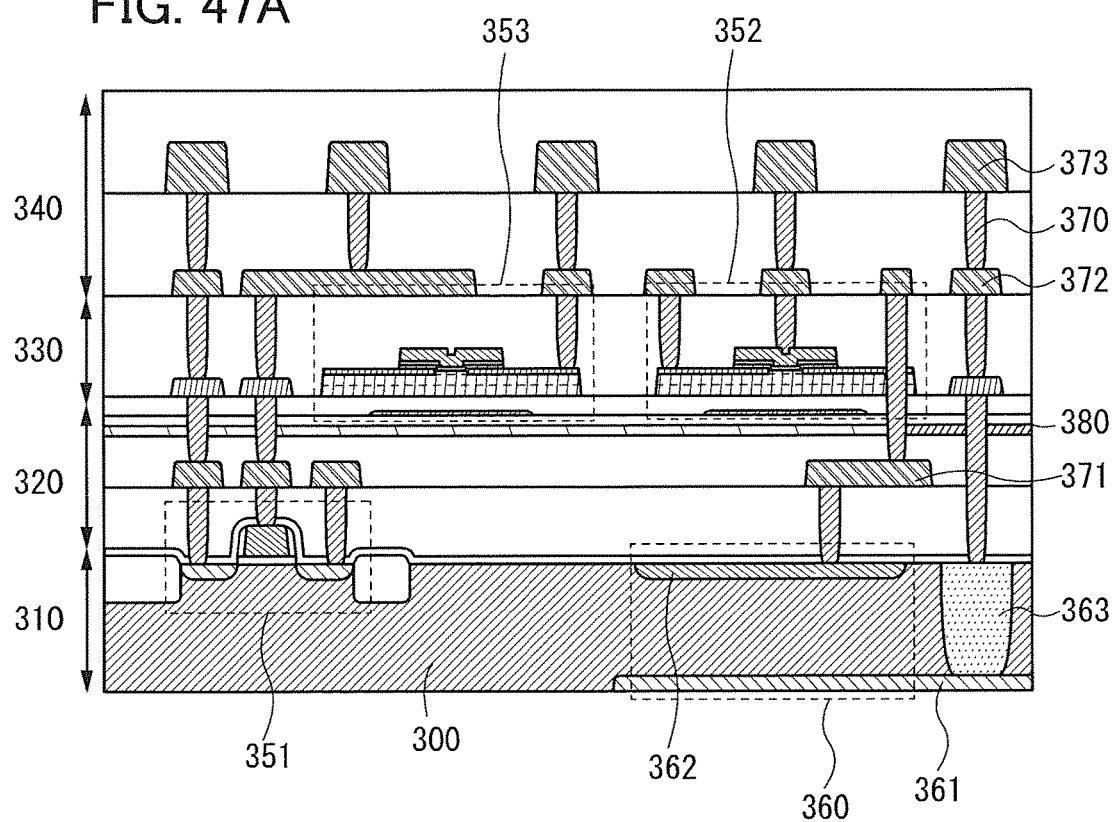
FIGS. 47A and 47B are cross-sectional views each illustrating a semiconductor device of one embodiment of the present invention.
Figure 47B:
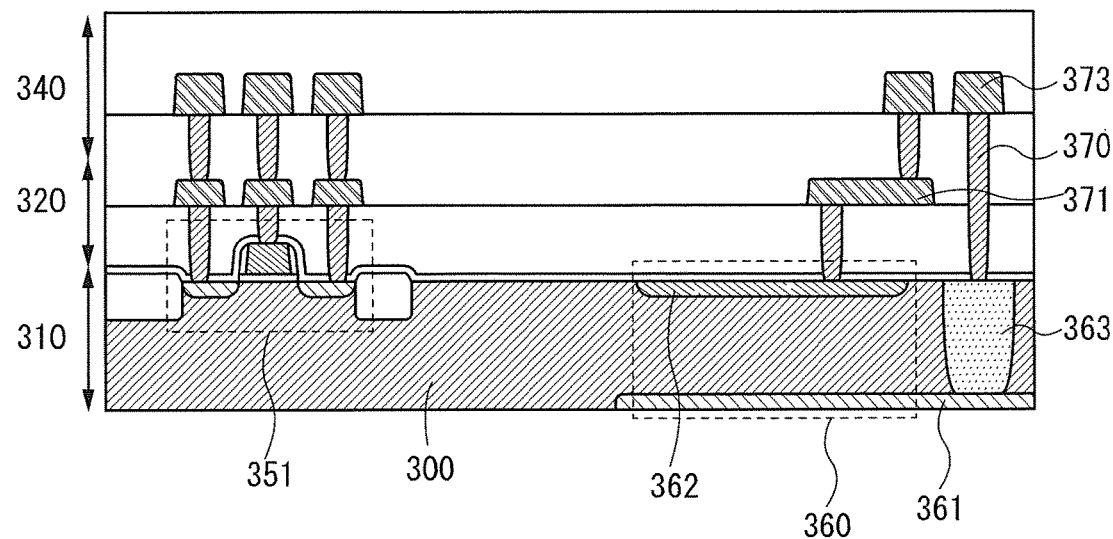

FIGS. 47A and 47B are each a cross-sectional view of an element included in an imaging device. The imaging device illustrated in FIG. 47A includes a transistor 351 including silicon over a silicon substrate 300, transistors 352 and 353 which include an oxide semiconductor and are stacked over the transistor 351, and a photodiode 360 provided in a silicon substrate 300. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

In the example of cross-sectional view in FIG. 47A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case where a pixel is formed with use of only transistors using an oxide semiconductor, the layer 310 may include the transistor using an oxide semiconductor. Alternatively, the layer 310 may be omitted, and the pixel may include only transistors using an oxide semiconductor.

In the case where a pixel is formed with use of only transistors using silicon, the layer 330 may be omitted. An example of a cross-sectional view in which the layer 330 is not provided is shown in FIG. 47B.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistor 351 and the photodiode 360 and the layer 330 including the transistors 352 and 353. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352, the transistor 353, and the like becomes one of factors generating a carrier in the oxide semiconductor. Thus, the hydrogen may cause a reduction of the reliability of the transistor 352, the transistor 353, and the like. Therefore, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 352, the transistor 353, and the like can be increased.

As the insulator 380, an insulator having a function of blocking oxygen or hydrogen is used, for example.

In the cross-sectional view in FIG. 47A, the photodiode 360 in the layer 310 and the transistor in the layer 330 can be formed so as to overlap with each other. Thus, the degree of integration of pixels can be increased. In other words, the resolution of the imaging device can be increased.

Figure 2:
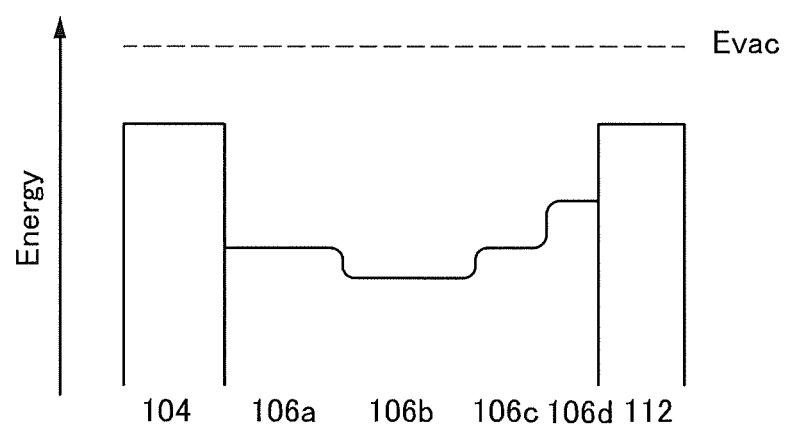
FIG. 2 is a band diagram showing one embodiment of the present invention.

As illustrated in FIG. 48A1 and FIG. 48B1, part or the whole of the imaging device can be bent. FIG. 48A1 illustrates a state in which the imaging device is bent in the direction of a dashed-dotted line X1-X2. FIG. 48A2 is a cross-sectional view illustrating a portion indicated by the dashed-dotted line X1-X2 in FIG. 48A1. FIG. 48A3 is a cross-sectional view illustrating a portion indicated by a dashed-dotted line Y1-Y2 in FIG. 48A1.

FIG. 48B1 illustrates a state where the imaging device is bent in the direction of a dashed-dotted line X3-X4 and the direction of a dashed-dotted line Y3-Y4. FIG. 48B2 is a cross-sectional view illustrating a portion indicated by the dashed-dotted line X3-X4 in FIG. 48B1. FIG. 48B3 is a cross-sectional view illustrating a portion indicated by the dashed-dotted line Y3-Y4 in FIG. 48B1.

The bent imaging device enables the curvature of field and astigmatism to be reduced. Thus, the optical design of lens and the like, which is used in combination of the imaging device, can be facilitated. For example, the number of lens used for aberration correction can be reduced; accordingly, a reduction of size or weight of electronic devices using the imaging device, and the like, can be achieved. In addition, the quality of a captured image can be improved.

<CPU>

A CPU including a semiconductor device such as any of the above-described transistors or the above-described memory device is described below.

Figure 49:
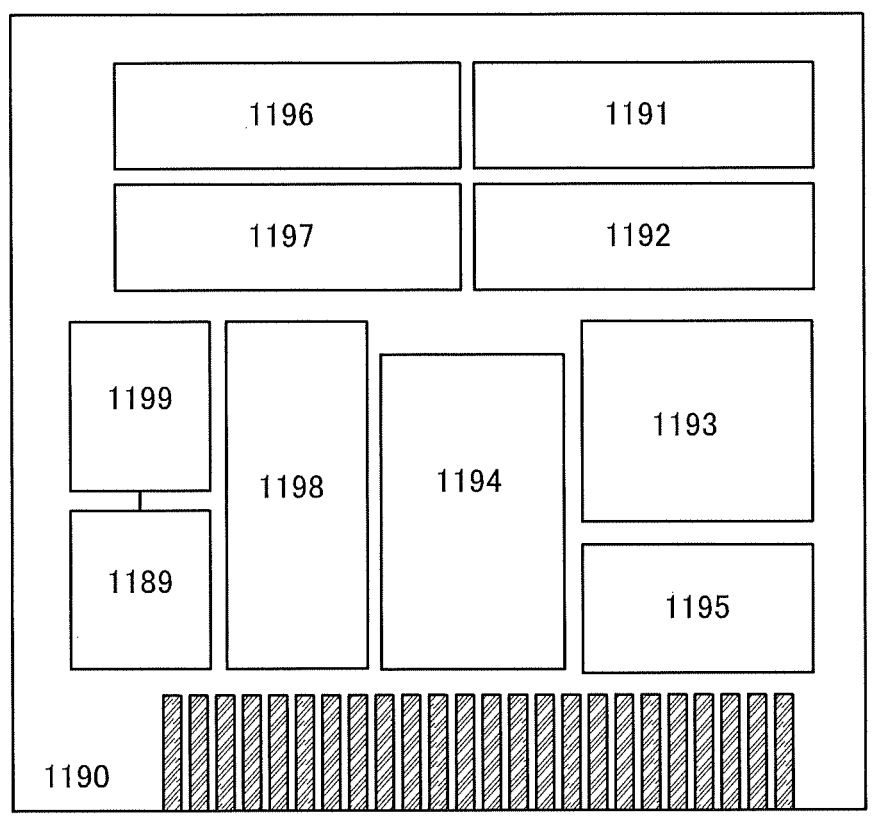
FIG. 49 is a block diagram illustrating a semiconductor device of one embodiment of the present invention.

FIG. 49 is a block diagram illustrating a configuration example of a CPU including any of the above-described transistors as a component.

The CPU illustrated in FIG. 49 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 49 is just an example in which the configuration has been simplified, and an actual CPU may have a variety of configurations depending on the application. For example, the CPU may have the following configuration: a structure including the CPU illustrated in FIG. 49 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 49, a memory cell is provided in the register 1196. For the memory cell of the register 1196, any of the above-described transistors, the above-described memory device, or the like can be used.

In the CPU illustrated in FIG. 49, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 50:
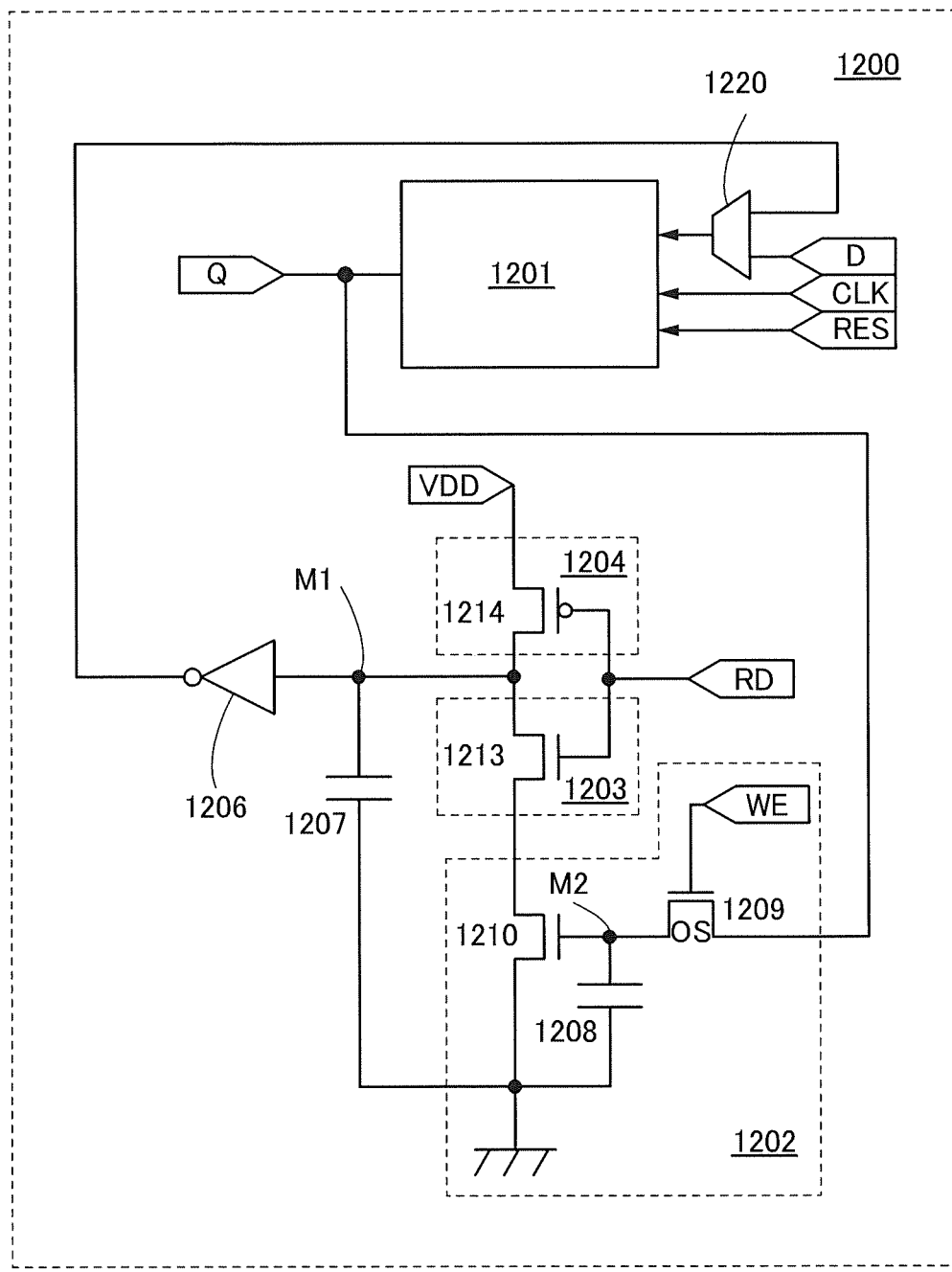
FIG. 50 is a circuit diagram of a semiconductor device of one embodiment of the present invention.

FIG. 50 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 50 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 50, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 50, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a film formed using a semiconductor other than an oxide semiconductor or in the substrate 1190 can be used for the rest of the transistors.

As the circuit 1201 in FIG. 50, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the transistor 1210 is brought into the on state or the off state depending on the signal retained by the capacitor 1208, and a signal corresponding to the state can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency (RF) device.

<Display Device>

A display device of one embodiment of the present invention is described below with reference to FIGS. 51A to 51C and FIGS. 52A and 52B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 51A:
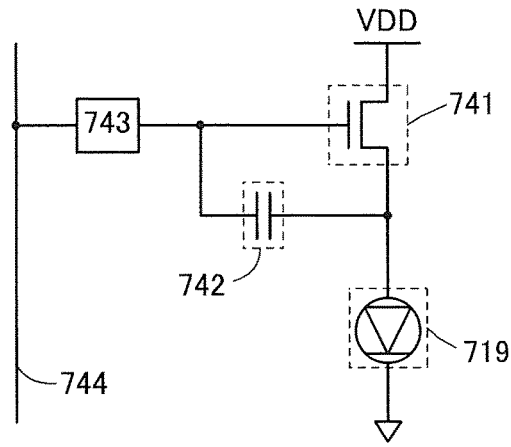
FIGS. 51A to 51C are a circuit diagram, a top view, and a cross-sectional view illustrating a semiconductor device of one embodiment of the present invention.
Figure 51B:
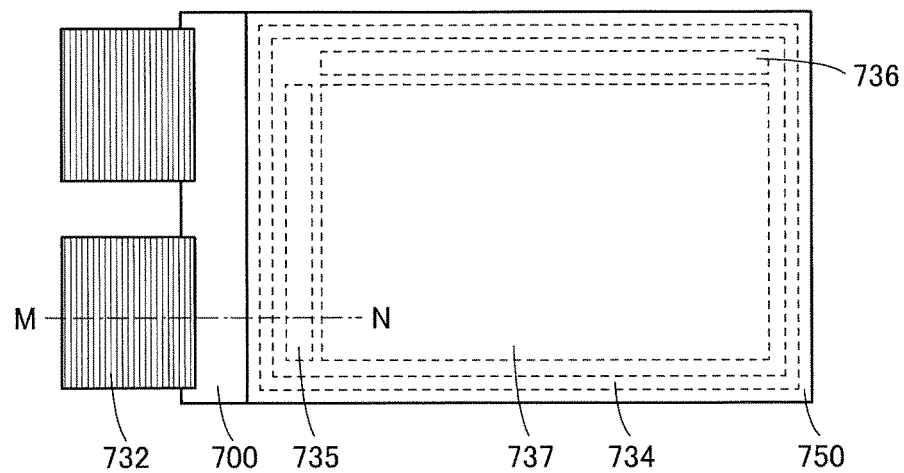
Figure 51C:
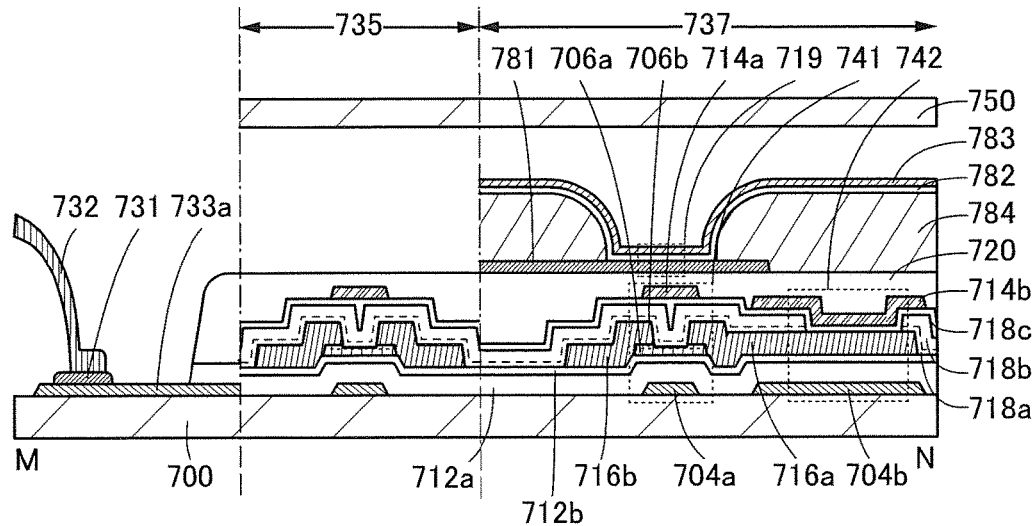

FIGS. 51A to 51C illustrate an example of an EL display device of one embodiment of the present invention. FIG. 51A is a circuit diagram of a pixel in an EL display device. FIG. 51B is a plan view showing the whole of the EL display device. FIG. 51C is a cross-sectional view taken along part of dashed-dotted line M-N in FIG. 51B.

FIG. 51A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 51A includes a switching element 743, a transistor 741, a capacitor 742, and a light-emitting element 719.

Note that FIG. 51A and the like each illustrate an example of a circuit structure; therefore, a transistor can be provided additionally. In contrast, for each node in FIG. 51A, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 51B is a plan view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 51C is a cross-sectional view of the EL display device taken along part of dashed-dotted line M-N in FIG. 51B.

FIG. 51C illustrates a structure of the transistor 741 including a conductor 704a over the substrate 700; an insulator 712a over the conductor 704a; an insulator 712b over the insulator 712a; semiconductors 706a and 706b that are over the insulator 712b and overlap with the conductor 704a; a conductor 716a and a conductor 716b in contact with the semiconductors 706a and 706b; an insulator 718a over the semiconductor 706b, the conductor 716a, and the conductor 716b; an insulator 718b over the insulator 718a; an insulator 718c over the insulator 718b; and a conductor 714a that is over the insulator 718c and overlaps with the semiconductor 706b. Note that the structure of the transistor 741 is just an example; the transistor 741 may have a structure different from that illustrated in FIG. 51C.

Thus, in the transistor 741 illustrated in FIG. 51C, the conductor 704a serves as a gate electrode, the insulator 712a and the insulator 712b serve as a gate insulator, the conductor 716a serves as a source electrode, the conductor 716b serves as a drain electrode, the insulator 718a, the insulator 718b, and the insulator 718c serve as a gate insulator, and the conductor 714a serves as a gate electrode. Note that in some cases, electrical characteristics of the semiconductors 706a and 706b change if light enters the semiconductors 706a and 706b. To prevent this, it is preferable that one or more of the conductor 704a, the conductor 716a, the conductor 716b, and the conductor 714a have a light-blocking property.

Note that the interface between the insulator 718a and the insulator 718b is indicated by a broken line. This means that the boundary between them is not clear in some cases. For example, in the case where the insulator 718a and the insulator 718b are formed using insulators of the same kind, the insulator 718a and the insulator 718b are not distinguished from each other in some cases depending on an observation method.

FIG. 51C illustrates a structure of the capacitor 742 including a conductor 704b over the substrate; the insulator 712a over the conductor 704b; the insulator 712b over the insulator 712a; the conductor 716a that is over the insulator 712b and overlaps with the conductor 704b; the insulator 718a over the conductor 716a; the insulator 718b over the insulator 718a; the insulator 718c over the insulator 718b; and a conductor 714b that is over the insulator 718c and overlaps with the conductor 716a. In this structure, part of the insulator 718a and part of the insulator 718b are removed in a region where the conductor 716a and the conductor 714b overlap with each other.

In the capacitor 742, each of the conductor 704b and the conductor 714b serves as one electrode, and the conductor 716a serves as the other electrode.

Thus, the capacitor 742 can be formed using a film of the transistor 741. The conductor 704a and the conductor 704b are preferably conductors of the same kind, in which case the conductor 704a and the conductor 704b can be formed through the same step. Furthermore, the conductor 714a and the conductor 714b are preferably conductors of the same kind, in which case the conductor 714a and the conductor 714b can be formed through the same step.

The capacitor 742 illustrated in FIG. 51C has a large capacitance per area occupied by the capacitor. Therefore, the EL display device illustrated in FIG. 51C has high display quality. Note that although the capacitor 742 illustrated in FIG. 51C has the structure in which the part of the insulator 718a and the part of the insulator 718b are removed to reduce the thickness of the region where the conductor 716a and the conductor 714b overlap with each other, the structure of the capacitor according to one embodiment of the present invention is not limited to the structure. For example, a structure in which part of the insulator 718c is removed to reduce the thickness of the region where the conductor 716a and the conductor 714b overlap with each other may be used.

An insulator 720 is provided over the transistor 741 and the capacitor 742. Here, the insulator 720 may have an opening reaching the conductor 716a that serves as the source electrode of the transistor 741. A conductor 781 is provided over the insulator 720. The conductor 781 may be electrically connected to the transistor 741 through the opening in the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719.

So far, examples of the EL display device are described. Next, an example of a liquid crystal display device is described.

Figure 52A:
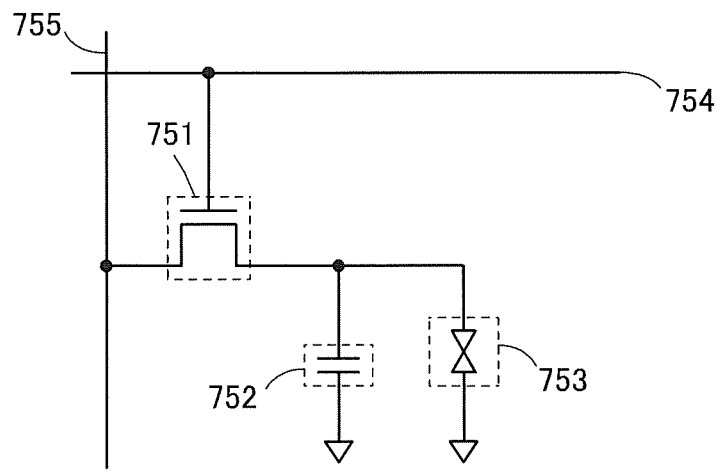
FIGS. 52A and 52B are a circuit diagram and a cross-sectional view illustrating a semiconductor device of one embodiment of the present invention.

FIG. 52A is a circuit diagram illustrating a configuration example of a pixel of a liquid crystal display device. A pixel shown in FIGS. 52A and 52B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 52B:
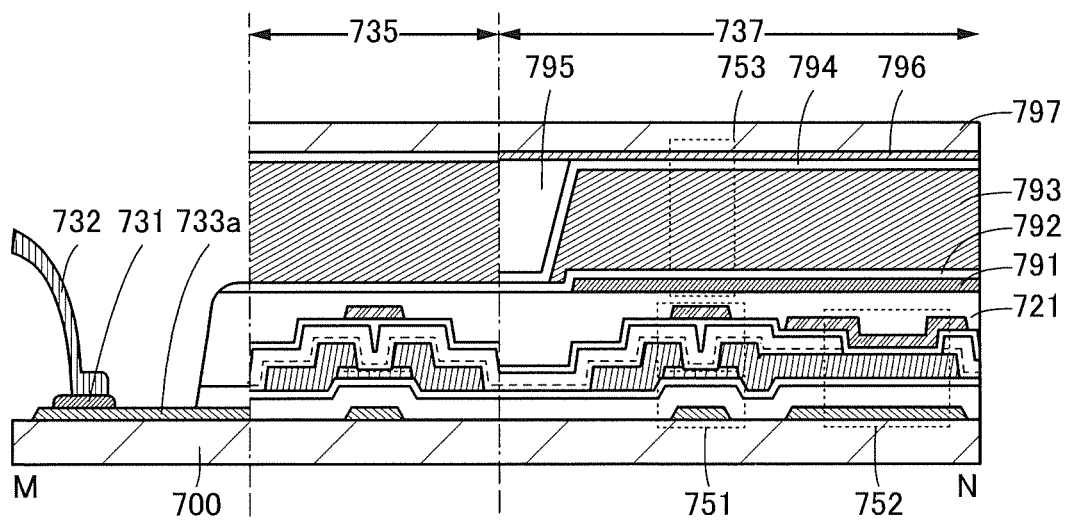

Note that the description of the liquid crystal display device is made on the assumption that the plan view of the liquid crystal display device is similar to that of the EL display device. FIG. 52B is a cross-sectional view of the liquid crystal display device taken along dashed-dotted line M-N in FIG. 51B. In FIG. 52B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 52B corresponds to, but is not limited to, the structure of the capacitor 742 in FIG. 51C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 53A to 53F illustrate specific examples of these electronic devices.

Figure 53A:
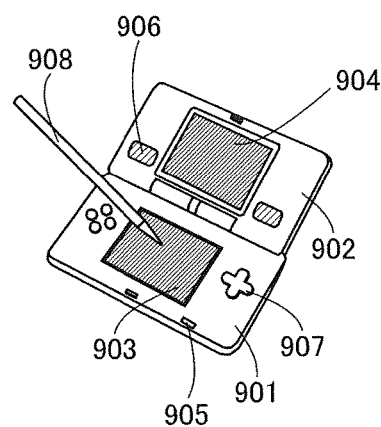
FIGS. 53A to 53F are perspective views each illustrating an electronic device of one embodiment of the present invention.

FIG. 53A illustrates a portable game console including a housing 901, a housing 902, a display portion 903, a display portion 904, a microphone 905, a speaker 906, an operation key 907, a stylus 908, and the like. Although the portable game console in FIG. 53A has the two display portions 903 and 904, the number of display portions included in a portable game console is not limited to this.

Figure 53B:
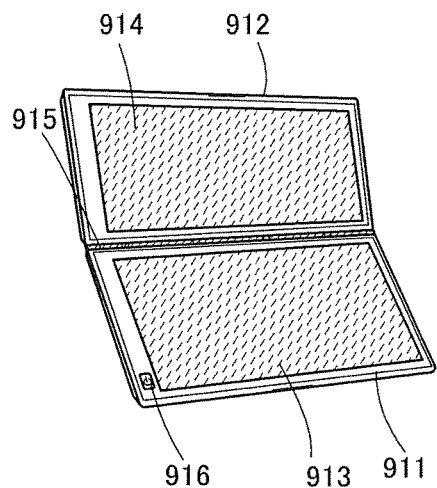

FIG. 53B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 53C:
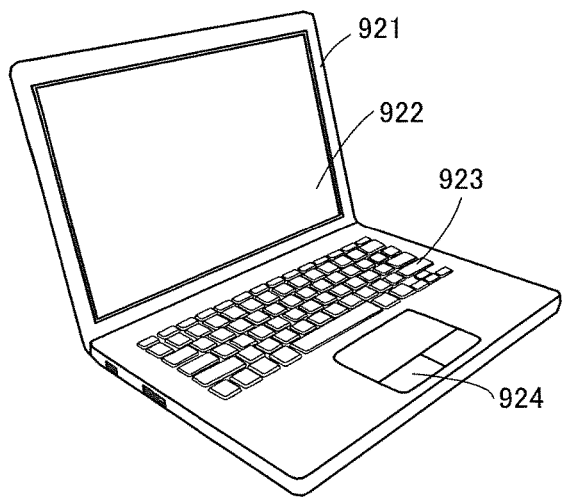

FIG. 53C illustrates a laptop personal computer, which includes a housing 921, a display portion 922, a keyboard 923, a pointing device 924, and the like.

Figure 53D:
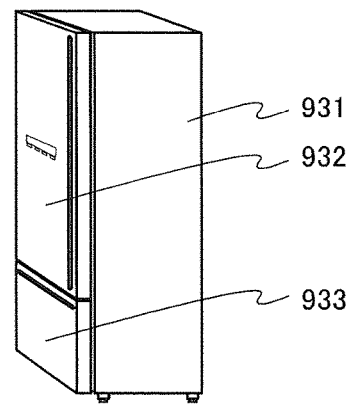

FIG. 53D illustrates an electric refrigerator-freezer, which includes a housing 931, a door for a refrigerator 932, a door for a freezer 933, and the like.

Figure 53E:
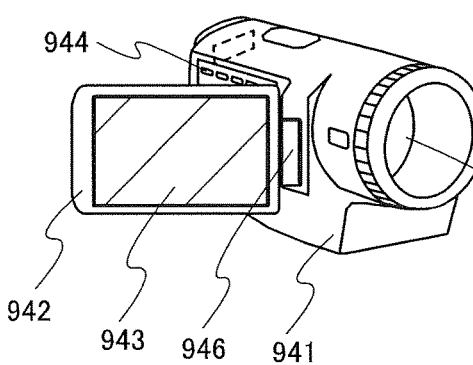

FIG. 53E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 53F:
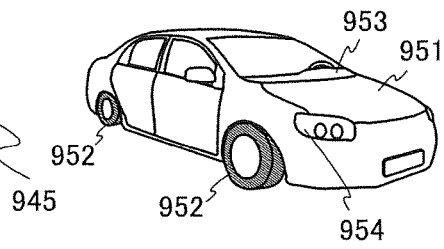

FIG. 53F illustrates a car including a car body 951, wheels 952, a dashboard 953, lights 954, and the like.

This embodiment describes one embodiment of the present invention. Note that one embodiment of the present invention is not limited to this. That is, various embodiments of the invention are described in this embodiment and the like, and one embodiment of the present invention is not limited to a particular embodiment. For example, an example in which a channel formation region, source and drain regions, and the like of a transistor include an oxide semiconductor is described as one embodiment of the present invention; however, one embodiment of the present invention is not limited to this example. Alternatively, depending on circumstances or conditions, various semiconductors may be included in various transistors, a channel formation region of a transistor, a source region or a drain region of a transistor, or the like of one embodiment of the present invention. Depending on circumstances or conditions, for example, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, a source region or a drain region of a transistor, or the like of one embodiment of the present invention. Alternatively, depending on circumstances or conditions, an oxide semiconductor is not necessarily included in various transistors, a channel formation region of a transistor, a source region or a drain region of a transistor, or the like of one embodiment of the present invention, for example.

EXAMPLE 1

In this example, device simulation was performed on a transistor of one embodiment of the present invention to examine the electrical characteristics of the transistor.

Figure 54A:
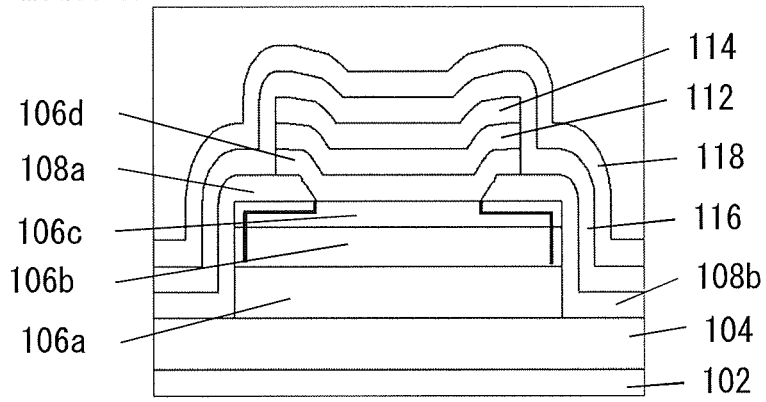
FIGS. 54A to 54C are cross-sectional views of models used for calculation in Example.
Figure 54B:
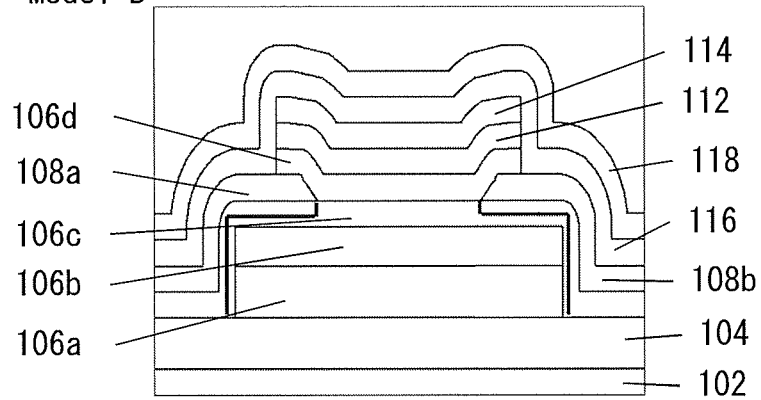
Figure 54C:
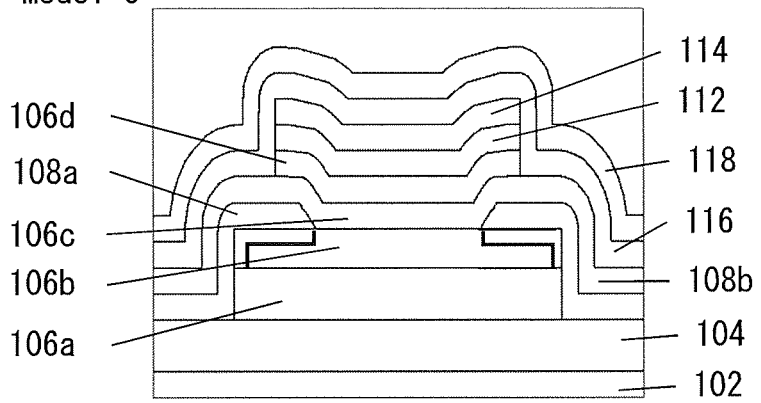

In this example, models A to C that correspond to the transistor 17, the transistor 22, and the transistor 30 described in the above embodiments were fabricated and the device simulation was performed on the models A to C. FIGS. 54A to 54C are cross-sectional views of the models A to C.

As described in the above embodiments, the transistor 17, the transistor 22, and the transistor 30 are modification examples of the transistor 10. Accordingly, each of the models A to C also includes the conductor 102, the insulator 104, the insulator 106a, the semiconductor 106b, the insulator 106c, the insulator 106d, the conductors 108a and 108b, the insulator 112, the conductor 114, the insulator 116, and the insulator 118.

Here, the models A to C are different in the way the insulator 106c is provided. In the model A, an end portion of the insulator 106c and end portions of the insulator 106a and the semiconductor 106b are aligned with each other. In the model B, the insulator 106c covers side surfaces of the insulators 106a and 106b. In the model C, the insulator 106c covers the insulator 106a, the semiconductor 106b, the conductor 108a, and the conductor 108b.

Here, the insulator 106a was assumed as IGZO (132), the semiconductor 106b was assumed as IGZO (111), the insulator 106c was assumed as IGZO (132), and the insulator 106d was assumed as $GaO_x$. It was supposed that in regions of the semiconductor 106b and the insulator 106c that were in contact with the conductor 108a and the conductor 108b, low-resistance regions were formed to a depth of 2.5 nm.

A device simulator "Atlas" developed by Silvaco Inc. was used for the calculation. Major calculation conditions were as follows: L/W=0.8 μm/0.8 μm, and the thicknesses of the insulator 104, the insulator 106a, the semiconductor 106b, the insulator 106c, the insulator 106d, and the insulator 112 were 400 nm, 20 nm, 15 nm, 5 nm, 5 nm, and 20 nm, respectively. Table 1 lists parameters used for the calculation. Note that Eg represents an energy gap, Nc represents the effective density of states in the conduction band, and Nv represents the effective density of states in the valence band. The parameters of the insulator 106a are the same as those of the insulator 106c except for the thickness.

TABLE 1

| | | |
|---|---|---|
| Structure | Channel length L | 800 nm |
| | Channel width W | 800 nm |
| Insulator 118 | Dielectric constant | 8 |
| Insulator 116 | Dielectric constant | 4.1 |
| Insulator 112 | Dielectric constant | 4.1 |
| | Thickness | 20 nm |
| Insulator 106d | Composition | $GaO_x$ |
| | Electron affinity | 3.9 eV |
| | Eg | 4.2 eV |
| | Dielectric constant | 15 |
| | Donor density | 6.60E−09 $cm^{-3}$ |
| | Electron mobility | 0.1 $cm^2/Vs$ |
| | Hole mobility | 0.01 $cm^2/Vs$ |
| | Nc | 5.00E+18 $cm^{-3}$ |
| | Nv | 5.00E+18 $cm^{-3}$ |
| | Thickness | 5 nm |
| Insulator 106c | Composition | IGZO(145/132) |
| | Electron affinity | 4.3 eV |
| | Eg | 3.7 eV |
| | Dielectric constant | 15 |
| | Donor density | 6.60E−09 $cm^{-3}$ |

TABLE 1-continued

| | | |
|---|---|---|
| | Electron mobility | 0.1 cm²/Vs |
| | Hole mobility | 0.01 cm²/Vs |
| | Nc | 5.00E+18 cm$^{-3}$ |
| | Nv | 5.00E+18 cm$^{-3}$ |
| | Thickness | 5 nm |
| Semiconductor 106b | Composition | IGZO(111) |
| | Electron affinity | 4.6 eV |
| | Eg | 3.2 eV |
| | Dielectric constant | 15 |
| | Donor density | 6.60E−09 cm$^{-3}$ |
| | Donor density (under SD) | 5.00E+18 cm$^{-3}$ |
| | Electron mobility | 10 cm²/Vs |
| | Hole mobility | 0.01 cm²/Vs |
| | Nc | 5.00E+18 cm$^{-3}$ |
| | Nv | 5.00E+18 cm$^{-3}$ |
| | Thickness | 15 nm |
| Insulator 106a | Composition | IGZO(145/132) |
| | Thickness | 20 nm |
| Insulator 104 | Composition | 4.1 |
| | Thickness | 400 nm |
| Conductor 102 | Work function | 5 eV |
| | Applied voltage | 0 V |
| Conductor 114 | Work function | 5 eV |
| Conductors 108a, 108b | Work function | 4.3 eV |
| | Thickness | 100 nm |

As described in the above embodiment, the energy gap of the insulator 106a is larger than that of the semiconductor 106b. The energy gap of the insulator 106c is larger than that of the semiconductor 106b. The energy gap of the insulator 106d is larger than that of the insulator 106c.

Figure 55A:
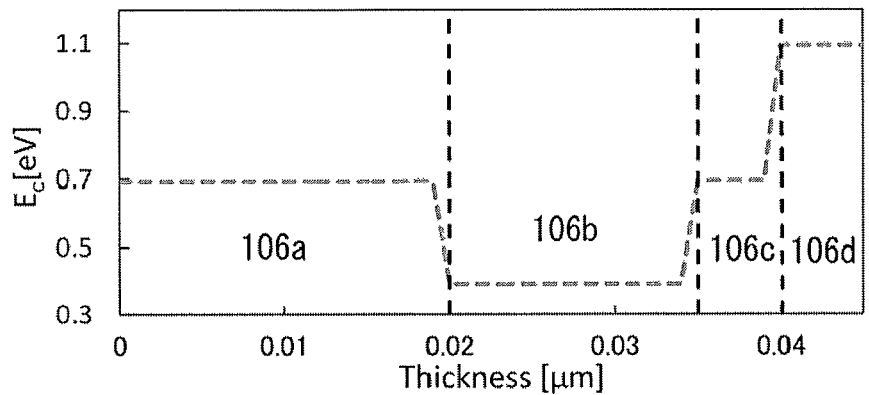
FIGS. 55A to 55C are graphs showing energy levels calculated in Example.
Figure 55B:
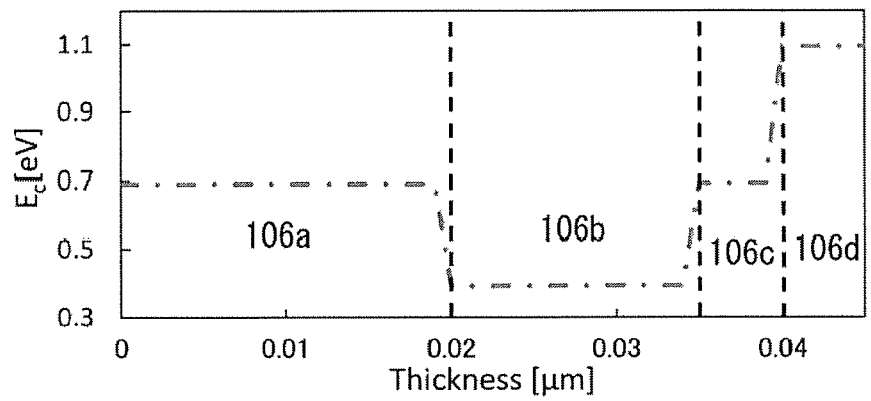
Figure 55C:
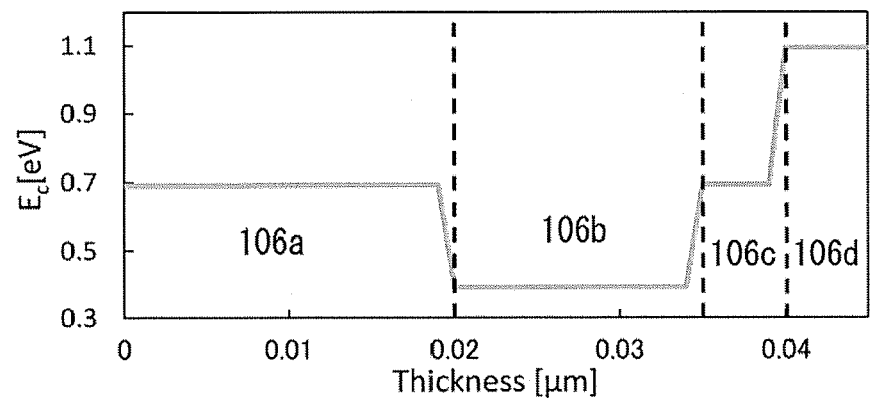

FIGS. 55A to 55C show calculation results of the energy level Ec of the conduction band minimum for the models A to C. In FIGS. 55A to 55C, the insulator 106a, the semiconductor 106b, the insulator 106c, and the insulator 106d in the thickness direction are plotted on the horizontal axis, where a boundary between the insulator 104 and the insulator 106a is plotted at 0 μm, and the vertical axis represents the energy level Ec of the conduction band minimum. Note that the energy level of the conduction band minimum in each of FIGS. 55A to 55C corresponds to that of the vicinity of the midpoint between the conductor 108a and the conductor 108b in the cross-sectional views of the models A to C.

The energy levels Ec of the conduction band minimum that are shown in FIGS. 55A to 55C were as follows. The energy level Ec of the conduction band minimum of the insulator 106a is closer to the vacuum level than the energy level Ec of the conduction band minimum of the semiconductor 106b is. The energy level Ec of the conduction band minimum of the insulator 106c is closer to the vacuum level than the energy level Ec of the conduction band minimum of the semiconductor 106b is. The energy level Ec of the conduction band minimum of the insulator 106d is closer to the vacuum level than the energy level Ec of the conduction band minimum of the insulator 106c is.

In addition, the energy level Ec of the conduction band minimum of each of the insulator 106a, the semiconductor 106b, the insulator 106c, and the insulator 106d differed only slightly between the models A to C.

Figure 56:
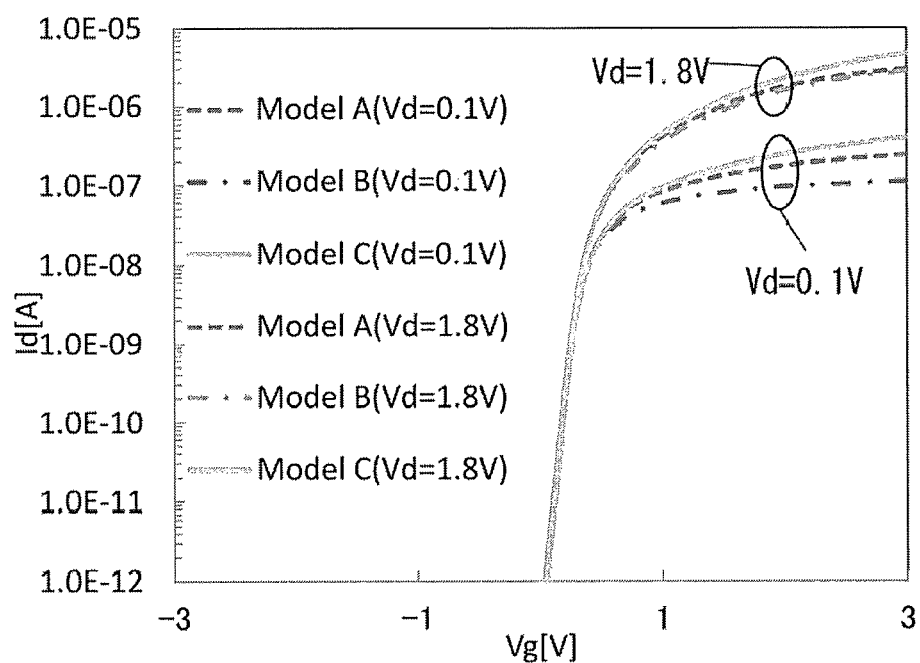
FIG. 56 is a graph showing $I_d$-$V_g$ characteristics calculated in Example.
Figure 57A:
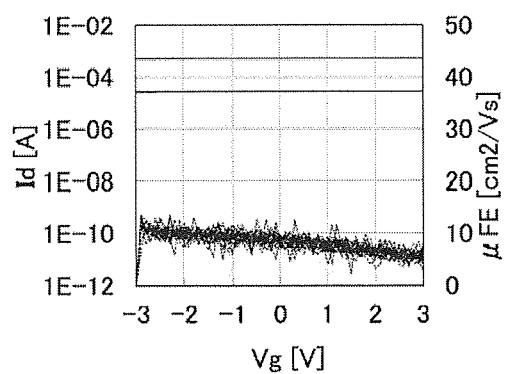
FIGS. 57A to 57D are graphs showing $I_d$-$V_g$ characteristics measured in Example.
Figure 57B:
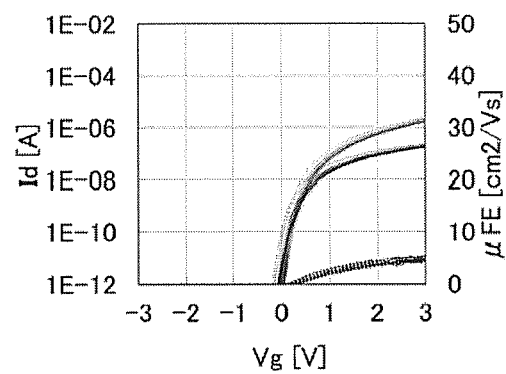
Figure 57C:
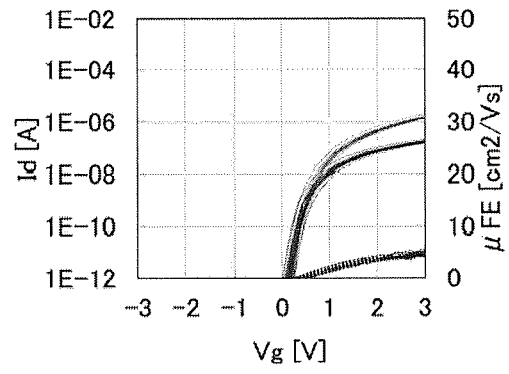
Figure 57D:
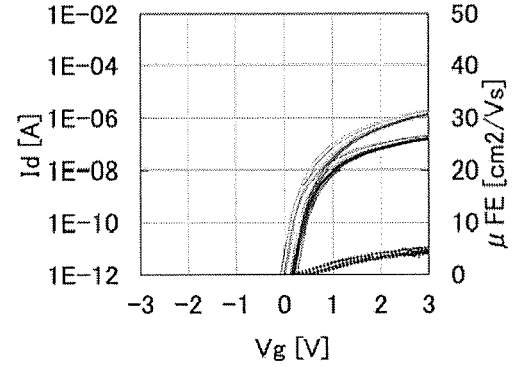

The device simulation was performed on the models A to C satisfying the relation of energy gaps and that of energy levels described in the above embodiment, and the obtained $I_d$-$V_g$ characteristics (drain current-gate voltage characteristics) are shown in FIG. 56. In FIG. 56, the horizontal axis represents gate voltage $V_g$ [V] and the vertical axis represents drain current $I_d$ [A]. Drain voltage $V_d$ was 0.1 V or 1.8 V, and gate voltage $V_g$ was swept from −3.0 V to 3.0 V.

As shown in FIG. 56, a sufficiently high on/off ratio and favorable transistor characteristics were obtained in each of the models A to C. In the model C, since the conductor 108a and the conductor 108b serving as the source electrode and the drain electrode of the transistor are in direct contact with a top surface of the semiconductor 106b, on-state current higher than that of the model A and the model B was obtained.

In the transistors subjected to the device simulation in this example, diffusion of In from the insulator 106d to the insulator 112 can be reduced owing to the insulator 106d to inhibit an increase in leakage current, as described in the above embodiment. Moreover, the insulator 106c between the semiconductor 106b and the insulator 106d allows a favorable interface to be formed between the insulator 106c and the semiconductor 106b where a channel is mainly formed.

EXAMPLE 2

In this example, as a transistor of one embodiment of the present invention, a transistor was fabricated by adding oxygen ions by an ion implantation method. A transistor 2A was fabricated as a comparative example without addition of oxygen ions, and transistors 2B to 2D were fabricated as transistors of embodiments of the present invention.

FIGS. 23A to 23C and other drawings can be referred to for the structure of the transistors, and FIGS. 31A to 31H, FIGS. 32A to 32F, and FIGS. 33A to 33F and other drawings can be referred to for the manufacturing method of the transistors.

First, a silicon substrate in which a 100-nm-thick silicon oxide film, a 280-nm-thick silicon nitride oxide film, a 300-nm-thick silicon oxide film, and a 300-nm-thick silicon oxide film were stacked in this order was prepared as the substrate 150.

Next, a 50-nm-thick aluminum oxide film was formed as the insulator 151 by a sputtering method.

Next, a 150-nm-thick tungsten film was formed by a sputtering method. A resist was formed over the tungsten film, and the tungsten film was processed using the resist to form the conductor 152 (see FIGS. 31A and 31B).

Next, a 20-nm-thick aluminum oxide film was formed as the insulator 153 by an ALD method. After that, heat treatment was performed at 550° C. in a nitrogen atmosphere for 1 hour.

Then, a 60-nm-thick silicon oxide film was formed as the insulator 154 by a PECVD method (see FIGS. 31C and 31D).

Next, a 20-nm-thick In—Ga—Zn oxide film was formed by a DC sputtering method to form the insulator 176a using a target having an atomic ratio of In:Ga:Zn=1:3:4 and deposition gases of an argon gas at 40 sccm and an oxygen gas at 5 sccm. A deposition pressure was 0.7 Pa (measured by Miniature Gauge MG-2 manufactured by CANON ANELVA CORPORATION). A deposition power was 500 W. A substrate temperature was 200° C. A distance between the target and the substrate was 60 mm.

Next, a 20-nm-thick In—Ga—Zn oxide film was formed by a DC sputtering method to form the semiconductor 176b using a target having an atomic ratio of In:Ga:Zn=1:1:1 and deposition gases of an argon gas at 30 sccm and an oxygen gas at 15 sccm. A deposition pressure was 0.7 Pa (measured by Miniature Gauge MG-2 manufactured by CANON ANELVA CORPORATION). A deposition power was 500 W. A substrate temperature was 300° C. A distance between the target and the substrate was 60 mm.

Next, heat treatment was performed at 450° C. under a nitrogen atmosphere for 1 hour. In addition, heat treatment was performed at 450° C. under an oxygen atmosphere for 1 hour.

Then, a 150-nm-thick tungsten film was formed by a DC sputtering method to form the conductor 178 (see FIGS. 31E and 31F).

A resist was then formed over the conductor 178, and the conductor 178 was processed using the resist to form the conductors 158a and 158b.

Next, the insulator 176a and the semiconductor 176b were processed using the resist, the conductor 158a, and the conductor 158b to form the insulator 156a and the semiconductor 156b (see FIGS. 31G and 31H).

Next, a 5-nm-thick gallium oxide film was formed by an RF sputtering method to form the insulator 176c using deposition gases of an argon gas at 30 sccm and an oxygen gas at 15 sccm. A deposition pressure was 0.4 Pa. A deposition power was 1000 W. A substrate temperature was 200° C. A distance between the target and the substrate was 60 mm.

A 20-nm-thick silicon oxynitride film was formed by a PECVD method to form the insulator 182.

Then, a 30-nm-thick titanium nitride film and a 135-nm-thick tungsten film were formed in this order by a DC sputtering method to form the conductor 184 (see FIGS. 32A and 32B). A resist was then formed over the conductor 184, and the conductor 184 was processed using the resist to form the conductor 164.

Then, the insulator 176c and the insulator 182 were processed using the resist and/or the conductor 164 to form the insulator 156c and the insulator 162 (see FIGS. 32C and 32D).

After that, a 10-nm-thick aluminum oxide film was formed by an ALD method as the insulator 166 (see FIGS. 32E and 32F).

Then, oxygen ions were added at a dose of $1 \times 10^{16}$ ions/cm$^2$ using an ion implantation apparatus (see FIGS. 33A and 33B). Here, the addition of oxygen ions was not performed in the transistor 2A; oxygen ions were added at an acceleration voltage of 5 kV in the transistor 2B; oxygen ions were added at an acceleration voltage of 7.5 kV in the transistor 2C; and oxygen ions were added at an acceleration voltage of 10 kV in the transistor 2D.

Next, a 130-nm-thick aluminum oxide film was formed by an RF sputtering method.

Next, heat treatment was performed at 400° C. under an oxygen atmosphere for 1 hour (see FIGS. 33C and 33D).

Then, a 300-nm-thick silicon oxynitride film was formed by a PECVD method.

Next, a 50-nm-thick titanium film, a 200-nm-thick aluminum film, and a 50-nm-thick titanium film were formed in this order by a DC sputtering method. The films were processed using a resist to form the conductor 170a and the conductor 170b (see FIGS. 33E and 33F).

In this manner, the transistors 2A to 2D each having a channel length L of 0.77 μm and a channel width W of 0.99 μm were fabricated.

The $I_d$-$V_g$ characteristics (drain current-gate voltage characteristics) of the transistors 2A to 2D were measured. The $I_d$-$V_g$ characteristics of the transistors were measured under the following conditions: the backgate voltage was 0 V, the drain voltage was 0.1 V or 1.8 V, and the gate voltage was swept from −3.0 V to 3.0 V in increments of 0.1 V.

Measured $I_d$-$V_g$ characteristics are shown in FIGS. 57A to 57D. FIGS. 57A, 57B, 57C, and 57D show the $I_d$-$V_g$ characteristics of the transistors 2A, 2B, 2C, and 2D, respectively. The horizontal axis represents gate voltage $V_g$ [V], the left vertical axis represents drain current $I_d$ [A], and the right vertical axis represents field-effect mobility μFE [cm$^2$/Vs]. In each of FIGS. 57A to 57D, a solid line denotes drain current and a dashed line denotes field-effect mobility.

As shown in FIGS. 57A to 57D, the transistor 2A without the addition of oxygen ions do not exhibit on/off ratio and electrical characteristics were not obtained, while the transistors 2B to 2D in which oxygen ions were added showed favorable electrical characteristics. Furthermore, the transistors 2B to 2D also had favorable field-effect mobility.

The above results suggest that by adding oxygen ions through the insulator 166 serving as an interlayer insulating film, excess oxygen is supplied and defects such as oxygen vacancies are reduced in the oxide semiconductor of the transistor. The use of such an oxide semiconductor with reduced defects makes it possible to provide a transistor with stable electrical characteristics.

EXAMPLE 3

In this example, TDS analysis results of an aluminum oxide film formed by an RF sputtering method are described. The following samples were used in the TDS analysis: a comparative sample 3A in which an aluminum oxide film was not formed, an example sample 3B in which an aluminum oxide film was formed by an RF sputtering method, an example sample 3C in which an aluminum oxide film was formed by an RF sputtering method and then removed, and an example sample 3D in which an aluminum oxide film was formed by an RF sputtering method, heat treatment was performed under an oxygen atmosphere, and the aluminum oxide film was removed.

First, by thermal oxidation of a silicon wafer, a 100-nm-thick thermal oxidation film was formed on a surface of the silicon wafer. The thermal oxidation was performed at 950° C. in an oxygen atmosphere containing HCl at 3 volume % for 4 hours.

Next, in the samples 3B to 3D, a 20-nm-thick aluminum oxide film was formed over the thermal oxidation film by an RF sputtering method using deposition gases of an argon gas at 25 sccm and an oxygen gas at 25 sccm. A deposition pressure was 0.4 Pa. A deposition power was 2500 W. A substrate temperature was 250° C. A distance between the target and the substrate was 60 mm.

Next, heat treatment was performed on the sample 3D at 400° C. under an oxygen atmosphere for 1 hour.

Then, for the samples 3C and 3D, wet etching was performed at 85° C. to remove the aluminum oxide film.

The samples 3A to 3D formed in the above manner were subjected to TDS analysis and the results are shown in FIGS. 58A to 58D. Note that in the TDS analysis, the amount of a released gas with a mass-to-charge ratio M/z=32, which corresponds to an oxygen molecule, was measured. In each of FIGS. 58A to 58D, the horizontal axis represents substrate heating temperature [° C.] and the vertical axis represents intensity proportional to the amount of the released gas with a mass-to-charge ratio M/z=32.

Figure 58A:
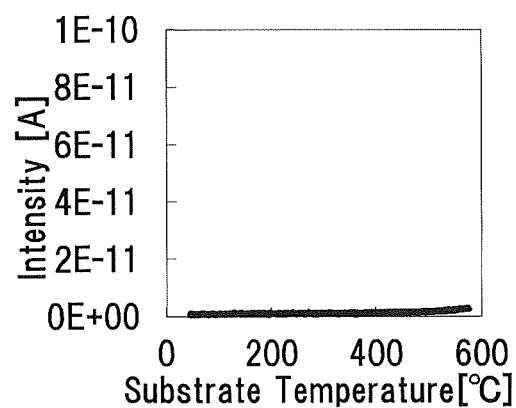
FIGS. 58A to 58D are graphs showing results of TDS analysis in Example.
Figure 58B:
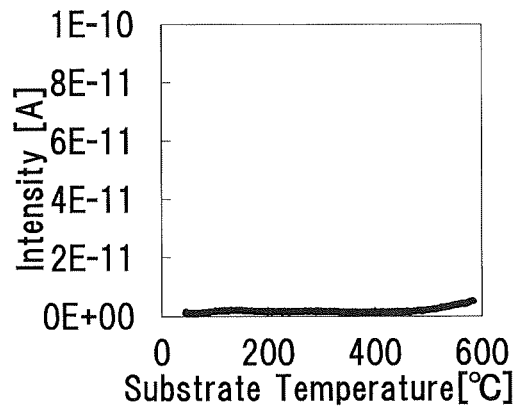
Figure 58C:
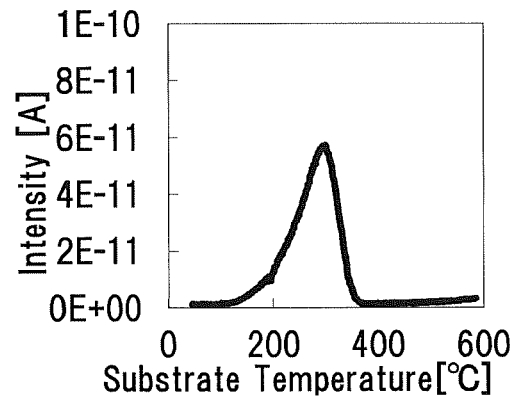
Figure 58D:
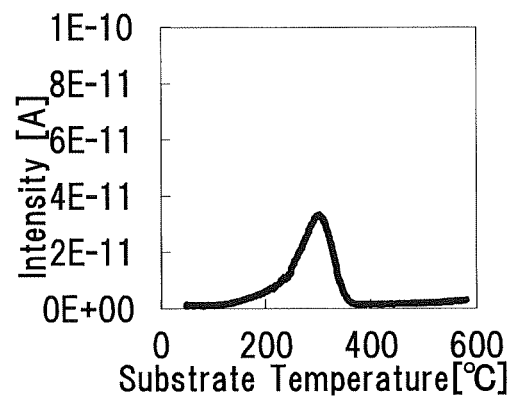

As shown in FIG. 58A, in the sample 3A in which an aluminum oxide film was not formed, oxygen molecules were hardly released. In contract, in the samples 3C and 3D in each of which the aluminum oxide film was formed by an RF sputtering method and then removed, oxygen molecules were released. The number of released oxygen molecules in the sample 3C was $2.2 \times 10^{15}$ molecules/cm$^2$, and the number of released oxygen molecules in the sample 3D was $1.3 \times 10^{15}$ molecules/cm$^2$. This suggests that the number of oxygen molecules released from the base insulating film of silicon oxide that is in contact with the interlayer insulating film of aluminum oxide is greater than or equal to $1.0 \times 10^{14}$ molecules/cm$^2$ and less than or equal to $1.0 \times 10^{16}$ molecules/cm$^2$, preferably greater than or equal to $1.0 \times 10^{15}$ molecules/cm$^2$ and less than or equal to $5.0 \times 10^{15}$ molecules/cm$^2$ in TDS analysis, as described in the above embodiment.

Meanwhile, in the sample 3B in which the formed aluminum oxide film was not removed, oxygen molecules were hardly released. This is probably because in the TDS analysis, release of oxygen molecules was blocked in the sample 3B in which the aluminum oxide film was formed, and oxygen molecules were released in the samples 3C and 3D in each of which the aluminum oxide film was not formed. This suggests that the aluminum oxide film has a high oxygen-blocking property. Therefore, the aluminum oxide film can prevent outward diffusion of oxygen added to silicon oxide.

Oxygen molecules were also released in the sample 3D in which the heat treatment was performed at 400° C. under an oxygen atmosphere after formation of the aluminum oxide film; thus, it was shown that outward diffusion of oxygen was blocked by the aluminum oxide at the time of the heat treatment.

EXAMPLE 4

In this example, for a sample in which an aluminum oxide film was formed over a silicon oxide film, oxygen diffusion was analyzed by SIMS. In this example, six samples of samples 4A to 4F were formed. The SIMS analysis was performed from a substrate side.

Methods for Fabricating the Samples 4A to 4F are Described.

By thermal oxidation of a silicon wafer, a 100-nm-thick silicon oxide film was formed on a surface of the silicon wafer. The thermal oxidation was performed at 950° C. in an oxygen atmosphere containing HCl at 3 volume % for 4 hours.

Then, in the samples 4A to 4E, a 10-nm-thick aluminum oxide film was formed over the silicon oxide film by an ALD method. Note that trimethyl aluminum (TMA) was used as a precursor, ozone was used as an oxidizer, and the substrate temperature was 250° C.

Next, in the sample 4F, a 70-nm-thick aluminum oxide film was formed over the silicon oxide film by an RF sputtering method using an aluminum oxide (Al$_2$O$_3$) target and deposition gases of oxygen at 25 sccm and argon at 25 sccm (O$_2$=50 volume %, Ar=50 volume %). A deposition pressure was 0.4 Pa. A deposition power was 2500 W. A substrate temperature was 250° C. A distance between the target and the substrate was 60 mm. Note that as the oxygen gas used as the sputtering gas, an oxygen gas whose oxygen molecule ($^{18}$O$_2$) includes oxygen atoms having a mass number of 18 was used.

Then, in the samples 4B to 4E, oxygen ions were added at a dose of $1.0 \times 10^{16}$ ions/cm$^2$ using an ion implantation apparatus. Here, oxygen ions were added at an acceleration voltage of 2.5 kV in the sample 4B; oxygen ions were added at an acceleration voltage of 5.0 kV in the sample 4C; oxygen ions were added at an acceleration voltage of 7.5 kV in the sample 4D; and oxygen ions were added at an acceleration voltage of 10.0 kV in the sample 4E. For the addition of oxygen ions, oxygen ions having a mass number of 18 ($^{18}$O) were used.

Figure 59:
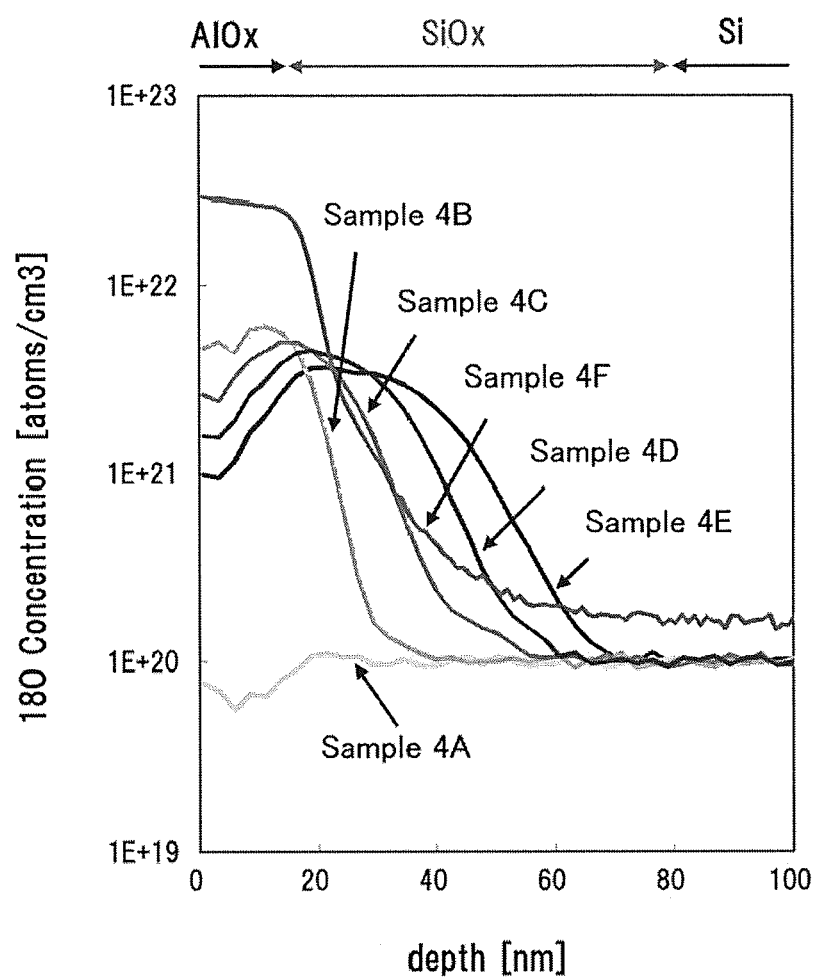
FIG. 59 is a graph showing results of SIMS analysis in Example.

FIG. 59 shows $^{18}$O detected in the SIMS analysis performed on the samples 4A to 4F that were fabricated in the above manner. In FIG. 59, the horizontal axis represents a depth [nm] with a surface of the aluminum oxide film as a reference and the vertical axis represents $^{18}$O concentration [atoms/cm$^3$]. Note that SIMS measurement was performed by using an ADEPT-1010 quadrupole mass spectrometry instrument manufactured by ULVAC-PHI, Inc.

FIG. 59 shows that almost no $^{18}$O was added in the sample 4A and that acceleration voltage correlates with the depth of a region implanted with $^{18}$O in the samples 4B to 4E. The profile of the sample 4F partly overlaps with that of the sample 4C. Accordingly, $^{18}$O was probably added in the sample 4F with energy equivalent to energy of ion implantation at an acceleration voltage of 5 kV. Furthermore, in relatively deep regions (a region around the interface between the silicon oxide film and the silicon wafer and a deeper region), $^{18}$O has a high concentration in the sample 4F as compared with the samples 4B to 4E because in the sample 4F, the substrate temperature was approximately 250° C. at the time of the addition of $^{18}$O, i.e., the formation of the aluminum oxide film by an RF sputtering method.

Thus, it was shown that even when oxygen is added to the silicon oxide film by formation of the aluminum oxide film by an RF sputtering method, the amount of added oxygen was substantially the same as the amount of oxygen added by addition of oxygen ions by ion implantation at an acceleration voltage of approximately 5 kV.

EXAMPLE 5

In this example, as a transistor of one embodiment of the present invention, a transistor was formed by adding oxygen ions without using an ion implantation method.

FIGS. 23A to 23C and other drawings can be referred to for the structure of the transistor, and FIGS. 31A to 31H, FIGS. 32A to 32F, and FIGS. 33A to 33F and other drawings can be referred to for the manufacturing method of the transistor.

First, a silicon substrate in which a 100-nm-thick silicon oxide film, a 280-nm-thick silicon nitride oxide film, a 300-nm-thick silicon oxide film, and a 300-nm-thick silicon oxide film were stacked in this order was prepared as the substrate 150.

Next, a 50-nm-thick aluminum oxide film was formed as the insulator 151 by a sputtering method.

Next, a 50-nm-thick tungsten film was formed by a sputtering method. A resist was formed over the tungsten film, and the tungsten film was processed using the resist to form the conductor 152 (see FIGS. 31A and 31B).

Then, a 10-nm-thick silicon oxide film was formed by a PECVD method (the film corresponds to the insulator 155 of the transistor 68 illustrated in FIGS. 30A and 30B).

Next, a 20-nm-thick hafnium oxide film was formed as the insulator 153 by an ALD method.

Then, a 30-nm-thick silicon oxide film was formed as the insulator 154 by a PECVD method (see FIGS. 31C and 31D).

Next, a 40-nm-thick In—Ga—Zn oxide film was formed by a DC sputtering method to form the insulator 176a using a target having an atomic ratio of In:Ga:Zn=1:3:4 and deposition gases of an argon gas at 40 sccm and an oxygen gas at 5 sccm. A deposition pressure was 0.7 Pa (measured by Miniature Gauge MG-2 manufactured by CANON ANELVA CORPORATION). A deposition power was 500 W. A substrate temperature was 200° C. A distance between the target and the substrate was 60 mm.

Next, a 20-nm-thick In—Ga—Zn oxide film was formed by a DC sputtering method to form the semiconductor 176b using a target having an atomic ratio of In:Ga:Zn=1:1:1 and deposition gases of an argon gas at 30 sccm and an oxygen gas at 15 sccm. A deposition pressure was 0.7 Pa (measured by Miniature Gauge MG-2 manufactured by CANON ANELVA CORPORATION). A deposition power was 500 W. A substrate temperature was 300° C. A distance between the target and the substrate was 60 mm.

Next, heat treatment was performed at 550° C. under a nitrogen atmosphere for 1 hour. In addition, heat treatment was performed at 550° C. under an oxygen atmosphere for 1 hour.

Then, a 50-nm-thick tungsten film was formed by a DC sputtering method to form the conductor 178 (see FIGS. 31E and 31F).

A resist was then formed over the conductor 178, and the conductor 178 was processed using the resist to form the conductors 158a and 158b.

Next, the insulator 176a and the semiconductor 176b were processed using the resist, the conductor 158a, and the conductor 158b to form the insulator 156a and the semiconductor 156b (see FIGS. 31G and 31H).

Next, a 5-nm-thick In—Ga—Zn oxide film was formed by a DC sputtering method to form the insulator 176c using a target having an atomic ratio of In:Ga:Zn=1:3:2 and deposition gases of an argon gas at 30 sccm and an oxygen gas at 15 sccm. A deposition pressure was 0.7 Pa. A deposition power was 500 W. A substrate temperature was 200° C. A distance between the target and the substrate was 60 mm.

A 13-nm-thick silicon oxynitride film was formed by a PECVD method to form the insulator 182.

Then, a 30-nm-thick titanium nitride film and a 135-nm-thick tungsten film were formed in this order by a DC sputtering method to form the conductor 184 (see FIGS. 32A and 32B). A resist was then formed over the conductor 184, and the conductor 184 was processed using the resist to form the conductor 164.

Then, the insulator 176c and the insulator 182 were processed using the resist and/or the conductor 164 to form the insulator 156c and the insulator 162 (see FIGS. 32C and 32D).

After that, a 140-nm-thick aluminum oxide film was formed by an RF sputtering method as the insulator 166 (see FIGS. 32E and 32F), using deposition gases of an argon gas at 25 sccm and an oxygen gas at 25 sccm. A deposition pressure was 0.4 Pa. A deposition power was 2500 W. A substrate temperature was 250° C. A distance between the target and the substrate was 60 mm.

Note that as described in the above embodiment, oxygen ions and the like are added at the same time as the formation of the insulator 166 by a sputtering method, whereby excess oxygen can be supplied to the insulator 154 and the like. Thus, in this example, addition of oxygen ions by an ion implantation method illustrated in FIGS. 33A and 33B was not performed.

Next, heat treatment was performed at 400° C. under an oxygen atmosphere for 1 hour.

Then, a 300-nm-thick silicon oxynitride film was formed by a PECVD method.

Next, a 50-nm-thick titanium film, a 200-nm-thick aluminum film, and a 50-nm-thick titanium film were formed in this order by a DC sputtering method. The films were processed using a resist to form the conductor 170a and the conductor 170b (see FIGS. 33E and 33F).

In this manner, the transistor having a channel length L of 0.21 μm and a channel width W of 0.34 μm was fabricated.

The $I_d$-$V_g$ characteristics (drain current-gate voltage characteristics) of the transistor were measured. The measurement of the $I_d$-$V_g$ characteristics was performed at a backgate voltage of 0 V and −5 V. Other measurement conditions were as follows: the drain voltage was 0.1 V or 1.8 V, and the gate voltage was swept from −3.0 V to 3.0 V in increments of 0.1 V.

Figure 60A:
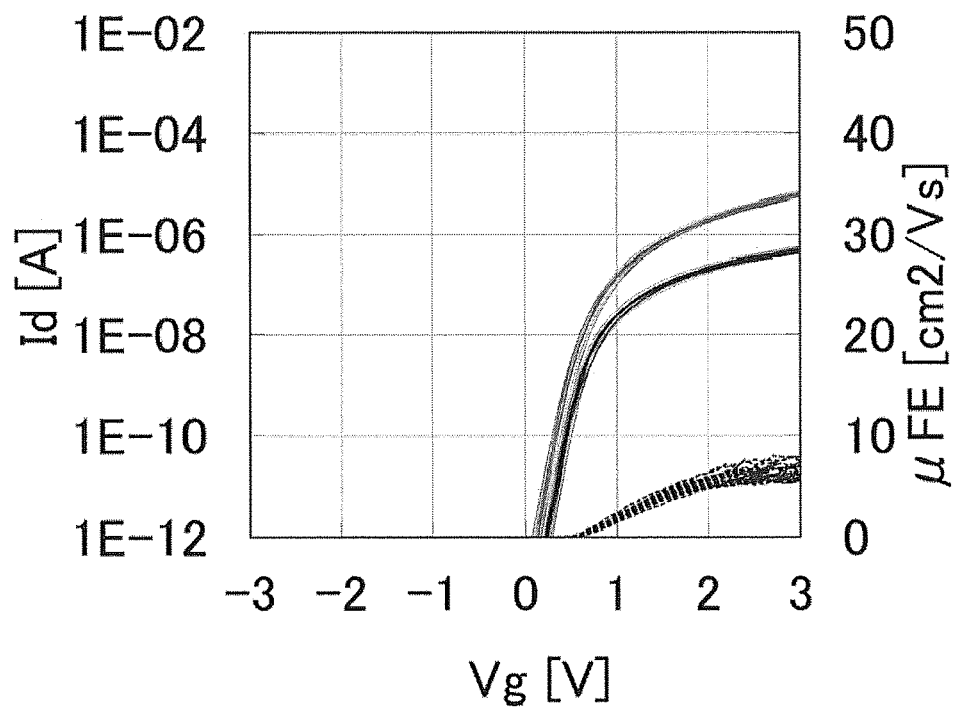
FIGS. 60A and 60B are graphs showing $I_d$-$V_g$ characteristics measured in Example.
Figure 60B:
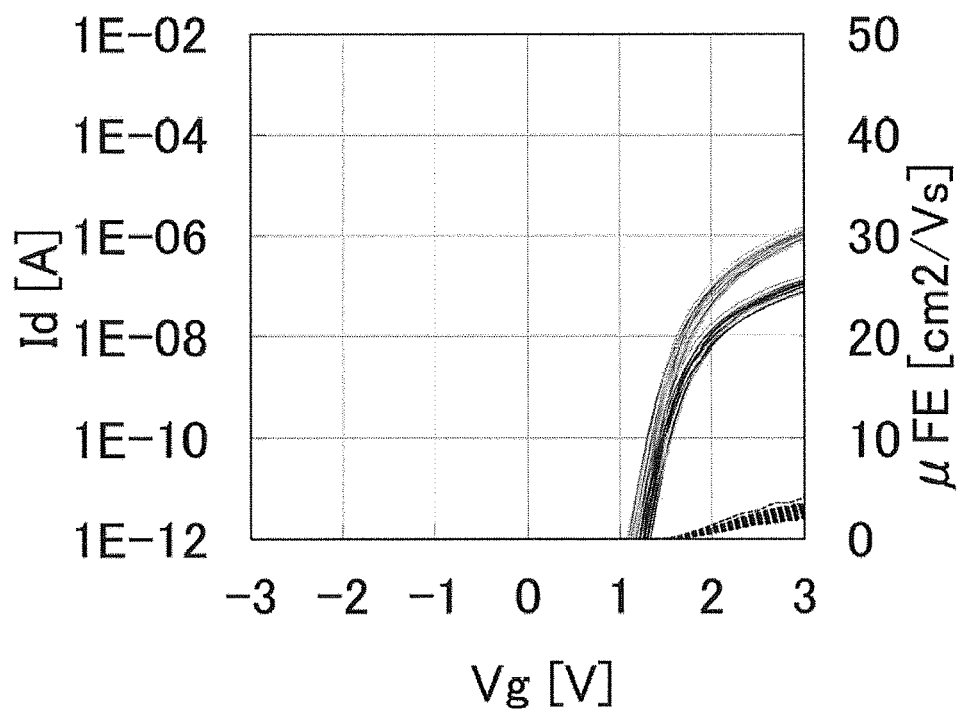
Figure 61A:
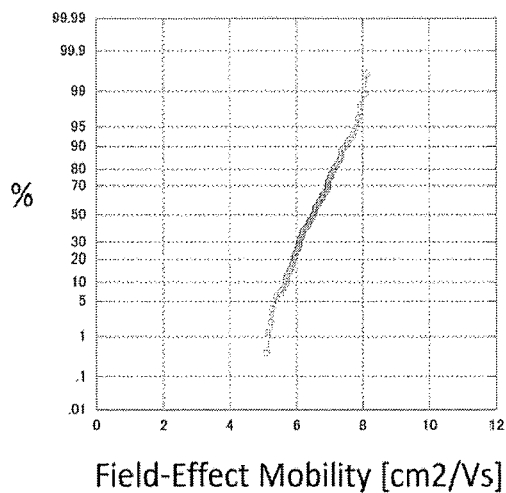
FIGS. 61A to 61D are graphs showing variations measured in Example.
Figure 61B:
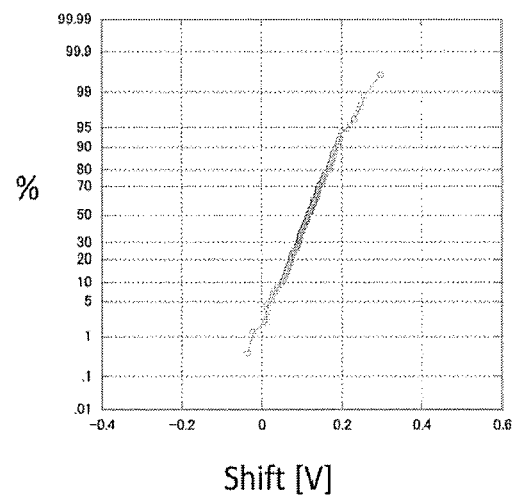
Figure 61C:
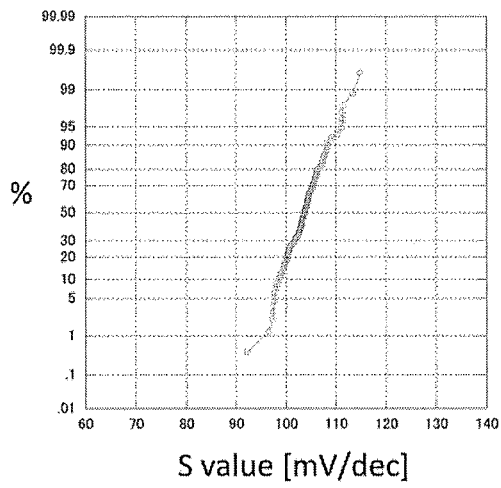
Figure 61D:
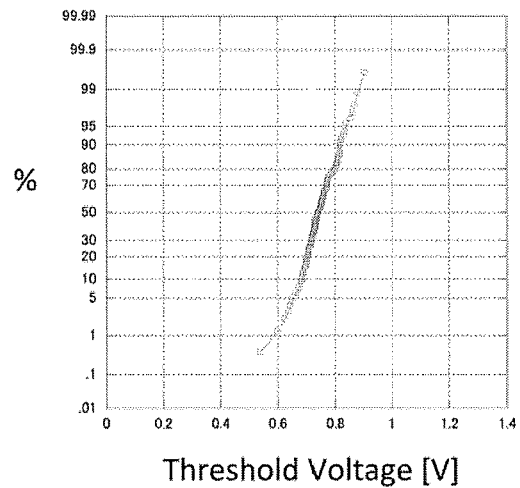

Measured $I_d$-$V_g$ characteristics are shown in FIGS. 60A and 60B. Here, FIG. 60A shows the results obtained when the backgate voltage was 0 V and FIG. 60B shows the results obtained when the backgate voltage was −5 V. In FIGS. 60A and 60B, the horizontal axis represents gate voltage $V_g$ [V], the left vertical axis represents drain current $I_d$ [A], and the right vertical axis represents field-effect mobility μFE [cm²/Vs]. In each of FIGS. 60A and 60B, a solid line denotes drain current and a dashed line denotes field-effect mobility.

As shown in FIGS. 60A and 60B, the transistor had favorable electrical characteristics even when oxygen ions were added by a sputtering method or the like. When the backgate voltage was 0 V and the drain voltage $V_d$ was 0.1 V, both the field-effect mobility and the subthreshold swing value (S value) were favorable, which were 6.4 cm²/Vs and 104.6 mV/dec, respectively. When the backgate voltage was −5 V and the drain voltage $V_d$ was 0.1 V, both the field-effect mobility and the S value were favorable, which were 2.8 cm²/Vs and 112.2 mV/dec, respectively.

Then, the threshold voltage $V_{th}$ and Shift of the transistor in this example were calculated.

The threshold voltage and Shift in this specification will be described. The threshold voltage is defined as, in the $V_g$-$I_d$ curve where the horizontal axis represents gate voltage $V_g$ [V] and the vertical axis represents the square root of drain current $I_d^{1/2}$ [A], a gate voltage at the intersection point of the line of $I_d^{1/2}$=0 ($V_g$ axis) and the tangent to the curve at a point where the slope of the curve is the steepest. Note that here, the threshold voltage is calculated with a drain voltage $V_d$ of 1.8 V.

Note that the gate voltage at the rising of drain current in $I_d$-$V_g$ characteristics is referred to as Shift. Furthermore, Shift in this specification is defined as, in the $V_g$-$I_d$ curve where the horizontal axis represents the gate voltage $V_g$ [V] and the vertical axis represents the logarithm of the drain current $I_d$ [A], a gate voltage at the intersection point of the line of $I_d$=1.0×10$^{-12}$ [A] and the tangent to the curve at a point where the slope of the curve is the steepest. Note that here, Shift is calculated with a drain voltage $V_d$ of 1.8 V.

In this example, when the backgate voltage was 0 V, the threshold voltage and Shift of the transistor were 0.7 V and 0.1 V, respectively, which means that the transistor had normally-off electrical characteristics even when the backgate voltage was 0 V. When the backgate voltage was −5 V, the threshold voltage and Shift of the transistor were 1.8 V and 1.16 V, respectively, which also means that the transistor had normally-off electrical characteristics.

The above results suggest that by supplying oxygen ions and the like at the same time as formation of the insulator 166 serving as an interlayer insulating film by a sputtering method or the like, excess oxygen is supplied to the insulator 154 and the like and defects such as oxygen vacancies are reduced in the oxide semiconductor of the transistor. The use of such an oxide semiconductor with reduced defects makes it possible to provide a transistor with stable electrical characteristics.

Next, variations in field-effect mobility μFE, Shift, S value, and threshold voltage $V_{th}$ were examined for 125 points of the substrate of the transistor fabricated in this example, and the results are shown in FIGS. 61A to 61D.

The horizontal axes in FIGS. 61A, 61B, 61C, and 61D represent field-effect mobility μFE [cm$^2$/Vs], Shift [V], S value [mV/dec], and threshold voltage $V_{th}$ [V], respectively, and vertical axes represent probability distribution.

As shown in FIGS. 61A to 61D, in-plane variations in field-effect mobility μFE, Shift, S value, and threshold voltage $V_{th}$ were small.

Figure 62:
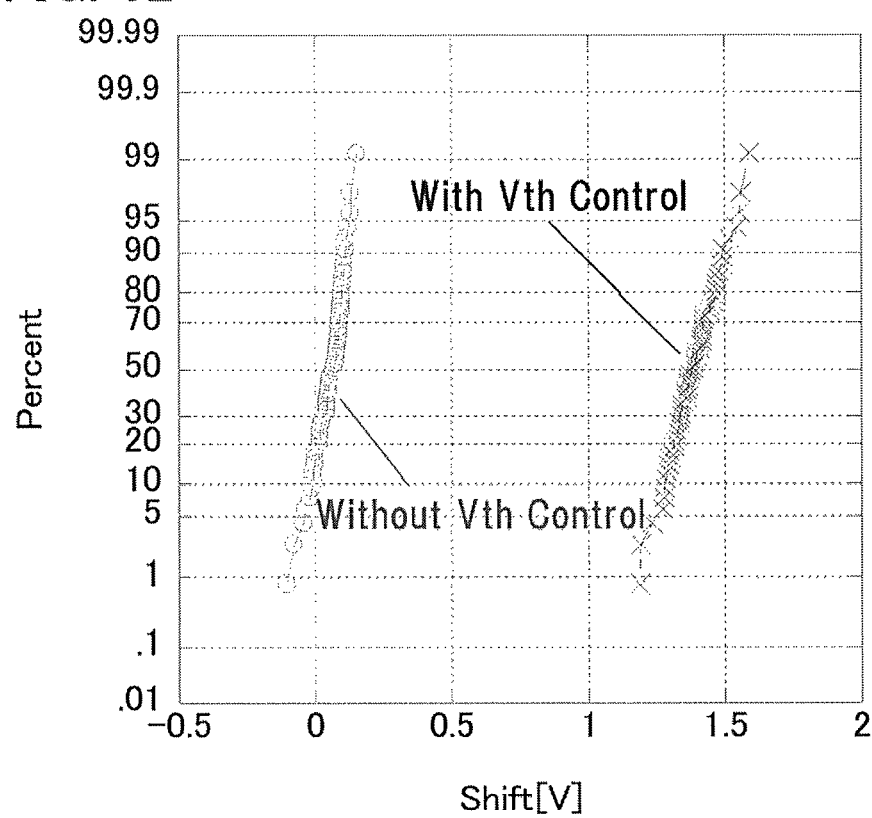
FIG. 62 is a graph showing variations in Shift measured in Example.

$V_{th}$ was controlled with the use of backgate (the conductor 152) voltage, and a variation in Shift before the control and that after the control were examined in the following manner: transistors with a structure similar to that of the above-described transistor were formed to be distributed over 5×5 blocks of a 5-inch substrate, and measurement was performed for 60 points in one block. $V_{th}$ was controlled by applying a backgate voltage $V_{bg}$ of 38 V for 200 milliseconds. FIG. 62 shows the variations in Shift. In FIG. 62, the horizontal axis represents Shift [V] and the vertical axis represents probability distribution.

As shown in FIG. 62, the variation in Shift before the control of $V_{th}$ was σ=53.0 mV and that after the control of $V_{th}$ was σ=73.2 mV, which means that the variation did not increase considerably after the control.

Next, a change in electrical characteristics of the transistor by stress tests was measured.

Figure 63A:
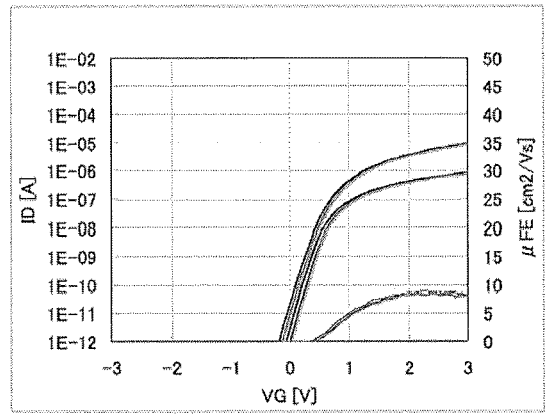
FIGS. 63A to 63D are graphs showing results of stress tests in Example.

FIG. 63A shows results of a positive gate BT (Bias-Temperature) stress test. In the positive gate BT stress test, first, $I_d$-$V_g$ characteristics before the stress test were measured. In the measurement, the backgate voltage was 0 V, the drain voltage was 0.1 V or 1.8 V, and the gate voltage was swept from −3.0 V to 3.0 V in increments of 0.1 V. Next, $I_d$-$V_g$ characteristics after the stress test were measured. In the measurement, the drain voltage was 0 V, the backgate voltage was 0 V, and a gate voltage of 3.3 V was applied for 1 hour. As shown in FIG. 63A, a change in Shift (ΔShift) before and after the positive gate BT stress test for 1 hour was as small as 0.08 V.

Figure 63B:
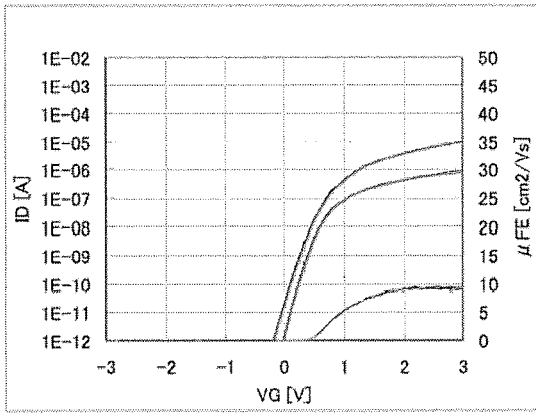

FIG. 63B shows results of a negative gate BT stress test. In the negative gate BT stress test, first, $I_d$-$V_g$ characteristics before the stress test were measured. In the measurement, the backgate voltage was 0 V, the drain voltage was 0.1 V or 1.8 V, and the gate voltage was swept from −3.0 V to 3.0 V in increments of 0.1 V. Next, $I_d$-$V_g$ characteristics after the stress test were measured. In the measurement, the drain voltage was 0 V, the backgate voltage was 0 V, and a gate voltage of −3.3 V was applied for 1 hour. As shown in FIG. 63B, ΔShift before and after the negative gate BT stress test for 1 hour was as small as 0.03 V.

Figure 63C:
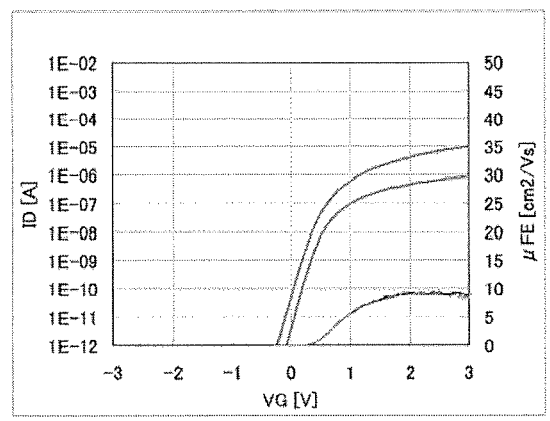

FIG. 63C shows results of a positive drain BT stress test. In the positive drain BT stress test, first, $I_d$-$V_g$ characteristics before the stress test were measured. In the measurement, the backgate voltage was 0 V, the drain voltage was 0.1 V or 1.8 V, and the gate voltage was swept from −3.0 V to 3.0 V in increments of 0.1 V. Next, $I_d$-$V_g$ characteristics after the stress test were measured. In the measurement, the gate voltage was 0 V, the backgate voltage was 0 V, and a drain voltage of 1.8 V was applied for 1 hour. As shown in FIG. 63C, ΔShift before and after the positive drain BT stress test for 1 hour was as small as 0.01 V.

Figure 63D:
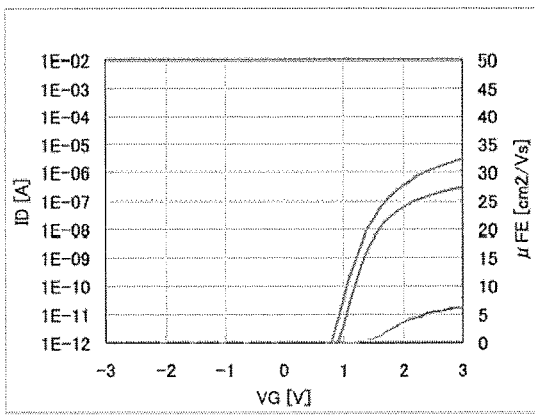

FIG. 63D shows results of a negative backgate BT stress test. In the negative backgate BT stress test, first, $I_d$-$V_g$ characteristics before the stress test were measured. In the measurement, the backgate voltage was −5 V, the drain voltage was 0.1 V or 1.8 V, and the gate voltage was swept from −3.0 V to 3.0 V in increments of 0.1 V. Next, $I_d$-$V_g$ characteristics after the stress test were measured. In the measurement, the drain voltage was 0 V, the gate voltage was 0 V, and a backgate voltage of −5 V was applied for 1 hour. As shown in FIG. 63D, ΔShift before and after the negative backgate BT stress test for 1 hour was as small as 0.01 V.

As described above, even when oxygen ions were added through formation of the insulator 166 by a sputtering method, changes in electrical characteristics of the transistor after the stress tests were small. Thus, by employing the structure described in this example, a highly reliable transistor can be provided.

EXAMPLE 6

In this example, three samples in each of which a silicon oxide film was formed over a silicon substrate were subjected to TDS analysis at the respective rates of heating, so that diffusion length of oxygen in the silicon oxide films of the samples was obtained.

Methods for manufacturing samples will be described. First, by thermal oxidation of a silicon wafer, a 100-nm-thick thermal oxidation film was formed on a surface of the silicon wafer. The thermal oxidation was performed at 950° C. in an oxygen atmosphere containing HCl at 3 volume % for 4 hours.

Next, a 100-nm-thick silicon oxide film was formed over the thermal oxidation film by an RF sputtering method using an oxygen gas at 50 sccm as a deposition gas. A deposition pressure was 0.4 Pa. A deposition power was 1500 W. A substrate temperature was 100° C. A distance between the target and the substrate was 60 mm.

The samples 6A, 6B, and 6C formed in the above manner were subjected to TDS analysis at rates of heating of 15° C./min, 30° C./min, and 60° C./min, respectively. Note that in the TDS analysis, the amount of a released gas with a mass-to-charge ratio M/z=32, which corresponds to an oxygen molecule, was measured.

Figure 64:
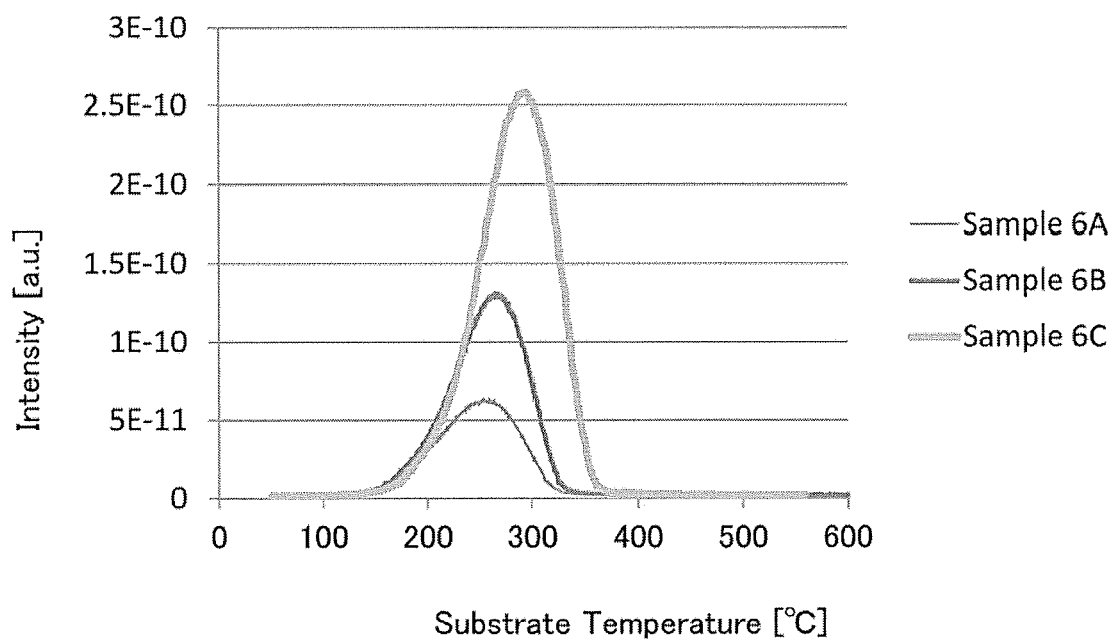
FIG. 64 is a graph showing results of TDS analysis in Example.

FIG. 64 shows the results of the TDS analysis. In FIG. 64, the horizontal axis represents substrate temperature [° C.] and the vertical axis represents desorption signal intensity proportional to the amount of a released gas with a mass-to-charge ratio M/z=32.

Figure 65:
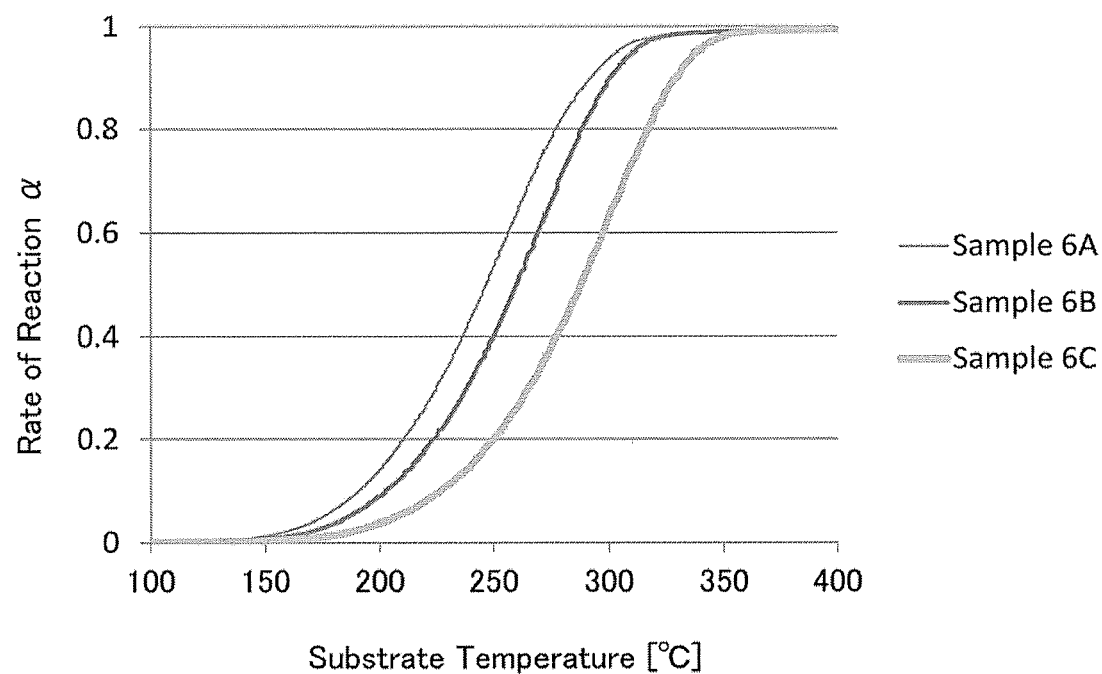
FIG. 65 is a graph showing rate of reaction curves obtained in Example.

FIG. 65 shows the rate of reaction curves obtained by integration and normalization of desorption signals in FIG. 64. In FIG. 65, the horizontal axis represents substrate temperature [° C.] and the vertical axis represents the rate of reaction α. Note that for the integration in obtaining the rate of reaction curves in FIG. 65, background values (the initial values of desorption signals) were subtracted.

Figure 66:
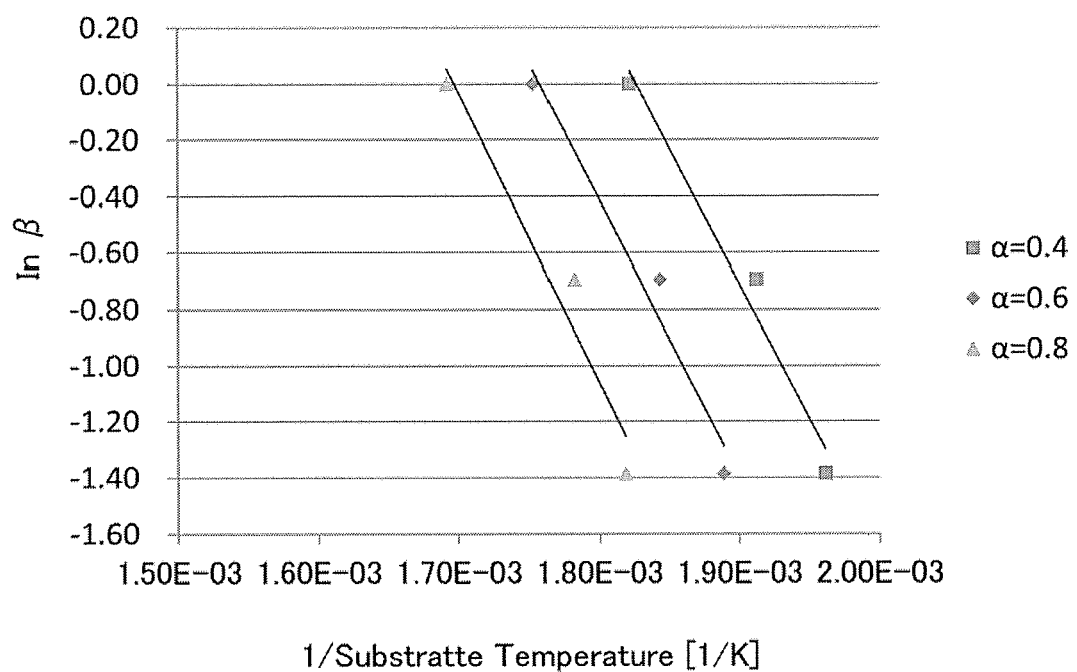
FIG. 66 is a graph showing a rate of heating measured in Example.

Values of α=0.4, α=0.6, and α=0.8 were extracted from the rate of reaction curves for the samples 6A to 6C shown in FIG. 65, and natural logarithms ln β of rate of heating β were plotted versus inverses of substrate temperature T. FIG. 66 shows plotted ln β and graphs obtained by approximating the plotted ln β by a primary function. In FIG. 66, the horizontal axis represents inverses of substrate temperature 1/T [1/K], and the vertical axis represents natural logarithms ln β of rate of heating β. Approximate curves were obtained from the plotted values when α is 0.4, 0.6, and 0.8. Activation energy $E_a$ [eV] was obtained from the slope of the approximate curves using the Arrhenius equation. Table 2 lists activation energy $E_a$ [eV] for each of the rates of reaction α=0.4, α=0.6, and α=0.8.

TABLE 2

| | Rate of reaction α | | |
|---|---|---|---|
| | 0.4 | 0.6 | 0.8 |
| Activation energy $E_a$ [eV] | 0.84 | 0.85 | 0.9 |

Here, to obtain the diffusion length of oxygen, a diffusion constant D(T) expressed by the formula (1) below needs to be calculated.

[Formula 1]

$$D(T) = D_0 \exp(-E_a/kT) \quad (1)$$

Here, $D_0$ represents a frequency factor and k represents the Boltzmann constant.

The model of thermal desorption signal q(T) can be expressed by the formula (2) below.

[Formula 2]

$$q(T) = \frac{2C_0 D_0}{d} \exp\left\{\frac{-E_a}{kT}\right\} \times \sum_{m=0}^{\infty} \exp\left[-\left\{\frac{(2m+1)\pi T}{d}\right\}^2 \left\{\frac{kD_0}{\beta E_a}\right\} \exp\left\{\frac{-E_a}{kT}\right\} \psi(T)\right] \quad (2)$$

Here, $C_0$ represents the initial concentration and β represents the rate of heating. Note that ψ(T) in the formula (2) can be expressed by the formula (3) below.

[Formula 3]

$$\psi(T) = \sum_{j=1}^{\infty} j! \left(\frac{-kT}{E_a}\right)^{j-1} \quad (3)$$

From the formula (1), unknown parameters in obtaining the diffusion constant D(T) are $E_a$ and $D_0$. $E_a$ was determined according to Table 1. Thus, $D_0$ is then obtained.

$D_0$ is determined so that a curve of the model expressed by the formula (2) corresponds to the peak of the desorption signal in the TDS analysis results shown in FIG. 64. Here, since $D_0$ is constant irrespective of the rate of heating, $D_0$ is selected such that the curve of the model expressed by the formula (2) comes close to the position of the peak of the desorption signal that was measured in FIG. 64 under all the three conditions of 15° C./min, 30° C./min, and 60° C./min.

Figure 67:
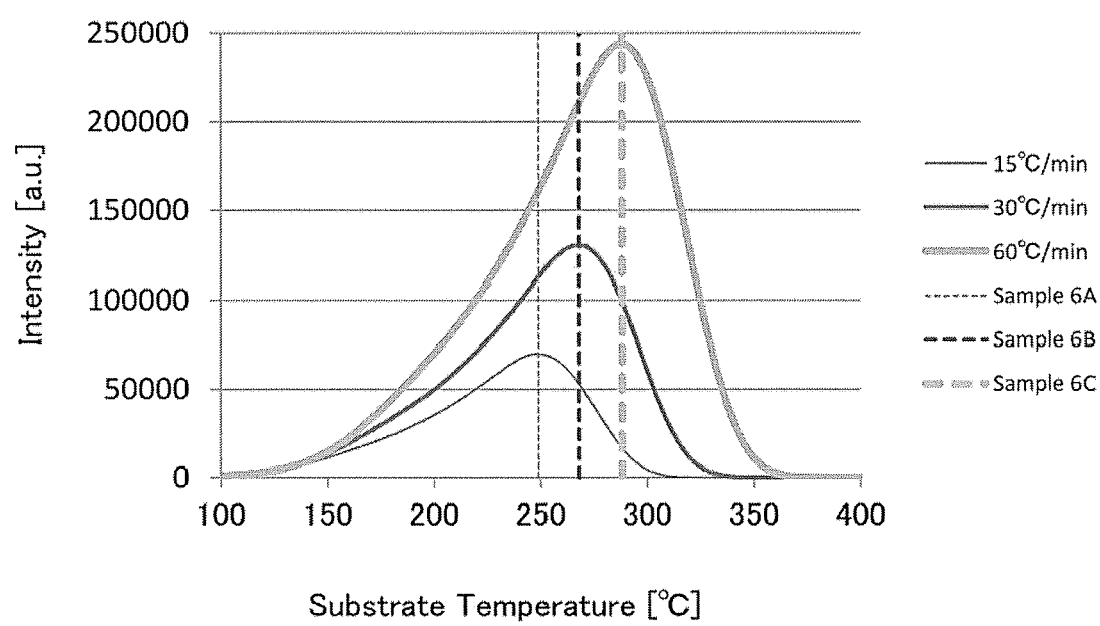
FIG. 67 is a graph showing thermal desorption signals calculated in Example.

FIG. 67 shows the curves of the model expressed by the formula (2) at the rates of heating of 15° C./min, 30° C./min, and 60° C./min and the peak positions of the desorption signals from the TDS analysis. In FIG. 67, the horizontal axis represents substrate temperature [° C.] and the vertical axis represents the desorption signal intensity.

As shown in FIG. 67, $D_0$ was calculated such that the peak position of the desorption signal that was measured in the TDS analysis was close as a whole to the peak position of the curve of the model expressed by the formula (2). Thus, $D_0$ was calculated to be $4.50 \times 10^{-6}$ cm$^2$/sec.

Table 3 shows the diffusion constant D(T) and the diffusion length $2\sqrt{D(T) \cdot t}$ at substrate temperatures of 300° C., 350° C., 400° C., and 450° C., which were calculated using $E_a = 0.84$ eV when α=0.4, and $D_0 = 4.50 \times 10^{-6}$ cm$^2$/sec. Here, t of the diffusion length $2\sqrt{D(T) \cdot t}$ represents heat treatment time, which was assumed to be 1 hour (3600 seconds). Although Table 3 shows the four substrate temperatures of 300° C., 350° C., 400° C., and 450° C., a diffusion constant and diffusion length for higher substrate temperatures can also be calculated using the above formula.

TABLE 3

| | T [° C.] | | | |
|---|---|---|---|---|
| | 300 | 350 | 400 | 450 |
| D (T) [cm²/sec] | 4.22E−13 | 1.54E−12 | 4.67E−12 | 1.21E−11 |
| 2√D (T) · t [µm] | 0.78 | 1.49 | 2.59 | 4.17 |

As shown in Table 3, oxygen in silicon oxide is diffused to a distance of approximately 1 µm to 3 µm when heat treatment is performed at 400° C. for 1 hour. Therefore, as described in the above embodiment, in the transistor 50 and the like, the distance between the region where the insulator 166 and the insulator 154 from which oxygen is diffused are in contact with each other and the region serving as the channel formation region of the semiconductor 156b and the like is 3 µm or less, preferably 1 µm or less.

EXAMPLE 7

In this example, samples for TDS analysis were each formed in the following manner: an insulating film was formed over a silicon substrate, an In—Ga—Zn oxide was deposited over the insulating film and then patterned, and heat treatment was performed. IDS analysis results of the samples are described. In this example, the following two samples were fabricated and evaluated: a sample 7A in which the heat treatment after the patterning of the oxide was not performed, and a sample 7B in which the heat treatment after the patterning of the oxide was performed.

A method for fabricating the samples used in the TDS analysis is described. First, by thermal oxidation of a silicon wafer, a 100-nm-thick silicon oxide film was formed on a surface of the silicon wafer. The thermal oxidation was performed at 950° C. in an oxygen atmosphere containing HCl at 3 volume % for 4 hours.

Then, a 10-nm-thick silicon oxide film was formed over the silicon oxide film by a PECVD method using deposition gases of SiH$_4$ at 1 sccm and N$_2$O at 800 sccm. The RF power source frequency was 60 MHz, the power of the RF power source was 150 W, a deposition pressure was 40 Pa, and the substrate temperature was 400° C.

Next, a 20-nm-thick hafnium oxide film was formed over the silicon oxide film by an ALD method. In the film formation by an ALD method, the substrate temperature was 200° C., and a source gas obtained by vaporizing a liquid containing tetrakis(dimethylamido)hafnium (TDMAH) and an O$_3$ gas that was an oxidizer were used.

Then, a 30-nm-thick silicon oxide film was formed over the hafnium oxide film by a PECVD method using deposition gases of SiH$_4$ at 1 sccm and N$_2$O at 800 sccm. The RF power source frequency was 60 MHz, the power of the RF power source was 150 W, a deposition pressure was 40 Pa, and the substrate temperature was 400° C. Note that in the following description, a stack including the 10-nm-thick silicon oxide film, the 20-nm-thick hafnium oxide film, and the 30-nm-thick silicon oxide film is referred to as a base insulating film in some cases.

Next, a 40-nm-thick In—Ga—Zn oxide film was formed by a DC sputtering method. Note that the In—Ga—Zn oxide film was formed using a target in which In:Ga:Zn=1:3:4

[atomic ratio], and this oxide is referred to as an In—Ga—Zn oxide (134) in some cases. As deposition gases, an argon gas at 40 sccm and an oxygen gas at 5 sccm were used. A deposition pressure was 0.7 Pa (measured by Miniature Gauge MG-2 manufactured by CANON ANELVA CORPORATION). A deposition power was 500 W. A substrate temperature was 200° C. A distance between the target and the substrate was 60 mm.

Next, a 20-nm-thick In—Ga—Zn oxide film was formed by a DC sputtering method. Note that the In—Ga—Zn oxide film was formed using a target in which In:Ga:Zn=1:1:1 [atomic ratio], and this oxide is referred to as an In—Ga—Zn oxide (111) in some cases. As deposition gases, an argon gas at 30 sccm and an oxygen gas at 15 sccm were used. A deposition pressure was 0.7 Pa (measured by Miniature Gauge MG-2 manufactured by CANON ANELVA CORPORATION). A deposition power was 500 W. A substrate temperature was 300° C. A distance between the target and the substrate was 60 mm.

Next, heat treatment was performed at 400° C. under a nitrogen atmosphere for 1 hour. In addition, heat treatment was performed at 400° C. under an oxygen atmosphere for 1 hour.

Next, a 20-nm-thick W film was formed by a DC sputtering method using an argon gas at 80 sccm as a deposition gas. A deposition pressure was 0.8 Pa. A deposition power was 1000 W. A substrate temperature was 130° C. A distance between the target and the substrate was 60 mm.

Next, a resist mask was formed over the W film, the In—Ga—Zn oxide (111), and the In—Ga—Zn oxide (134), and this stack was processed using the resist mask.

The stack was processed through two steps by an ICP dry etching method. The treatment conditions for the first step were as follows: the pressure was 1.2 Pa, the power of the RF power source was 1000 W on the upper side and 400 W on the lower side, etching gases were methane at 12.5 sccm and argon at 75 sccm, and the treatment time was 15 seconds. The treatment conditions for the second step were as follows: the pressure was 0.6 Pa, the power of the RF power source was 1000 W on the upper side and 400 W on the lower side, etching gases were methane at 12.5 sccm and argon at 75 sccm, and the treatment time was 82 seconds.

After the stack was processed in this manner, only the sample 7B was subjected to heat treatment at 400° C. under a nitrogen atmosphere for 1 hour.

Next, the samples 7A and 7B were subjected to wet etching, so that the stack including the W film, the In—Ga—Zn oxide (111), and the In—Ga—Zn oxide (134) was removed. As a result, the base insulating film was exposed in each of the samples 7A and 7B.

Figure 68A:
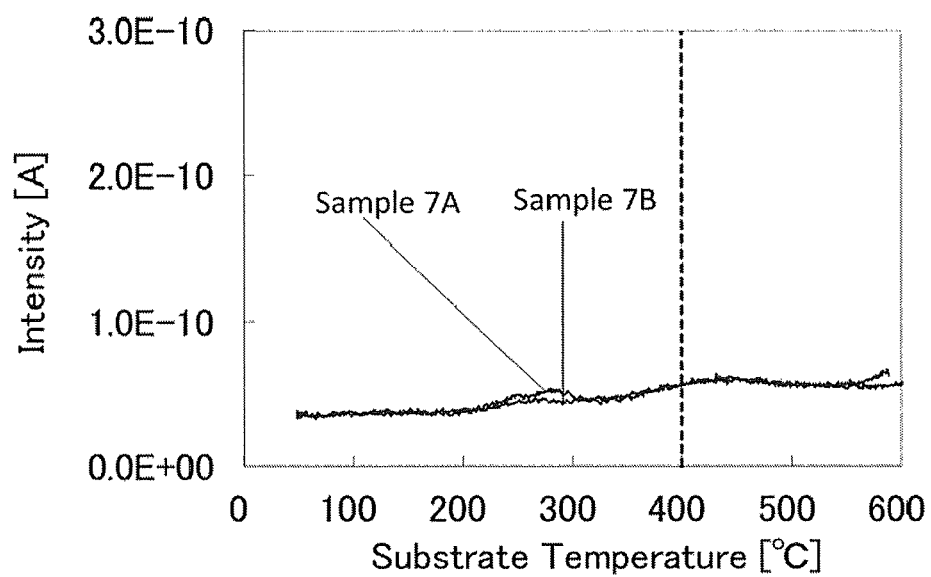
FIGS. 68A and 68B are graphs showing results of TDS analysis in Example.
Figure 68B:
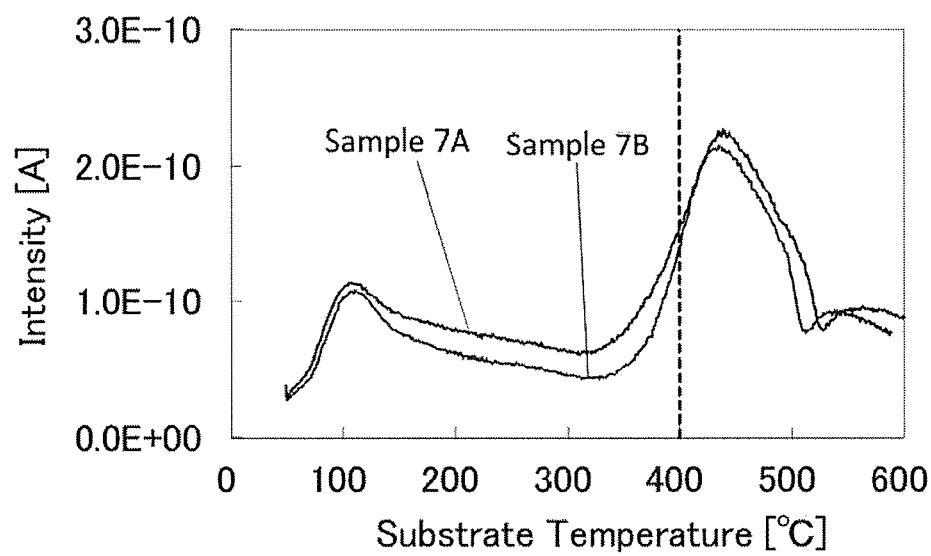

The samples 7A and 7B formed in the above manner were subjected to TDS analysis and the results are shown in FIGS. 68A and 68B. Note that in the TDS analysis, the amount of a released gas with a mass-to-charge ratio M/z=2, which corresponds to a hydrogen molecule, and that of a released gas with a mass-to-charge ratio M/z=18, which corresponds to a water molecule, were measured. FIG. 68A shows the measurement results of hydrogen and FIG. 68B shows those of water. In each of FIGS. 68A and 68B, the horizontal axis represents substrate heating temperature [° C.] and the vertical axis represents intensity proportional to the amount of a released gas with a mass-to-charge ratio.

As shown in FIG. 68B, the number of water molecules released in the sample 7B was smaller than that of water molecules released in the sample 7A. In particular, at substrate temperatures of 400° C. and lower, the number of water molecules released in the sample 7B was much smaller than that of water molecules released in the sample 7A. The temperature corresponds to the temperature of 400° C. of the heat treatment that was performed after the W film, the In—Ga—Zn oxide (111), and the In—Ga—Zn oxide (134) over the base insulating film were patterned in the sample 7B.

It was thus shown that when the W film, the In—Ga—Zn oxide (111), and the In—Ga—Zn oxide (134) over the base insulating film were patterned and heat treatment was performed under a nitrogen atmosphere, water contained in the base insulating film was reduced.

In a substrate temperature range from 200° C. to 300° C., the number of released hydrogen molecules was a little smaller in the sample 7B, but there was no big difference. Hydrogen in the base insulating film is presumably bonded to oxygen in the base insulating film by substrate heating to form a water molecule. It is thus conceivable that some of the water molecules measured in the above TDS analysis had been hydrogen in the base insulating film. Accordingly, it is presumable that when the W film, the In—Ga—Zn oxide (111), and the In—Ga—Zn oxide (134) over the base insulating film were patterned and heat treatment was performed under a nitrogen atmosphere, hydrogen contained in the base insulating film was also reduced.

EXAMPLE 8

In this example, the following samples were fabricated as transistors of embodiments of the present invention: a sample 8A in which a high-temperature heat treatment (e.g., 550° C. or higher) was performed in a fabrication process of the transistor, a sample 8B in which a low-temperature heat treatment (e.g., 410° C. or lower) was performed in a fabrication process of the transistor, and a sample 8C in which a low-temperature heat treatment (e.g., 410° C. or lower) was performed in a fabrication process of the transistor and heat treatment was further performed after an oxide semiconductor was patterned. The electrical characteristics and reliability of the transistors of the samples 8A to 8C were examined.

FIG. 30A and other drawings can be referred to for the structure of the transistors, and FIGS. 31A to 31H, FIGS. 32A to 32F, and FIGS. 33A to 33F and other drawings can be referred to for the manufacturing method of the transistors.

First, a silicon substrate in which a 100-nm-thick silicon oxide film, a 50-nm-thick silicon nitride oxide film, a 300-nm-thick silicon oxide film, and a 300-nm-thick silicon oxide film were stacked in this order was prepared as the substrate 150.

Then, heat treatment was performed at 590° C. in a nitrogen atmosphere for 10 hours in the sample 8A, and heat treatment was performed at 410° C. in a nitrogen atmosphere for 10 hours in the samples 8B and 8C.

Next, a 50-nm-thick aluminum oxide film was formed by an RF sputtering method as the insulator 151, using deposition gases of an argon gas at 25 sccm and an oxygen gas at 25 sccm. A deposition pressure was 0.4 Pa. A deposition power was 2500 W. A substrate temperature was 250° C. A distance between the target and the substrate was 60 mm.

Next, a 50-nm-thick tungsten film was formed by a DC sputtering method using an argon gas at 80 sccm as a deposition gas. A deposition pressure was 0.8 Pa. A deposition power was 1000 W. A substrate temperature was 130° C. A distance between the target and the substrate was 60 mm. A resist was formed over the tungsten film, and the tungsten film was processed using the resist to form the conductor 152.

Then, a 10-nm-thick silicon oxide film was formed by a PECVD method as the insulator 155, using deposition gases of $SiH_4$ at 1 sccm and $N_2O$ at 800 sccm. The RF power source frequency was 60 MHz, the power of the RF power source was 150 W, a deposition pressure was 40 Pa, and the substrate temperature was 400° C.

Next, a 20-nm-thick hafnium oxide film was formed as the insulator 153 by an ALD method. In the film formation by an ALD method, the substrate temperature was 200° C., and a source gas obtained by vaporizing a liquid containing tetrakis(dimethylamido)hafnium (TDMAH) and an $O_3$ gas that was an oxidizer were used.

Then, a 30-nm-thick silicon oxide film was formed by a PECVD method as the insulator 154, using deposition gases of $SiH_4$ at 1 sccm and $N_2O$ at 800 sccm. The RF power source frequency was 60 MHz, the power of the RF power source was 150 W, a deposition pressure was 40 Pa, and the substrate temperature was 400° C.

Then, heat treatment was performed at 550° C. in an oxygen atmosphere for 1 hour in the sample 8A, and heat treatment was performed at 410° C. in an oxygen atmosphere for 1 hour in the samples 8B and 8C.

Next, a 40-nm-thick In—Ga—Zn oxide film was formed by a DC sputtering method to form an oxide to be the insulator 156a using a target having an atomic ratio of In:Ga:Zn=1:3:4 and deposition gases of an argon gas at 40 sccm and an oxygen gas at 5 sccm. A deposition pressure was 0.7 Pa (measured by Miniature Gauge MG-2 manufactured by CANON ANELVA CORPORATION). A deposition power was 500 W. A substrate temperature was 200° C. A distance between the target and the substrate was 60 mm.

Next, a 20-nm-thick In—Ga—Zn oxide film was formed by a DC sputtering method to form an oxide to be the semiconductor 156b using a target having an atomic ratio of In:Ga:Zn=1:1:1 and deposition gases of an argon gas at 30 sccm and an oxygen gas at 15 sccm. A deposition pressure was 0.7 Pa (measured by Miniature Gauge MG-2 manufactured by CANON ANELVA CORPORATION). A deposition power was 500 W. A substrate temperature was 300° C. A distance between the target and the substrate was 60 mm.

Then, in the sample 8A, heat treatment was performed at 550° C. in a nitrogen atmosphere for 1 hour and heat treatment was further performed at 550° C. in an oxygen atmosphere for 1 hour. In the samples 8B and 8C, heat treatment was performed at 400° C. in a nitrogen atmosphere for 1 hour and heat treatment was further performed at 400° C. in an oxygen atmosphere for 1 hour.

Next, a 50-nm-thick tungsten film was formed by a DC sputtering method to form a conductor to be the conductors 158a and 158b.

A resist was then formed over the conductor, and the conductor was processed using the resist to form the conductors 158a and 158b.

Next, the above oxide was processed using the resist, the conductor 158a, and the conductor 158b to form the insulator 156a and the semiconductor 156b.

Next, heat treatment was performed on only the sample 8C at 400° C. under a nitrogen atmosphere for 1 hour.

Next, a 5-nm-thick In—Ga—Zn oxide film was formed by a DC sputtering method to form an oxide to be the insulator 156c using a target having an atomic ratio of In:Ga:Zn=1:3:2 and deposition gases of an argon gas at 30 sccm and an oxygen gas at 15 sccm. A deposition pressure was 0.7 Pa. A deposition power was 500 W. A substrate temperature was 200° C. A distance between the target and the substrate was 60 mm.

A 13-nm-thick silicon oxynitride film was formed by a PECVD method to form an oxynitride to be the insulator 162.

Then, a 30-nm-thick titanium nitride film and a 135-nm-thick tungsten film were formed in this order by a DC sputtering method to form a conductor to be the conductor 164. A resist was then formed over the conductor, and the conductor was processed using the resist to form the conductor 164.

Next, the above oxide and oxynitride were processed using the resist to form the insulator 156c and the insulator 162.

Next, a 140-nm-thick aluminum oxide film was formed by an RF sputtering method to form the insulator 166, using deposition gases of an argon gas at 25 sccm and an oxygen gas at 25 sccm. A deposition pressure was 0.4 Pa. A deposition power was 2500 W. A substrate temperature was 250° C. A distance between the target and the substrate was 60 mm.

Next, heat treatment was performed at 400° C. under an oxygen atmosphere for 1 hour.

Then, a 300-nm-thick silicon oxynitride film was formed by a PECVD method to form the insulator 168.

Next, a 50-nm-thick titanium film, a 200-nm-thick aluminum film, and a 50-nm-thick titanium film were formed in this order by a DC sputtering method. The films were processed using a resist to form the conductor 170a and the conductor 170b.

In this manner, the transistor having a channel length L of 0.20 μm and a channel width W of 0.20 μm was fabricated.

The $I_d$-$V_g$ characteristics (drain current-gate voltage characteristics) of the samples 8A to 8C were measured. The measurement of the $I_d$-$V_g$ characteristics was performed at a backgate voltage of 0 V. Other measurement conditions were as follows: the drain voltage was 0.1 V or 1.8 V, and the gate voltage was swept from −3.0 V to 3.0 V in increments of 0.1 V.

Figure 69A:
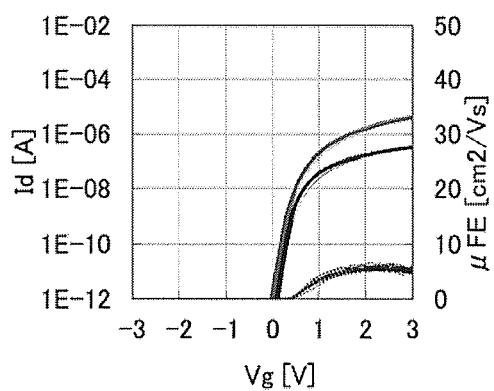
FIGS. 69A to 69C are graphs showing $I_d$-$V_g$ characteristics calculated in Example.
Figure 69B:
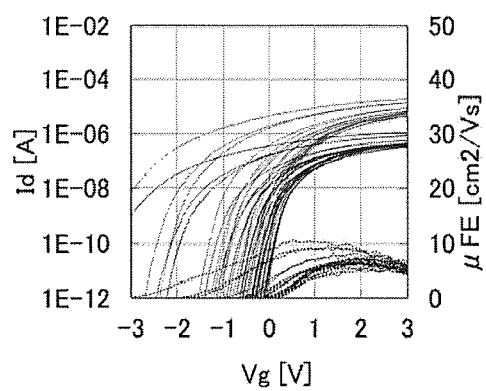
Figure 69C:
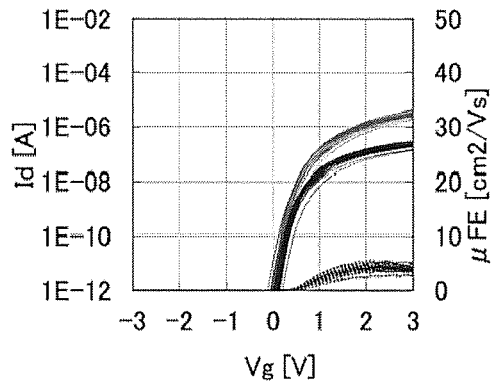

Measured $I_d$-$V_g$ characteristics of the samples 8A to 8C are shown in FIGS. 69A to 69C. FIGS. 69A to 69C show the $I_d$-$V_g$ characteristics of the transistors. The horizontal axis represents gate voltage $V_g$ [V], the left vertical axis represents drain current $I_d$ [A], and the right vertical axis represents field-effect mobility μFE [$cm^2$/Vs]. In each of FIGS. 69A to 69C, a solid line denotes drain current and a dashed line denotes field-effect mobility.

As shown in FIGS. 69A to 69C, the sample 8B exhibited large variations in transistor characteristics and, as a whole, the gate voltage at the rising of drain current shifted in a negative direction. In contrast, in the sample 8C, there was no variation in transistor characteristics and the electrical characteristics were as great as those of the sample 8A in which the high-temperature heat treatment was performed in the fabrication process of the transistor. In the sample 8C, when the backgate voltage was 0 V and the drain voltage $V_d$ was 0.1 V, both the field-effect mobility and the subthreshold swing value (S value) were favorable, which were 4.5 $cm^2$/Vs and 107.3 mV/dec, respectively.

Then, the threshold voltage $V_{th}$ and Shift of the transistor of the sample 8C were calculated. In the sample 8C, when the backgate voltage was 0 V, the threshold voltage and Shift of the transistor were 0.6 V and 0.0 V, respectively, which means that the transistor had normally-off electrical characteristics even when the backgate voltage was 0 V.

Here, in the sample 8C, the heat treatment was performed in the state where the insulator 154 was exposed after the formation of the semiconductor 156b as in the sample 7B in Example 7. It is presumable that as a result of this heat treatment, water or hydrogen contained in the stack including the insulator 155, the insulator 153, and the insulator 154 was reduced and favorable transistor characteristics were achieved. Although the heating temperature in the process of fabricating the sample 8C was approximately 400° C., the sample 8C had transistor characteristics as great as those of the sample 8A in which the heating temperature in the fabrication process was approximately 550° C.

The above results suggest that by performing heat treatment after formation of the semiconductor 156b with the insulator 154 exposed, water, hydrogen, or the like in the base insulating film (e.g., the insulator 154) in the vicinity of the semiconductor 156b is reduced and formation of defect states in the semiconductor 156b is inhibited. The use of such an oxide semiconductor with a reduced density of defect states makes it possible to provide a transistor with stable electrical characteristics.

Next, changes in electrical characteristics of the samples 8A to 8C by stress tests were measured.

Figure 70A:
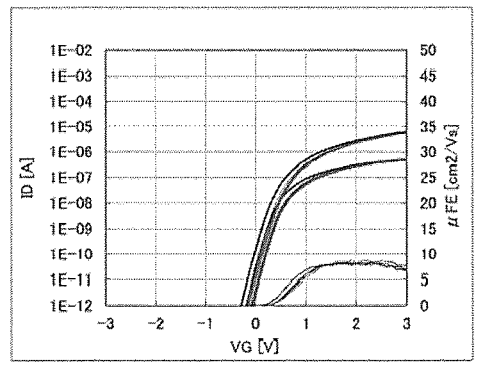
FIGS. 70A to 70D are graphs showing results of stress tests in Example.
Figure 71A:
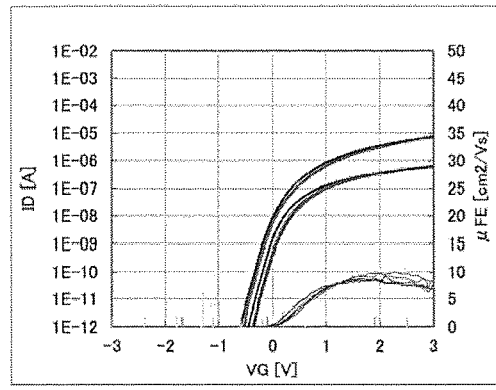
FIGS. 71A to 71D are graphs showing results of stress tests in Example.
Figure 72A:
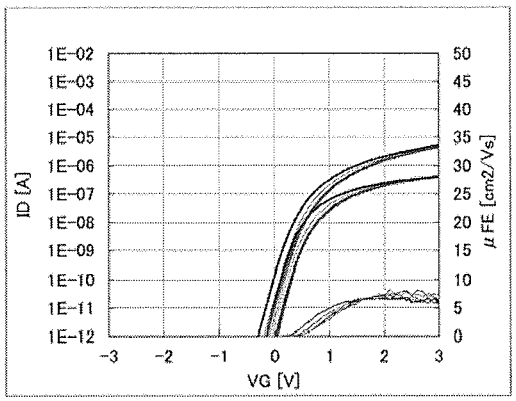
FIGS. 72A to 72D are graphs showing results of stress tests in Example.

FIG. 70A, FIG. 71A, and FIG. 72A show results of a positive gate BT (Bias-Temperature) stress test. FIG. 70A, FIG. 71A, and FIG. 72A show the results of the sample 8A, the sample 8B, and the sample 8C, respectively. Note that the stress test described below was performed at a substrate temperature of 150° C. In the positive gate BT stress test, first, $I_d$-$V_g$ characteristics before the stress test were measured. In the measurement, the backgate voltage was 0 V, the drain voltage was 0.1 V or 1.8 V, and the gate voltage was swept from −3.0 V to 3.0 V in increments of 0.1 V. Next, $I_d$-$V_g$ characteristics after the stress test were measured. In the measurement, the drain voltage was 0 V, the backgate voltage was 0 V, and a gate voltage of 3.3 V was applied for 1 hour. Note that measurement was performed 100 seconds, 300 seconds, 600 seconds, 1000 seconds, 30 minutes, 1 hour, 2 hours, 10000 seconds, 5 hours, 9 hours, and 12 hours after stress application, and the value after 12 hours after the stress application is described below. As shown in FIG. 70A, FIG. 71A, and FIG. 72A, the samples 8A to 8C were not significantly different in reliability. In the sample 8C, a change in Shift (ΔShift) before and after the positive gate BT stress test for 12 hours was as small as 0.15 V.

Figure 70B:
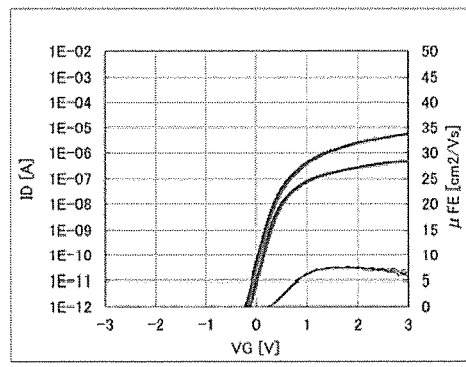
Figure 71B:
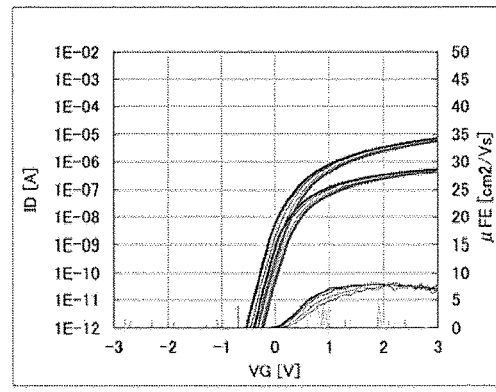
Figure 72B:
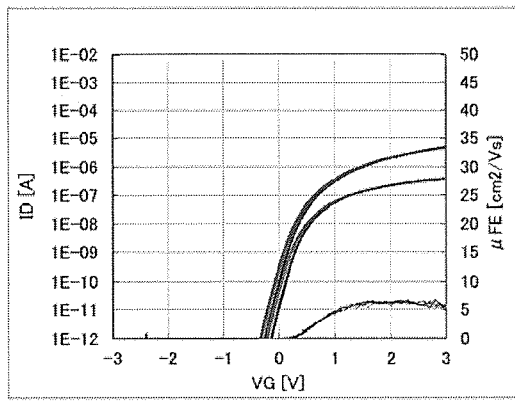

FIG. 70B, FIG. 71B, and FIG. 72B show results of a negative gate BT stress test. FIG. 70B, FIG. 71B, and FIG. 72B show the results of the sample 8A, the sample 8B, and the sample 8C, respectively. Note that the stress test described below was performed at a substrate temperature of 150° C. In the negative gate BT stress test, first, $I_d$-$V_g$ characteristics before the stress test were measured. In the measurement, the backgate voltage was 0 V, the drain voltage was 0.1 V or 1.8 V, and the gate voltage was swept from −3.0 V to 3.0 V in increments of 0.1 V. Next, $I_d$-$V_g$ characteristics after the stress test were measured. In the measurement, the drain voltage was 0 V, the backgate voltage was 0 V, and a gate voltage of −3.3 V was applied for 1 hour. Note that measurement was performed 100 seconds, 300 seconds, 600 seconds, 1000 seconds, 30 minutes, 1 hour, 2 hours, 10000 seconds, 5 hours, 9 hours, and 12 hours after stress application, and the value after 12 hours after the stress application is described below. As shown in FIG. 70B, FIG. 71B, and FIG. 72B, the samples 8A to 8C were not significantly different in reliability. In the sample 8C, ΔShift before and after the negative gate BT stress test for 12 hours was as small as −0.08 V.

Figure 70C:
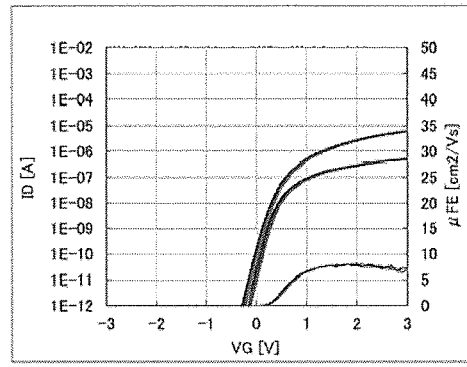
Figure 71C:
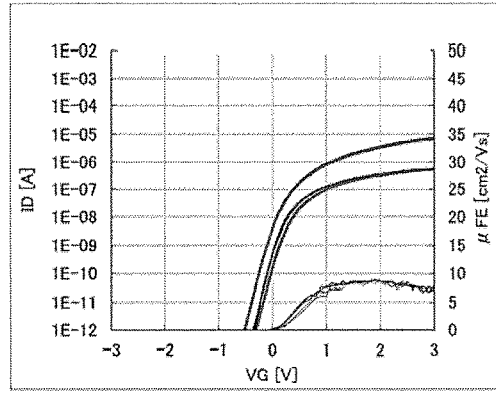
Figure 72C:
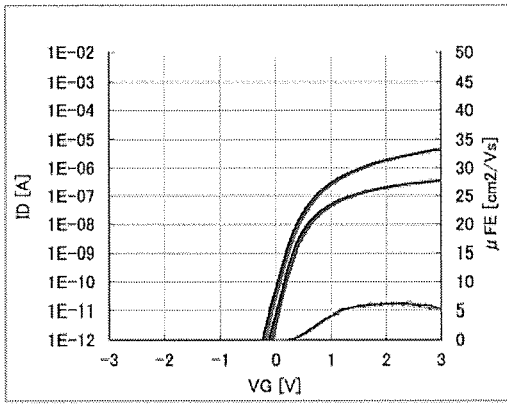

FIG. 70C, FIG. 71C, and FIG. 72C show results of a positive drain BT stress test. FIG. 70C, FIG. 71C, and FIG. 72C show the results of the sample 8A, the sample 8B, and the sample 8C, respectively. Note that the stress test described below was performed at a substrate temperature of 150° C. In the positive drain BT stress test, first, $I_d$-$V_g$ characteristics before the stress test were measured. In the measurement, the backgate voltage was 0 V, the drain voltage was 0.1 V or 1.8 V, and the gate voltage was swept from −3.0 V to 3.0 V in increments of 0.1 V. Next, $I_d$-$V_g$ characteristics after the stress test were measured. In the measurement, the gate voltage was 0 V, the backgate voltage was 0 V, and a drain voltage of 1.8 V was applied for 1 hour. Note that measurement was performed 100 seconds, 300 seconds, 600 seconds, 1000 seconds, 30 minutes, 1 hour, 2 hours, 10000 seconds, 5 hours, 9 hours, and 12 hours after stress application, and the value after 12 hours after the stress application is described below. As shown in FIG. 70C, FIG. 71C, and FIG. 72C, the samples 8A to 8C were not significantly different in reliability. In the sample 8C, Δshift before and after the positive drain BT stress test for 12 hours was as small as 0.05 V.

Figure 70D:
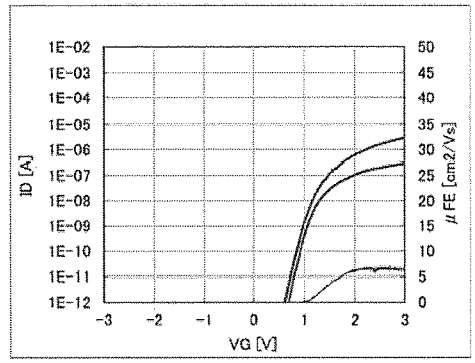
Figure 71D:
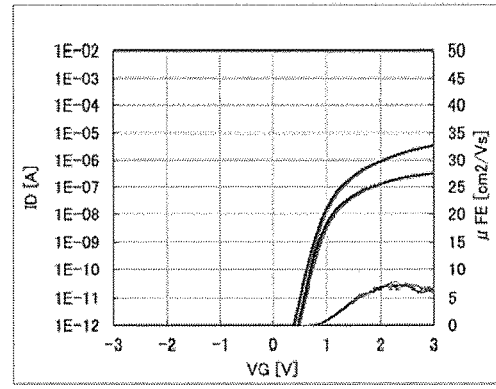
Figure 72D:
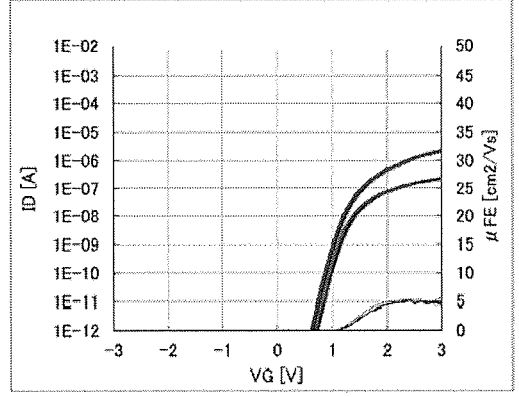

FIG. 70D, FIG. 71D, and FIG. 72D show results of a negative backgate BT stress test. FIG. 70D, FIG. 71D, and FIG. 72D show the results of the sample 8A, the sample 8B, and the sample 8C, respectively. Note that the stress test described below was performed at a substrate temperature of 150° C. In the negative backgate BT stress test, first, $I_d$-$V_g$ characteristics before the stress test were measured. In the measurement, the backgate voltage was −5 V, the drain voltage was 0.1 V or 1.8 V, and the gate voltage was swept from −3.0 V to 3.0 V in increments of 0.1 V. Next, $I_d$-$V_g$ characteristics after the stress test were measured. In the measurement, the drain voltage was 0 V, the gate voltage was 0 V, and a backgate voltage of −5 V was applied for 1 hour. Note that measurement was performed 100 seconds, 300 seconds, 600 seconds, 1000 seconds, 30 minutes, 1 hour, 2 hours, 10000 seconds, 5 hours, 9 hours, and 12 hours after stress application, and the value after 12 hours after the stress application is described below. As shown in FIG. 70D, FIG. 71D, and FIG. 72D, the samples 8A to 8C were not significantly different in reliability. In the sample 8C, ΔShift before and after the negative backgate BT stress test for 12 hours was as small as −0.05 V.

As described above, in the transistor in which the heat treatment was performed after formation of the semiconductor 156b with the insulator 154 exposed, a change in electrical characteristics of the transistor after the stress tests was small. Thus, by employing the structure described in this example, a highly reliable transistor can be provided. Furthermore, although the heating temperature in the process of fabricating the transistor was approximately 400° C., favorable reliability was achieved.

Figure 73A:
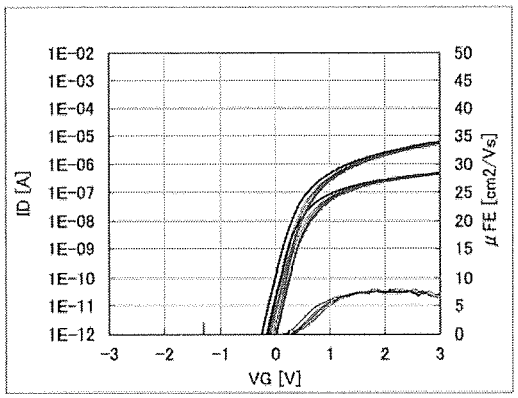
FIGS. 73A to 73C are graphs showing results of stress tests in Example.
Figure 73B:
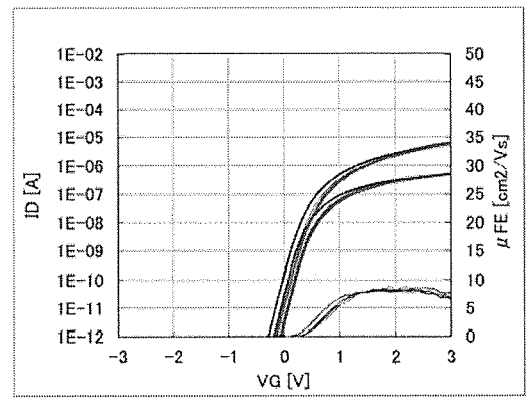
Figure 73C:
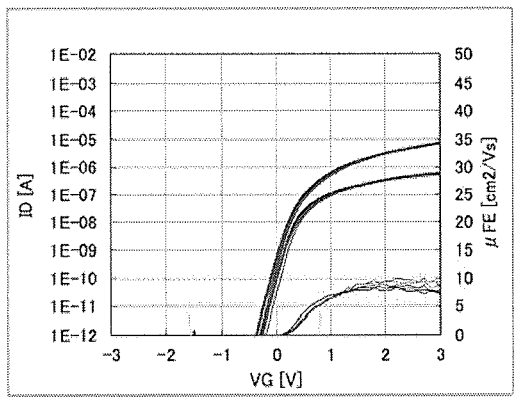
Figure 74A:
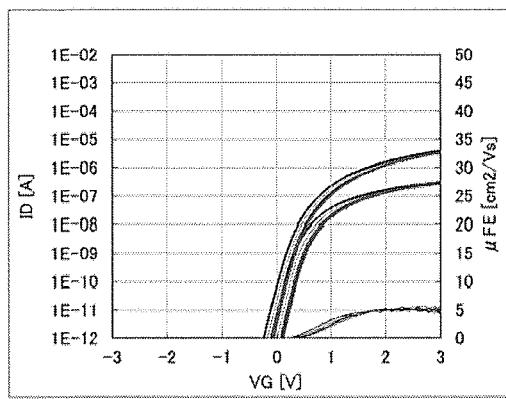
FIGS. 74A to 74C are graphs showing results of stress tests in Example.
Figure 74B:
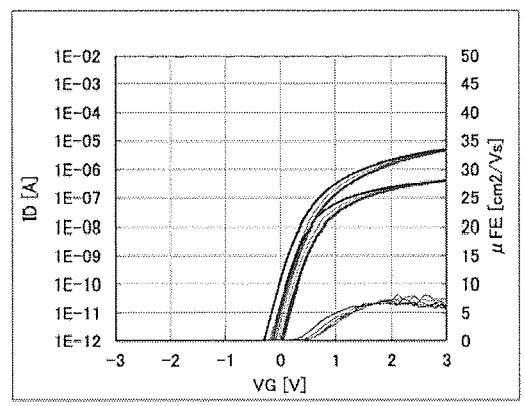
Figure 74C:
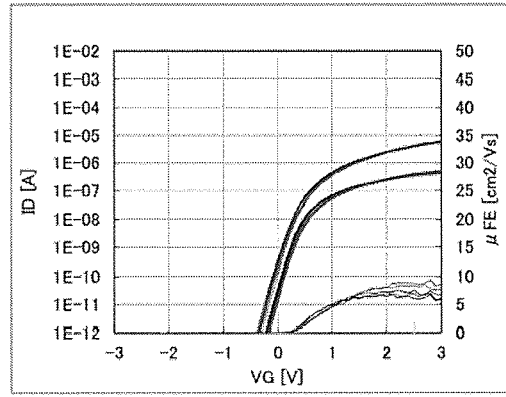

The results of positive gate BT stress tests which were performed on the samples 8A and 8C and in which the substrate temperatures were 125° C., 150° C., and 175° C. are shown in FIGS. 73A to 73C (the sample 8A) and FIGS. 74A to 74C (the sample 8C). FIG. 73A and FIG. 74A show the results obtained when the substrate temperature was 125° C., FIG. 73B and FIG. 74B show the results obtained when the substrate temperature was 150° C., and FIG. 73C and FIG. 74C show the results obtained when the substrate temperature was 175° C. Accordingly, the results shown in FIG. 73B are the same as those shown in FIG. 70A, and the results shown in FIG. 74B are the same as those shown in FIG. 72A. Note that the conditions of the positive gate BT stress test were the same as those of the above-described positive gate BT stress test except for the substrate temperature.

Figure 75A:
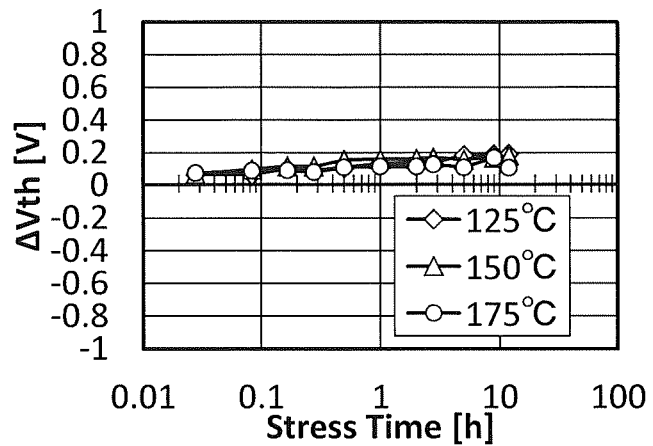
FIGS. 75A to 75C are graphs showing variations as a function of stress time measured in Example.
Figure 75B:
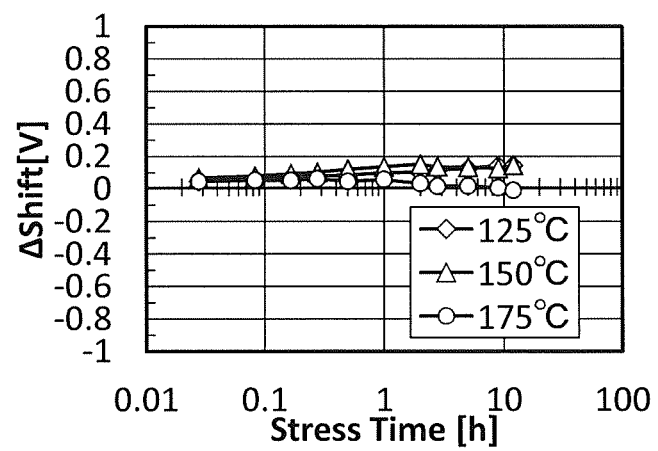
Figure 75C:
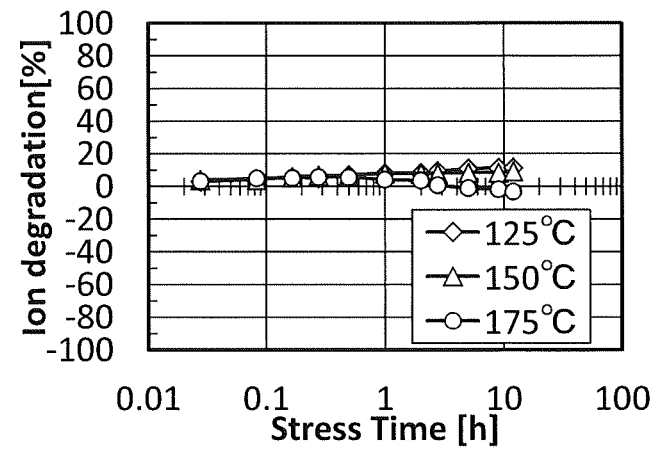
Figure 76A:
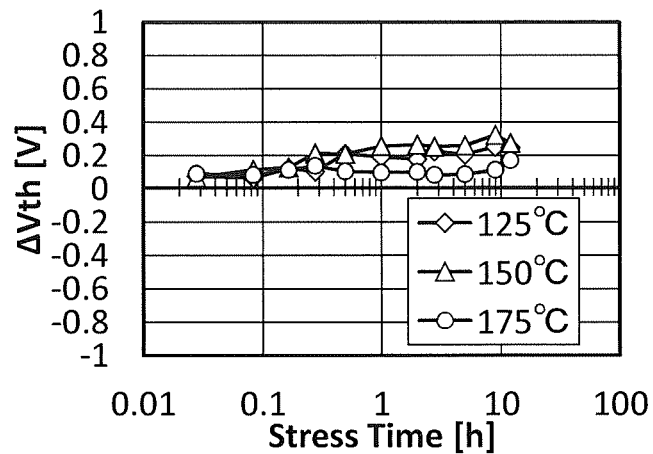
FIGS. 76A to 76C are graphs showing variations as a function of stress time measured in Example.
Figure 76B:
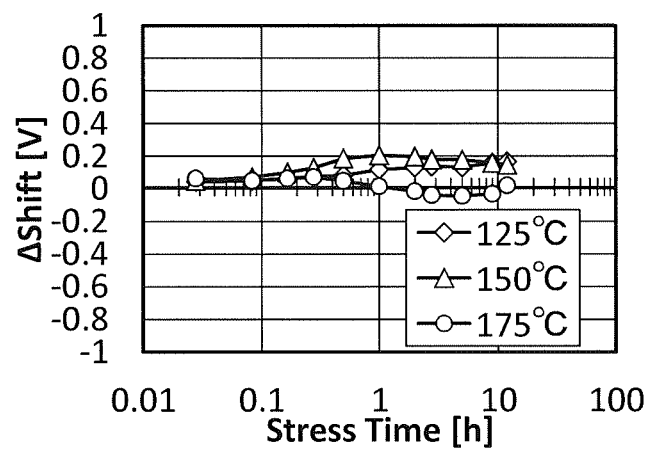
Figure 76C:
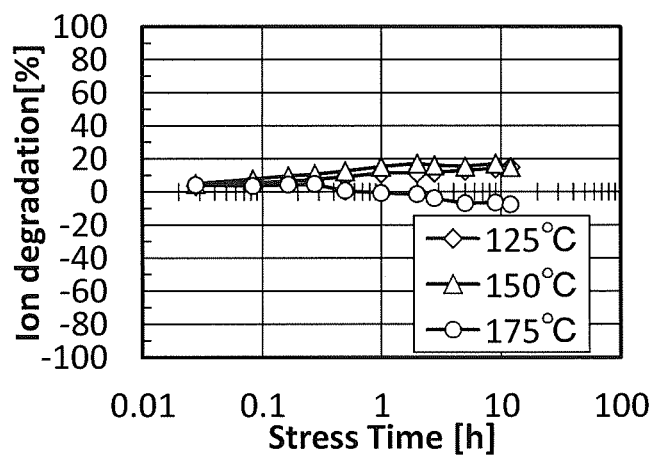

Furthermore, a variation in $V_{th}$ ($\Delta V_{th}$), $\Delta$Shift, and the deterioration rate of $I_{on}$ before and after the stress test were estimated from the transistor characteristics shown in FIGS. 73A to 73C and FIGS. 74A to 74C, and the results are shown in FIGS. 75A to 75C and FIGS. 76A to 76C. FIGS. 75A, 75B, and 75C each show the results of the sample 8A and show $\Delta V_{th}$ [V], $\Delta$Shift [V], and the deterioration rate of $I_{on}$ [%], respectively, versus stress application time. FIGS. 76A, 76B, and 76C each show the results of the sample 8C and show $\Delta V_{th}$ [V], $\Delta$Shift [V], and the deterioration rate of $I_{on}$ [%], respectively, versus stress application time.

As shown in FIGS. 73A to 73C, FIGS. 74A to 74C, FIGS. 75A to 75C, and FIGS. 76A to 76C, changing the substrate temperature to 125° C. or 175° C. did not result in a big difference in reliability between the samples 8C and 8A.

Next, for the samples 8A and 8C, a positive gate BT stress test in which a substrate temperature was 150° C. and stress time was 1 hour was performed, and a variation in $\Delta$Shift was examined for 9 points of the substrate. Note that other conditions of the positive gate BT stress test were the same as those of the above-described positive gate BT stress test.

Figure 77A:
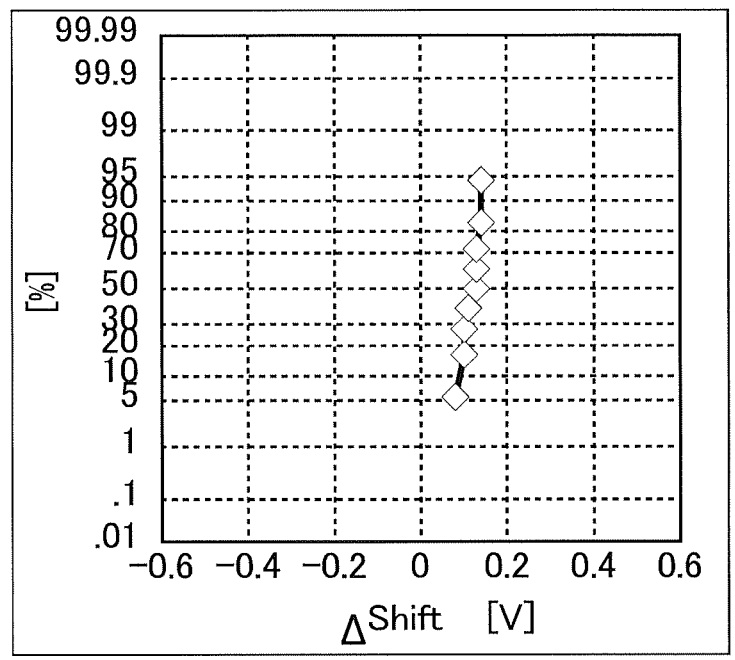
FIGS. 77A and 77B are graphs each showing a variation in ΔShift measured in Example.
Figure 77B:
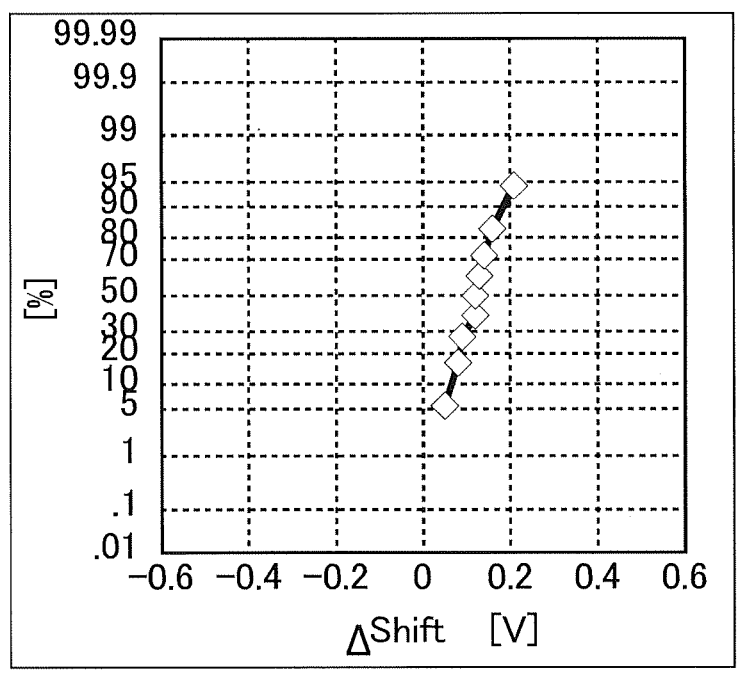

FIGS. 77A and 77B show the variations in $\Delta$Shift. Here, FIG. 77A shows the results of the sample 8A and FIG. 77B shows the results of the sample 8C. In FIGS. 77A and 77B, the horizontal axis represents $\Delta$Shift [V] and the vertical axis represents probability distribution.

As shown in FIGS. 77A and 77B, the samples 8C and 8A were not significantly different in $\Delta$Shift.

REFERENCE NUMERALS

10: transistor, 12: transistor, 14: transistor, 16: transistor, 17: transistor, 18: transistor, 19: transistor, 20: transistor, 22: transistor, 24: transistor, 26: transistor, 28: transistor, 30: transistor, 32: transistor, 34: transistor, 50: transistor, 52: transistor, 54: transistor, 56: transistor, 58: transistor, 60: transistor, 62: transistor, 64: transistor, 66: transistor, 68: transistor, 70: transistor, 100: substrate, 101: insulator, 102: conductor, 103: insulator, 104: insulator, 106a: insulator, 106b: semiconductor, 106c: insulator, 106d: insulator, 108a: conductor, 108b: conductor, 109a: low-resistance region, 109b: low-resistance region, 110a: conductor, 110b: conductor, 112: insulator, 112a: insulator, 112b: insulator, 112c: insulator, 114: conductor, 116: insulator, 118: insulator, 120a: conductor, 120b: conductor, 122: conductor, 124: insulator, 126: oxygen ion, 130: mixed region, 131: oxygen, 150: substrate, 151: insulator, 152: conductor, 153: insulator, 154: insulator, 155: insulator, 156a: insulator, 156b: semiconductor, 156c: insulator, 157: insulator, 158a: conductor, 158b: conductor, 159a: low-resistance region, 159b: low-resistance region, 160a: conductor, 160b: conductor, 162: insulator, 162a: insulator, 162b: insulator, 162c: insulator, 164: conductor, 166: insulator, 168: insulator, 170a: conductor, 170b: conductor, 172: conductor, 174a: conductor, 174b: conductor, 176a: insulator, 176b: semiconductor, 176c: insulator, 178: conductor, 182: insulator, 184: conductor, 186: oxygen ion, 187: region, 188: channel formation region, 200: imaging device, 201: switch, 202: switch, 203: switch, 210: pixel portion, 211: pixel, 212: subpixel, 212B: subpixel, 212G: subpixel, 212R: subpixel, 220: photoelectric conversion element, 230: pixel circuit, 231: wiring, 247: wiring, 248: wiring, 249: wiring, 250: wiring, 253: wiring, 254: filter, 254B: filter, 254G: filter, 254R: filter, 255: lens, 256: light, 257: wiring, 260: peripheral circuit, 270: peripheral circuit, 280: peripheral circuit, 290: peripheral circuit, 291: light source, 300: silicon substrate, 310: layer, 320: layer, 330: layer, 340: layer, 351: transistor, 352: transistor, 353: transistor, 360: photodiode, 361: anode, 363: low-resistance region, 370: plug, 371: wiring, 372: wiring, 373: wiring, 380: insulator, 450: semiconductor substrate, 452: insulator, 454: conductor, 456: region, 460: region, 462: insulator, 464: insulator, 466: insulator, 468: insulator, 472a: region, 472b: region, 474a: conductor, 474b: conductor, 474c: conductor, 476a: conductor, 476b: conductor, 478a: conductor, 478b: conductor, 478c: conductor, 480a: conductor, 480b: conductor, 480c: conductor, 489: insulator, 490: insulator, 491: insulator, 492: insulator, 493: insulator, 494: insulator, 496a: conductor, 496b: conductor, 496c: conductor, 496d: conductor, 498a: conductor, 498b: conductor, 498c: conductor, 504: conductor, 511: insulator, 514: conductor, 516a: conductor, 516b: conductor, 700: substrate, 704a: conductor, 704b: conductor, 706: semiconductor, 706a: semiconductor, 706b: semiconductor, 712a: insulator, 712b: insulator, 714a: conductor, 714b: conductor, 716a: conductor, 716b: conductor, 718a: insulator, 718b: insulator, 718c: insulator, 719: light-emitting element, 720: insulator, 721: insulator, 731: terminal, 732: FPC, 733a: wiring, 734: sealant, 735: driver circuit, 736: driver circuit, 737: pixel, 741: transistor, 742: capacitor, 743: switching element, 744: signal line, 750: substrate, 751: transistor, 752: capacitor, 753: liquid crystal element, 754: scan line, 755: signal line, 781: conductor, 782: light-emitting layer, 783: conductor, 784: partition wall, 791: conductor, 792: insulator, 793: liquid crystal layer, 794: insulator, 795: spacer, 796: conductor, 797: substrate, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: door for refrigerator, 933: door for freezer, 941: housing, 942: housing, 943: display portion, 944: operation key, 945: lens, 946: joint, 951: car body, 952: wheels, 953: dashboard, 954: light, 1000: deposition apparatus, 1002: carrying-in chamber, 1004: carrying-out chamber, 1006: transfer chamber, 1008: deposition chamber, 1009: deposition chamber, 1010: deposition chamber, 1020: chamber, 1021a: source material supply portion, 1021b: source material supply portion, 1022a: high-speed valve, 1022b: high-speed valve, 1023a: source material introduction port, 1023b: source material introduction port, 1024: source material exhaust port, 1025: evacuation unit, 1026: substrate holder, 1030: substrate, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 2100: transistor, 2200: transistor, 3001: wiring, 3002: wiring, 3003: wiring, 3004: wiring, 3005: wiring, 3200: transistor, 3300: transistor, 3400: capacitor, 4001: wiring, 4003: wiring, 4005: wiring, 4006: wiring, 4007: wiring, 4008: wiring, 4009: wiring, 4021: first layer, 4022: second layer, 4023: third layer, 4100: transistor, 4200: transistor, 4300: transistor, 4400: transistor, 4500: capacitor, 4600: capacitor, 5200: pellet, 5201: ion, 5203: particle, 5206: oxide thin film, 5220: substrate, 5230: target, 5240: plasma.

This application is based on Japanese Patent Application serial no. 2014-249819 filed with Japan Patent Office on Dec. 10, 2014 and Japanese Patent Application serial no. 2015-096669 filed with Japan Patent Office on May 11, 2015, the entire contents of which are hereby incorporated by reference.

The invention claimed is:

1. A semiconductor device comprising:
a first insulator over a substrate;
a first oxide insulator comprising indium over the first insulator;
an oxide semiconductor comprising indium in contact with the first oxide insulator;
a second oxide insulator comprising indium in contact with the oxide semiconductor;
a pair of conductors in contact with the second oxide insulator;
a third oxide insulator comprising at least one element other than oxygen included in the second oxide insulator in contact with the second oxide insulator and the pair of conductors;
a second insulator over the third oxide insulator;
a first conductor over the second insulator; and
a third insulator over the first conductor,
wherein a region in the second oxide insulator between the pair of conductors has a smaller thickness than regions in the second oxide insulator overlapping with the pair of conductors,
wherein an energy level of a conduction band minimum of each of the first oxide insulator and the second oxide insulator is closer to a vacuum level than an energy level of a conduction band minimum of the oxide semiconductor is,
wherein an energy level of a conduction band minimum of the third oxide insulator is closer to the vacuum level than the energy level of the conduction band minimum of the second oxide insulator is.

2. The semiconductor device according to claim 1, wherein part of the first conductor does not overlap with the pair of conductors.

3. The semiconductor device according to claim 1, wherein the third oxide insulator comprises an element M (titanium, gallium, yttrium, zirconium, lanthanum, cerium, neodymium, tin, or hafnium), zinc, and oxygen.

4. The semiconductor device according to claim 1, wherein the pair of conductors each have a stacked-layer structure, and
wherein an upper layer of each of the pair of conductors comprises one or more kinds of elements selected from silver, copper, ruthenium, iridium, platinum, and gold.

5. The semiconductor device according to claim 1, further comprising:
a fourth conductor; and
a fourth insulator,
wherein the fourth conductor is formed over the substrate and below the first insulator,
wherein the fourth insulator is formed between the fourth conductor and the first insulator, and
wherein the fourth insulator is an oxide or a nitride comprising boron, aluminum, silicon, scandium, titanium, gallium, yttrium, zirconium, indium, lanthanum, cerium, neodymium, hafnium, or thallium.

6. The semiconductor device according to claim 1, wherein the first oxide insulator, the oxide semiconductor, and the second oxide insulator each further comprise an element M (titanium, gallium, yttrium, zirconium, lanthanum, cerium, neodymium, tin, or hafnium), zinc, and oxygen.

7. The semiconductor device according to claim 1, wherein the third insulator comprises oxygen and aluminum.

8. A semiconductor device comprising:
a first insulator over a substrate;
a first oxide insulator comprising indium over the first insulator;
an oxide semiconductor comprising indium in contact with the first oxide insulator;
a second oxide insulator comprising indium in contact with the oxide semiconductor;
a pair of conductors in contact with the second oxide insulator;
a third oxide insulator comprising at least one element other than oxygen included in the second oxide insulator in contact with the second oxide insulator and the pair of conductors;
a second insulator over the third oxide insulator;
a first conductor over the second insulator; and
a third insulator over the first conductor,
wherein a region in the second oxide insulator between the pair of conductors has a smaller thickness than regions in the second oxide insulator overlapping with the pair of conductors,
wherein an energy gap of each of the first oxide insulator and the second oxide insulator is larger than an energy gap of the oxide semiconductor,
wherein an energy gap of the third oxide insulator is larger than the energy gap of the second oxide insulator.

9. The semiconductor device according to claim 8, wherein part of the first conductor does not overlap with the pair of conductors.

10. The semiconductor device according to claim 8, wherein the third oxide insulator comprises an element M (titanium, gallium, yttrium, zirconium, lanthanum, cerium, neodymium, tin, or hafnium), zinc, and oxygen.

11. The semiconductor device according to claim 8, wherein the pair of conductors each have a stacked-layer structure, and
wherein an upper layer of each of the pair of conductors comprises one or more kinds of elements selected from silver, copper, ruthenium, iridium, platinum, and gold.

12. The semiconductor device according to claim 8, further comprising:
a fourth conductor; and
a fourth insulator,
wherein the fourth conductor is forming over the substrate and below the first insulator,
wherein the fourth insulator is formed between the fourth conductor and the first insulator, and
wherein the fourth insulator is an oxide or a nitride comprising boron, aluminum, silicon, scandium, titanium, gallium, yttrium, zirconium, indium, lanthanum, cerium, neodymium, hafnium, or thallium.

13. The semiconductor device according to claim 8, wherein the first oxide insulator, the oxide semiconductor, and the second oxide insulator each further comprise an element M (titanium, gallium, yttrium, zirconium, lanthanum, cerium, neodymium, tin, or hafnium), zinc, and oxygen.

14. The semiconductor device according to claim 8, wherein the third insulator comprises oxygen and aluminum.

* * * * *